(12) United States Patent
Shimooka et al.

(10) Patent No.: US 7,833,436 B2
(45) Date of Patent: *Nov. 16, 2010

(54) MULTINARY OXYNITRIDE PHOSPHOR, AND LIGHT EMITTING DEVICE, IMAGE DISPLAY, ILLUMINATING DEVICE AND PHOSPHOR-CONTAINING COMPOSITION USING THE SAME, AND MULTINARY OXYNITRIDE

(75) Inventors: Satoshi Shimooka, Yokohama (JP); Kyota Ueda, Yokohama (JP); Masayoshi Mikami, Yokohama (JP); Naoto Kijima, Yokohama (JP); Hiroyuki Imura, Yokohama (JP); Kentaro Horibe, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/400,188

(22) Filed: Mar. 9, 2009

(65) Prior Publication Data

US 2009/0166584 A1 Jul. 2, 2009

Related U.S. Application Data

(63) Continuation of application No. 12/278,220, filed as application No. PCT/JP2007/051783 on Feb. 2, 2007.

(30) Foreign Application Priority Data

Feb. 2, 2006 (JP) .............................. 2006-026272
Nov. 7, 2006 (JP) .............................. 2006-302031

(51) Int. Cl.
*C09K 11/02* (2006.01)
*C09K 11/08* (2006.01)
*C09K 11/66* (2006.01)
*C09K 11/77* (2006.01)

(52) U.S. Cl. .......................... 252/301.4 F; 252/301.4 R
(58) Field of Classification Search .......... 252/301.4 H, 252/301.4 R
See application file for complete search history.

(56) References Cited

U.S. PATENT DOCUMENTS

| 2003/0094893 A1 | 5/2003 | Ellens et al. |
| 2005/0205845 A1 | 9/2005 | Delsing et al. |
| 2006/0011922 A1 | 1/2006 | Schmidt et al. |
| 2006/0033081 A1 | 2/2006 | Hintzen et al. |
| 2006/0076883 A1 | 4/2006 | Himaki et al. |
| 2008/0296596 A1 | 12/2008 | Setlur et al. |
| 2009/0033201 A1* | 2/2009 | Shimooka et al. ........... 313/483 |

FOREIGN PATENT DOCUMENTS

| EP | 1995294 | * 11/2008 |
| JP | 2003-206481 | 7/2003 |
| JP | 2005-093912 | 4/2005 |
| JP | 2005-200584 | 7/2005 |
| JP | 2005-529229 | 9/2005 |
| JP | 2005-281700 | 10/2005 |
| JP | 2005-530917 | 10/2005 |
| JP | 2006-503431 | 1/2006 |
| WO | 2004-039915 | 5/2004 |
| WO | WO2007/091687 | * 8/2007 |
| WO | 2009/016096 | 2/2009 |

OTHER PUBLICATIONS

Stadler, Florian et al., "Die neuen Schichtsilicate $Ba_3Si_6O_9N_4$ und $Eu_3Si_6O_9N_4$ (The New Layer-Silicates $Ba_3Si_6O_9N_4$ and $Eu_3Si_6O_9N_4$)", Z. Anorg. Allg. Chem., vol. 632, pp. 949-954, 2006 (with English abstract).
U.S. Appl. No. 12/671,481, filed Jan. 29, 2010, Shimooka, et al.

* cited by examiner

*Primary Examiner*—C. Melissa Koslow
*Assistant Examiner*—Matthew E Hoban
(74) *Attorney, Agent, or Firm*—Oblon, Spivak, McClelland, Maier & Neustadt, L.L.P.

(57) ABSTRACT

To provide a green phosphor with high conversion efficiency of blue of near-ultraviolet light and excellent color purity, a multinary oxynitride phosphor represented by the general formula [I] is proposed.

$$M1_xBa_yM2_zL_uO_vN_w \qquad [I]$$

In the formula [I], M1 represents Cr, Mn, Fe, Ce, Pr, Nd, Sm, Eu, Tb, Dy, Ho, Er, Tm and Yb, M2 represents Sr, Ca, Mg and Zn, L represents metal elements belonging to the fourth group or the fourteenth group of the periodic table, and x, y, z, u, v and w are the numeric values in the following ranges:

$0.00001 \leq x \leq 3$ $0 \leq y \leq 2.99999$ $2.6 \leq x+y+z \leq 3$

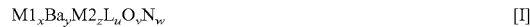

$0 < u \leq 11$ $6 < v \leq 25$ $0 < w \leq 17$.

6 Claims, 34 Drawing Sheets

Selected-Area Electron Diffraction Images of Ba2Si7O10N4:Eu Crystal

MULTINARY OXYNITRIDE PHOSPHOR, AND LIGHT EMITTING DEVICE, IMAGE DISPLAY, ILLUMINATING DEVICE AND PHOSPHOR-CONTAINING COMPOSITION USING THE SAME, AND MULTINARY OXYNITRIDE

CROSS REFERENCE TO RELATED APPLICATIONS

The present application is a continuation of U.S. patent application Ser. No. 12/278,220, which is the U.S. national stage of International Application No. PCT/JP07/51783, filed Feb. 2, 2007, the disclosures of which are incorporated herein by reference in their entireties. The present application claims priority benefit of Japanese Patent Application No. 2006-26272, filed on Feb. 2, 2006, Japanese Patent Application No. 2006-302031, filed on Nov. 7, 2006, and Japanese Patent Application No. 2007-23824, filed on Feb. 2, 2007, and the disclosures of which are incorporated herein by reference in their entireties.

TECHNICAL FIELD

The present invention relates to a multinary oxynitride phosphor, and a light emitting device, image display, illuminating device and phosphor-containing composition using the same, and a multinary oxynitride. More particularly, it relates to a multinary oxynitride phosphor emitting green light when irradiated with light from an excitation light source such as a semiconductor luminous element, which serves as a first luminous body, and a high-efficiency light emitting device, image display, illuminating device and phosphor-containing composition using the same, and a multinary oxynitride.

BACKGROUND ART

Though nitrides are inferior to oxides in stability or facilitation of production, not a few of them are known to have characteristics which oxides or other inorganic compounds do not have. Actually, such binary system nitrides as $Si_3N_4$, BN, AlN, GaN and TiN are used for various purposes such as substrate material, semiconductor, light-emitting diode (hereinafter abbreviated as "LED" as appropriate), structural ceramics and coating agent, and in industrial-scale production. In addition, large numbers of new substances of ternary or multinary nitrides are in production in these years. Among them, particularly phosphor materials with superior characteristics, which are made of multinary oxynitrides or multinary nitrides based on silicon nitride, have been developed recently. It is known that these phosphor materials emit yellow to red light when excited by a blue LED or near-ultraviolet LED. By such combination of a blue or near-ultraviolet LED and these phosphors, a light emitting device emitting white light can be fabricated.

A white light, which is frequently used in the uses for the illuminating device and display, is generally obtained by mixing blue, green and red light emissions in accordance with the additive color mixing principle of light. In the back-lighting of color liquid-crystal display, a field of uses for displays, it is preferable that each of blue, green and red luminous bodies has as high emission intensity as possible and good color purity, in order to reproduce colors having wide range of chromaticity coordinates efficiently. As an example of the indication of these characteristics, NTSC is known, which is a standard of color reproduction range of TV. In these years, a semiconductor light emitting device has been tried to be used as a light source for these three colors of blue, green and red. However, when semiconductor light emitting devices are used for all of the three colors, usually, a circuit for compensating a color shift is required. Therefore, it is practical to obtain desired colors of blue, green and red by the wavelength conversion of light which is emitted from a semiconductor luminous element using a wavelength conversion material such as a phosphor. Specifically, methods are known, in which blue, green and red lights are emitted using a near-ultraviolet semiconductor luminous element as the light source, and in which blue light from the semiconductor luminous element is used just as it is and green and red lights are obtained by the wavelength conversion using phosphors.

Among these three colors of blue, green and red, green is particularly important compared to the other two colors because it is especially high in luminosity factor to human eyes and it greatly contributes to the entire brightness of the display.

However, the existing phosphors emitting green lights are insufficient in conversion efficiency of blue or near-ultraviolet light and in color purity, and therefore a high-performance phosphor emitting green fluorescence (hereinafter, referred to as "green phosphor" as appropriate), which can satisfy the above requirements, has been desired.

As conventional known arts of green phosphor, the following phosphors can be cited such as $SrSi_2O_2N_2$:Eu, $CaSi_2O_2N_2$:Eu and $BaSi_2O_2N_2$:Eu, shown in Patent Documents 1 and 2, for example. These phosphors, having emission peak wavelengths ranging from 490 nm to 580 nm by an excitation light of 400-nm wavelength, show colors of blue green to yellow red. However, as is evident from the emission spectrum of these phosphors, their peak wavelengths are too short, and color purities are too low due to the broad full width at half maximums. Thus, the color reproduction ranges of displays using these phosphors are narrow. In addition, the phosphors are low in brightness and thus they are insufficient for the above requirements.

In Patent Document 3, an oxynitride phosphor having luminescent color of blue green to yellow is disclosed. However, only the phosphors are disclosed in Patent Document 3, of which compositions are the same as those described in the above-mentioned known documents 1 and 2, or of which metal element or silicon is merely substituted by the other elements, and therefore they also have the same problems as described above.

In Patent Document 4, an Si—O—N based phosphor containing Al is disclosed. However, the phosphor is also low in color purity due to its broad full width at half maximum of the emission spectrum, which is still insufficient for the above-mentioned requirements.

On the other hand, in Non-Patent Document 1, synthetic methods of $Ba_3Si_6O_9N_4$ and $Eu_3Si_6O_9N_4$, as well as their X-ray structural analysis results are disclosed. However, none of these oxynitrides does not emit fluorescence. The document was contributed on Nov. 17, 2005 and fully disclosed online on May 3, 2006, but only its title, including such composition formulae as $Ba_3Si_6O_9N_4$ and $Ba_3Si_6O_9N_4$, was disclosed before the priority date of the present application.

Patent Document 1: Japanese Patent Laid-Open Publication (Translation of PCT Application) No. 2005-530917
Patent Document 2: Japanese Patent Laid-Open Publication (Translation of PCT Application) No. 2006-503431
Patent Document 3: The pamphlet of International Publication No. 2004-039915
Patent Document 4: Japanese Patent Laid-Open Publication (Translation of PCT Application) No. 2005-529229

Non-Patent Document 1: Z. Anorg. Allg. Chem., 2006, vol. 632, pp. 949-954

DISCLOSURE OF THE INVENTION

Problem to be Solved by the Invention

It is preferable that a green luminous body for a illuminating device or display has the emission peak wavelength around 525 nm and high emission efficiency. In addition, it is preferable for it to be low in decrease of emission efficiency, accompanying temperature rising of the light emitting device, and also in color shift.

However, existing green phosphors are insufficient either in conversion efficiency of blue or near-ultraviolet light or in color purity. Therefore, a green phosphor having high performances and satisfying the above requirements has been desired.

Means for Solving the Problem

The present inventors have found a previously-unknown, completely new oxynitride, and have succeeded in production of a high-performance green phosphor by adding a luminescent center element to that oxynitride, which serves as the host crystal. This led to the completion of the present invention.

Namely, the subject matter of the present invention lies in a multinary oxynitride phosphor represented by the general formula [I].

$$M1_x Ba_y M2_z L_u O_v N_w \qquad [I]$$

(In the general formula [I], M1 represents at least one kind of an activation element selected from the group consisting of Cr, Mn, Fe, Ce, Pr, Nd, Sm, Eu, Tb, Dy, Ho, Er, Tm and Yb, M2 represents at least one kind of a divalent metal element selected from the group consisting of Sr, Ca, Mg and Zn, L represents a metal element selected from the metal elements belonging to the fourth group or the fourteenth group of the periodic table, and x, y, z, u, v and w are the numeric values in the following ranges:

$0.00001 \leq x \leq 3$ $0 \leq y \leq 2.99999$ $2.6 \leq x+y+z \leq 3$ $0 < u \leq 11$ $6 < v \leq 25$ $0 < w \leq 17$.)

In this case, it is preferable that u, v and w are $5 \leq u \leq 7$, $9 < v < 15$ and $0 < w < 4$, respectively, in the general formula [I].

Further, it is preferable that the crystalline structure of said multinary oxynitride phosphor has the trigonal unit cell.

Further, it is preferable that M1 includes at least Eu or Ce.

Further, it is preferable that y is the numeric value in the range of $0 < y < 2.99999$, in the general formula [I].

Further, it is preferable that said multinary oxynitride phosphor includes BSON crystal phase defined as follows.

BSON Crystal Phase

A crystal phase of which diffraction peak is observed within the range (R0) of the diffraction angle (2θ) from 26.9° to 28.2°, in X-ray diffraction measurement using a CuKα as an X-ray source, wherein, when that diffraction peak (P0) is taken as the reference diffraction peak, with 5 diffraction peaks (other than the diffraction peaks existing in the angle ranging from 20.9° to 22.9°) derived from the Bragg angle (θ0) of P0 shown by P1, P2, P3, P4 and P5 respectively in increasing order of angle and with diffraction angle ranges of these diffraction peaks shown by R1, R2, R3, R4 and R5, R1, R2, R3, R4 and R5 indicate the following angle ranges respectively:

$R1 = R1s \sim R1e$, $R2 = R2s \sim R2e$, $R3 = R3s \sim R3e$, $R4 = R4s \sim R4e$, $R5 = R5s \sim R5e$, at least one diffraction peak exists in all the ranges of R1, R2, R3, R4 and R5, and, to the highest diffraction peak height among those of P0, P1, P2, P3, P4 and P5, P0 has an intensity of 20% or stronger in diffraction peak height ratio and at least one of P1, P2, P3, P4 and P5 has a peak intensity of 5% or stronger in diffraction peak height ratio.

In this context, when two or more diffraction peaks exist in each angle range of R0, R1, R2, R3, R4 or R5, the peak having the highest peak intensity of them is taken as P0, P1, P2, P3, P4 or P5, and R1s, R2s, R3s, R4s and R5s, indicating the starting angles of R1, R2, R3, R4 and R5 respectively and R1e, R2e, R3e, R4e and R5e, indicating the ending angles of R1, R2, R3, R4 and R5 respectively, are the following angles:

$R1s: 2 \times \arcsin\{\sin(\theta 0)/(1.994 \times 1.015)\}$ $R1e: 2 \times \arcsin\{\sin(\theta 0)/(1.994 \times 0.985)\}$ $R2s: 2 \times \arcsin\{\sin(\theta 0)/(1.412 \times 1.015)\}$ $R2e: 2 \times \arcsin\{\sin(\theta 0)/(1.412 \times 0.985)\}$ $R3s: 2 \times \arcsin\{\sin(\theta 0)/(1.155 \times 1.015)\}$ $R3e: 2 \times \arcsin\{\sin(\theta 0)/(1.155 \times 0.985)\}$ $R4s: 2 \times \arcsin\{\sin(\theta 0)/(0.894 \times 1.015)\}$ $R4e: 2 \times \arcsin\{\sin(\theta 0)/(0.894 \times 0.985)\}$ $R5s: 2 \times \arcsin\{\sin(\theta 0)/(0.756 \times 1.015)\}$ $R5e: 2 \times \arcsin\{\sin(\theta 0)/(0.756 \times 0.985)\}$.

Further, in the above-mentioned multinary oxynitride phosphor, it is preferable that, in X-ray diffraction measurement using a CuKα as an X-ray source, the strongest peak intensity of the impurity phase, among the measurement results of the X-ray diffraction, is 40% or weaker to the strongest peak intensity of the P0, P1, P2, P3, P4 and P5.

Another subject matter of the present invention lies in a phosphor-containing composition comprising: the above-mentioned multinary oxynitride phosphor and a liquid medium.

Still another subject matter of the present invention lies in a light emitting device comprising: an excitation light source and a phosphor emitting green fluorescence when irradiated with light from the excitation light source and having the below characteristics (1), (2) and (3).

(1) When irradiated with light having wavelength of 455 nm, the ratio of the peak intensity value of the emission at 150° C. in the emission spectrum map, to the peak intensity value of the emission at 20° C. in the emission spectrum map, is 55% or more.

(2) The ratio of the peak intensity value of the emission when irradiated with light having wavelength of 410 nm in the emission spectrum map, to the peak intensity value of the emission when irradiated with light having wavelength of 390 nm in the emission spectrum map, is 90% or more.

(3) The chromaticity coordinate of the luminescent color of the phosphor, according to JIS Z8701, meets conditions of x≦0.3 and y≧0.5.

Still another subject matter of the present invention lies in a light emitting device comprising: an excitation light source and a phosphor emitting green fluorescence when irradiated with light from the excitation light source and having the below characteristic (4) and the above-mentioned characteristics (2) and (3).

(4) The crystalline structure of an oxynitride has the trigonal unit cell.

In the above-mentioned light emitting device, it is preferable that the chromaticity (x, y) of the light emission after energization with current density of 238 mA/mm² for 200 hrs at a temperature of 85° C. and relative humidity of 85%, to the chromaticity (x', y') before the energization, meets each condition of 0≦|x−x'|≦0.035 and 0≦|y−y'|≦0.035.

Further, in the above-mentioned light emitting device, it is preferable that the emission efficiency is 30 lm/W or larger.

Further, it is preferable that said light emitting device comprises at least one kind of the above-mentioned multinary oxynitride phosphor.

Still another subject matter of the present invention lies in a light emitting device comprising: a first luminous body and a second luminous body which emits visible light when irradiated with light from said first luminous body, wherein said light emitting device comprises, as said second luminous body, a first phosphor including at least one kind of said multinary oxynitride phosphor as described herein.

In this case, it is preferable that said light emitting device comprises, as said second luminous body, a second phosphor including at least one kind of a phosphor of which emission peak wavelength is different from that of said first phosphor.

Further, it is preferable that said light emitting device comprises, as said second phosphor, at least one kind of a phosphor having emission peak wavelength in the wavelength range of from 570 nm to 780 nm.

Further, in the above-mentioned light emitting device, it is preferable that said first luminous body has an emission peak in the wavelength range of from 420 nm to 500 nm.

Further, in the above-mentioned light emitting device, it is preferable that said first luminous body has an emission peak in the wavelength range of from 300 nm to 420 nm, and said light emitting device comprises, as said second phosphor, at least one kind of a phosphor having emission peak in the wavelength range of from 420 nm to 490 nm and at least one kind of a phosphor having emission peak in the wavelength range of from 570 nm to 780 nm.

Further, it is preferable that said light emitting device comprises, as said second phosphor, at least one kind of a phosphor selected from the group consisting of $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, $(Ca,Sr)S$:Eu, $(La,Y)_2O_2S$:Eu and Eu complexes.

Further, it is preferable that said light emitting device comprises, as said second phosphor, at least one kind of a phosphor selected from the group consisting of $(Ca,Sr,Ba)MgAl_{10}O_{17}$:Eu, $(Sr,Ca,Ba,Mg)_{10}(PO_4)_6(Cl,F)_2$:Eu and $(Ba,Ca,Mg,Sr)_2SiO_4$:Eu.

Further, in the above-mentioned light emitting device, it is preferable that the luminescent color is in the range which is defined, in JIS Z8701, as (Yellowish) White, (Greenish) White, (Bluish) White, (Purplish) White or White.

Still another subject matter of the present invention lies in an image display comprising the above-mentioned light emitting device.

Still another subject matter of the present invention lies in a illuminating device comprising the above-mentioned light emitting device.

Still another subject matter of the present invention lies in a multinary oxynitride represented by the general formula [II].

$$Ba_{y'}M2'_{z'}L_{u'}O_{v'}N_{w'} \quad [II]$$

(In the general formula [II], M2' represents at least one kind of a metal element selected from the group consisting of Sr, Ca, Mg, Zn, Cr, Mn, Fe, Y, La, Ce, Pr, Nd, Sm, Eu, Gd, Tb, Dy, Ho, Er, Tm, Yb and Lu, L represents a metal element selected from the metal elements belonging to the fourth group or the fourteenth group of the periodic table, and y', z', u', v' and w' are the numeric values in the following ranges:

$$0 \leq y' \leq 3$$

$$2.6 \leq y'+z' \leq 3$$

$$5 \leq u' \leq 7$$

$$9 < v' < 15$$

$$0 < w' < 4.)$$

In this case, it is preferable that the crystalline structure of said multinary oxynitride has the trigonal unit cell.

Further, it is preferable that said multinary oxynitride includes BSON crystal phase defined earlier.

Further, in the above-mentioned multinary oxynitride, it is preferable that, in X-ray diffraction measurement using a CuKα as an X-ray source, the strongest peak intensity of the impurity phase, among the measurement results of the X-ray diffraction, is 40% or weaker to the strongest peak intensity of the P0, P1, P2, P3, P4 and P5.

The chemical composition of the new multinary oxynitride phosphor of the present invention is typically $Ba_3Si_6O_{12}N_2$, and the novelty of that crystal structure was verified by X-ray diffraction method using a CuKα as an X-ray source. Furthermore, the present inventors have found that a green phosphor, having high efficient emission under the irradiation of the excitation light, such as of from 380-nm to 480-nm wavelengths, from a semiconductor luminous element, can be obtained by substituting Ba-ion [sic] site in this crystal with $Eu^{2+}$, which serves as an activator. This led to the completion of the present invention.

ADVANTAGEOUS EFFECT OF THE INVENTION

The multinary oxynitride phosphor of the present invention is a green phosphor that can be excited efficiently, particularly with a semiconductor luminous element emitting light of near ultraviolet or blue, and of which peak wavelength of the emission spectrum is around 525 nm. In addition, in the multinary oxynitride phosphor of the present invention, the decrease in emission efficiency accompanying temperature rising is usually small, compared to a YAG:Ce phosphor which is often used for a conventional white light emitting device.

The multinary oxynitride phosphor of the present invention can be widely used in such fields as illuminating device or display. Among them, it can be suitably used for an LED lamp of a general illuminating device, and particularly suitably for a white, back-lighting LED of high power, high brightness and broad range of color reproduction. The light emitting device of the present invention has high emission efficiency, less decrease in emission efficiency accompanying temperature rising, high brightness and broad range of color reproduction.

Further, the multinary oxynitride of the present invention is excellent in acid stability and high-temperature stability, and therefore it is used preferably as a heat-resistant material.

BRIEF DESCRIPTION OF THE DRAWINGS

Both

EXPLANATION OF LETTERS OR NUMERALS

Figure 1:
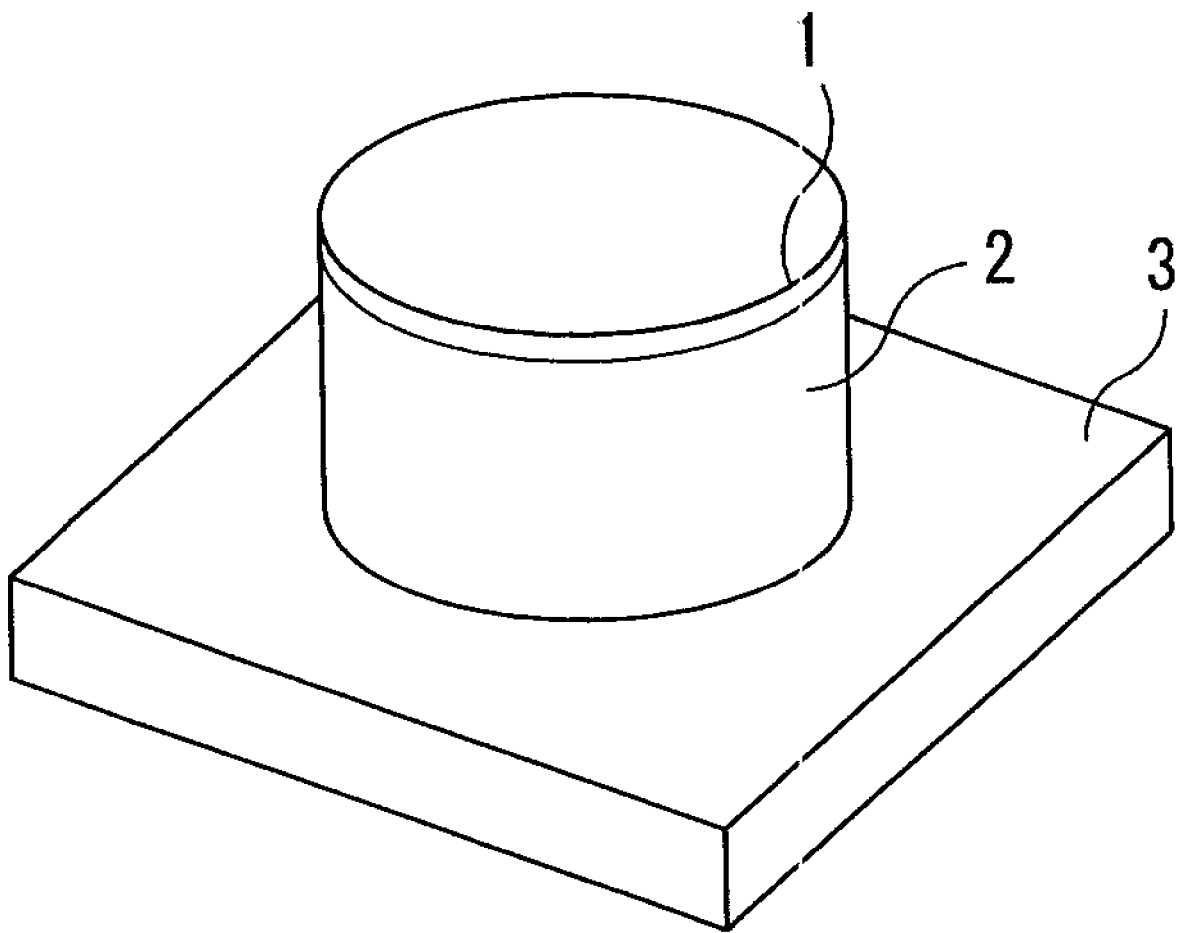
FIG. 1 is a schematic perspective view illustrating the positional relationship between an excitation light source (first luminous body) and a phosphor-containing part (second luminous body), in an example of the light emitting device of the present invention.

1: second luminous body
2: surface emitting type GaN-based LD
3: substrate
4: light emitting device
5: mount lead
6: inner lead
7: first luminous body
8: phosphor-containing resinous part
9: conductive wire
10: mold member
11: surface-emitting illuminating device
12: holding case
13: light emitting device
14: diffusion plate
15: display
16: light source
17R, 17G, 17B: phosphor parts
17-1: transparent substrate
17-2: black matrix layer
18: frame
19: polarizer
20: optical shutter
20-1: back electrode
20-2: liquid crystal layer
20-3: front electrode
21: analyzer
22: first luminous body
23: phosphor-containing resinous part
24: frame
25: conductive wire
26: electrode
27: electrode

BEST MODES FOR CARRYING OUT THE INVENTION

An embodiment of the present invention will be explained in detail below. It is to be understood that the present invention is not limited to the following embodiment and any modification can be added thereto insofar as they do not depart from the scope of the present invention.

All the relationships between color names and their chromaticity coordinates in this Description comply with the Japanese Industrial Standards (JIS Z8110 and Z8701).

Each composition formula of phosphors in this Description is punctuated by a comma (,). Further, when two or more elements are juxtaposed with a comma (,) in between, one kind of or two or more kinds of the juxtaposed elements can be contained in any combination and in any composition. For example, a composition formula "(Ca,Sr,Ba)Al$_2$O$_4$:Eu" inclusively indicates all of "CaAl$_2$O$_4$:Eu", "SrAl$_2$O$_4$:Eu", "BaAl$_2$O$_4$:Eu", "Ca$_{1-x}$Sr$_x$Al$_2$O$_4$:Eu", "Sr$_{1-x}$Ba$_x$Al$_2$O$_4$:Eu", "Ca$_{1-x}$Ba$_x$Al$_2$O$_4$:Eu" and "Ca$_{1-x-y}$Sr$_x$Ba$_y$Al$_2$O$_4$:Eu" (here, in these formulae, 0<x<1, 0<y<1, 0<x+y<1).

[1. Multinary Oxynitride Phosphor]

[1-1. Composition and Crystal Structure of Multinary Oxynitride Phosphor]

The present inventors investigate into ternary systems of BaO, Si$_3$N$_4$ and SiO$_2$ for the purpose of finding a new phosphor, and then obtained a substance showing a diffraction pattern that is not yet registered in PDF (Powder Diffraction File) and can be almost identified as a single phase (hereinafter, the crystal phase is referred to as BSON crystal phase).

The composition range of the multinary oxynitride phosphor of the present invention (hereinafter referred to as "phosphor of the present invention" as appropriate) is represented by the below general formula [I].

$$M1_xBa_yM2_zL_uO_vN_w \quad [I]$$

(In the general formula [I],

M1 represents at least one kind of an activation element selected from the group consisting of Cr, Mn, Fe, Ce, Pr, Nd, Sm, Eu, Tb, Dy, Ho, Er, Tm and Yb, M2 represents at least one kind of a divalent metal element selected from the group consisting of Sr, Ca, Mg and Zn, L represents a metal element selected from the metal elements belonging to the fourth group or the fourteenth group of the periodic table, and x, y, z, u, v and w are the numeric values in the following ranges:

$$0.00001 \leq x \leq 3$$

$$0 \leq y \leq 2.99999$$

$$2.6 \leq x+y+z \leq 3$$

$$0 < u \leq 11$$

$$6 < v \leq 25$$

$$0 < w \leq 17.)$$

In the above general formula [I], M1 is an activation element.

As above M1, following can be cited; at least one kind of a transition element or rare-earth element selected from the group consisting of Cr, Mn, Fe, Ce, Pr, Nd, Sm, Tb, Dy, Ho, Er, Tm and Yb, in addition to Eu. M1 can include any one kind of these elements singly or two or more kinds of them in any combination and in any ratio. Of these, as preferable elements, following can be cited; rare-earth elements of Ce, Sm, Tm and Yb, as well as Eu. Among them, it is preferable that M1 includes at least Eu or Ce, from the standpoint of luminescent quantum efficiency. It is more preferable that it contains at least Eu, from the standpoint of emission peak wavelength, and especially preferably, it contains only Eu.

The activation element, M1, is present as a state of divalent and/or trivalent cation in the phosphor of the present invention. At this point, it is preferable that the content of divalent cations is higher in the activation element M1. More concretely, when M1 is Eu, the content ratio of Eu$^{2+}$ to the whole amount of Eu is usually 20 mole percent or more, preferably 50 mole percent or more, more preferably 80 mole percent, and particularly preferably 90 mole percent or more.

The content of Eu$^{2+}$ to the whole amount of Eu contained in the phosphor of the present invention can be examined by a measurement for the X-ray absorption fine structure, for example. Namely, the content can be decided quantitatively from the areas of each-separated absorption peaks of Eu$^{2+}$ and Eu$^{3+}$, which can be obtained by a measurement for the L3-absorption edge of Eu atom. The content of Eu$^{2+}$ to the whole amount of Eu contained in the phosphor of the present invention can be decided also by a measurement of electron spin resonance (ESR).

In the above general formula [I], x is a numeric value in the range of 0.00001≤x≤3. Particularly, x is preferably 0.03 or larger, more preferably 0.06 or larger, and especially preferably 0.12 or larger. On the other hand, when the content ratio of activation element M1 is too large, concentration quenching may occur. Therefore, it is preferably 0.9 or less, more preferably 0.7 or less, and particularly preferably 0.45 or less.

In addition, Ba site of the phosphor of the present invention can be substituted with Sr, Ca, Mg and/or Zn, while maintaining a crystal structure of the BSON crystal phase. Therefore, in the above general formula [I], M2 represents at least one kind of a divalent metal element selected from the group consisting of Sr, Ca, Mg and Zn. At this point, M2 is preferably Sr, Ca and/or Zn, more preferably Sr and/or Ca, and further preferably Sr. Furthermore, a part of Ba and M2 can be substituted with their ions.

The above M2 can include any one kind of these elements singly or two or more kinds of them together in any combination and in any ratio.

When substituted with the above Ca ion, the content of Ca to the total amount of Ba and Ca is preferably 40 mole percent or less. When the Ca amount is larger than the above range, the luminous wavelength may be longer and the emission intensity may decrease.

When substituted with the above Sr ion, the content of Sr to the total amount of Ba and Sr is preferably 50 mole percent or less. When the Sr amount is larger than the above range, the luminous wavelength may be longer and the emission intensity may decrease.

When substituted with the above Zn ion, the content of Zn to the total amount of Ba and Zn is preferably 60 mole percent or less. When the Zn amount is larger than the above range, the luminous wavelength may be longer and the emission intensity may decrease.

Therefore, in the above general formula [I], the amount of Z can be decided in accordance with the kind of metal element M2 and the value of y. More concretely, in the above general formula [I], the above y is a numeric value in the range of $0 \leq y \leq 2.9999$. In addition, in the above general formula [I], x+y+z satisfies $2.6 \leq x+y+z \leq 3$.

In the phosphor of the present invention, Ba or M2 element may be deficient, as well as the oxygen or nitrogen. Therefore, in the above general formula [I], the value of x+y+z may be less than 3. The value of x+y+z can usually fall within the range of $2.6 \leq x+y+z \leq 3$, and ideally, x+y+z is equal to 3.

Further, it is preferable that the phosphor of the present invention contains Ba, from the standpoint of stability in its crystal structure. Therefore, in the above general formula [I], y is preferably larger than 0, more preferably 0.9 or larger, and particularly preferably 1.2 or larger. In addition, in view of the relationship to the content of activator element, it is preferably smaller than 2.99999, more preferably 2.99 or smaller, still more preferably 2.98 or smaller, and particularly preferably 2.95 or smaller.

In the above general formula [I], L represents a metal element selected from the metal elements belonging to the fourth group of the periodic table, such as Ti, Zr and HF, or the fourteenth group of the periodic table, such as Si and Ge. L can include any one kind of these metal elements singly or two or more kinds of them together in any combination and in any ratio. Of these, L is preferably Ti, Zr, Hf, Si or Ge, more preferably Si or Ge, and particularly preferably Si. At this point, in a part of the above L, a metal element that can be trivalent cation, such as B, Al and Ga, can be mixed insofar as the performance of the phosphor will not be affected adversely in electric charge balance of the phosphor crystal. The mixing amount is usually 10 atomic percent or smaller and preferably 5 atomic percent or smaller, to the amount of L.

Further, in the above general formula [I], u is a numeric value of usually 11 or smaller, preferably 9 or smaller, more preferably 7 or smaller, and larger than 0, preferably 3 or larger, more preferably 5 or larger.

The amount of O ion and N ion are represented by numeric values v and w, respectively, in the general formula [I]. Concretely, in the above general formula [I], v is a numeric value of usually larger than 6, preferably larger than 7, more preferably larger than 8, still more preferably larger than 9, particularly preferably larger than 11, and usually 25 or smaller, preferably smaller than 20, more preferably smaller than 15, still more preferably smaller than 13.

Furthermore, N is essential component in the phosphor of the present invention, which is an oxynitride. Therefore, in the above general formula [I], w is a numeric value of larger than 0. In addition, w is a numeric value of usually 17 or smaller, preferably smaller than 10, more preferably smaller than 4, and still more preferably smaller than 2.4.

Therefore, from the above standpoint, it is particularly preferable that u, v and w are $5 \leq u \leq 7$, $9 < v < 15$ and $0 < w < 4$, respectively, in the above general formula [I]. Thereby, the emission intensity can be enhanced.

Furthermore, in the phosphor of the present invention, it is preferable that the ratio of oxygen atoms to the metal elements such as (M1+Ba+M2) and L is larger than that of nitrogen atoms. The ratio of nitrogen atoms amount to the oxygen atoms amount (N/O) is 70 mole percent or smaller, preferably 50 mole percent or smaller, more preferably 30 mole percent or smaller, and still more preferably smaller than 20 mole percent. The lower limit thereof is usually larger than 0 mole percent, preferably 5 mole percent or larger, and more preferably 10 mole percent or larger.

The preferable examples of the composition of the phosphor of the present invention will be listed in the following, but the composition of the phosphor of the present invention is not limited to these examples.

As preferable examples of the phosphor of the present invention, following can be cited; $(Ca,Sr,Ba)_3(Si,Ge)_6O_{12}N_2$:(Eu,Ce,Mn), $(Ca,Sr,Ba)_3(Si,Ge)_6O_9N_4$:(Eu,Ce,Mn), $(Ca,Sr,Ba)_3(Si,Ge)_6O_3N_8$:(Eu,Ce,Mn), $(Ca,Sr,Ba)_3(Si,Ge)_7O_{12}N_{8/3}$:(Eu,Ce,Mn), $(Ca,Sr,Ba)_3(Si,Ge)_8O_{12}N_{14/3}$:(Eu,Ce,Mn), $(Ca,Sr,Ba)_3(Si,Ge)_8O_{12}N_6$:(Eu,Ce,Mn), $(Ca,Sr,Ba)_3(Sr,Ge)_{28/3}O_{12}N_{22/3}$:(Eu,Ce,Mn), $(Ca,Sr,Ba)_3(Si,Ge)_{29/3}O_{12}N_{26/3}$:(Eu,Ce,Mn), $(Ca,Sr,Ba)_3(Si,Ge)_{6.5}O_{13}N_2$:(Eu,Ce,Mn), $(Ca,Sr,Ba)_3(Si,Ge)_7O_{14}N_2$:(Eu,Ce,Mn), $(Ca,Sr,Ba)_3(Si,Ge)_8O_{16}N_2$:(Eu,Ce,Mn), $(Ca,Sr,Ba)_3(Si,Ge)_9O_{18}N_2$:(Eu,Ce,Mn), $(Ca,Sr,Ba)_3(Si,Ge)_{10}O_{20}N_2$:(Eu,Ce,Mn) and $(Ca,Sr,Ba)_3(Si,Ge)_{11}O_{22}N_2$:(Eu,Ce,Mn). As more preferable examples can be cited $Ba_3Si_6O_{12}N_2$:Eu, $Ba_3Si_6O_9N_4$:Eu, $Ba_3Si_6O_3N_8$:Eu, $Ba_3Si_7O_{12}N_{8/3}$:Eu, $Ba_3Si_8O_{12}N_{14/3}$:Eu, $Ba_3Si_8O_{12}N_6$:Eu, $Ba_3Si_{28/3}O_{12}N_{22/3}$:Eu, $Ba_3Si_{29/3}O_{12}N_{26/3}$:Eu, $Ba_3Si_{6.5}O_{13}N_2$:Eu, $Ba_3Si_7O_{14}N_2$:Eu, $Ba_3Si_8O_{16}N_2$:Eu, $Ba_3Si_9O_{18}N_2$:Eu, $Ba_3Si_{10}O_{20}N_2$:Eu, $Ba_3Si_{11}O_{22}N_2$:Eu, $Ba_3Si_6O_{12}N_2$:Eu,Mn, $Ba_3Si_6O_9N_4$:Eu,Mn, $Ba_3Si_6O_3N_8$:Eu,Mn, $Ba_3Si_7O_{12}N_{8/3}$:Eu,Mn, $Ba_3Si_8O_{12}N_{14/3}$:Eu,Mn, $Ba_3Si_8O_{12}N_6$:Eu,Mn, $Ba_3Si_{28/3}O_{12}N_{22/3}$:Eu,Mn, $Ba_3Si_{29/3}O_{12}N_{26/3}$:Eu,MN, $Ba_3Si_{6.5}O_{13}N_2$:Eu,Mn, $Ba_3Si_7O_{14}N_2$:Eu,Mn, $Ba_3Si_8O_{16}N_2$:Eu,Mn, $Ba_3Si_9O_{18}N_2$:Eu,Mn, $Ba_3Si_{10}O_{20}N_2$:Eu,Mn, $Ba_3Si_{11}O_{22}N_2$:Eu,Mn, $Ba_3Si_6O_{12}N_2$:Ce, $Ba_3Si_6O_9N_4$:Ce, $Ba_3Si_6O_3N_8$:Ce, $Ba_3Si_7O_{12}N_{8/3}$:Ce, $Ba_3Si_8O_{12}N_{14/3}$:Ce, $Ba_3Si_8O_{12}N_6$:Ce, $Ba_3Si_{28/3}O_{12}N_{22/3}$:Ce, $Ba_3Si_{29/3}O_{12}N_{26/3}$:Ce, $Ba_3Si_{6.5}O_{13}N_2$:Ce, $Ba_3Si_7O_{14}N_2$:Ce, $Ba_3Si_8O_{16}N_2$:Ce, $Ba_3Si_9O_{18}N_2$:Ce, $Ba_3Si_{11}O_{20}N_2$:Ce and $Ba_3Si_{11}O_{22}N_2$:Ce.

The present inventors have found that a phosphor having a specified crystal structure, in addition to the above-mentioned composition range, shows particularly high emission intensity.

Namely, it is preferable that the crystalline structure, which can be identified by such diffraction methods as X-ray diffraction and neutron diffraction, of the phosphor of the present invention has the trigonal unit cell (characteristic (4)). Thereby, the luminous wavelength is in a visible region, particularly in a green region.

The lattice constant thereof varies depending on the kind of composition elements of the crystal. However, the lattice constant of a is usually 7.2 angstrom or larger, preferably 7.26 angstrom or larger, more preferably 7.3 angstrom or larger, and usually 7.8 angstrom or smaller, more preferably 7.7 angstrom or smaller. The lattice constant of c is usually 5.8 angstrom or larger, preferably 6.0 angstrom or larger, more preferably 6.1 angstrom or larger, still more preferably 6.2 angstrom or larger, and usually 6.8 angstrom or smaller, more preferably 6.7 angstrom or smaller.

Further, it is preferable that the neighbor atomic distance of L-N chemical bond ($J_{(L-N)}$) and neighbor atomic distance of L-O chemical bond ($J_{(L-O)}$), calculated from the atomic coordinates, satisfy $J1_{(L-N)} \times (1-0.15) \leq J_{(L-N)} \leq J1_{(L-N)} \times (1+0.15)$ and $J1_{(L-O)} \times (1-0.15) \leq J_{(L-O)} \leq J1_{(L-O)} \times (1+0.15)$, respectively. In this context, $J1_{(L-N)}$ is equal to 1.7±0.3 angstrom and $J1_{(L-O)}$ is equal to 1.6±0.3 angstrom.

Furthermore, it is preferable that the space group thereof belongs to No. 143 (P3) or No. 147 (P3-) defined in "International Tables for Crystallography (Third, revised edition), Volume A SPACE-GROUP SYMMETRY".

The above-mentioned lattice constant can be decided by Rietveld analysis of the results of X-ray diffraction and neutron diffraction. The space group can be decided by electron beam diffraction.

The Rietveld analysis can be performed with reference to "Hunmatsu X-sen Kaiseki no Jissai: Rietveld method Nyumon" written and edited by Nakai Izumi and Izumi Hujio, published by Asakura Shoten (2002) using an analysis program RIETAN2000.

In such crystal structure, the activation element is substituted for the site of Ba and/or M2 in a state of solid solution. In addition, a part of N may exist in O site.

The determination of the crystal structure is generally made by crystal system, space group, such as described above, or the like. However, the crystal phase of the phosphor of the present invention is difficult in univocal structural definition because of a change in the crystal system or the space group induced by distortion of the crystal structure (subtle structural change) associated with a change in its composition. Then, the phosphor of the present invention is defined by the X-ray diffraction pattern required for specifying the crystal phase that contributes the light emission. Usually, in order to decide the identity of the two crystal structures of two compounds by their X-ray diffraction patterns, it is enough to examine their agreement in angles (2θ) of about 6 diffraction peaks including the highest diffraction peak of its crystal structure. However, the diffraction peak angles of compounds having different constituent element ratios, like compounds of the present invention, will shift, even though the crystal structures thereof are the same. In that case, the specific diffraction peak angles can not be defined as numerical values. Then, the present inventors have given attention to an interplanar spacing of the diffraction peak calculated using the Bragg equation, and have specified the angle range of the diffraction peak by the following indication method.

Bragg Equation $$d = \lambda / \{2 \times \sin(\theta)\} \quad \text{(formula 1)}$$

$$\theta = \arcsin \{\lambda/(2 \times d)\} \quad \text{(formula 2)}$$

In this context, the formula 2 is given by a deformation of the formula 1. In the formulae 1 and 2, d, θ and λ indicate the followings, respectively.

d: interplanar spacing (Å)
θ: Bragg angle (°)
λ: X-ray wavelength of CuKα=1.54184 Å

When the interplanar spacing range of the reference diffraction peak (P0) is defined as 3.31 Å to 3.16 Å, the diffraction angle (2θ) falls within the range of 26.9° to 28.2°, from the formula 2. The interplanar spacing (d0) of the reference diffraction peak can be obtained, from the angle (θ0) of the reference diffraction peak (P0) observed, by the following formula 3 in accordance with the formula 1.

$$d0 = \lambda / \{2 \times \sin(\theta 0)\} \quad \text{(formula 3)}$$

Five diffraction peaks (other than the diffraction peaks existing in the angle range of from 20.9° to 22.9°) exclusive of the reference diffraction peak (P0) are shown by P1, P2, P3, P4 and P5, respectively, in increasing order of angle, and the diffraction angle ranges, in which these diffraction peaks appear, are shown by R1, R2, R3, R4 and R5, respectively. At this point, the angle range R1 in which P1 appears is determined as follows. Namely, when the interplanar spacing of the diffraction plane is defined to be 1.994 times the interplanar spacing (d0) originating from the reference diffraction peak and the deviation of the interplanar spacing accompanying distortion of the structure is defined to be 1.5%, the starting angle (R1s) and ending angle (R1e) of the angle range R1 can be derived from formula 1 as follows.

$$R1s: 2 \times \arcsin \{\lambda/(2 \times d0 \times 1.994 \times 1.015)\}$$

$$R1e: 2 \times \arcsin \{\lambda/(2 \times d0 \times 1.994 \times 0.985)\}$$

Substitution of the formula 3 in each of the above formulae results in the following formulae.

$$R1s: 2 \times \arcsin \{\sin(\theta 0)/(1.994 \times 1.015)\}$$

$$R1e: 2 \times \arcsin \{\sin(\theta 0)/(1.994 \times 0.985)\}$$

In the same way, the angle ranges in which P2, P3, P4 and P5 appear are determined as follows. Namely, when the respective interplanar spacings of the diffraction planes are defined to be 1.412, 1.155, 0.894 and 0.756 times the interplanar spacing originating from the reference diffraction peak and the deviations of the interplanar spacings accompanying distortions of the structure are defined to be 1.5% uniformly, the angle ranges will be as follows.

$$R2s: 2 \times \arcsin \{\sin(\theta 0)/(1.412 \times 1.015)\}$$

$$R2e: 2 \times \arcsin \{\sin(\theta 0)/(1.412 \times 0.985)\}$$

$$R3s: 2 \times \arcsin \{\sin(\theta 0)/(1.155 \times 1.015)\}$$

$$R3e: 2 \times \arcsin \{\sin(\theta 0)/(1.155 \times 0.985)\}$$

$$R4s: 2 \times \arcsin \{\sin(\theta 0)/(0.894 \times 1.015)\}$$

$$R4e: 2 \times \arcsin \{\sin(\theta 0)/(0.894 \times 0.985)\}$$

$$R5s: 2 \times \arcsin \{\sin(\theta 0)/(0.756 \times 1.015)\}$$

$$R5e: 2 \times \arcsin \{\sin(\theta 0)/(0.756 \times 0.985)\}$$

The existence of the specified crystal structure (crystal phase: BSON crystal phase) of the present invention can be confirmed by verifying that, with respect to the X-ray diffraction measurement results obtained, each of the peaks, P0 (reference peak) to P5, appears in the above-mentioned angle ranges.

It is preferable that the multinary oxynitride phosphor of the present invention is a new multinary oxynitride phosphor including a crystal structure having the BSON crystal phase. Namely, it is preferable that the multinary oxynitride phosphor of the present invention is a multinary oxynitride phosphor including BSON crystal phase defined as follows.

BSON Crystal Phase

A crystal phase of which diffraction peak is observed within the range (R0) of the diffraction angle (2θ) of from 26.9° to 28.2°, in X-ray diffraction measurement using a CuKα as an X-ray source, wherein, when that diffraction peak (P0) is taken as the reference diffraction peak, with 5 diffraction peaks (other than the diffraction peaks existing in the angle range of from 20.9° to 22.9°) derived from the Bragg angle (θ0) of P0 shown by P1, P2, P3, P4 and P5 respectively in increasing order of angle and with diffraction angle ranges of these diffraction peaks shown by R1, R2, R3, R4 and R5, R1, R2, R3, R4 and R5 indicate the following angle ranges respectively:

$R1 = R1s \sim R1e,$ $R2 = R2s \sim R2e,$ $R3 = R3s \sim R3e,$ $R4 = R4s \sim R4e,$ $R5 = R5s \sim R5e,$ At least one diffraction peak exists in all the ranges of R1, R2, R3, R4 and R5, and, P0 has an intensity of 20% or stronger in diffraction peak height ratio to the highest diffraction peak height among those of P0, P1, P2, P3, P4 and P5, and at least one of P1, P2, P3, P4 and P5 has a peak intensity of 5% or stronger, preferably 9% or stronger in the diffraction peak height ratio.

In this context, when two or more diffraction peaks exist in each angle range of R0, R1, R2, R3, R4 or R5, the peak having the highest peak intensity of them is taken as P0, P1, P2, P3, P4 or P5, and R1s, R2s, R3s, R4s and R5s, indicating the starting angles of R1, R2, R3, R4 and R5 respectively and R1e, R2e, R3e, R4e and R5e, indicating the ending angles of R1, R2, R3, R4 and R5 respectively, are the following angles:

$R1s: 2 \times \arcsin\{\sin(\theta 0)/(1.994 \times 1.015)\}$ $R1e: 2 \times \arcsin\{\sin(\theta 0)/(1.994 \times 0.985)\}$ $R2s: 2 \times \arcsin\{\sin(\theta 0)/(1.412 \times 1.015)\}$ $R2e: 2 \times \arcsin\{\sin(\theta 0)/(1.412 \times 0.985)\}$ $R3s: 2 \times \arcsin\{\sin(\theta 0)/(1.155 \times 1.015)\}$ $R3e: 2 \times \arcsin\{\sin(\theta 0)/(1.155 \times 0.985)\}$ $R4s: 2 \times \arcsin\{\sin(\theta 0)/(0.894 \times 1.015)\}$ $R4e: 2 \times \arcsin\{\sin(\theta 0)/(0.894 \times 0.985)\}$ $R5s: 2 \times \arcsin\{\sin(\theta 0)/(0.756 \times 1.015)\}$ $R5e: 2 \times \arcsin\{\sin(\theta 0)/(0.756 \times 0.985)\}$ The phosphor of the present invention may contain an impurity phase such as cristobalite, which is a crystalline form of silicon dioxide, α-silicon nitride and β-silicon nitride, in the X-ray diffraction measurement using a CuKα as an X-ray source. The content of these impurities can be examined by the X-ray diffraction measurement using a CuKα as an X-ray source. Namely, it is preferable that the strongest peak intensity of the impurity phase, among the measurement results of the X-ray diffraction, is usually 40% or weaker, preferably 30% or weaker, more preferably 20% or weaker, still more preferably 10% or weaker, to the strongest peak intensity of the P0, P1, P2, P3, P4 and P5. Particularly, it is preferable that the peak of the impurity phase is not be observed and the BSON crystal phase is present as single phase. Thereby, the emission intensity can be enhanced.

[1-2. Characteristics of Multinary Oxynitride Phosphor]

It is preferable that the phosphor of the present invention further have the following characteristics, in addition to the above-mentioned characteristics.

[1-2-1. Emission Spectrum Characteristics]

It is preferable that the phosphor of the present invention has the following emission spectrum characteristics when measured with excitation light of 400-nm wavelength, in consideration of its application as a green phosphor.

First, it is preferable that the phosphor of the present invention has the peak wavelength $\lambda_p$ (nm) of the above emission spectrum in the range of usually longer than 500 nm, particularly 510 nm or longer, further particularly 515 nm or longer, and usually 550 nm or shorter, particularly 540 nm or shorter, further particularly 535 nm or shorter. When the emission peak wavelength $\lambda_p$ is too short, the color tends to be bluish green. On the other hand, when it is too long, the color tends to be yellowish green. In both the cases, the performance as green emission may deteriorate.

In addition, it is preferable that the phosphor of the present invention has a full width at half maximum (hereinafter abbreviated as "FWHM" as appropriate) of the emission peak, in the above emission spectrum, in the range of usually wider than 40 nm, particularly 50 nm or wider, further particularly 60 nm or wider, and usually narrower than 90 nm, particularly 80 or narrower, further particularly 75 nm or narrower. When the full width at half maximum, FWHM, is too narrow, the emission brightness will decrease in the use as a illuminating device, leading to too low color rendering. When it is too wide, the color purity will decrease in the use as a image display such as a liquid crystal display, leading to too narrow color reproduction range of the image display.

For excitation of the phosphor of the present invention with 400 nm wavelength light, a GaN-based LED can be used, for example. The measurement of emission spectrum of the phosphor of the present invention and the calculation of its emission peak wavelength, relative peak intensity and full width at half maximum of the peak can be carried out by using a fluorescence measurement apparatus (manufactured by JASCO corporation) equipped with a 150-W xenon lamp as excitation light source and a multichannel CCD detector C7041 (manufactured by Hamamatsu Photonics K.K.) as spectrum measurement apparatus, for example.

[1-2-2. Temperature Characteristics]

Furthermore, the phosphor of the present invention also excels in temperature characteristics. More specifically, when irradiated with light having wavelength of 455 nm, the ratio of the peak intensity value of the emission at 150° C. in the emission spectrum, to the peak intensity value of the emission at 20° C. in the emission spectrum, is usually 55% or more, preferably 60% or more, and particularly preferably 70% or more (characteristic (1)).

Furthermore, though it is very rare that this ratio of a usual phosphor exceeds 100% because its emission intensity decreases with increasing temperature, it can exceed 100% for some reason. Getting over 150% of that ratio, it tends to lead color shift due to the temperature change.

The phosphor of the present invention is superior not only in the above-mentioned emission peak but also in brightness. More specifically, when irradiated with light having wavelength of 455 nm, the ratio of the brightness at 150° C. to the brightness at 20° C. is usually 55% or more, preferably 60% or more, and particularly preferably 70% or more.

The above-mentioned temperature characteristics can be examined as follows, for example, using an emission spectrum device of multi-channel spectrum analyzer, MCPD7000, manufactured by Otsuka Electronics Co., Ltd., a brightness measurement device of luminance calorimeter, BM5A, a stage equipped with a cooling system using a peltiert device and a heating system using a heater, and a light source device equipped with a 150-W xenon lamp. A cell holding the phosphor sample is put on the stage, and the temperature is changed within the range of from 20° C. to 150° C. After verifying the surface temperature of the phosphor is held constant at 20° C. or 150° C., the emission spectrum of the phosphor is measured when it is excited with a light having wavelength of 455 nm, which is separated from the light source using a diffraction grating. Then, the emission peak intensity can be decided from the measured emission spectrum. At this point, as the measurement value of the surface temperature of the phosphor irradiated with the excitation light, is used a value corrected by temperature values measured with a radiation thermometer and a thermocouple.

[1-2-3. Excitation Wavelength]

It is preferable that the phosphor of the present invention can be excited by a light with wavelength ranging from 200 nm to 500 nm. Furthermore, when it is used for a light emitting device in which a semiconductor element is used as the first luminous body and the light thereof is used as the excitation light source for the phosphor, it is preferable that, for example, it can be excited by a light of blue region (wavelength range: from 420 nm to 500 nm) and/or a light of near-ultraviolet region (wavelength range: 300 nm to 420 nm).

In addition, it is preferable that the ratio of the peak intensity value of the emission when irradiated with light having wavelength of 410 nm in the emission spectrum, to the peak intensity value of the emission when irradiated with light having wavelength of 390 nm in the emission spectrum, is 90% or more (characteristic (2)). The emission spectrum can be measured, in the same way as described above, by exciting the phosphor with a light having wavelength of 390 nm or 410 nm, which is derived from a light source using a diffraction grating. Then the emission peak intensity can be obtained from the measured emission spectrum.

[1-2-4. Luminescent Color]

In addition, the chromaticity coordinate of the luminescent color of the phosphor of the present invention, according to JIS Z8701, usually satisfies x is a numeric value of usually 0.3 or smaller, preferably 0.29 or smaller, and y is a numeric value of usually 0.5 or larger, preferably 0.55 or larger, more preferably 0.6 or larger (characteristic (3)).

[1-2-5. Solubility]

It is preferable that the phosphor of the present invention is insoluble in water and/or 1-N hydrochloric acid.

[1-2-6. Durability]

The phosphor of the present invention is not degraded in a durability test under such condition as 2-hr heating under nitrogen atmosphere, even at usually 1000° C. or higher, preferably 1200° C. or higher, more preferably 1500° C. or higher, and particularly preferably 1700° C. or higher.

Furthermore, the phosphor of the present invention is stable in a durability test at a temperature of 85° C. and relative humidity of 85% usually for over 200 hr, preferably for over 500 hr, more preferably for over 600 hr, and particularly preferably for over 800 hr. In such a case, the longer the time for which it is stable, the more preferable. However, it is usually fully sufficient for it to be stable for as long as 1000 hr. In this context, the word "stable" means that the ratio of the emission intensity after the durability test to that before the durability test is 50% or larger. Such durability can be measured by energization with current of 20 mA at a temperature of 85° C. and relative humidity of 85%, using an LED aging system manufactured by Yamakatsu Electronics Industry Co., Ltd. However, it can be measured using other similar equipment.

[1-2-7. Weight Median Diameter]

It is preferable that the weight median diameter of the phosphor of the present invention is in the range of usually 0.01 μm or larger, preferably 1 μm or larger, more preferably 5 μm or larger, still more preferably 10 μm or larger, and usually 100 μm or smaller, preferably 30 μm or smaller, more preferably 20 μm or smaller. When the weight median diameter is too small, the brightness will decrease and the phosphor particles tend to aggregate. On the other hand, the weight median diameter is too large, unevenness in coating, clogging in a dispenser, or the like may occur. The weight median diameter of the phosphor of the present invention can be measured using a laser diffraction/scattering particle size distribution analyzer, for example.

[1-2-8. Internal Quantum Efficiency or the Like]

The higher its internal quantum efficiency is, the more preferable the phosphor of the present invention. It is usually 0.5 or higher, preferably 0.6 or higher, more preferably 0.7 or higher. In this context, internal quantum efficiency means the ratio of the number of emitted photons to the number of photons in the excitation light that is absorbed into the phosphor. When the internal quantum efficiency is low, the emission efficiency tends to decrease.

Also, the higher its absorption efficiency is, the more preferable the phosphor of the present invention. The value thereof is usually 0.5 or higher, preferably 0.6 or higher, and more preferably 0.7 or higher. When the absorption efficiency is low, the emission efficiency tends to decrease.

The external quantum efficiency is usually 0.2 or higher, preferably 0.3 or higher, more preferably 0.4 or higher, and particularly preferably 0.5 or higher. When the external quantum efficiency is low, it may be difficult to design a light emitting device having high emission intensity.

(Method for Measuring Absorption Efficiency, Internal Quantum Efficiency and External Quantum Efficiency)

In the following, methods for determining the absorption efficiency $\alpha q$, internal quantum efficiency $\eta i$ and external quantum efficiency $\eta o$ of a phosphor will be described.

First, the phosphor sample to be measured (for example in a state of powder or the like) is stuffed up in a cell with its surface smoothed sufficiently to keep high measurement accuracy, and then it is set on a condenser such as an integrating sphere. The reason for using a condenser such as an integrating sphere is to count up all the photons both reflected at and emitted, by a fluorescence phenomenon, from the phosphor sample. In other words, it is to prevent the failure in counting photons going out of the measurement system.

A light emission source for exciting the phosphor is attached on the condenser such as an integrating sphere. This light emission source, an Xe lamp for example, is adjusted using a filter, monochromator (grating monochromator) or the like so that the emission peak wavelength thereof will be that of a monochromatic light of for example, 405 nm or 455 nm. Then the spectrum including those of emitted light (fluorescence) and reflected light is measured, using a spectrometer, such as MCPD2000 or MCPD7000 manufactured by Otsuka Electronics Co., Ltd., for example, by irradiating the phosphor sample to be measured with the light from the light emission source, of which emission peak wavelength is adjusted. The light, of which spectrum is measured here, actually includes, among lights from the excitation light source (hereinafter simply referred to as "excitation lights"), reflected lights that are not absorbed in the phosphor and emitted lights (fluorescences) having the other wavelengths, emitted by a fluorescence phenomenon from the phosphor which absorbed the excitation light. Namely, the region close to the excitation light corresponds to the reflection spectrum, and the region of which wavelengths are longer than that corresponds to the fluorescence spectrum (occasionally referred to as "emission spectrum").

Absorption efficiency $\alpha q$ takes the value of $N_{abs}/N$, wherein $N_{abs}$ is the number of photons of the excitation light that is absorbed in the phosphor sample and N is the number of all the photons in the excitation light.

First, the latter one, the total number N of all the photons in the excitation light is determined as follows. That is, the reflection spectrum $I_{ref}(\lambda)$ is measured using the spectrometer with respect to a substance to be measured, having reflectance R of approx. 100% to the excitation light, such as a reflection plate "Spectralon" manufactured by Labsphere (with 98% of reflectance to an excitation light of 450 nm wavelength), which is attached to the above condenser such as an integrating sphere in the same disposition as the phosphor sample. The value in the following (formula 4), calculated from this reflection spectrum $I_{ref}(\lambda)$, is proportional to N.

[Mathematical Formula 1]

$$\frac{1}{R}\int \lambda \cdot I_{ref}(\lambda) d\lambda \quad \text{(Formula 4)}$$

In this formula, the integration may be performed at only such intervals that $I_{ref}(\lambda)$ takes a substantially significant value.

The number $N_{abs}$ of the photons in the excitation light, which is absorbed in the phosphor sample is proportional to the amount calculated in the following (formula 5).

[Mathematical Formula 2]

$$\frac{1}{R}\int \lambda \cdot I_{ref}(\lambda) d\lambda - \int \lambda \cdot I(\lambda) d\lambda \quad \text{(Formula 5)}$$

Here, the function $I(\lambda)$ is a reflection spectrum when the target phosphor sample, of which absorption efficiency $\alpha q$ is intended to be determined, is attached. The integration interval in (formula 5) is set to be the same as in (formula 4). By restricting the integration interval as above, the second term in (formula 5) comes to correspond to the number of photons emitted from the measurement object, phosphor sample, by the reflection of the excitation light. In other words, it comes to correspond to the number of all photons emitted from the measurement object, phosphor sample, except for the number of photons emitted by a fluorescence phenomenon. Because the actual measurement value of the spectrum is generally obtained as digital data which are divided by a certain finite band width which is related to $\lambda$, the integrations of (formula 4) and (formula 5) are calculated as finite sum, based on the band width.

Consequently, $\alpha q$ can be calculated as $\alpha q = N_{abs}/N = $(formula 5)/(formula 4).

Next, a method for determining internal quantum efficiency $\eta i$ will be described. The internal quantum efficiency $\eta i$ takes the value of $N_{PL}/N_{abs}$, wherein $N_{PL}$ is the number of photons originating from the fluorescence phenomenon and $N_{abs}$ is the number of photons absorbed in the phosphor sample.

Here, $N_{PL}$ is proportional to the amount calculated by the following (formula 6).

[Mathematical Formula 3]

$$\int \lambda \cdot I(\lambda) d\lambda \quad \text{(Formula 6)}$$

At this point, the integration interval is restricted to the wavelength region of photons that are originating from the fluorescence phenomenon of the phosphor sample. This is because contribution of the photons reflected from the phosphor sample can be eliminated from $I(\lambda)$. More specifically, the lower limit of the integration interval in (formula 6) takes the value of upper limit of the integration interval in (formula 4), and the upper limit thereof takes the value that is necessary and sufficient for including the photons originating from the fluorescence.

Consequently, internal quantum efficiency $\eta i$ can be calculated as $\eta i = $(formula 6)/(formula 5).

Incidentally, the integration from spectra expressed by digital data can be performed in the same way as when absorption efficiency $\alpha q$ is calculated.

The external quantum efficiency $\eta o$ can be decided as a product of the absorption efficiency $\alpha q$ and internal quantum efficiency $\eta i$, which are obtained as above. In another way, it can be determined using a relation of $\eta o = $(formula 6)/(formula 4). The value $\eta o$ is equal to $N_{PL}/N$, wherein $N_{PL}$ is the number of photons originating from the fluorescence and N is the number of total photons in the excitation light.

[1-3. Production Method of Multinary Oxynitride Phosphor]

Materials, production method and the like, for obtaining the phosphor of the present invention, are as follows.

The production method of the phosphor of the present invention is not limited specially. For example, they can be produced by the following processes, mixing (mixing step) material for the activation element of element M1 (hereinafter referred to as "M1 source" as appropriate), material for Ba (hereinafter referred to as "Ba source" as appropriate), material for metal element M2 (hereinafter referred to as "M2 source" as appropriate) and material for L (hereinafter referred to as "L source" as appropriate), in the above-mentioned general formula (I), and firing the obtained mixture (firing step).

[1-3-1. Material Used to Produce Phosphor]

As materials used to produce the phosphor of the present invention (namely, sources of M1, Ba, M2 and L), following can be cited; metal, alloy, imide compound, oxynitride, nitride, oxide, hydroxide, carbonate, nitrate, sulfate, oxalate, carboxylate and halide of each element of M1, Ba, M2 and L. Of these compounds, preferable ones are to be selected in consideration of reactivity into multinary oxynitride and the reduction of the amount of $NO_x$, $SO_x$ or the like generated by firing.

Of the M1 sources mentioned above, as concrete examples of Eu source, following can be cited, $Eu_2O_3$, $Eu_2(SO_4)_3$, $Eu_2(C_2O_4)_3.10H_2O$, $EuCl_2$, $EuCl_3$, $Eu(NO_3)_3.6H_2O$, $EuN$ and $EuNH$. Of these, preferable are $Eu_2O_3$ and $EuCl_2$. $Eu_2O_3$ is particularly preferable.

As concrete examples of the sources of Sm, Tm, Yb and other activator elements, following can be cited; those compounds cited as the concrete examples of the Eu source in which Eu is replaced by Sm, Tm, Yb, etc.

As concrete examples of Ba source mentioned above, following can be cited; $BaO$, $Ba(OH)_2.8H_2O$, $BaCO_3$, $Ba(NO_3)_2$, $BaSO_4$, $Ba(C_2O_4)$, $Ba(OCOCH_3)_2$, $BaCl_2$, $Ba_3N_2$ and $BaNH$. Of these, a carbonate, oxide or the like can be preferably used. As the oxide reacts easily with atmospheric water, the carbonate is more preferable from the standpoint of easy handling. Among them, $BaCO_3$ is preferable, because it is stable in air, easily decomposed by heat leaving no undesirable elements, and its highly purified material is easily available. When carbonate is used as the material, it is preferable to calcine the carbonate preliminarily before used as material.

Of the M2 sources mentioned above, as concrete examples of Sr source, following can be cited; $SrO$, $Sr(OH)_2.8H_2O$, $SrCO_3$, $Sr(NO_3)_2$, $SrSO_4$, $Sr(C_2O_4).H_2O$, $Sr(OCOCH_3)_2.0.5H_2O$, $SrCl_2$, $Sr_3N_2$ and $SrNH$. Of these, preferable is $SrCO_3$, because it is stable in air, easily decomposed by heat, leaves no undesirable elements after firing, and its highly purified material is easily available.

As concrete examples of the source of Mg, following can be cited; $MgO$, $Mg(OH)_2$, basic magnesium carbonate ($mMgCO_3.Mg(OH)_2.nH_2O$), $Mg(NO_3)_2.6H_2O$, $MgSO_4$, $Mg(C_2O_4).2H_2O$, $Mg(OCOCH_3)_2.4H_2O$, $MgCl_2$, $Mg_3N_2$ and $MgNH$. Of these, preferable are $MgO$ and basic magnesium carbonate.

As concrete examples of Ca source, following can be cited; $CaO$, $Ca(OH)_2$, $CaCO_3$, $Ca(NO_3)_2.4H_2O$, $CaSO_4.2H_2O$, $Ca(C_2O_4).H_2O$, $Ca(OCOCH_3)_2.H_2O$, $CaCl_2$, $Ca_3N_2$ and $CaNH$. Of these, preferable are $CaCO_3$ and $CaCl_2$.

As concrete examples of Zn source, following can be cited; zinc compounds (including hydrate) such as $ZnO$, $ZnF_2$, $ZnCl_2$, $Zn(OH)_2$, $Zn_3N_2$ and $ZnNH$. Of these, preferable are $ZnF_2.4H_2O$ (and its anhydrate) or the like, from the standpoint of high efficiency of promoting particle growth.

When carbonate is used as the material of M2, it is preferable to calcine the carbonate preliminarily before used as material.

Of the above-mentioned L sources, it is preferable to use $SiO_2$ or $Si_3N_4$ as Si source compound. It is also possible to use a compound which can be converted to $SiO_2$. Concrete examples of such compound are $SiO_2$, $H_4SiO_4$ and $Si(OCOCH_3)_4$. Regarding $Si_3N_4$, preferable from reactivity is a form of small particle size and preferable from emission efficiency is a high purity form. Furthermore, from the standpoint of emission efficiency, $\beta$-$Si_3N_4$ is more preferable than $\alpha$-$Si_3N_4$. Also preferable is a form with low content of carbon which is an impurity. The lower the carbon content is, the more preferable. However, the carbon content is usually 0.01 weight % or more, and usually 0.3 weight % or less, preferably 0.1 weight % or less, more preferably 0.05 weight % or less.

It is preferable to use $GeO_2$ or $Ge_3N_4$ as Ge source compound. It is also possible to use a compound which can be converted to $GeO_2$. Concrete examples of such compound are $GeO_2$, $Ge(OH)_4$, $Ge(OCOCH_3)_4$ and $GeCl_4$.

As other concrete examples of the L source, following can be cited; those compounds cited above as the concrete examples of Si source and Ge source in which Si or Ge is replaced by Ti, Zr, Hf etc.

Of the above various materials of the phosphor, it is preferable to use a material of high purity with a high degree of whiteness in order to heighten emission efficiency of the resultant phosphor. Concretely, it is preferable to use a material whose reflectance in the wavelength region of 380 nm to 780 nm is 60% or higher, preferably 70% or higher, more preferably 80% or higher. In particular, at 525 nm, which is close to the emission peak wavelength of the phosphor of the present invention, reflectance of the phosphor material is preferably 60% or higher, more preferably 70% or higher, still more preferably 80% or higher, particularly preferably 90% or higher.

Of various materials of the phosphor, $Si_3N_4$ in particular is preferably of high reflectance. In order to achieve high reflectance, it is preferable that the content of carbon in $Si_3N_4$ as an impurity is usually 0.2 weight % or lower, preferably 0.1 weight % or lower, more preferably 0.05 weight % or lower, still more preferably 0.03 weight % or lower. The lower the content of impurity carbon is, the more preferable. It is usually 0.001 weight % or higher.

The reflectance can be determined by measuring reflectance spectrum. The method of measurement is the same as what is described for the previously-mentioned absorption efficiency, internal quantum efficiency and external quantum efficiency.

The above-mentioned sources of M1, Ba, M2 and L can be used either as a single one or as a combination of two or more kinds in any combination and in any ratio.

[1-3-2. Production Method of Phosphors: Mixing Step]

Materials of phosphors are weighed out so as to give desired composition, mixed well using a ball mill for example, transferred to a crucible, and fired at a predetermined temperature in a predetermined atmosphere. The phosphor of the present invention can be obtained by pulverizing and washing the fired product.

No particular limitation is imposed on the method of the above mixing. Concretely, methods (A) and (B) described below can be used.

(A) Dry-type mixing method in which the above-mentioned phosphor material is pulverized and mixed by combining pulverization, which is done by means of a dry-type pulverizer such as a hammer mill, roll mill, ball mill and jet mill, or pestle/mortar, and complex mixing, which is done by means of a mixing apparatus such as ribbon blender, V type blender and Henschel mixer, or pestle/mortar.

(B) Solvent or dispersion medium such as water is added to the above-mentioned phosphor material, and mixing is done by means of a pulverizer, pestle /mortar or evaporation dish/stirring rod, to make a solution or slurry. This is followed by drying by such method as spray dry, heating dry or air dry in this wet-type mixing method.

The mixing of the phosphor material can be done either by the dry-type method or by the wet-type method mentioned above. Preferable is a wet-type method using water or ethanol.

[1-3-3. Production Method of Phosphors: Firing Step]

The mixture obtained is filled into a heat-resistant vessel such as a crucible or tray which is made of material unlikely to react with each phosphor material. As material examples of such heat-resistant vessel used at firing, following can be cited; alumina, quartz, boron nitride, silicon nitride, silicon carbide, magnesium, ceramics such as mullite, metal such as platinum, molybdenum, tungsten, tantalum, niobium, iridium and rhodium, alloys mainly constituted of these metals and carbon (graphite). Of these, a heat-resistant vessel made of quartz can be used for heat treatment at relatively low temperatures such as 1200° C. or lower, and the preferable temperature range of its use is 1000° C. or lower.

As preferable examples of these heat-resistant vessels, following can be cited those made of boron nitride, alumina, silicon nitride, silicon carbide, platinum, molybdenum, tungsten and tantalum.

In the firing step, at temperatures of over 1600° C., sintering of fired powder may usually occur, resulting in lowering of the emission intensity. At firing temperatures of around 1400° C., powder of good crystallinity can be obtained. Therefore, in order to produce the phosphor of the present invention, the firing temperature is usually 1000° C. or higher, preferably 1100° C. or higher, more preferably 1200° C. or higher, and usually 1600° C. or lower, preferably 1500° C. or lower, more preferably 1450° C. or lower.

No particular limitation is imposed on the atmosphere of firing. Usually, the firing is performed in an atmosphere of inert gas or in a reducing atmosphere. As mentioned before, it is preferred that the valency of the activation element is mostly divalent. Therefore, reducing atmosphere is preferable. The inert gas and reducing gas can be used either as a single one or as a combination of two or more kinds in any combination and in any ratio.

As examples of inert gas and reducing gas, following can be cited carbon monoxide, hydrogen, nitrogen and argon. Of these, preferable is a nitrogen gas atmosphere, and more preferable is a nitrogen gas atmosphere containing hydrogen gas. As the above nitrogen gas, it is preferable that its purity is 99.9% or higher. When nitrogen containing hydrogen is used, it is preferable that oxygen concentration in an electric furnace is kept at 20 ppm or lower. Further, it is preferable that hydrogen content in the atmosphere is 1 volume % or higher, more preferably 2 volume % or higher, and preferably 5 volume % or lower. This is because, when the content of hydrogen in the atmosphere is too high, safety may not be guaranteed. When it is too low, sufficient reducing atmosphere may not be secured.

Firing time depends on the temperature or pressure at firing. Usually, it is 0.5 hr or longer, and preferably 1 hr or longer. Longer firing time is preferable, but it is usually 100 hr or shorter, preferably 50 hr or shorter, more preferably 24 hr or shorter, and still more preferably 12 hr or shorter.

Pressure at the time of firing differs depending on such factors as firing temperature and is not limited specially. Usually, it is $1\times10^{-5}$ Pa or higher, preferably $1\times10^{-3}$ Pa or higher, more preferably 0.01 Mpa or higher, still more preferably 0.1 MPa or higher. The upper limit is usually 5 GPa or lower, preferably 1 GPa or lower, more preferably 200 MPa or lower, and still more preferably 100 MPa or lower. Industrially, from atmospheric pressure to 1 MPa is convenient and preferable from the standpoint of cost and convenience.

[1-3-4. Flux]

In the firing step, flux may be added to the reaction system in order to secure growth of good quality crystals. No particular limitation is imposed on the kind of flux. The examples include: ammonium halide such as $NH_4Cl$ and $NH_4F.HF$; alkali metal carbonate such as $NaCO_3$ and $LiCO_3$; alkali metal halide such as LiCl, NaCl, KCl, CsCl, LiF, NaF, KF and CsF; alkaline earth metal halide such as $CaCl_2$, $BaCl_2$, $SrCl_2$, $CaF_2$, $BaF_2$ and $SrF_2$; alkaline earth metal oxide such as CaO, SrO and BaO; boron oxide, boric acid and boric acid salt such as $B_2O_3$, $H_3BO_3$ and $NaB_4O_7$; phosphate such as $Li_3PO_4$ and $NH_4H_2PO_4$; aluminum halide such as $AlF_3$; zinc compound such as zinc halide like $ZnCl_2$ and $ZnF_2$, zinc oxide and zinc sulfate; compound of the 15th group element of the periodic table such as $Bi_2O_3$; and nitride of alkali metal, alkaline earth metal or the 13th group element such as $Li_3N$, $Ca_3N_2$, $Sr_3N_2$, $Ba_3N_2$ and BN. Of these, preferable are halides. Particularly preferable are alkali metal halide, alkaline earth metal halide and Zn halide. Of these halides, fluorides and chlorides are preferable.

The amount of flux used differs depending on the kind of the material, or compound used as flux. It is preferably in the range of usually 0.01 weight % or more, preferably 0.1 weight % or more, more preferably 1 weight % or more, and usually 20 weight % or less, preferably 10 weight % or less. When the amount of the flux is too small, the effect of flux may not be exhibited. When the amount is too large, the effect of flux may be saturated, or it is taken up into host crystals resulting in the change in luminescent color and decrease in brightness. These fluxes can be used either as a single one or as a mixture of two or more kinds in any combination and in any ratio.

[1-3-5. Primary Firing and Secondary Firing]

The firing step may be separated into primary firing and secondary firing. The mixture of material obtained in the mixing step may be subjected to primary firing, and after pulverization using a ball mill for example, subjected to secondary firing.

There is no special limitation on the temperature of primary firing, insofar as the advantage of the present invention is not significantly impaired. However, it is usually 800° C. or higher, preferably 1000° C. or higher, and usually 1600° C. or lower, preferably 1400° C. or lower, more preferably 1300° C. or lower.

In order to obtain phosphors of uniform particle size, it is desirable to set the primary firing temperature low and allow the reaction to proceed in the solid phase as powder. On the other hand, in order to obtain phosphors of high brightness, it is desirable to set the primary firing temperature high and allow the reaction to proceed in the molten state for sufficient mixing and reaction, followed by secondary firing for crystal growth.

There is no special limitation on the length of time of primary firing, insofar as the advantage of the present invention is not significantly impaired. However, it is usually 1 hr or longer, preferably 2 hr or longer, and usually 100 hr or shorter, preferably 50 hr or shorter, more preferably 24 hr or shorter, still more preferably 12 hr or shorter.

The conditions such as temperature or length of time of the secondary firing are basically the same as described earlier for the firing step.

Flux may be added either before the primary firing or before the secondary firing. Different firing conditions such as different atmospheres may be employed for the primary firing and the secondary firing.

[1-3-6. Post-Treatment]

After the heat treatment in the above firing step, the product is subjected to washing, drying, pulverization and classification treatment, if considered appropriate.

For pulverization, pulverizers such as those cited in the mixing step can be used.

Washing can be done using, for example, water such as deionized water, organic solvent such as ethanol, and alkaline aqueous solution such as ammonia water. Further, in order to, for example, remove flux used, water solution of inorganic acid such as hydrochloric acid, nitric acid and sulfuric acid, or of organic acid such as acetic acid can be used. In this case, after washing with acidic aqueous solution, additional washing with water is preferable.

Classification treatment is done by, for example, in-water sieving. Various classifiers such as air current classifier or vibrating sieve can also be used. Of these, dry classification by means of a nylon mesh can be conveniently used to obtain the phosphor of good dispersibility with weight median diameter of about 20 μm.

When the phosphor of the present invention is used to manufacture a light emitting device by a method described later, the surface of the phosphor may be subjected to surface treatment in which the surface is covered with some foreign compound, in order to improve weather proofness such as moisture resistance or to improve dispersibility in a resin in the phosphor-containing part of the light emitting device described later.

As substance which can be applied to the surface of the phosphor (hereinafter referred to as "surface treatment substance" as appropriate), following can be cited; organic compound, inorganic compound and glass material.

As examples of the organic compound, following can be cited; thermofusible polymer such as acrylic resin, polycarbonate, polyamide and polyethylene, latex and polyorganosiloxane.

As examples of the inorganic compound, following can be cited; metal oxide such as magnesium oxide, aluminum oxide, silicon oxide, titanium oxide, zirconium oxide, tin oxide, germanium oxide, tantalum oxide, niobium oxide, vanadium oxide, boron oxide, antimony oxide, zinc oxide, yttrium oxide and bithmus oxide, metal nitride such as silicon nitride and aluminum nitride, orthophosphate such as calcium phosphate, barium phosphate and strontium phosphate, and polyphosphate.

As examples of the glass material, following can be cited; boron silicate, phosphorus silicate and alkali silicate.

These surface treatment substances can be used either as a single one or as a combination of two or more kinds in any combination and in any ratio.

The phosphor of the present invention obtained by the surface treatment mentioned above has surface treatment substance existing on its surface. The mode of existence of the surface treatment substance can be as follows, for example.

(i) The above surface treatment substance constitutes a continuous layer and covers the surface of the phosphor.

(ii) The above surface treatment substance is attached to the surface of the phosphor as numerous microparticles and these microparticles cover the surface.

There is no special limitation on the amount of the surface treatment substance which can cover or be attached to the surface of the phosphor, insofar as the advantage of the present invention is not significantly impaired. However, the amount, relative to the weight of the phosphor, is usually 0.1 weight % or more, preferably 1 weight % or more, more preferably 5 weight % or more, still more preferably 10 weight % or more, and usually 50 weight % or less, preferably 30 weight % or less, more preferably 20 weight % or less. When the amount of the surface treatment substance relative to that of the phosphor is too large, the luminescent characteristics of the phosphor may be impaired. When it is too small, the coverage of the surface may be insufficient, and moisture resistance and dispersibility may not be improved.

There is no special limitation on the film thickness (layer thickness) of the surface treatment substance formed by surface treatment, insofar as the advantage of the present invention is not significantly impaired. However, it is usually 10 nm or larger, preferably 50 nm or larger, and usually 2000 nm or smaller, preferably 1000 nm or smaller. When the layer is too thick, the luminescent characteristics of the phosphor may be impaired. When it is too thin, the coverage of the surface may be insufficient, and moisture resistance and dispersibility may not be improved.

No particular limitation is imposed on the method of surface treatment. An example can be cited the following coating treatment method using a metal oxide (silicon oxide).

The phosphor of the present invention is added to alcohol such as ethanol, mixed and stirred. To this is added alkaline aqueous solution such as ammonia water, followed by stirring. Hydrolyzable silicic acid alkyl ester such as tetraethyl orthosilicate is then added and the mixture is stirred. The solution obtained is allowed to stand for 3 to 60 min, and then the supernatant containing silicon oxide particles which remain unattached to the surface of the phosphor is removed by pipetting or the like. Then, mixing in alcohol, stirring, allowing to stand and removal of the supernatant are repeated several times and, after heating for 10 min to 5 hr at 120° C. to 150° C., and 2-hr drying process under reduced pressure, for example, surface-treated phosphor is obtained.

As other surface treatment methods of phosphor, following can be cited; various known methods such as method in which spherical silicon oxide fine powder is attached to phosphor (Japanese Patent Laid-Open Publications No. Hei 2-209989 and No. Hei 2-233794), method in which a coating film of Si-compound is attached to phosphor (Japanese Patent Laid-Open Publication No. Hei 3-231987), method in which the surface of phosphor microparticle is covered with polymer microparticles (Japanese Patent Laid-Open Publication No. Hei 6-314593), method in which phosphor is coated with an organic, inorganic, grass or the like material (Japanese Patent Laid-Open Publication No. 2002-223008), method in which the surface of phosphor is covered by means of chemical vapor reaction (Japanese Patent Laid-Open Publication No. 2005-82788) and method in which particles of a metal compound is attached (Japanese Patent Laid-Open Publication No. 2006-28458).

[1-3-7. Production Method Using Alloy]

The phosphor of the present invention can be produced by, in addition to the above-mentioned production method using the above raw materials, a production method using alloy as material.

As refinement technologies of elemental metals, which are widely utilized industrially, sublimation refining, floating zone refining, distillation method and the like are known. As such, there are many elemental metals that can be purified easier than compounds. Accordingly, the use of an elemental metal necessary for manufacturing a phosphor as starting material is superior to the use of compounds as material in that a material of higher purity can be easily obtained.

In addition, elemental metals can be used advantageously for material constituent elements of a phosphor from the viewpoint of homogeneous dispersion of activator elements within the crystal lattice. This is because by melting them to form alloys the activator elements can be easily dispersed uniformly.

From the above standpoint, it is possible to produce highly efficient phosphor industrially by using, as starting material, alloy containing metal elements constituting the phosphor, preferably alloy containing all the metal elements constituting the phosphor.

As alloy containing Si and alkaline earth metal, there have been known $Ca_7Si$, $Ca_2Si$, $Ca_5Si_3$, $CaSi$, $Ca_2Si_2$, $Ca_{14}S_{19}$, $Ca_3Si_4$, $SrSi$, $SrSi_2$, $Sr_4Si_7$, $Sr_5Si_3$ and $Sr_7Si$. As alloy containing Si, aluminum and alkaline earth metal, $Ca(Si_{1-x}Al_x)_2$, $Sr(Si_{1-x}Al_x)_2$, $Ba(Si_{1-x}Al_x)_2$ and $Ca_{1-x}Sr_x(Si_{1-y}Al_y)_2$ or the like are known. Of these, $A(B_{0.5}Si_{0.5})_2$: (A=Ca,Sr,Ba: B=Al, Ga) has been studied regarding its superconductivity and reported in such references as Japanese Patent Laid-Open Publication (Kokai) No. 2005-54182, M. Imai, Applied Physics Letters, 80 (2002) 1019-1021, and M. Imai, Physical Review B, 68, (2003), 064512, or the like.

In the present invention, as fusion method, known fusion methods can be used for the above alloys containing Si and alkaline earth metal, for example, arc fusion or high-frequency fusion method.

Material alloy in the form of a lump can hardly be made to react into a phosphor, and it is preferable to adjust its particle diameter to a predetermined level by a pulverization process. The preferable particle diameter is usually 1 μm or larger and 500 μm or smaller. Even if there is heterogeneity in alloy, homogenization will be achieved by this pulverization process from a macroscopic viewpoint. However, it is not desirable that there is heterogeneity in particle composition microscopically. Therefore, it is preferable that the alloy is homogeneous as a whole.

The alloy powder thus obtained is filled into a crucible or tray, and placed in a heating furnace in which control of atmosphere is possible. A gas containing nitrogen is passed until the atmosphere of the system is sufficiently replaced with the gas. If considered necessary, the gas may be passed after air is evacuated from the system first. For production of oxynitride, a mixed gas of nitrogen and oxygen can be used.

It is desirable that the above alloy powder is fired with its volume filling rate maintained at 40% or lower. The volume filling rate can be calculated by the formula: (bulk density of mixed powder)/(theoretical density of mixed powder)×100 [%]. As the vessel, sintered boron nitride is appropriate because its reactivity with metal compound is low.

Nitride formation reaction of metals is usually exothermic reaction. When metal alloy is used as material, it should be taken into consideration that, because of reaction heat liberated suddenly, material alloy is fused again and its surface area decreases, leading to delay in reaction with nitrogen gas. Therefore, it is preferable to maintain reaction rate which does not allow fusion of the material alloy, in order to produce a phosphor of high efficiency in a stable manner.

[1-4. Application of Multinary Oxynitride Phosphor]

The phosphor of the present invention can be used for any purpose that uses a phosphor. Particularly, it can be used for various light emitting devices (for example, "the first, second and third light emitting device of the present invention" to be described later), making the most of such characteristics that it can be excited with a blue light or a near-ultraviolet light. By adjusting the kind or content of the phosphors used together, light emitting devices having various luminescent colors can be produced. Among them, combination of an excitation light source emitting blue light and a phosphor emitting orange to red fluorescence (orange to red phosphor) can realize a white light emitting device, as the phosphor of the present invention is a green phosphor. In this case, the luminescent color can be modified freely by means of adjusting the luminous wavelength of the phosphor of the present invention or the green phosphor. For example, even an emission spectrum that is similarly to so-called pseudo-white (for example, a luminescent color of the light emitting device having a blue LED and a phosphor emitting yellow fluorescence (yellow phosphor) in combination) emission spectrum can be obtained. Furthermore, by incorporating a phosphor emitting red fluorescence (red phosphor) in this white light emitting device, a light emitting device that is extremely excellent in red color rendering or that emits light with a color of light bulb (a warm white color). A white light emitting device can also be produced by combination of an excitation light source emitting near-ultraviolet light, the phosphor of the present invention, a phosphor emitting blue fluorescence (blue phosphor) and a red phosphor.

The luminescent color of the light emitting device is not limited to white. Actually, light emitting devices emitting any color of light can be produced by combining, as needed, a yellow phosphor (a phosphor emitting yellow fluorescence), blue phosphor, orange to red phosphor or other kind of green phosphor and adjusting the kinds or the contents of the phosphors. The light emitting device obtained as above can be used for an illuminant portion (especially, back-lighting of a liquid crystal display) of an image display or a illuminating device.

[2. Phosphor-Containing Composition]

The phosphor of the present invention can be used as a mixture with a liquid medium. Particularly when the phosphor of the present invention is used for a light emitting device or the like, it is preferably used as a dispersion in a liquid medium. The phosphor of the present invention that is dispersed in a liquid medium will be referred to as "the phosphor-containing composition of the present invention" as appropriate.

[2-1. Phosphor]

There is no limitation on the type of the phosphor of the present invention to be contained in the phosphor-containing composition of the present invention, and any of that can be selected from those described above. The phosphor of the present invention to be contained in the phosphor-containing composition of the present invention can be used as a single kind thereof or as a mixture of two or more kinds in any combination and in any ratio.

Furthermore, in the phosphor-containing composition of the present invention, a phosphor other than the phosphor of the present invention can be contained, insofar as the advantage of the present invention is not significantly impaired.

[2-2. Liquid Medium]

There is no special limitation on the kind of a liquid medium used for the phosphor-containing composition of the present invention, insofar as the performance of the phosphor can be sufficient enough to achieve the object of the present invention. For example, any inorganic material and/or organic material can be used, insofar as it exhibits liquid characteristics under a desired use condition and lets the phosphor of the present invention be dispersed preferably without any unfavorable reaction.

As examples of inorganic materials, following can be cited; metal alkoxide, ceramic precursor polymer, a solution obtained by hydrolytic polymerization of a solution containing metal alkoxide using a sol-gel method, or inorganic material obtained by curing a combination of such materials (such as an inorganic material containing siloxane bond).

As examples of organic materials, following can be cited; thermoplastic resin, thermosetting resin and light curing resin. More specifically, the examples include: methacrylic resin such as polymethacrylate methyl; styrene resin such as polystyrene, styrene-acrylonitrile copolymer; polycarbonate resin; polyester resin; phenoxy resin; butyral resin; polyvinyl alcohol; cellulose resin such as ethyl cellulose, cellulose acetate, and cellulose acetate butyrate; epoxy resin; phenol resin; and silicone resin.

Of these, a silicon-containing compound can be preferably used for the purpose of high heat resistance, high light resistance or the like, particularly when the phosphor is used for a high-power light emitting device such as a illuminating device.

Silicon-containing compound means a compound of which molecular contains a silicon atom. As examples thereof, following can be cited; organic materials (silicone materials) such as polyorganosiloxane, inorganic materials such as silicon oxide, silicon nitride and silicon oxynitride, glass materials such as borosilicate, phosphosilicate and alkali silicate. Among them, silicone materials are preferably used from the standpoint of ease in handling or the like.

The above-mentioned silicone material usually indicates organic polymers having a siloxane bond as the main chain. As examples thereof, following can be cited; compounds represented by the general composition formula (i) and/or mixtures of them.

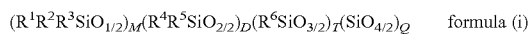   formula (i)

In the general composition formula (i), $R^1$ to $R^6$ are each selected from the group consisting of organic functional group, hydroxyl group and hydrogen atom. $R^1$ to $R^6$ can be the same as or different from each other.

In addition, M, D, T and Q of the above-mentioned formula (i) are each number of 0 or greater and smaller than 1, and they satisfy M+D+T+Q=1.

When the silicone material is used for sealing a semiconductor luminous element, a liquid silicone material can be used by being cured with heat or light after the sealing.

When categorizing silicone materials based on the curing mechanism, they fall into addition polymerization-curable type, polycondensation-curable type, ultraviolet ray-curable type and peroxide vulcanized type. Of these, preferable are addition polymerization-curable type (addition type silicone resin) and condensation-curable type (condensing type silicone resin) and ultraviolet ray-curable type. In the following, addition type silicone material and condensing type silicone material will be explained.

Addition type silicone material silicone material represents a material in which polyorganosiloxane chain is cross-linked by an organic additional bond. A typical example can be cited as follows: a compound having a Si—C—C—Si bond as the crosslinking point, which can be obtained through a reaction between vinylsilane and hydrosilane in the presence of an addition type catalyst such as Pt catalyst. As such compounds, commercially available ones can be used. For example, as concrete commercial names of an addition polymerization-curable type, following can be cited; "LPS-1400", "LPS-2410" and "LPS-3400", manufactured by Shin-Etsu Chemical Co., Ltd.

On the other hand, as an example of a condensing type silicone material, following can be cited; a compound having a Si—O—Si bond as the crosslinking point, which can be obtained through hydrolysis and polycondensation of alkyl alkoxysilane.

Concrete example includes, a polycondensate obtained by performing hydrolysis and polycondensation of compounds represented by the following general formula (ii) and/or (iii), and/or an oligomer thereof. These compounds and/or oligomers thereof can be used either as a single kind thereof or as a mixture of two or more kinds in any combination and in any ratio.

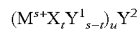   general formula (ii)

(In the general formula (ii), M represents at least one element selected from silicon, aluminum, zirconium and titanium, X represents a hydrolyzable group, $Y^1$ represents a monovalent organic group, m represents an integer of 1 or larger representing the valence of M, and n represents an integer of 1 or larger representing the number of X groups, where m≧n.)

$(M^{s+}X_t Y^1_{s-t})_u Y^2$   general formula (iii)

(In the general formula (iii), M represents at least one element selected from silicon, aluminum, zirconium and titanium, X represents a hydrolyzable group, $Y^1$ represents a monovalent organic group, $Y^2$ represents a u-valent organic group, s represents an integer of 1 or larger representing the valence of M, t represents an integer of 1 or larger and s−1 or smaller, and u represents an integer of 2 or larger.)

The condensing type silicone material may contain a curing catalyst. As the curing catalyst, a metal chelate compound can be used preferably, for example. The metal chelate compound preferably contains at least one of Ti, Ta and Zr, and more preferably contains Zr. The curing catalysts may be used either as a single kind thereof or as a mixture of more than one kind in any combination and in any ratio.

As such condensing type silicone material, following can be used; preferably, for example, semiconductor light-emitting device members disclosed in Japanese Patent Applications No. 2006-47274 to No. 2006-47277 and Japanese Patent Application No. 2006-176438.

In the following, particularly preferable ones among condensing type silicone materials will be explained.

Silicone materials generally have problems such as low adhesiveness to the semiconductor luminous element, the substrate at which the element is disposed, and the package. However, as a silicone material with especially high adhesion, following can be preferably cited; a condensing type silicone material having the following characteristics [5] to [7].

[5] The silicon content is 20 weight % or more.

[6] In the solid Si-nuclear magnetic resonance spectrum (NMR), measured by a method to be described later in detail, it comprises at least one of Si-originated peaks of the following (a) and/or (b).

(a) A peak whose peak top position is in an area of a chemical shift of −40 ppm or more and 0 ppm or less, with reference to tetramethoxysilane, and whose full width at half maximum is 0.3 ppm or more and 3.0 ppm or less.

(b) A peak whose peak top position is in an area of a chemical shift of −80 ppm or more and less than −40 ppm, with reference to tetramethoxysilane, and whose full width at half maximum is 0.3 ppm or more and 5.0 ppm or less.

[7] The silanol content is 0.1 weight % or more and 10 weight % or less.

It is preferable that the silicone material in the present invention has the characteristic [5], among the above-mentioned characteristics [5] to [7]. It is more preferable that the silicone material has the above-mentioned characteristics [5] and [6]. It is particularly preferable that the silicone material has all the above-mentioned characteristics [5] to [7]. In the following, the above-mentioned characteristics [5] to [7] will be explained.

[2-2-1. Characteristic [5] (Silicon Content)]

The silicon content in the silicone material that is preferable for the present invention is usually 20 weight % or more. However, it is preferably 25 weight % or more, and more preferably 30 weight % or more. On the other hand, the upper limit thereof is usually 47 weight %, because the silicon content of a glass consisting only of $SiO_2$ is 47 weight %.

The silicon content of a silicone material can be calculated based on the result of inductively coupled plasma spectrometry (hereinafter abbreviated as "ICP" when appropriate) analysis using, for example, a method described below.

{Measurement of Silicon Content}

A silicone material is kept in a platinum crucible in the air at 450° C. for 1 hr and then at 750° C. for 1 hr and at 950° C. for 1.5 hr for firing. After removal of carbon components, the small amount of residue obtained is added with a 10-fold amount or more of sodium carbonate, and then heated by a burner to melt it. Then the melted product is cooled and added with desalted water, being diluted to several ppm in silicon while adjusting pH value to around neutrality using hydrochloric acid. Then the ICP spectrometry is performed.

[2-2-2. Characteristic [6] (Solid Si-NMR Spectrum)]

When measuring the solid Si-NMR spectrum of a silicone material preferable for the present invention, at least one, preferably two or more of peaks can be observed in the aforementioned peak regions (a) and/or (b), originating from a silicon atom directly bonded with a carbon atom of an organic group.

Summarizing in terms of chemical shifts, in a silicone material preferable for the present invention, the full width at half maximum of the peak described in (a) is generally smaller than that of the peak described in (b), to be described later, due to smaller constraints of molecular motion. Namely, it is in the range of usually 3.0 ppm or less, preferably 2.0 ppm or less, and usually 0.3 ppm or more.

On the other hand, the full width at half maximum of the peak described in (b) is in the range of usually 5.0 ppm or less, preferably 4.0 ppm or less, and usually 0.3 ppm or more, preferably 0.4 ppm or more.

If the full width at half maximum of a peak observed in the above chemical shift areas is too large, a state in which constraints of molecular motion is large and thus distortion is large is created, leading possibly to forming a member inferior in heat resistance and weather resistance, and of which cracks are more likely to appear. For example when a lot of tetrafunctional silane is used or when large internal stress is generated by a rapid drying in the drying process, the range of the full width at half maximum will be larger than the above range.

If the full width at half maximum of the peak is too small, Si atoms existing in its environment are not involved in the siloxane crosslinking. In such a case, for example when trifunctional silane remains in a non-crosslinked state, the obtained member may be inferior in heat resistance and weather resistance to materials formed mainly of siloxane bonds.

However, even if a peak, of the above-mentioned the range of the full width at half maximum, is observed in an area of −80 ppm or more in a silicone material containing a small amount of Si component in a large amount of organic components, excellent heat resistance, light resistance and coating properties may not be obtained.

The chemical shift value of a silicone material preferable for the present invention can be calculated based on the results of a solid Si-NMR measurement performed by, for example, a method described in the following. The measured data (the full width at half maximum, silanol amount and so on) is analyzed by a method in which each peak is divided and extracted by the waveform separation analysis or the like utilizing, for example, the Gauss function or Lorentz function.

{Solid Si-NMR Spectrum Measurement and Calculation of the Silanol Content}

When measuring the solid Si-NMR spectrum of a silicone material, the solid Si-NMR spectrum measurement and the waveform separation analysis are first performed under the following conditions. Further, the full width at half maximum of each peak is determined, for the silicone material, based on the obtained waveform data. In addition, the silanol content is determined by comparing the ratio (%) of silicon atoms in silanol to all silicon atoms, decided from the ratio of peak areas originating from silanol to all peak areas, with the silicon content ratio analyzed separately.

{Device Conditions}

Device: Infinity CMX-400 nuclear magnetic resonance spectroscope manufactured by Chemagnetics Co.

29Si resonance frequency: 79.436 MHz

Probe: 7.5 mm φ CP/MAS probe

Temperature: Room temperature

Rotational frequency of sample: 4 kHz

Measurement method: Single pulse method 1H decoupling frequency: 50 kHz

29Si flip angle: 90°

29Si 90° pulse width: 5.0 μs

Repetition time: 600 s

Total count: 128 times

Observation width: 30 kHz

Broadening factor: 20 Hz

Authentic sample: tetramethoxysilane

For a silicone material, 512 points are taken in as measured data and zero-filled to 8192 points, before Fourier transformation, is performed.

{Waveform Separation Analysis Method}

For each peak after Fourier transformation, an optimization calculation is performed by the nonlinear least square method using variable parameters such as center position, height, and full width at half maximum of a peak shape, created by a Lorentz waveform, Gauss waveform, or a mixture of the two.

For identification of a peak, refer to AIChE Journal, 44(5), p. 1141, 1998 or the like.

[2-2-3. Characteristic [7] (Silanol Content)]

The silanol content of a silicone material preferable for the present invention is in the range of usually 0.1 weight % or more, preferably 0.3 weight % or more, and usually 10 weight % or less, preferably 8 weight % or less, more preferably 5 weight % or less. When the silanol content is small, the silanol material varies little over time and can be superior in long-term performance stability, as well as in low hygroscopicity and moisture permeability. However, a member containing no silanol has only poor adhesion, and therefore, there is such appropriate range of the silanol content as described above.

The silanol content of a silicone material can be determined by, for example, a method described in {Solid Si-NMR spectrum measurement and calculation of the silanol content} of [2-2-2. Characteristic [6] (solid Si-NMR spectrum)]. Namely, it can be calculated by comparing the ratio (%) of silicon atoms in silanol to all silicon atoms, decided by a Solid Si-NMR spectrum measurement from the ratio of peak areas originating from silanol to all peak areas, with the silicon content analyzed separately.

Since a silicone material preferable for the present invention contains an appropriate amount of silanol, silanol is bound to a polar portion existing on the device surface through hydrogen bond so that adhesion develops. The polar portion includes, for example, a hydroxyl group and oxygen in a metalloxane bond.

In addition, a silicone material preferable for the present invention forms, clue to dehydration condensation, a covalent bond with a hydroxyl group on the device surface when heated in the presence of an appropriate catalyst, leading to a development of still firmer adhesion.

With too much content of silanol, on the other hand, thickening in the system may make the coating difficult, and also, with increased activity, the occurrence of curing before low-boiling point components volatilize by heating may induce a foaming and an increase in internal stress, which may result in crack generations.

[2-2-4. Content of Liquid Medium]

There is no special limitation on the content of the liquid medium, insofar as the advantage of the present invention is not significantly impaired. However, it is usually 50 weight % or more, preferably 75 weight % or more, and usually 99 weight % or less, preferably 95 weight % or less, to the whole phosphor-containing composition of the present invention. Even a large amount of liquid medium does not induce any problems particularly, but in order to achieve desired chromaticity coordinate, color rendering index, emission efficiency or the like when it is used for a semiconductor light emitting device, it is preferable that the liquid medium is used usually in the above-mentioned proportion. With too small amount of the liquid medium, on the other hand, its handling may be difficult due to too little fluidity.

The liquid medium serves mainly as binder, in the phosphor-containing composition of the present invention. The liquid medium can be used either as a single one or as a mixture of two or more kinds in any combination and in any ratio. For example, when a silicon-containing compound is used for the purpose of high heat resistance or light resistance, other thermosetting resin such as epoxy resin can be included to the extent that the durability of the silicon-containing compound will not be impaired. In such a case, the content of the other thermosetting resin is usually 25 weight % or lower, preferably 10 weight % or lower, to the whole amount of the liquid medium, which serves as the binder.

[2-3. Other Component]

In the phosphor-containing composition of the present invention, other components can be contained in addition to the phosphor and liquid medium, insofar as the advantage of the present invention is not significantly impaired. The other components may be used either as a single kind thereof or as a mixture of two or more kinds in any combination and in any ratio.

[3. Light Emitting Device]

[3-1. First Light Emitting Device]

The first light emitting device of the present invention comprises an excitation light source and a phosphor emitting green fluorescence when irradiated with light from the excitation light source and having the below characteristics (1), (2) and (3).

(1) When irradiated with light having wavelength of 455 nm, the ratio of the peak intensity value of the emission at 150° C. in the emission spectrum, to the peak intensity value of the emission at 20° C. in the emission spectrum, is 55% or more.

(2) The ratio of the peak intensity value of the emission when irradiated with light having wavelength of 410 nm in the emission spectrum, to the peak intensity value of the emission when irradiated with light having wavelength of 390 nm in the emission spectrum, is 90% or more.

(3) The chromaticity coordinate of the luminescent color of the phosphor, according to JIS Z8701, meets conditions of $x \leqq 0.3$ and $y \geqq 0.5$.

There is no limitation on the excitation light source. Any type of it can be used, insofar as it can excite the green phosphor having the characteristics (1) to (3). Among them, one that is the same as the first luminous body to be described later is preferable. The excitation light source can be used either as a single one or as a mixture of two or more kinds in any combination and in any ratio.

The characteristic (1) is the same as described for [1-2-2. Temperature characteristics]. The characteristic (2) is the same as described for [1-2-3. Excitation wavelength]. The characteristic (3) is the same as described for [1-2-4. Luminescent color].

The first light emitting device of the present invention may have any known device configuration, insofar as it comprises an excitation light source and uses a green phosphor having the above-mentioned characteristics (1), (2) and (3).

By using a green phosphor having the above-mentioned characteristics (1), (2) and (3), a light emitting device can be realized, which is superior in less color shift accompanying temperature rising, stable emission efficiency with respect to excitation light sources of near-ultraviolet to blue region and wide color reproduction range of the display when the device is used as white light emitting device for a light source of a liquid crystal display or the like.

Furthermore, it is preferable that the green phosphor used for the first light emitting device of the present invention has characteristics, in addition to the characteristics (1), (2) and (3), which are the same as the phosphor of the present invention described in [1-2-2. Temperature characteristics], [1-2-3. Excitation wavelength] and [1-2-4. Luminescent color].

The weight median diameter of the green phosphor used for the first light emitting device of the present invention is the same as described for the phosphor of the present invention in [1-2-7. Weight median diameter].

The internal quantum efficiency, absorption efficiency and external quantum efficiency of the green phosphor used for the first light emitting device of the present invention are the same as described for the phosphor of the present invention in [1-2-8. Internal quantum efficiency or the like].

As a preferable example of the green phosphor used for the first light emitting device of the present invention described above, the aforementioned phosphor of the present invention can be cited. Therefore, the first light emitting device of the present invention can be constructed, containing one or more kind of the phosphor of the present invention.

The emission peak in the green region, of the emission spectrum of the first light emitting device of the present invention, preferably exists in the wavelength range from 515 nm to 535 nm.

The emission spectrum of the first light emitting device of the present invention can be measured in a room of which temperature is kept at 25±1° C. using a software for measuring color and illumination intensity, manufactured by Ocean Optics, Inc., and a spectroscope of USB2000 series (integrating sphere version). From this emission spectrum data, in the wavelength region of 380 nm to 780 nm, the chromaticity value (CIEx, CIEy, CIEz) can be calculated as the chromaticity coordinate in XYZ color system, defined in JIS Z8701. In this case, the relational expression of $Cx+Cy+Cz=1$ holds.

It is preferable that the first light emitting device of the present invention has high NTSC ratio, when it is a white light emitting device that can emit each monochromatic color of RGB. In this context, "can emit each monochromatic color of RGB" means that it can emit each monochromatic light of red, green or blue. More specifically, the NTSC ratio (%) of the first light emitting device of the present invention is usually 70 or higher, preferably 72 or higher, and more preferably 74 or higher. The higher the value of NTSC ratio is, the more preferable, but it is theoretically 150 or lower, and usually 120 or lower.

NTSC ratio is decided as follows.

In NTSC system, the standard of Japanese color TV, reference R, G, B chromaticity points are defined as follows as points (x,y) on the CIE chromaticity coordinate.

R(0.67, 0.33), G(0.21, 0.71), B(0.14, 0.08)

NTSC ratio can be obtained as the area of the triangle formed with R, G and B of the white light emitting device to be measured, letting the area of the triangle formed with above reference R, G and B be 100. More specifically, the NTSC ratio (%) can be obtained by multiplying by 100 the value of the area of the triangle, formed by plotting the chromaticity points of monochromatic RGB emitted by the white light emitting device for measurement on the CIE chromaticity diagram, divided by the area of the reference triangle of NTSC.

Further, either P/V(blue) or P/V(red), described below, of the first light emitting device of the present invention is preferably 1.4 or larger, more preferably 1.5 or larger, still more preferably 1.6 or larger, particularly preferably 1.7 or larger.

(a) Intensity ratio (P/V(blue)) of the maximum value (P) of the emission intensity in an emission peak existing in the emission-spectrum wavelength range from 515 nm to 535 nm to the minimum value (V) of the emission intensity in the wavelength range from 480 nm to 515 nm.

(b) Intensity ratio (P/V(red)) of the maximum value (P) of the emission intensity in an emission peak existing in the emission-spectrum wavelength range from 515 nm to 535 nm to the minimum value (V) of the emission intensity in the wavelength range from 535 nm to 590 nm.

The aforementioned P/V(blue) and P/V(red) vary depending on the kind or amount of the phosphor used with the above-mentioned green phosphor. By selecting the kind and amount of the phosphor to meet the above-mentioned specifications, a light emitting device with broad color reproduction range can be provided. The larger the value of P/V(blue) or P/V(red) is, the more preferable, but they are usually 100 or smaller.

Furthermore, it is preferable that the light emitting device have such durability as defined below. Namely, it is preferable for the first light emitting device of the present invention that the chromaticity (x, y) after energization with current density of 238 mA/mm$^2$ for 200 hrs at a temperature of 85° C. and relative humidity of 85%, to the chromaticity (x', y') before the energization, meets each condition of 0≦|x−x'|≦0.035 and 0≦|y−y'|≦0.035. Further, the |x−x'| is more preferably 0.025 or smaller, and still more preferably 0.02 or smaller. In addition, the |y−y'| is more preferably 0.025 or smaller, and still more preferably 0.02 or smaller.

Such durability can be measured by energization with current of 20 mA at a temperature of 85° C. and relative humidity of 85%, using an LED aging system manufactured by Yamakatsu Electronics Industry Co., Ltd. However, it can be measured using other similar equipment.

The emission efficiency of the first light emitting device of the present invention is preferably 30 lm/W or higher, more preferably 35 lm/W or higher, and particularly preferably 40 lm or higher. The higher emission efficiency is, the more preferable, but it is usually 250 lm/W or lower.

Emission efficiency can be determined by calculating the total luminous flux from the results of emission-spectrum measurement using a light emitting device as mentioned earlier, and dividing the lumen value (lm) with the power consumption (W). The power consumption can be obtained as the product of the current value and the voltage value, which is measured between the LED terminals using True RMS Multimeters Model 187 and 189 manufactured by Fluke Corporation.

[3-2. Second Light Emitting Device]

The second light emitting device of the present invention comprises an excitation light source and a phosphor emitting green fluorescence when irradiated with light from the excitation light source and having the below characteristics (4), (2) and (3).

(4) The crystalline structure of an oxynitride has the trigonal unit cell.

(2) The ratio of the peak intensity value of the emission when irradiated with light having wavelength of 410 nm in the emission spectrum, to the peak intensity value of the emission when irradiated with light having wavelength of 390 nm in the emission spectrum, is 90% or more.

(3) The chromaticity coordinate of the luminescent color of the phosphor, according to JIS Z8701, meets conditions of x≦0.3 and y≦0.5.

There is no limitation on the excitation light source. Any type of it can be used, insofar as it can excite the green phosphor having the characteristics (2) to (4). Among them, one that is the same as the first luminous body to be described later is preferable. The excitation light source can be used either as a single one or as a mixture of two or more kinds in any combination and in any ratio.

The characteristic (2) is the same as described for [1-2-3. Excitation wavelength]. The characteristic (3) is the same as described for [1-2-4. Luminescent color]. The characteristic (4) is the same as described for [1-1. Composition and crystal structure of multinary oxynitride phosphor].

The second light emitting device of the present invention may have any known device configuration, insofar as it comprises an excitation light source and uses a green phosphor having the above-mentioned characteristics (4), (2) and (3).

By using a green phosphor having the above-mentioned characteristics (4), (2) and (3), a light emitting device can be realized, which is superior in less color shift accompanying temperature rising, stable emission efficiency with respect to excitation light sources of near-ultraviolet to blue region and wide color reproduction range of the display when the device is used as white light emitting device for a light source of a liquid crystal display or the like.

Furthermore, it is preferable that the green phosphor used for the second light emitting device of the present invention has characteristics which are the same as the phosphor of the present invention described in [1-2-2. Temperature characteristics].

Furthermore, it is preferable that the green phosphor used for the second light emitting device of the present invention has characteristics, in addition to the characteristics (2) to (4), which are the same as the phosphor of the present invention described in [1-1. Composition and crystal structure of multinary oxynitride phosphor], [1-2-3. Excitation wavelength] and [1-2-4. Luminescent color].

The weight median diameter of the green phosphor used for the second light emitting device of the present invention is the same as described for the phosphor of the present invention in [1-2-7. Weight median diameter].

The internal quantum efficiency, absorption efficiency and external quantum efficiency of the green phosphor used for the second light emitting device of the present invention are the same as described for the phosphor of the present invention in [1-2-8. Internal quantum efficiency or the like].

As a preferable example of the green phosphor used for the second light emitting device of the present invention described above, the aforementioned phosphor of the present invention can be cited. Therefore, the second light emitting device of the present invention can be constructed, containing one or more kind of the phosphor of the present invention.

Furthermore, the second light emitting device of the present invention is the same as the first light emitting device of the present invention, in wavelength range at which the emission peak of green region exists in the emission spectrum of the light emitting device, NTSC ratio, P/V(blue) or P/V (red), durability and emission efficiency, respectively.

[3-3. Third Light Emitting Device]

The third light emitting device of the present invention comprises a first luminous body and a second luminous body which emits visible light when irradiated with light from the first luminous body. The third light emitting device also comprises, as the second luminous body, a first phosphor including at least one kind of the phosphor of the present invention.

The third light emitting device of the present invention may have any known device configuration, insofar as it comprises a first luminous body which can be an excitation light source and, as the second luminous body, a first phosphor including at least one kind of the phosphor of the present invention.

As the third light emitting device, one having a device configuration as described below can be cited.

[3-3-1. Configuration of the Third Light Emitting Device (Luminous Body)]

[3-3-1-1. First Luminous Body]

The first luminous body emits light for exciting the second luminous body to be described later.

The first luminous body has no particular limitation in its luminous wavelength, insofar as it overlaps the absorption wavelength of the second luminous body to be described later, and therefore, various luminous bodies with wide range of luminous wavelength regions can be applicable. Usually a luminous body having luminous wavelength from ultraviolet region to blue region is used. Among them, particularly preferable is a luminous body having luminous wavelength from near-ultraviolet region to blue region. The luminous wavelength of the first luminous body usually has a concrete value of 200 nm or longer. Among them, when a near-ultraviolet light is used as the excitation light, a luminous body with a peak luminous wavelength of usually 300 nm or longer, preferably 330 nm or longer, more preferably 360 nm or longer, and usually 420 nm or shorter is used. When a blue light is used as the excitation light, a luminous body with a peak luminous wavelength of usually 420 nm or longer, preferably 430 nm or longer, and usually 500 nm or shorter, preferably 480 nm or shorter is used. This is from the standpoint of color purity of the light emitting device. As this first luminous body, a semiconductor luminous element is generally used. Concretely, an LED, semiconductor laser diode (hereinafter, abbreviated as "LD" as appropriate) or the like can be used. Other examples of a luminous body that can be used as the first luminous body include an organic electroluminescence luminous element, inorganic electroluminescence luminous element or the like. However, the first luminous body that can be used is not restricted to those exemplified in the present Description.

Among them, a GaN-based LED and GaN-based LD, using a GaN-based compound semiconductor, are preferable for the first luminous body. This is because a GaN-based LED and GaN-based LD have light output and external quantum efficiency of far greater than those of an SiC-based LED that emits the same range of light and therefore they can give very bright luminescence with very low electric power when used in combination with the above-mentioned phosphor. For example, for current load of 20 mA, a GaN-based LED and GaN-based LD usually have emission intensity 100 times or higher than that of an SiC-based LED. As GaN-based LED or GaN-based LD, those having an $Al_xGa_yN$ luminous layer, GaN luminous layer or $In_xGa_yN$ luminous layer are preferable. Among them, as GaN-based LED, one having an $In_xGa_yN$ luminous layer is particularly preferable due to its remarkably high emission intensity, and one having a multiple quantum well structure of the $In_xGa_yN$ layer and GaN layer is particularly preferable also due to its remarkably high emission intensity.

In the above description, the X+Y usually takes a value in the range of 0.8 to 1.2. A GaN-based LED that has such kind of a luminous layer, doped with Zn or Si or without any dopant, is preferable for the purpose of adjusting the luminescent characteristics.

A GaN-based LED contains such kind of luminous layer, p layer, n layer, electrode and substrate, as its basic components. Among them, a GaN-based LED having such a heterostructure as sandwiching the luminous layer with $Al_xGa_yN$ layers, GaN layers or $In_xGa_yN$ layers, one of which is n type and the other p type, is preferable, from the standpoint of high emission efficiency. Moreover, the one whose heterostructure is replaced by a quantum well structure is more preferable because it can have higher emission efficiency.

The first luminous body can be used either singly or as a combination of two or more of them in any combination and in any ratio.

[3-3-1-2. Second Luminous Body]

The second luminous body of the third light emitting device of the present invention is a luminous body which emits visible light when irradiated with light from the above-mentioned first luminous body. It comprises the aforementioned phosphor of the present invention (green phosphor) as the first phosphor, as well as the second phosphor (red phosphor, blue phosphor, orange phosphor and the like) to be described later, as appropriate depending on its use of the like. The second luminous body is formed, for example, so that the first and the second phosphors are dispersed in a sealing material.

There is no special limitation on the composition of the phosphor that is used in the second luminous body, exclusive of the phosphor of the present invention. The examples include compounds having a host crystal, such as a metal oxide typified by $Y_2O_3$, $Zn_2SiO_4$, $Y_3Al_5O_{12}$, and $Sr_2SiO_4$ metal nitride typified by $Sr_2Si_5N_8$, phosphate typified by $Ca_5(PO_4)_3Cl$ and sulfide typified by ZnS, SrS and CaS, to which is added an activation element or coactivation element, such as an ion of a rare earth metal of Ce, Pr, Nd, Pm, Sm, Eu, Tb, Dy, Ho, Er, Tm and Yb, or metal ion of Ag, Cu, Au, Al, Mn and Sb.

Preferable examples of the host crystal include sulfides such as (Zn,Cd)S, $SrGa_2S_4$, SrS and ZnS; oxysulfides such as $Y_2O_2S$; aluminates such as $(Y,Gd)_3Al_5O_{12}$, $YAlO_3$, $BaMgAl_{10}O_{17}$, $(Ba,Sr)(Mg,Mn)Al_{10}O_{17}$, $(Ba,Sr,Ca)(Mg,Zn,Mn)Al_{10}O_{17}$, $BaAl_{12}O_{19}$, $CeMgAl_{11}O_{19}$, $(Ba,Sr,Mg)O \cdot Al_2O_3$, $BaAl_2Si_2O_8$, $SrAl_2O_4$, $Sr_4Al_{14}O_{25}$ and $Y_3Al_5O_{12}$; silicates such as $Y_2SiO_5$ and $Zn_2SiO_4$; oxides such as $SnO_2$ and $Y_2O_3$; borates such as $GdMgB_5O_{10}$ and $(Y,Gd)BO_3$; halophosphates such as $Ca_{10}(PO_4)_6(F,Cl)_2$ and $(Sr,Ca,Ba,Mg)_{10}(PO_4)_6Cl_2$; and phosphates such as $Sr_2P_2O_7$ and $(La,Ce)PO_4$.

No particular limitation is imposed on the element compositions of the above-mentioned host crystal, and activation element or coactivation element. Partial substitution with an element of the same group is possible. Any phosphor obtained can be used so long as it absorbs light in the near-ultraviolet to visible region and emits visible light.

More concretely, those to be described later can be used as phosphor. However, those list serves just as an example and phosphors that can be used in the present invention are not limited to those examples. In those example lists to be described later, phosphors with different partial structure are shown abbreviated as a group for the sake of convenience, as mentioned earlier.

[3-3-1-2-1. First Phosphor]

The second luminous body in the third light emitting device of the present invention contains at least the above-mentioned phosphor of the present invention as the first phosphor. The phosphor of the present invention can be used either as a single kind or as a mixture of two or more kinds in any combination and in any ratio.

In addition, the first phosphor may contain, in addition to the phosphor of the present invention, a phosphor (combined same-color phosphor) emitting a fluorescence of the same color as that of the phosphor of the present invention. As the phosphor of the present invention is a green phosphor, another kind of green phosphor can be used as the first phosphor in combination with the phosphor of the present invention.

Any kind of green phosphor can be used, insofar as the advantage of the present invention is not significantly impaired. At this point, it is preferable that the emission peak wavelength of the green phosphor is in the wavelength range of usually 490 nm or longer, preferably 500 nm or longer, more preferably 510 nm or longer, still more preferably 515 nm or longer, and usually 560 nm or shorter, preferably 550 nm or shorter, more preferably 540 nm or shorter, still more preferably 535 nm or shorter.

Examples of the green phosphor include europium-activated alkaline earth silicon oxynitride phosphor represented by $(Mg,Ca,Sr,Ba)Si_2O_2N_2$:Eu, which is constituted by fractured particles having a fractured surface and emits light in the green region, and europium-activated alkaline earth silicate phosphor represented by $(Ba,Ca,Sr,Mg)_2SiO_4$:Eu, which is constituted by fractured particles having a fractured surface and emits light in the green region.

Other examples of the green phosphor include: Eu-activated aluminate such as $Sr_4Al_{14}O_{25}$:Eu and $(Ba,Sr,Ca)Al_2O_4$:Eu; Eu-activated silicate such as $(Sr,Ba)Al_2Si_2O_8$:Eu, $(Ba,Mg)_2SiO_4$:Eu, $(Ba,Sr,Ca,Mg)_2SiO_4$:Eu and $(Ba,Sr,Ca)_2(Mg,Zn)Si_2O_7$:Eu, $(Ba,Ca,Sr,Mg)_9(Sc,Y,Lu,Gd)_2(Si,Ge)_6O_{24}$:Eu; Ce,Tb-activated silicate such as $Y_2SiO_5$:Ce,Tb; Eu-activated borophosphate such as $Sr_2P_2O_7.Sr_2B_2O_5$:Eu; Eu-activated halosilicate such as $Sr_2Si_3O_8.2SrCl_2$:Eu; Mn-activated silicate such as $Zn_2SiO_4$:Mn; Tb-activated aluminate such as $CeMgAl_{11}O_{19}$:Tb and $Y_3Al_5O_{12}$:Tb; Tb-activated silicate such as $Ca_2Y_8(SiO_4)_6O_2$:Tb and $La_3Ga_5SiO_{14}$:Tb; Eu,Tb,Sm-activated thiogalate such as $(Sr,Ba,Ca)Ga_2S_4$:Eu,Tb,Sm; Ce-activated aluminate such as $Y_3(Al,Ga)_5O_{12}$:Ce and $(Y,Ga,Tb,La,Sm,Pr,Lu)_3(Al,Ga)_5O_{12}$:Ce; Ce-activated silicate such as $Ca_3Sc_2Si_3O_{12}$:Ce and $Ca_3(Sc,Mg,Na,Li)_2Si_3O_{12}$:Ce; Ce-activated oxide such as $CaSc_2O_4$:Ce; Eu-activated oxynitride such as $SrSi_2O_2N_2$:Eu, $(Mg,Sr,Ba)Si_2O_2N_2$:Eu and Eu-activated β-sialon; Eu,Mn-activated aluminate such as $BaMgAl_{10}O_{17}$:Eu; Eu-activated aluminate such as $SrAl_2O_4$:Eu; Tb-activated oxysulfide such as $(La,Gd,Y)_2O_2S$:Tb; Ce,Tb-activated phosphate such as $LaPO_4$:Ce,Tb; sulfide such as $ZnS:Cu,Al$ and $ZnS:Cu,Au,Al$; Ce,Tb-activated borate such as $(Y,Ga,Lu,Sc,La)BO_3$:Ce,Tb, $Na_2Gd_2B_2O_7$:Ce,Tb and $(Ba,Sr)_2(Ca,Mg,Zn)B_2O_6$:K,Ce,Tb; Eu,Mn-activated halosilicate such as $Ca_8Mg(SiO_4)_4Cl_2$:Eu,Mn; Eu-activated thioaluminate or thiogallate such as (Sr,Ca,Ba)$(Al,Ga,In)_2S_4$:Eu; Eu,Mn-activated halosilicate such as $(Ca,Sr)_8(Mg,Zn)(SiO_4)_4Cl_2$:Eu,Mn; and Eu-activated oxynitride such as $MSi_2O_2N_2$:Eu, $M_3Si_6O_9N_4$:Eu, $M_2Si_7O_{10}N_4$:Eu (here, M represents alkaline earth metal element).

Also applicable as the green phosphor are fluorescent dyes such as pyridine-phthalimide condensed derivative, benzoxadinone compound, quinazoline compound, coumarine compound, quinophthalone compound, naphthalic acid imide compound, and organic phosphors such as terbium complex.

The green phosphor exemplified above can be used either as a single kind or as a mixture of two or more kinds in any combination and in any ratio.

It is preferable that the first phosphor used for the third light emitting device of the present invention has a peak wavelength λp (nm) in the range of usually longer than 500 nm, particularly 510 nm or longer, further particularly 515 nm, and usually 550 nm or shorter, particularly 540 nm or shorter, further particularly 535 nm or shorter. When the emission peak wavelength λp is too short, the color tends to be bluish green. On the other hand, when it is too long, the color tends to be yellowish green. In both cases, the performance as green light may deteriorate, which is unfavorable.

In addition, it is preferable that the first phosphor used for the third light emitting device of the present invention has a full width at half maximum (FWHM) of the emission peak, in the above emission spectrum, in the range of usually wider than 40 nm, particularly 50 nm or wider, further particularly 60 nm or wider, and usually narrower than 90 nm, particularly 80 or narrower, further particularly 75 nm or narrower. When the full width at half maximum, FWHM, is too narrow, the emission brightness will decrease in the use as a illuminating device, leading to too low color rendering. When it is too wide, the color purity will decrease in the use as an image display such as a liquid crystal display, leading to too narrow color reproduction range of the image display.

[3-3-1-2-2. Second Phosphor]

The second luminous body of the third light emitting device of the present invention may contain another phosphor (namely, a second phosphor) in addition to the above-mentioned first phosphor, depending on its use. The second phosphor is a phosphor having a different luminous wavelength from the first phosphor. Such second phosphor is usually used for the purpose of adjusting the color tone of light emission of the second luminous body. Therefore, mostly a phosphor having a different-color fluorescence from the first phosphor is used as the second phosphor. As a green phosphor is usually used for the first phosphor, as described above, a phosphor other than a green phosphor, such as an orange to red phosphor, blue phosphor or yellow phosphor, is used as the second phosphor.

It is preferable that the weight median diameter of the second phosphor used for the third light emitting device of the present invention is in the range of usually 0.01 μm or larger, preferably 1 μm or larger, more preferably 5 μm or larger, still more preferably 10 μm or larger, and usually 100 μm or smaller, preferably 30 μm or smaller, more preferably 20 μm or smaller. When the weight median diameter is too small, the brightness will decrease and the phosphor particles tend to aggregate. On the other hand, the weight median diameter is too large, unevenness in coating, clogging in a dispenser, or the like may occur.

[3-3-1-2-2-1. Orange to Red Phosphor]

When an orange to red phosphor is used as the second phosphor, any kind of orange to red phosphor can be used, insofar as the advantage of the present invention is not significantly impaired. It is preferable that the emission peak wavelength of the orange to red phosphor is usually 570 nm or longer, preferably 580 nm or longer, more preferably 585 nm or longer, and usually 780 nm or shorter, preferably 700 nm or shorter, more preferably 680 nm or shorter.

Examples of such orange to red phosphor include an europium-activated alkaline earth silicon nitride phosphor represented by $(Mg,Ca,Sr,Ba)_2Si_5N_8$:Eu, which is constituted by fractured particles having red fractured surface and emits light in the red region, and an europium-activated rare earth oxychalcogenide phosphor represented by $(Y,La,Gd,Lu)_2O_2S$:Eu, which is constituted by growing particles having a nearly spherical shape typical of regular crystal growth and emits light in the red region.

Also applicable in the present embodiment is an phosphor containing oxynitride and/or oxysulfide which contains at least one element selected from the group consisting of Ti, Zr, Hf, Nb, Ta, W and Mo, as described in Japanese Patent Laid-Open Publication (Kokai) No. 2004-300247, and containing an oxynitride having an α-sialon structure in which all or part of Al element is replaced by Ga element. These are phosphors which contain oxynitride and/or oxysulfide.

Other examples of the red phosphor include: Eu-activated oxysulfide such as $(La,Y)_2O_2S$:Eu; Eu-activated oxide such as $Y(V,P)O_4$:Eu and $Y_2O_3$:Eu; Eu,Mn-activated silicate such as $(Ba,Mg)_2SiO_4$:Eu,Mn and $(Ba,Sr,Ca,Mg)_2SiO_4$:Eu,Mn; Eu-activated tungstate such as $LiW_2O_8$:Eu, $LiW_2O_8$:Eu,Sm, $Eu_2W_2O_9$:Nb, $Eu_2W_2O_9$:Sm; Eu-activated sulfide such as $(Ca,Sr)S$:Eu; Eu-activated aluminate such as $YAlO_3$:Eu; Eu-activated silicate such as $Ca_2Y_8(SiO_4)_6O_2$:Eu, $LiY_9(SiO_4)_6O_2$:Eu, $(Sr,Ba,Ca)_3SiO_5$:Eu and $Sr_2BaSiO_5$:Eu; Ce-activated aluminate such as $(Y,Gd)_3Al_5O_{12}$:Ce and $(Tb,Gd)_3Al_5O_{12}$:Ce; Eu-activated nitride or oxynitride such as $(Mg,Ca,Sr,Ba)_2Si_5(N,O)_8$:Eu, $(Mg,Ca,Sr,Ba)Si(N,O)_2$:Eu and $(Mg,Ca,Sr,Ba)AlSi(N,O)_3$:Eu; Ce-activated nitride oxynitride such as $(Mg,Ca,Sr,Ba)AlSi(N,O)_3$:Ce; Eu,Mn-activated halophosphate such as $(Sr,Ca,Ba,Mg)_{10}(PO_4)_6Cl_2$:Eu,Mn; Eu,Mn-activated silicate such as $Ba_3MgSi_2O_8$:Eu,Mn and $(Ba,Sr,Ca,Mg)_3(Zn,Mg)Si_2O_8$:Eu,Mn; Mn-activated germanate such as $3.5MgO.0.5MgF_2.GeO_2$:Mn; Eu-activated oxynitride such as Eu-activated α-sialon; Eu,Bi-activated oxide such as $(Gd,Y,Lu,La)_2O_3$:Eu,Bi; Eu,Bi-activated oxysulfide such as $(Gd,Y,Lu,La)_2O_2S$:Eu,Bi; Eu,Bi-activated vanadate such as $(Gd,Y,Lu,La)VO_4$:Eu,Bi; Eu,Ce-activated sulfide such as $SrY_2S_4$:Eu,Ce; Ce-activated sulfide such as $CaLa_2S_4$:Ce; Eu,Mn-activated phosphate such as $(Ba,Sr,Ca)MgP_2O_7$:Eu,Mn and $(Sr,Ca,Ba,Mg,Zn)_2P_2O_7$:Eu,Mn; Eu,Mo-activated tungstate such as $(Y,Lu)_2WO_6$:Eu,Mo; Eu,Ce-activated nitride such as $(Ba,Sr,Ca)_xSi_yN_z$:Eu,Ce (x, y, z being an integer of 1 or larger); Eu,Mn-activated halophosphate such as $(Ca,Sr,Ba,Mg)_{10}(PO_4)_6(F,Cl,Br,OH)_2$:Eu,Mn; and Ce-activated silicate such as $((Y,Lu,Gd,Tb)_{1-x-y}Sc_xCe_y)_2(Ca,Mg)_{1-r}(Mg,Zn)_{2+r}Si_{z-q}Ge_qO_{12+\delta}$.

Also applicable as the red phosphor are the following examples: red organic phosphor consisting of rare-earth ion complex containing anions such as β-diketonate, β-diketone, aromatic carboxylic acid or Bronsted acid as ligand, perylene pigment (for example, dibenzo{[f,f']-4,4',7,7'-tetraphenyl}diindeno[1,2,3-cd:1',2',3'-lm]perylene), anthraquinone pigment, lake pigment, azo pigment, quinacridone pigment, anthracene pigment, isoindoline pigment, isoindolinone pigment, phthalocyanine pigment, triphenylmethane series basic dye, indanthrone pigment, indophenol pigment, cyanine pigment and dioxazine pigment.

Among them, it is preferable that the red phosphor contains at least one type of phosphor selected from the group consisting of $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, $(Ca,Sr)S$:Eu, $(La,Y)_2O_2S$:Eu and Eu complex. It is more preferable that it contains at least one of $(Ca,Sr,Ba)_2Si_5(N,O)_8$:Eu, $(Ca,Sr,Ba)Si(N,O)_2$:Eu, $(Ca,Sr,Ba)AlSi(N,O)_3$:Eu, $(Ca,Sr,Ba)AlSi(N,O)_3$:Ce, $(Sr,Ba)_3SiO_5$:Eu, $(Ca,Sr)S$:Eu, $(La,Y)_2O_2S$:Eu, β-diketone Eu complex such as $Eu(dibenzoylmethane)_3.1,10$-phenanthroline complex or carboxylic acid Eu complex. Of these, especially preferable are $(Ca,Sr,Ba)_2Si_5(N,O)_8$:Eu, $(Sr,Ca)AlSiN_3$:Eu and $(La,Y)_2O_2S$:Eu.

Among the above examples, preferable as the orange phosphor is $(Sr,Ba)_3SiO_5$:Eu.

[3-3-1-2-2-2. Blue Phosphor]

When a blue phosphor is used as the second phosphor, any kind of blue phosphor can be used, insofar as the advantage of the present invention is not significantly impaired. At this point, it is preferable that the emission peak wavelength of the blue phosphor is in the wavelength range of usually 420 nm or longer, preferably 430 nm or longer, more preferably 440 nm or longer, and usually 490 nm or shorter, preferably 480 nm or shorter, more preferably 470 nm or shorter, still more preferably 460 nm or shorter.

Examples of the blue phosphor include europium-activated barium magnesium aluminate phosphors represented by $BaMgAl_{10}O_{17}$:Eu, which is constituted by growing particles having a nearly hexagonal shape typical of regular crystal growth and emits light in the blue region, europium-activated calcium halphosphate phosphors represented by $(Ca,Sr,Ba)_5(PO_4)_3Cl$:Eu, which is constituted by growing particles having a nearly spherical shape typical of regular crystal growth and emits light in the blue region, europium-activated alkaline earth chloroborate phosphors represented by $(Ca,Sr,Ba)_2B_5O_9Cl$:Eu, which is constituted by growing particles having a nearly cubic shape typical of regular crystal growth and emits light in the blue region, and europium-activated alkaline earth aluminate phosphors represented by $(Sr,Ca,Ba)Al_2O_4$:Eu or $(Sr,Ca,Ba)_4Al_{14}O_{25}$:Eu, which is constituted by fractured particles having fractured surface and emits light in the blue green region.

Other examples of the blue phosphor include: Sn-activated phosphate such as $Sr_2P_2O_7$:Sn; Eu-activated aluminate such as $(Sr,Ca,Ba)Al_2O_4$:Eu or $(Sr,Ca,Ba)_4Al_{14}O_{25}$:Eu, $BaMgAl_{10}C_{17}$:Eu, $(Ba,Sr,Ca)MgAl_{10}O_{17}$:Eu, $BaMgAl_{10}O_{17}$:Eu,Tb,Sm and $BaAl_8O_{13}$:Eu; Ce-activated thiogalate such as $SrGa_2S_4$:Ce and $CaGa_2S_4$:Ce; Eu,Mn-activated aluminate such as $(Ba,Sr,Ca)MgAl_{10}O_{17}$:Eu,Mn; Eu-activated halophosphate such as $(Sr,Ca,Ba,Mg)_{10}(PO_4)_6Cl_2$:Eu and $(Ba,Sr,Ca)_5(PO_4)_3(Cl,F,Br,OH)_2$:Eu,Mn,Sb; Eu-activated silicate such as $BaAl_2Si_2O_8$:Eu, $(Sr,Ba)_3MgSi_2O_8$:Eu; Eu-activated phosphate such as $Sr_2P_2O_7$:Eu; sulfide such as ZnS:Ag and ZnS:Ag,Al; Ce-activated silicate such as $Y_2SiO_5$:Ce; tungstate such as $CaWO_4$; Eu,Mn-activated borophosphate such as $(Ba,Sr,Ca)BPO_5$:Eu,Mn, $(Sr,Ca)_{10}(PO_4)_6.nB_2O_3$:Eu and $2SrO.0.84P_2O_5.0.16B_2O_3$:Eu; Eu-activated halosilicate such as $Sr_2Si_3O_8.2SrCl_2$:Eu; and Eu-activated oxynitride such as $SrSi_9Al_{19}ON_{31}$:Eu and $EuSi_9Al_{19}ON_{31}$.

Also applicable as the blue phosphor are fluorescent dyes such as naphthalimide compound, benzoxazole compound, styryl compound, coumarine compound, pyrazoline compound and triazole compound, and organic phosphors such as thlium complex.

Among them, it is preferable that the blue phosphor contains at least one type of phosphor selected from the group consisting of $(Ca,Sr,Ba)MgAl_{10}O_{17}$:Eu, $(Sr,Ca,Ba,Mg)_{10}(PO_4)_6(Cl,F)_2$:Eu and $(Ba,Ca,Mg,Sr)_2SiO_4$:Eu. It is more preferable that it contains at least one of $(Ca,Sr,Ba)MgAl_{10}O_{17}$:Eu, $(Sr,Ca,Ba,Mg)_{10}(PO_4)_6(Cl,F)_2$:Eu or $(Ba,Ca,Sr)_3MgSi_2O_8$:Eu. It is still more preferable that it contains at least one of $BaMgAl_{10}O_{17}$:Eu, $Sr_{10}(PO_4)_6(Cl,F)_2$:Eu or $Ba_3MgSi_2O_8$:Eu. Of these, $(Ca,Sr,Ba)MgAl_{10}O_{17}$:Eu is preferable when used for a illuminating device, and $(Sr,Ca,Ba,Mg)_{10}(PO_4)_6Cl_2$:Eu is preferable when used for a display.

[3-3-1-2-2-3. Yellow Phosphor]

When a yellow phosphor is used as the second phosphor, any kind of yellow phosphor can be used, insofar as the advantage of the present invention is not significantly impaired. It is preferable that the emission peak wavelength of the yellow phosphor is in the range of usually 530 nm or longer, preferably 540 nm or longer, more preferably 550 nm or longer, and usually 620 nm or shorter, preferably 600 nm or shorter, more preferably 580 nm or shorter.

Examples of the yellow phosphor include various phosphors of such as oxide, nitride, oxynitride, sulfide and oxysulfide.

Particularly preferable examples include garnet phosphors represented by such as $RE_3M_5O_{12}$:Ce (here, RE indicates at least one element selected from the group consisting of Y, Tb, Gd, Lu and Sm, M indicates at least one element selected from the group consisting of Al, Ga and Sc) and $M^a_3M^b_2M^c_3O_{12}$:Ce (here, $M^a$, $M^b$ and $M^c$ are divalent, trivalent and tetravalent metal element respectively), having garnet structures; orthosilicate phosphors represented by such as $AE_2M^dO_4$:Eu (here, AE indicates at least one element selected from the group consisting of Ba, Sr, Ca, Mg and Zn, Md indicates Si and/or Ge); oxynitride phosphors in which a part of oxygen, which is constituent element of the above types of phosphors, is substituted by nitrogen; and Ce-activated nitride phosphors having $CaAlSiN_3$ structures such as $AEAlSiN_3$:Ce (here, AE indicates at least one element selected from the group consisting of Ba, Sr, Ca, Mg and Zn).

Also applicable as the yellow phosphor are Eu-activated sulfide phosphors such as $CaGa_2S_4$:Eu, $(Ca,Sr)Ga_2S_4$:Eu and $(Ca,Sr)(Ga,Al)_2S_4$:Eu; Eu-activated oxynitride phosphors having SiAlON structure such as $Ca_x(Si,Al)_{12}(O,N)_{16}$:Eu.

Other examples of the yellow phosphor include fluorescent dyes such as brilliant sulfoflavine FF (Color Index Number 56205), basic yellow HG (Color Index Number 46040), eosine (Color Index Number 45380), rhodamine 6G (Color Index Number 45160).

[3-3-1-2-2-4. Other Points on Second Phosphor]

The above-mentioned second phosphor of the present invention can be used either as a single kind or as a mixture of two or more kinds in any combination and in any ratio. There is no special limitation on the ratio of the first phosphor and second phosphor, insofar as the advantage of the present invention is not significantly impaired. Accordingly, the amount of the second phosphor used, as well as the combination and the mixing ratio of phosphors used as the second phosphor, can be set arbitrarily according to the use or the like of the third light emitting device.

Whether the above-described second phosphor (an orange to red phosphor, blue phosphor or the like) is used or not and what kind of it is used, in the third light emitting device of the present invention, can be decided as appropriate depending on the use of the third light emitting device. For example when the third light emitting device of the present invention is constructed as green light emitting device, it usually requires only the first phosphor (green phosphor) without any second phosphor.

On the other hand, when the third light emitting device of the present invention is constructed as white light emitting device, it would be better to combine the first luminous body, the first phosphor (green phosphor) and the second phosphor appropriately, for the sake of obtaining the desired white color. As concrete examples of the preferable combination of the first luminous body, the first phosphor and the second phosphor, when the third light emitting device of the present invention is constructed as white light emitting device, the following combinations (i) to (iii) can be cited.

(i) A blue luminous body (blue LED or the like) as the first luminous body, a green phosphor (the phosphor of the present invention or the like) as the first phosphor, and a red phosphor as the second phosphor are used. In this case, as red phosphor preferably used is one or more than one kind of red phosphor selected from the group consisting of $(Sr,Ca)AlSiN_3$:Eu.

(ii) A near-ultraviolet luminous body (near-ultraviolet LED or the like) as the first luminous body, a green phosphor (the phosphor of the present invention or the like) as the first phosphor, and a combination of a blue phosphor and a red phosphor as the second phosphor, are used. In this case, as blue phosphor preferably used is $BaMgAl_{10}O_{17}$:Eu. As red phosphor preferably used is one or more than one kind of red phosphor selected from the group consisting of $(Sr,Ca)AlSiN_3$:Eu and $La_2O_2S$:Eu. It is particularly preferable to use a near-ultraviolet LED, the phosphor of the present invention, $BaMgAl_{10}O_{17}$:Eu as blue phosphor, and $(Sr,Ca)AlSiN_3$:Eu as red phosphor in combination.

(iii) A blue luminous body (blue LED or the like) as the first luminous body, a green phosphor (the phosphor of the present invention or the like) as the first phosphor, and an orange phosphor as the second phosphor are used. In this case, as orange phosphor, preferably used is $(Sr,Ba)_3SiO_5$:Eu.

The phosphor of the present invention can be used as a mixture with another phosphor (in this context, "mixture" does not necessarily mean to blend the phosphors with each other, but means to use different kinds of phosphors in combination). Among them, the combined use of phosphors described above will provide a preferable phosphor mixture. There is no special limitation on the kind or the ratio of the phosphors mixed.

[3-4-1. Sealing Material]

Each phosphor, used in the first, second or third light emitting device of the present invention (hereinafter, when the first, second and third light emitting devices of the present invention are indicated without specially distinguished, they are referred to simply as "the light emitting device of the present invention"), is usually used by being dispersed in a liquid medium, which serves as a sealing material.

As that liquid medium, the same ones can be cited as described in the aforementioned [2-2. Liquid medium].

The liquid medium may contain a metal element that can be a metal oxide having high refractive index, for the purpose of adjusting the refractive index of the sealing member. Examples of metal oxides having high refractive indexes include Si, Al, Zr, Ti, Y, Nb and B. These metal elements can be used as a single kind or as a mixture of two or more kinds in any combination and in any ratio.

There is no special limitation on the state of existence of such metal elements, insofar as the transparency of the sealing member does not deteriorate. For example, they may exist as a uniform glass layer of metalloxane bonds or as particles in the sealing member. When they exist in a state of particles, the structure inside the particles may be either amorphous or crystal structure. However, for higher refractive index, the crystal structure is preferable. In such a case, the particle diameter is usually equal to or smaller than the luminous wavelength of a semiconductor luminous element, and preferably 100 nm or smaller, more preferably 50 nm or smaller, particularly preferably 30 nm or smaller, in order not to impair the transparency of the sealing member. The above-mentioned metal elements can be present as particles in the sealing member, for example by adding particles of such as silicon oxide, aluminium oxide, zirconium oxide, titanium oxide, yttrium oxide, niobium oxide or the like in a silicone material.

Furthermore, the above-mentioned liquid medium may be added with known additives such as diffusing agent, filler, viscosity modifier and UV absorbing agent.

[3-4-2. (Other) Configurations of Light Emitting Device]

There is no special limitation on the other configuration of the light emitting device of the present invention, insofar as it comprises the above-mentioned excitation light source (the first luminous body) and the phosphor (the second luminous body). However, it usually comprises a frame on which the above-mentioned excitation light source (the first luminous body) and the phosphor (the second luminous body) are located. The location is configured so that the phosphor (the second luminous body) is excited by the light emitted from the excitation light source (the first luminous body) to emit light and the lights from the excitation light source (the first luminous body) and/or from the phosphor (the second luminous body) are radiated to the outside. At this point, when more than one kind of phosphors are used, the phosphors may not necessarily be contained in the same layer. The different colored phosphors may be contained in the different layers separately. For example, a layer containing the second phosphor can be piled on a layer containing the first phosphor.

The light emitting device of the present invention may also utilize a member other than the above-mentioned excitation light source (the first luminous body), the phosphor (the second luminous body) and a frame. Examples include the aforementioned sealing material. The sealing material can be used for, in addition to dispersing the phosphor (the second luminous body), adhering the excitation light source (the first luminous body), the phosphor (the second luminous body) and the frame to each other, in the light emitting device.

[3-4-3. Embodiment of Light Emitting Device]

The light emitting device of the present invention will be explained in detail below with reference to a concrete embodiment. However, it is to be noted that the present invention is by no means restricted to the following embodiment and any modifications can be added thereto insofar as they do not depart from the scope of the present invention.

FIG. 1 is a schematic perspective view illustrating the positional relationship between the first luminous body, which functions as the excitation light source, and the second luminous body, constructed as the phosphor-containing part containing a phosphor, in an example of the light emitting device of the present invention. In FIG. 1, the numeral 1 indicates a phosphor-containing part (second luminous body), the numeral 2 indicates a surface emitting type GaN-based LD as an excitation light source (first luminous body), and the numeral 3 indicates a substrate. In order to configure them so as to be in contact with each other, the LD (2) and the phosphor-containing part (second luminous body) (1), prepared separately, may be made contact with each other in their surfaces by means of adhesive or the like, or otherwise, a layer of the phosphor-containing part (second luminous body) may be formed on the emission surface of the LD (2). With such configurations, the LD (2) and the phosphor-containing part (second luminous body) (1) can be kept contact with each other.

With such device configurations, light quantity loss, induced by a leakage of light emitted from the excitation light source (first luminous body) and reflected on the layer surface of the phosphor-containing part (second luminous body) to outside, can be avoided, which makes possible enhancement in emission efficiency of the entire device.

Figure 2A:
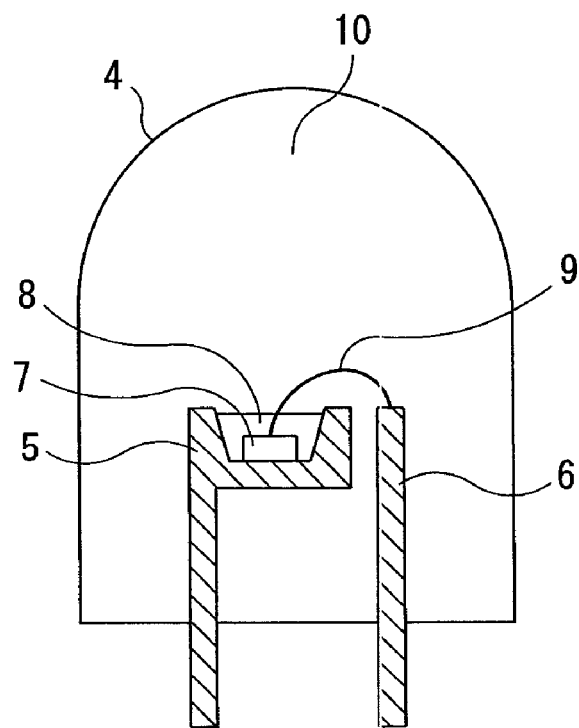
FIG. 2(a) and FIG. 2(b) are schematic sectional views illustrating an example of the light emitting device comprising an excitation light source (first luminous body) and a phosphor-containing part (second luminous body).

FIG. 2(a) shows a typical example of a light emitting device generally called a shell type. It is a schematic sectional view illustrating an example of the light emitting device comprising an excitation light source (first luminous body) and a phosphor-containing part (second luminous body). In this light emitting device (4), the numeral 5, numeral 6, numeral 7, numeral 8, numeral 9 and numeral 10 indicate a mount lead, inner lead, excitation light source (first luminous body), phosphor-containing resinous part, conductive wire and mold member, respectively.

Figure 2B:
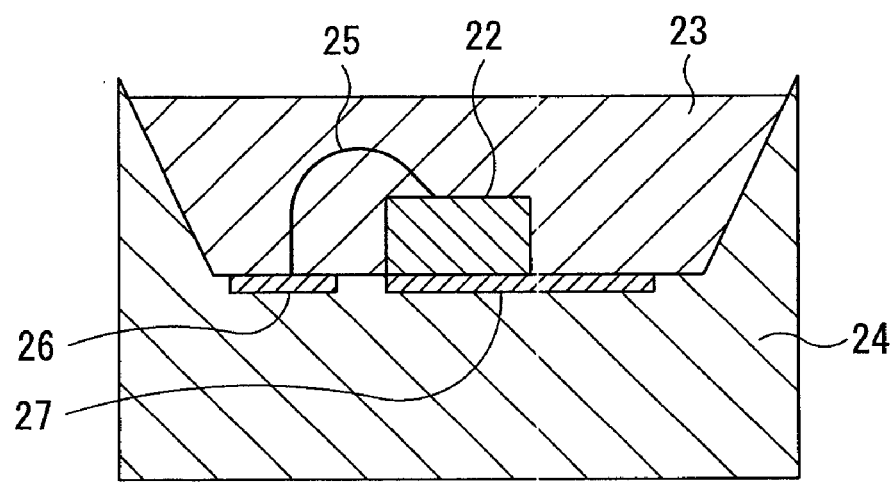

FIG. 2(b) shows a typical example of a light emitting device generally called a surface-mount type. It is a schematic sectional view illustrating an example of the light emitting device comprising an excitation light source (first luminous body) and a phosphor-containing part (second luminous body). In the Figure, the numeral 22, numeral 23, numeral 24, numeral 25 and numeral 26, 27 indicate an excitation light source (first luminous body), a phosphor-containing resinous part as phosphor-containing part (second luminous body), a frame, a conductive wire and electrodes, respectively.

[3-4-4. Other Points about the First to the Third Light Emitting Devices]

All of the above-mentioned light emitting devices of the present invention can be constructed as a white light emitting device by means of adopting a known device configuration, using an excitation light source such as described above as the excitation light source (the first luminous body), and any combined use of known phosphors such as green, red, blue and yellow phosphors such as described above. In this context, the white color of the white light emitting device includes all of (Yellowish) White, (Greenish) White, (Bluish) White, (Purplish) White and White, which are defined in JIS Z8701. Of these, preferable is White.

[3-5. Application of Light Emitting Device]

There is no special limitation on the application of the light emitting device of the present invention, and therefore it can be used in various fields where a usual light emitting device is used. However, owing to its wide color reproduction range and high color rendering, it can be preferably used as a light source of a illuminating device or an image display.

[3-5-1. Illuminating Device]

The application of the light emitting device of the present invention to a illuminating device can be carried out by incorporating a light emitting device such as described earlier into a known illuminating device as appropriate. A surface-emitting illuminating device (11), shown in FIG. 3, in which the aforementioned light emitting device (4) is incorporated, can be cited as such an example.

Figure 3:
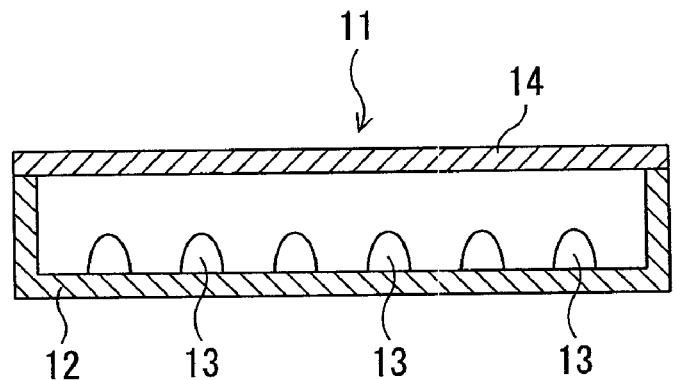
FIG. 3 is a sectional view schematically illustrating an embodiment of the illuminating device of the present invention.

FIG. 3 is a sectional view schematically illustrating an embodiment of the illuminating device of the present invention. As shown in this FIG. 3, the surface-emitting illuminating device comprises a large number of light emitting devices (13) (corresponding to the aforementioned light emitting device (4)) on the bottom surface of a rectangular holding case (12), of which inner surfaces are made opaque ones such as white smooth surfaces, and a power supply, circuit or the like (not shown) for driving the light emitting devices (13) outside the holding case. In addition, it comprises a milky-white diffusion plate (14), such as an acrylic plate, at the place corresponding to the cover part of the holding case (12), for homogenizing the light emitted.

When the surface-emitting illuminating device (11) is driven, light is emitted from the excitation light source (the first luminous body) of the light emitting device (13), due to the application with a voltage, and the aforementioned phosphor in the phosphor-containing resinous part, which serves as phosphor-containing part (the second luminous body), absorbs a part of the emitted light and then emits visible light. On the other hand, the blue light that is not absorbed in the phosphor is mixed with the visible light to form a light with high color rendering, and then it passes through the diffusion plate (14) to be radiated in the upward direction in the Figure. Consequently, an Illumination light with a brightness that is uniform within the surface of the diffusion plate (14) of the holding case (12) can be obtained.

[3-5-2. Image Display]

When the light emitting device of the present invention is applied to an image display, there is no limitation on the concrete configuration of the image display. However, typical examples such as shown in FIG. 4 and FIG. 5 can be cited.

Figure 4:
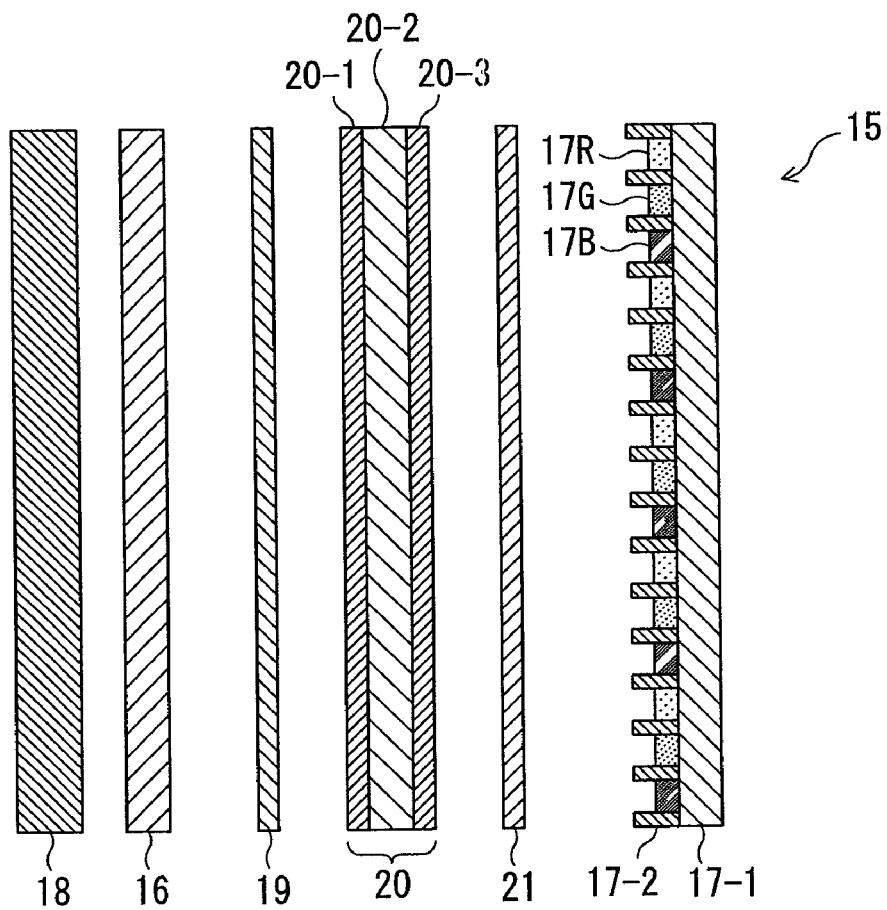
FIG. 4 is an exploded sectional view schematically illustrating the substantial part of the image display of an embodiment of the present invention.
Figure 5:
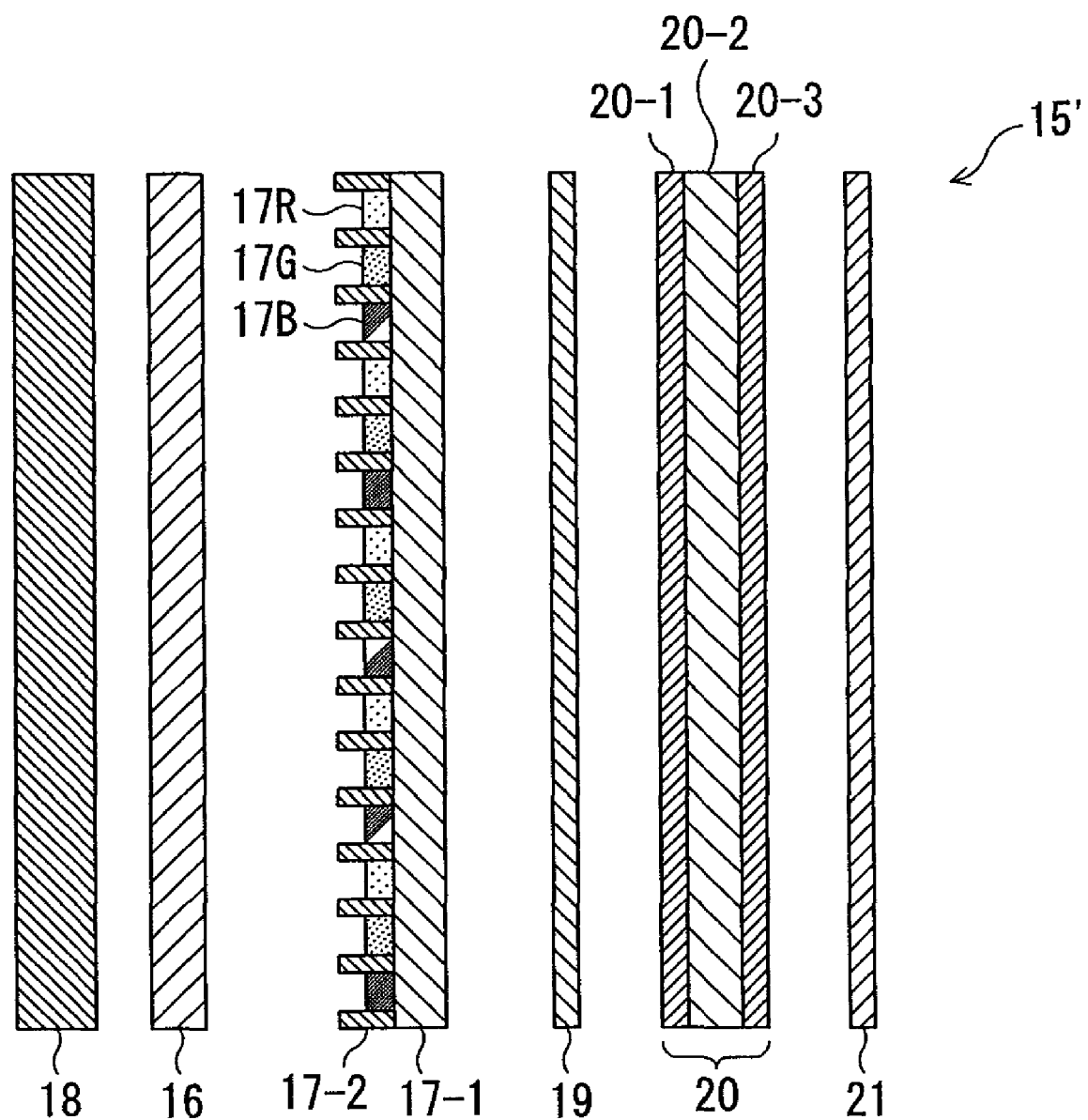
FIG. 5 is an exploded sectional view schematically illustrating the substantial part of the image display of another embodiment of the present invention.

FIG. 4 is an exploded sectional view schematically illustrating the substantial part of the image display of an embodiment of the present invention. In FIG. 4, it is assumed that an observer looks at the image shown on the display from the right side in the figure.

The display (15) of the present embodiment comprises a light source (16) which emits excitation light, and phosphor parts (17R), (17G), and (17B) containing phosphors which absorb the light emitted from the light source (16) and emit visible lights. In addition, the display (15) comprises a frame (18), a polarizer (19), a optical shutter (20) and an analyzer (21).

In the following, an explanation will be given on each of the components.

[Frame]

The frame (18) is a base to hold the light source (16) and other members constituting the display (15), and no special limitation is imposed on its shape.

There is no special limitation on the material of the frame (18), either. The examples thereof include inorganic materials such as metal, alloy, glass or carbon, and organic materials such as synthetic resin. An appropriate one can be selected according to the manner the frame is used.

At this point, it is preferable that a surface of the frame (18), irradiated with light emitted from the light source (16), has a heightened reflectance with regard to that light, from the standpoint of effective utilization of the light emitted from the light source (16) and improvement in emission efficiency of the display (15). Therefore, it is preferable that at least a surface of the frame irradiated with light is made of material having high reflectance. Examples include materials containing substances of high reflectance, such as glass fiber, alumina powder or titanium powder (resin used for injection molding and the like). It is preferable to make the entire frame (18), or the surface of the frame (18), with such materials.

There is no special limitation on the concrete method to increase the reflectance of the surface of the frame (18). In addition to selecting a suitable material for the frame (18) itself as described above, it is possible to heighten the light reflectance by plating or vapor deposition of the frame with metal or alloy having high reflectance, such as silver, platinum or aluminum.

Enhanced reflectance can be provided to only a part of the frame (18) or to the entire frame (18). It is usually preferable that all the surfaces irradiated with light emitted from the light source (16) have enhanced reflectance.

Additionally, the frame (18) is usually fitted with an electrode or a terminal, via which electric power is supplied to the light source (16). At this point, there is no special limitation on the means to connect such electrode or terminal with the light source (16). For example, the light source (16) and an electrode or a terminal can be connected by wire bonding to supply electric power. There is no limitation on the material or the size of the wire. For example, metals such as gold or aluminum can be used as materials for the wire and its thickness is usually in the range of 20 μm to 40 μm. The wires to be used, however, is by no means limited by these examples.

As another example of the method of supplying electric power to the light source (16), a method based on flip-chip mounting using a bump can be cited.

Soldering is another method for supplying electric power to the light source (16). This is because the heat dissipating property of the display (15) can be enhanced, due to excellent heat dissipating property of soldering, especially when high power LED or LD, in which the heat release matters, is used as the excitation light source (first luminous body) of the light source (16). There is no special limitation on the kind of solder. For example, AuSn or AgSn can be used.

The soldering can be used for just attaching the light source (16) on the frame (18), without being connected to an electrode or terminal to be used as power-supplying means.

When a method other than soldering is used to attach the light source (16) to the frame (18), an adhesive agent such as epoxy resin, imide resin or acrylic resin can be used, for example. In this case, a paste can be used, which is prepared by adding conductive filler such as silver particles or carbon particles to the adhesive agent, so as to make possible the power supply to the light source (16) by energizing the adhesive agent, similarly to when soldering is used. The use of such conductive filler is desirable also from the viewpoint of increasing heat dissipating property.

In the present embodiment, a flat-plate shaped frame (18) is used, of which surface is enhanced in reflectance and has a terminal (not shown in the figure) thereon to supply electric power to the light source (16). To the terminal, electric power can be supplied from a power supply (not shown in the figure).

[Light Source]

The light source (16) corresponds to the first luminous body, which emits excitation light, of the light emitting device of the present invention such as described before. The light emitted from the light source (16) serves as excitation light to excite the phosphors contained in the phosphor parts (17R), (17G), and (17B). Furthermore, the display (15) can be configured so that the observer of the display (15) can look at the light emitted from the light source (16) itself. In such a case, the light emitted from the light source (16) will also be a light from the picture element itself.

As wavelength of the light emitted from the light source (16), any one of ultraviolet region or visible region can be used, insofar as the light can excite the phosphors within the phosphor parts (17R), (17G), and (17B). A preferable range of wavelength of the light emitted from the light source is, in its main emission peak wavelength, usually 350 nm or longer, preferably 380 nm or longer, more preferably 390 nm or longer, and usually 500 nm or shorter, preferably 480 nm or shorter, more preferably 470 nm or shorter. When it falls below the above lower limit, when using a liquid crystal optical shutter as the optical shutter (20), the liquid crystal material may be destructed by the light emitted from the light source (16). On the other hand, when the upper limit of the above-mentioned range is exceeded, decrease in emission efficiency of the phosphor may induce degradation in brightness of the picture elements or narrower color reproduction range, which is not preferable.

As the excitation light emitted from the light source (16) is in the wavelength range of visible light, the light emitted from the light source (16) can be used for image display just as it is. In such a case, adjusting the quantity of light emitted from the light source (16) using the optical shutter (20) can control the brightnesses of the picture elements for which the light emitted from the light source (16) is utilized. For example when the light source (16) emits blue light with wavelength of from 450 nm to 470 nm, the blue light can be utilized just as it is for a light emitted from the picture elements of the display (15). In this case, wavelength conversion using a phosphor is not necessary, and therefore, phosphor parts corresponding to the blue picture elements can be omitted.

Examples of the light source include an LED, fluorescent lamp, edge-emitting type or surface-emitting type of LD, and electroluminescence device. Of these, an LED or fluorescent lamp is usually preferable. As fluorescent lamp, a conventionally-used cold-cathode tube or hot-cathode tube can be used. However, since the use of a white light will let the blue, green and red light-emitting areas be mixed with other colors, it is preferable that the near-ultraviolet region is separated from the white light using a filter or the like. Particularly preferable is a fluorescent lamp coated with only a near-ultraviolet phosphor, in view of decreased power consumption.

Examples of a phosphor used for a fluorescent lamp include $SrMgP_2O_7$:Eu (luminous wavelength: 394 nm), $Sr_3(PO_4)_2$:Eu (luminous wavelength: 408 nm), $(Sr,Ba)Al_2Si_2O_8$:Eu (luminous wavelength: 400 nm), $Y_2Si_2O_7$:Ce (luminous wavelength: 385 nm), $ZnGa_2O_4$:Li,Ti (luminous wavelength: 380 nm), $YTaO_4$:Nb (luminous wavelength: 400 nm), $CaWO_4$:Ce (luminous wavelength: 410 nm), BaFX:Eu (where X is a halogen, luminous wavelength: 380 nm), $(Sr, Ca)O.2B_2O_3$:Eu (luminous wavelength: 380 nm to 450 nm), $SrAl_{12}O_{14}$:Eu (luminous wavelength: 400 nm) and $Y_2SiO_5$:Ce (luminous wavelength: 400 nm). These phosphors can be used either as a single kind or as a mixture of two or more kinds in any combination and in any ratio.

On the other hand, as an LED light source, a near-ultraviolet inorganic semiconductor LED with high brightness can be used, which is commercially-available recently. This type of light source can be used for a back-lighting. This near-ultraviolet emitting inorganic semiconductor LED can be used particularly preferably, because it can emit light that has a preferable wavelength region for the present invention selectively. Preferable examples of the LED light source include a known blue LED of single or multiple quantum well structure, having InGaN luminous layer, and a known near-ultraviolet LED of single or multiple quantum well structure, having AlInGaN, GaN or AlGaN luminous layer.

In addition, the light emitted from the light source (16) can enter directly to the phosphor parts (17R), (17G), and (17B), as well as after converted into a planar emission using an optical waveguide or light-diffusion plate. Or otherwise, it can enter the phosphor parts (17R), (17G), and (17B) after reflected on a reflection plate, which is disposed appropriately. With a reflection plate, similar to the aforementioned frame (18) having high reflectance, desposed on the backside (the opposite side to the optical shutter (20)) of the light source (16), the utilization efficiency of the light emitted from the light source (16) can be enhanced.

There is no limitation or the conversion mechanism for converting the light emitted from the light source (16) into a planar emission. Examples include any one of, or preferably any combination of an optical waveguide, such as quartz plate, glass plate or acrylic plate, a reflection mechanism, such as Al sheet or various metal-evaporated films, and a light-diffusion mechanism, such as a pattern using $TiO_2$ compounds, light-diffusion sheet or light-diffusion prism. Among them, a conversion mechanism that converts the light into a planar light by constituting the light source (16) into a surface-emitting luminous body using an optical waveguide, reflection plate, diffusion plate or the like can be used preferably in the present embodiment. As another example, a conversion mechanism currently used for a liquid crystal display or the like can also be used preferably.

There is no limitation on the means of installing the light source (16) on the frame (18), and therefore, any known one can be used. Accordingly, the light source (16) can be installed on the frame (18) by such a method as soldering and the like, as described earlier.

In the present embodiment, a surface-emitting luminous body, which emits planar light, is used as the light source (16). In addition, it is assumed that the electric power is supplied to the light source (16) via an interconnection circuit, a wire or the like by means of connecting the terminal on the frame (18) and the electrode of the light source (16) electrically.

[Polarizer]

It is preferable that a polarizer (19) is disposed forward (right side in the figure) of the light source (16), more specifically, between the light source (16) and the optical shutter (20). The polarizer (19) is provided for the purpose of selecting the light in the predetermined direction, from the lights emitted from the light source (16). Also in the present embodiment, the polarizer (19) is assumed to be located between the light source (16) and the optical shutter (20).

[Optical Shutter]

The optical shutter (20) of the present embodiment adjusts the light quantity of the light radiated thereon and lets it pass through. More specifically, it adjusts the light quantities of lights, radiated on its backside, separately for each picture element, in accordance with the image to be displayed, and lets them pass through forward. In the case of the present embodiment, the optical shutter (20) adjusts the light quantities of the lights emitted from the light source (16) toward the phosphor parts (17R), (17G), and (17B), separately for each picture element, and lets them pass through forward. Even when the light emitted from the light source (16) is used just as it is as the light from the picture element, the optical shutter (20) adjusts the light quantity of the light emitted from the light source (16) and lets them pass through forward.

More specifically, when the display (15) is constructed as a multicolor or full-color display, two or more kinds of the above-mentioned phosphors are disposed, independently from each other, at the area specified for the light-wavelength conversion mechanism (namely, phosphor parts (17R), (17G), and (17B)). In the display (15) of the present embodiment, the light quantities of the lights emitted from the phosphor parts (17R), (17G), and (17B) can be adjusted by controlling the respective light quantities of the excitation lights radiated onto the phosphor parts (17R), (17G), and (17B)

using the optical shutter (20), and thus a desired image can be displayed with multicolored emission.

Some kind of optical shutter (20) can adjust the light quantity only of the light having a limited wavelength region. Accordingly, as the optical shutter (20), the one that car adjust the light quantity with respect to the wavelength region of the light emitted from the light source (16) for switching lights should be used. Meanwhile, the optical shutter (20) may adjust the light quantity of the light emitted from the phosphor parts (17R), (17G), and (17B), not from the light source (16), depending on the configuration of the display (15).

In such a case, the one that can adjust the light quantity of the light having a wavelength region of light emitted from the phosphor parts (17R), (17G), and (17B), for switching lights, should be used. Because the center wavelength of the light emitted from the light source (16) or the phosphor parts (17R), (17G), and (17B) is usually 350 nm or longer and 780 nm or shorter, and preferably 420 nm or shorter, it is desirable to use an optical shutter (20) that can adjust the light quantity of the light in such wavelength region.

The mechanism of the optical shutter (20) usually consists of a collective of a plurality of picture elements (pixels). However, the number, size and arrangement pattern vary, depending on the display size, display format, use or the like, and thus they are not limited to specific constant values. Accordingly, there is no limitation on the size of the picture elements of the optical shutter (20) either, insofar as the advantage of the present invention is not significantly impaired.

For example, when used for a common display, the size of one picture element is preferably 500 μm square or smaller. Further, concerning a favorable pixel size, it is more preferable that the number of the picture elements is around 640× 3×480 and the size of one pixel of a monochromatic color is around 100×300 μm, following the values of a liquid crystal display in practical use at present.

In addition, there is no limitation on the number or size of the optical shutter (20) itself either, insofar as the advantage of the present invention is not significantly impaired. For example, it is useful the optical shutter (20) has a thickness of usually 5 cm or smaller. It is preferable that the thickness is 1 cm or smaller from the viewpoint of a thinner and lighter system of the display.

When the display (15) is formed to be a flat type, an optical shutter (20) that can change the light transmittance of the picture elements to any value arbitrarily by electrical control can be preferably used, to make possible the display of halftones. The higher the absolute value of the light transmittance, the contrast of its change and the velocity response are, the more preferable.

Examples of the optical shutter (20) satisfying such requirements include a transmission type liquid crystal optical shutter such as TFT (Thin Film Transistor) type, STN (Super Twisted Nematic liquid crystal) type, ferroelectric type, antiferroelectric type, guest-host type using dichroism pigment and PDN (Polymer Dispersed Network) type in which polymer is dispersed; and electrochromic or chemical-chromic materials typified by tungsten oxide, iridium oxide, prussian blue, viologen derivatives, TTF-polystyrene, rare-earth diphthalocyanine complex, polythiophene and polyaniline. Among them, a liquid crystal optical shutter is preferably used because of its thin, light and low-power consumption characteristics and possibility of high-density segments due to its practical durability. Particularly preferable is a liquid crystal optical shutter of TFT active matrix type or PDN type. This is because the active matrix type utilizing a twisted nematic liquid crystal can realize high-speed response that can keep up with a moving image and no cross talk, and the PDN type, which requires no polarizer (21), and so leads to less attenuation of the light from a light source (16) or phosphor parts (17R), (17G), and (17B), can realize high-brightness light emission.

Further, a control part (not shown in the figure) is usually provided in the display (15) for controlling the optical shutter (20) so that it adjusts the light quantity of each picture element separately in accordance with the image to be displayed on the display (15). The optical shutter (20) functions to adjust the light quantity of the visible light emitted from each picture element in response to the control from the control part, thereby a desired image can be displayed on the display (15).

The adjustment of the brightness of each picture element using an optical shutter (20) can simplify the control circuit of the control part in the display (15). For example when the brightness adjustment of the picture element is carried out by controlling the emission intensity or the like of an LED, used as light source (16), the current-brightness characteristics of the LED will change with time, which may lead to a complicated control circuit for controlling the image to be displayed. In contrast to that, when the brightness adjustment of the picture element is carried out by an optical shutter (20), which is mostly voltage-controlled, like in the case of a liquid crystal optical shutter, to adjust the light quantity of the light emitted from the light source (16), like in the present embodiment, the control circuit for the brightness adjustment can be simplified.

In the present embodiment, a liquid crystal optical shutter, in which a back electrode (20-1), a liquid crystal layer (20-2) and a front electrode (20-3) are laminated in this order, is used as the optical shutter (20), and the optical shutter (20) is located forward (right side in the figure) of the polarizer (19). The back electrode (20-1) and front electrode (20-3) are assumed to be formed of transparent electrodes which do not absorb the light used for the display (15). In this liquid crystal optical shutter, the voltage applied to the back electrode (20-1) and front electrode (20-3) controls the molecular arrangement of the liquid crystal in the liquid crystal layer (20-2), and the molecular arrangement adjusts the light quantity of each light incident from the backside, for each picture element (namely, for each phosphor part (17R), (17G), and (17B)) separately.

[Analyzer]

Usually, an analyzer (21) to receive light of which light quantity is adjusted when passing through the optical shutter (20) is disposed forward of the optical shutter (20). The analyzer (21) selects lights having just a specified polarization planes from the lights that passed through the optical shutter (20).

Also in the present embodiment, it is assumed that an analyzer (21) is disposed forward of the optical shutter (20), more specifically, between the optical shutter (20) and the phosphor parts (17R), (17G), and (17B)

[Phosphor Part]

Phosphor parts (17R), (17G), and (17B) are the parts that contain phosphors absorbing the excitation light emitted from the light source (16) and then emitting visible lights for forming an image to be displayed on the display (15). Further, phosphor parts (17R), (17G), and (17B) are arranged one by one, corresponding to each picture element, and each of them emits light which is regarded as light emitted from each of the picture elements of the display (15). Consequently, in the present embodiment, the observer recognizes the image by seeing fluorescences emitted from these phosphor parts (17R), (17G), and (17B).

Regarding the phosphors used in the above-mentioned phosphor parts, any kind of phosphors can be used, insofar as at least the phosphor according to the present invention is used as the green phosphor and the advantage of the present invention is not significantly impaired. Concrete examples of these phosphors include those exemplified for the aforementioned first phosphor and second phosphor.

Furthermore, the phosphor can be prepared by blending one or more than one kind of phosphors. There is no limitation on the luminescent color of the phosphors, because the appropriate color varies depending on the use. For example when a full-color display is produced, blue, green and red luminous bodies with high color purities are preferably used. There are several methods for expressing the appropriate colors. As an easy method, the center wavelength, CIE chromaticity coordinates or the like of the emitted light can be used. When the light-wavelength conversion mechanism is for a monochrome display or multicolor display, it is preferable to contain phosphors showing colors of purple, purple blue, yellow green, yellow and orange. In addition, two or more of these phosphors can be mixed to obtain a light emission with high color purity or obtain an intermediate-color or white light emission.

Further, a binder is used to the phosphor parts (17R), (17G), and (17B) to protect the phosphors from external force of external environment, moisture or the like.

There is no special limitation on the kind of the binder, insofar as it is usually used in this use. A colorless and transparent material, such as the above-mentioned liquid medium, is used for the binder.

In the phosphor parts (17R), (17G), and (17B), there is no limitation on the content ratio of the binder in the phosphor parts (17R), (17G), and (17B), insofar as the advantage of the present invention is not significantly impaired. However, it is usually 5 weight parts or more, preferably 10 weight parts or more, and usually 95 weight parts or less, preferably 90 weight parts or less, with respect to 100 weight parts of the phosphor. When it falls below the lower limit of the range, the phosphor parts (17R), (17G), and (17B) may be fragile. The emission intensity may be low when the upper limit is exceeded.

To the phosphor parts (17R), (17G), and (17B), an additive other than binder or phosphor can be added. As additive, for example, a diffusing agent can be used for wider viewing angle. Concrete examples of the diffusing agent include barium titanate, titanium oxide, aluminium oxide and silicon oxide. As another additive, for example, an organic or inorganic coloring dye or coloring pigment can be used, for the purpose of cutting off the wavelengths not desired. These additives can be used either as a single kind or as a mixture of two or more kinds in any combination and in any ratio.

Further, the phosphor parts (17R), (17G), and (17B) can be prepared by any known method. For example, the phosphor parts (17R), (17G), and (17B) can be formed on a transparent substrate (17-1) by the screen printing method using a mixture (coating liquid) comprising a binder, phosphors and solvent, in an arrangement of mosaic, array or stripe, with an interval corresponding to the picture elements of the optical shutter (20).

Further, a black matrix layer (17-2) can be formed between each of the phosphor parts (17R), (17G), and (17B) for absorbing the light from outside. The black matrix layer (17-2) can be formed through the process of producing a light-absorption film composed of carbon black on a transparent substrate (17-1) such as a glass, utilizing the photosensitivity principle of a photosensitive resin. Or otherwise, it can be formed by laminating a mixture comprising a resin, carbon black and a solvent by screen printing.

Further, there is no limitation on the arrangement of the phosphor parts (17R), (17G), and (17B). For example when the display (15) is constructed to be of multicolor, phosphors, having predetermined emission colors, are disposed in the light-emitting regions such as phosphor parts (17R), (17G), and (17B), in accordance with the arrangement of pixels of the optical shutter mechanism. Examples of the arrangement of the phosphor parts (17R), (17G), and (17B) include a segment-display type, used for displaying numbers, and dot-matrix type. Preferable examples of the dot-matrix type are a stripe arrangement and delta arrangement. Moreover, for monochrome display, in addition to the above-mentioned arrangements, a phosphor coated uniformly can be used.

Further, there is no limitation on the dimension of the phosphor parts (17R), (17G), and (17B). For example, no particular limitation is imposed on its thickness, insofar as the advantage of the present invention is not significantly impaired. Usually, they can be preferably used with a thickness of 1 cm or smaller. Moreover, the thickness is preferably 2 mm or smaller when they are used for a flat-panel display, in which thickness reduction and weight reduction are demanded. In consideration of the balance with the output rate of the light beam, the thickness is usually 1 μm or larger, preferably 5 μm or larger, more preferably 10 μm or larger, and usually 1000 μm or smaller, preferably 500 μm or smaller, more preferably 200 μm or smaller.

Incidentally, as described earlier, when the light source (16) emits a visible light such as a blue light, the visible light, emitted from the light source (16), can be used as the light emitted from the picture elements. In that case, a phosphor part that emits fluorescence of the same color as that visible light is not essential. For example when a blue-light emitting LED is used as the light source (16), a phosphor part containing a blue phosphor is not necessary. Accordingly, when a visible light emitted from the light source (16) is radiated outside from the display (15) after the adjustment of its light quantity using an optical shutter, it is not necessary to use phosphors for all of the picture elements. However, also in such a case, it is preferable that the visible light emitted from the light source (16) passes through a light-transmitting portion in which an additive is contained in a binder, for the sake of effective radiation of the visible light emitted from the light source (16) to the outside, scattering it or cutting off the light with undesired wavelengths.

When the above-mentioned image display is put to use, the light source (16) is made to emit light with a predetermined intensity. The light emitted from the light source (16) enters the optical shutter (20), after the polarization plane thereof is aligned by the polarizer (19).

The optical shutter (20) adjusts the light quantities of the lights incident from the backside for each of the picture elements separately in accordance with the image to be displayed by the control of the control part (not shown in the figure), before they pass through the shutter to the front side. More specifically, it adjusts the orientation of the liquid crystals corresponding to each position of the picture element by means of a control of the voltage applied to the transparent electrodes (20-1) and (20-3), thereby the lights incident from the backside can pass through it to the front side as their intensions are adjusted for each of the picture elements separately.

The lights, passed through the optical shutter (20), enter each of the corresponding phosphor parts (17R), (17G), and (17B) via the analyzer (21).

In the phosphor part (17R), red phosphors, dispersed within the phosphor part (17R), absorb the incident light and emit red fluorescences. In the phosphor part (17G), green phosphors, dispersed within the phosphor part (17G), absorb the incident light and emit green fluorescences. In the phosphor part (17B), blue phosphors, dispersed within the phosphor part (17B), absorb the incident light and emit blue fluorescences.

At this moment, because the light quantities of the fluorescences (visible lights), emitted from each phosphor part (17R), (17G), and (17B), are already adjusted for each of the picture elements separately when the light quantities of the incident lights are adjusted by the optical shutter (20) in accordance with the image to be displayed for each of the picture elements separately, the desired image can be formed.

The red, green and blue fluorescences emitted here are radiated outside (right side in the figure) of the display (15) after passing through the transparent substrate (17-1). The observer recognizes the image by seeing the lights emitted from the surface of this transparent substrate (17-1).

With the above-mentioned configuration, coloring of the binder, contained in the phosphor parts (17R), (17G), and (17B), induced by light degradation can be prevented in the image display (15). This leads to the possibility of preventing degradation with time of color or brightness of the image shown on the image display (15).

Moreover, with the above-mentioned display, the water content in the phosphor parts (17R), (17G), and (17B) can be decreased compared to the previous ones. This makes possible the inhibition of deterioration of the phosphors contained in the phosphor parts (17R), (17G), and (17B).

Further, in the above-mentioned image display (15), decrease in brightness or change in colors of the picture elements, depending on the viewing angle, can be prevented, unlike a display utilizing a liquid crystal optical shutter.

FIG. 5 is an exploded sectional view schematically illustrating the substantial part of the image display of another embodiment of the present invention. In FIG. 5, it is assumed that an observer looks at the image shown on the display from the right side in the figure. In FIG. 5, components designated by the same reference numerals as in FIG. 4 are the same as those of FIG. 4.

In the image display (15'), phosphor parts are disposed between a light source (16) and a polarizer (19). In the present image display, the same components as for the aforementioned display (15) can be used.

It is preferable that black matrixes (not shown in the figure) are provided between each of the picture elements of the optical shutter (20). Black matrix has a function to blacken gaps between the picture elements for better visibility of the display. As material for the black matrix, for example, chromium, carbon, or resin in which carbon or other black material is dispersed can be used, but they are by no means restrictive. In the present embodiment, because the observer looks at the light that passed through the optical shutter (20), the black matrix is provided in the optical shutter.

The display (15') of the present embodiment, of which arrangement order of the components is changed as described above, is constructed so that the optical shutter (20) adjusts light quantities of the lights emitted from the phosphor parts (17R), (17G), and (17B) for each of the picture elements separately before they pass through the shutter toward the front side. In other words, it has such a configuration that the phosphors within the phosphor parts (17R), (17G), and (17B) emit lights by the excitation light that is emitted from the light source (16) and entered the phosphor parts (17R), (17G), and (17B) and the light quantities of the lights emitted from the phosphors within the phosphor parts (17R), (17G), and (17B) are adjusted by the optical shutter (20) before they pass through the shutter toward the front side. Then the lights, of which light quantities are adjusted by the optical shutter (20), will form a desired image on the display (15') by multicolored emission.

Accordingly, with respect to the optical shutter (20), the one that can adjust the light quantity with respect to the wavelength region of the light emitted from the light source (16) should be used in the image display (15), but in the display (15') of the present embodiment, the one that can adjust the light quantity with respect to the wavelength region of the light emitted from the phosphor parts (17R), (17G), and (17B) should be used. More specifically, in the optical shutter (20) of the present embodiment, the voltage applied to the back electrode (20-1) and front electrode (20-3) controls the molecular arrangement of the liquid crystal in the liquid crystal layer (20-2), and the molecular arrangement adjusts the light quantity of each light incident from the backside, for each of the picture elements separately.

The light that passed through the optical shutter (20) is radiated on the analyzer (21). At this moment, because the light quantities of the fluorescences, emitted from the phosphor parts (17R), (17G), and (17B), are already adjusted by the optical shutter (20) for each of the picture elements separately, the fluorescences incident on the analyzer (21) will form the desired image. The observer recognizes the image by seeing the lights emitted from the surface of the analyzer (21).

With the above-mentioned configuration, coloring of the binder, contained in the phosphor parts (17R), (17G), and (17B), induced by light degradation can be prevented in the display (15'). This leads to the possibility of preventing degradation with time of color or brightness of the image shown on the image display (15').

Moreover, with the above-mentioned image display (15'), the water content in the phosphor parts (17R), (17G), and (17B) can be decreased compared to the previous ones. This makes possible the inhibition of deterioration of the phosphors contained in the phosphor parts (17R), (17G), and (17B).

Further, in the image display (15'), an influence due to the decay characteristic of the phosphors within the phosphor parts (17R), (17G), and (17B) can be eliminated, unlike a conventional display utilizing a liquid crystal optical shutter. A phosphor occasionally emits fluorescence even after stopping the light irradiation for a predetermined time. This time, for which fluorescence is emitted after light irradiation, is called decay characteristic. As decay characteristic differs depending on the phosphors, there is a tendency to enhance a specific color of an image displayed on a conventional display, which is one of causes of high cost and complicated control. However, by the configuration of the image display (15'), the above-mentioned influence of the decay characteristic can be eliminated and enhancement of the specific color of an image can be prevented.

This also leads to a simpler control circuit of the control part, similar to the case of the image display (15).

[Others]

The image display of the present invention is by no means limited to the above-mentioned embodiment of the image display, but, each component thereof can be replaced arbitrarily.

For example, though such a case that an image is displayed using three kinds of red, green and blue lights was explained in the above-mentioned embodiment, a light other than the above-mentioned red, green and blue lights can be used for image display. Moreover, two kinds of or four or more kinds of lights can be used for image display.

Or otherwise, the light emitted from the light source (16) can be used directly as the light from the picture element, in a part of the picture elements, for example.

Furthermore, a reflection type configuration can be adopted, in which the light emitted from the light source (16) does not pass through the phosphor parts (17R), (17G), and (17B) but is reflected at the phosphor parts (17R), (17G), and (17B). More specifically, the light source (16) can be located forwarder of the phosphor parts (17R), (17G), and (17B) in the image display (15), for example.

Further, the intensity of the lights emitted from the light source (16) may be controlled to obtain the desired brightness of each picture element for each of the picture elements separately not by an optical shutter (20), but by adjusting the currents supplied to each of the light sources (16), which are provided corresponding to each picture element separately.

In addition, the above-mentioned components such as light source (16), phosphor parts (17R), (17G), (17B), frame (18), polarizer (19), optical shutter (20) and analyzer (21) can be used in any combination, insofar as they do not depart from the scope of the present invention.

Moreover, still another component can be incorporated in the image display of the present invention. For example, a protective film can be adopted, as described in Japanese Patent Laid-Open Publication (Kokai) No. 2005-884506, in [0039] and the following sections.

Further, to the above components, films having various functions, such as antireflection layer, orientation film, phase difference film, brightness improvement film, reflection film, semitransparent reflection film and light diffusion film, can be added or laminated.

Films having these optical functions can be formed, for example by methods such as described below.

A layer having a function of phase difference film can be formed, for example by a stretching treatment disclosed in Japanese Patent Publications No. 2841377 and No. 3094113 or a treatment disclosed in Japanese Patent Publication No. 3168850.

A layer having a function of brightness improvement film can be formed, for example by forming a microporous structure following methods disclosed in Japanese Patent Laid-Open Publications (Kokai) No. 2002-169025 and No. 2003-29030 or by overlaying two or more of cholesteric liquid crystal layers having different center wavelengths of selective reflection.

A layer having a function of reflection film or semitransparent reflection film can be formed, for example by using a metallic thin film prepared by vapor deposition, sputtering or the like.

A layer having a function of diffusion film can be formed by coating a resin solution containing microparticles onto the above-mentioned protective film.

A layer having a function of phase difference film or optical compensation film can be formed by coating and orienting a liquid crystal compound such as discotic liquid crystal compound or nematic liquid crystal compound.

[4. Multinary Oxynitride]

The multinary oxynitride of the present invention is represented by the general formula [II].

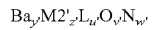  [II]

(In the general formula [II],

M2' represents at least one kind of a metal element selected from the group consisting of Sr, Ca, Mg, Zn, Cr, Mn, Fe, Y, La, Ce, Pr, Nd, Sm, Eu, Gd, Tb, Dy, Ho, Er, Tm, Yb and Lu, L represents a metal element selected from the metal elements belonging to the fourth group or the fourteenth group of the periodic table, and y', z', u', v' and w' are the numeric values in the following ranges:

$$0 \leq y' \leq 3$$

$$2.6 \leq y'+z' \leq 3$$

$$5 \leq u' \leq 7$$

$$9 < v' < 15$$

$$0 < w' < 4.)$$

The multinary oxynitride of the present invention is a novel compound and corresponds to the host crystal of the phosphor of the present invention.

In the above general formula [II], M2' represents at least one kind of a metal element selected from the group consisting of Sr, Ca, Mg, Zn, Cr, Mn, Fe, Y, La, Ce, Pr, Nd, Sm, Eu, Gd, Tb, Dy, Ho, Er, Tm, Yb and Lu. Of these, the same ones as described for M1 and M2 in the general formula [I] are preferable.

In the above-mentioned general formula [II], L is the same as described in the general formula [I].

In the above-mentioned general formula [II], y' is a numeric value of usually 0 or larger, preferably 1 or larger, more preferably 1.5 or larger, and usually 3 or smaller.

In the above-mentioned general formula [II], y'+z' is a numeric value of usually 2.6 or larger, preferably 2.7 or larger, more preferably 2.8 or larger, and usually 3 or smaller.

In the above-mentioned general formula [II], u' is a numeric value of usually 5 or larger, preferably 5.2 or larger, more preferably 5.5 or larger, and usually 7 or smaller, preferably 6.8 or smaller, more preferably 6.5 or smaller.

In the above-mentioned general formula [II], v' is a numeric value of usually larger than 9, preferably 10 or larger, more preferably 11 or larger, and usually 15 or smaller, preferably 14 or smaller, more preferably 13 or smaller.

In the above-mentioned general formula [II], w' is a numeric value of usually larger than 0, preferably 1 or larger, more preferably 1.5 or larger, and usually smaller than 4, preferably 3 or smaller, more preferably 2.5 or smaller.

Preferable examples of the multinary oxynitride of the present invention include $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_6O_{12}N_2$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_6O_9N_4$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_6O_3N_8$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_7O_{12}N_{8/3}$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_8O_{12}N_{14/3}$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_8O_{12}N_6$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_{28/3}O_{12}N_{22/3}$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_{29/3}O_{12}N_{26/3}$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_{6.5}O_{13}N_2$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_7O_{14}N_2$, $(Sr,Ca,Mg,Ba,Zn,Cr,Mn,Fe,Ce,Pr,Nd,Sm,Eu,Gd,Tb,Dy,Ho,Er,Tm,Yb)_3(Si,$ $Ge)_8O_{16}N_2$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_9O_{18}N_2$, $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_{10}O_{20}N_2$ and $(Sr,Ca,Mg,Ba,Zn,Cr,Mn,Fe,Ce,Pr,Nd,Sm,Eu,Gd,Tb,Dy,Ho,Er,Tm,Yb)_3(Si,Ge)_{11}O_{22}N_2$.

More preferable examples include $Ba_3(Si,Ge)_6O_{12}N_2$, $Ba_3(Si,Ge)_6O_9N_4$, $Ba_3(Si,Ge)_6O_3N_8$, $Ba_3(Si,Ge)_7O_{12}N_{8/3}$, $Ba_3(Si,Ge)_8O_{12}N_{14/3}$, $Ba_3(Si,Ge)_8O_{12}N_6$, $Ba_3(Si,Ge)_{28/3}O_{12}N_{22/3}$, $Ba_3(Si,Ge)_{29/3}O_{12}N_{26/3}$, $Ba_3(Si,Ge)_{6.5}O_{13}N_2$, $Ba(Si,Ge)_7O_{14}N_2$, $Ba_3(Si,Ge)_8O_{16}N_2$, $Ba_3(Si,Ge)_9O_{18}N_2$, $Ba_3(Si,Ge)_{10}O_{20}N_2$, $Ba_3(Si,Ge)_{11}O_{22}N_2$, $(Ba,Ca)_3Si_6O_{12}N_2$, $(Ba,Ca)_{33}Si_6O_9N_4$, $(Ba,Ca)_{33}Si_6O_3N_8$, $(Ba,Ca)_3Si_7O_{12}N_{8/3}$, $(Ba,Ca)_3Si_8O_{12}N_{14/3}$, $(Ba,Ca)_3Si_8O_{12}N_6$, $(Ba,Ca)_3Si_{28/3}O_{12}N_{22/3}$, $(Ba,Ca)_3Si_{29/3}O_{12}N_{26/3}$, $(Ba,Ca)_3Si_{6.5}O_{13}N_2$, $(Ba,Ca)_3Si_7O_{14}N_2$, $(Ba,Ca)_3Si_8O_{16}N_2$, $(Ba,Ca)_3Si_9O_{18}N_2$, $(Ba,Ca)_3Si_{10}O_{20}N_2$, $(Ba,Ca)_3Si_{11}O_{22}N_2$, $(Ba,Sr)_3Si_6O_{12}N_2$, $(Ba,Sr)_3Si_6O_9N_4$, $(Ba,Sr)_3Si_6O_3N_8$, $(Ba,Sr)_3Si_7O_{12}N_{8/3}$, $(Ba,Sr)_3Si_8O_{12}N_{14/3}$, $(Ba,Sr)_3Si_8O_{12}N_6$, $(Ba,Sr)_3Si_{28/3}O_{12}N_{22/3}$, $(Ba,Sr)_3Si_{29/3}O_{12}N_{26/3}$, $(Ba,Sr)_3Si_6O_5O_{13}N_2$, $(Ba,Sr)_3Si_7O_{14}N_2$, $(Ba,Sr)_3Si_8O_{16}N_2$, $(Ba,Sr)_3Si_9O_{18}N_2$, $(Ba,Sr)_3Si_{10}O_{20}N_2$, $(Ba,Sr)_3Si_{11}O_{22}N_2$, $(Ba,Mn)_3Si_6O_{12}N_2$, $(Ba,Mn)_3Si_6O_9N_4$, $(Ba,Mn)_3Si_6O_3N_8$, $(Ba,Mn)_3Si_7O_{12}N_{8/3}$, $(Ba,Mn)_3Si_8O_{12}N_{14/3}$, $(Ba,Mn)_3Si_8O_{12}N_6$, $(Ba,Mn)_3Si_{28/3}O_{12}N_{22/3}$, $(Ba,Mn)_3Si_{29/3}O_{12}N_{26/3}$, $(Ba,Mn)_3Si_{6.5}O_{13}N_2$, $(Ba,Mn)_3Si)_7O_{14}N_2$, $(Ba,Mn)_3Si_8O_{16}N_2$, $(Ba,Mn)_3Si_9O_{18}N_2$, $(Ba,Mn)_3Si_{10}O_{20}N_2$, $(Ba,Mn)_3Si_{11}O_{22}N_2$, $(Ba,Pr)_3Si_6O_{12}N_2$, $(Ba,Pr)_3Si_6O_9N_4$, $(Ba,Pr)_3Si_6O_3N_8$, $(Ba,Pr)_3Si_7O_{12}N_{8/3}$, $(Ba,Pr)_3Si_8O_{12}N_{14/3}$, $(Ba,Pr)_3Si_8O_{12}N_6$, $(Ba,Pr)_3Si_{28/3}O_{12}N_{22/3}$, $(Ba,Pr)_3Si_{29/3}O_{12}N_{26/3}$, $(Ba,Pr)_3Si_{6.5}O_{13}N_2$, $(Ba,Pr)_3Si_7O_{14}N_2$, $(Ba,Pr)_3Si_8O_{16}N_2$, $(Ba,Pr)_3Si_9O_{18}N_2$, $(Ba,Pr)_3Si_{10}O_{20}N_2$, $(Ba,Pr)_3Si_{11}O_{22}N_2$, $(Ba,Nd)_3Si_6O_{12}N_2$, $(Ba,Nd)_3Si_6O_9N_4$, $(Ba,Nd)_3Si_6O_3N_8$, $(Ba,Nd)_3Si_7O_{12}N_{8/3}$, $(Ba,Nd)_3Si_8O_{12}N_{14/3}$, $(Ba,Nd)_3Si_8O_{12}N_6$, $(Ba,Nd)_3Si_{28/3}O_{12}N_{22/3}$, $(Ba,Nd)_3Si_{29/3}O_{12}N_{26/3}$, $(Ba,Nd)_3Si_{6.5}O_{13}N_2$, $(Ba,Nd)_3Si_7O_{14}N_2$, $(Ba,Nd)_3Si_8O_{16}N_2$, $(Ba,Nd)_3 Si_9O_{18}N_2$, $(Ba,Nd)_3Si_{10}O_{20}N_2$, $(Ba,Nd)_3Si_{11}O_{22}N_2$, $(Ba,Sm)_3Si_6O_{12}N_2$, $(Ba,Sm)_3Si_6O_9N_4$, $(Ba,Sm)_3Si_6O_3N_8$, $(Ba,Sm)_3Si_7O_{12}N_{8/3}$, $(Ba,Sm)_3Si_8O_{12}N_{14/3}$, $(Ba,Sm)_3Si_8O_{12}N_6$, $(Ba,Sm)_3Si_{28/3}O_{12}N_{22/3}$, $(Ba,Sm)_3Si_{29/3}O_{12}N_{26/3}$, $(Ba,Sm)_3Si_{6.5}O_{13}N_2$, $(Ba,Sm)_3Si_7O_{14}N_2$, $(Ba,Sm)_3Si_8O_{16}N_2$, $(Ba,Sm)_3Si_9O_{18}N_2$, $(Ba,Sm)_3Si_{10}O_{20}N_2$, $(Ba,Sm)_3 Si_{11}O_{22}N_2$, $(Ba,Tb)_3Si_6O_{12}N_2$, $(Ba,Tb)_3Si_6O_9N_4$, $(Ba,Tb)_3Si_6O_3N_8$, $(Ba,Tb)_3Si_7O_{12}N_{8/3}$, $(Ba,Tb)_3Si8O12N_{14/3}$, $(Ba,Tb)_3Si_8O_{12}N_6$, $(Ba,Tb)_3Si_{28/3}O_{12}N_{22/3}$, $(Ba,Tb)_3Si_{29/3}O_{12}N_{26/3}$, $(Ba,Tb)_3Si_{6.5}O_{13}N_2$, $(Ba,Tb)_3Si_7O_{14}N_2$, $(Ba,Tb)_3Si_8O_{16}N_2$, $(Ba,Tb)_3Si_9O_{18}N_2$, $(Ba,Tb)_3Si_{10}O_{20}N_2$, $(Ba,Tb)_3Si_{11}O_{22}N_2$, $(Ba,Dy)_3Si_6O_{12}N_2$, $(Ba,Dy)_3Si_6O_9N_4$, $(Ba,Dy)_3Si_6O_3N_8$, $(Ba,Dy)_3Si_7O_{12}N_{8/3}$, $(Ba,Dy)_3Si_8O_{12}N_{14/3}$, $(Ba,Dy)_3Si_8O_{12}N_6$, $(Ba,Dy)_3Si_{28/3}O_{12}N_{22/3}$, $(Ba,Dy)_3Si_{29/3}O_{12}N_{26/3}$, $(Ba,Dy)_3Si_{6.5}O_{13}N_2$, $(Ba,Dy)_3Si_7O_{14}N_2$, $(Ba,Dy)_3Si_8O_{16}N_2$, $(Ba,Dy)_3Si_9O_{18}N_2$, $(Ba,Dy)_3Si_{10}O_{20}N_2$, $(Ba,Dy)_3Si_{10}O_{22}N_2$, $(Ba,Ho)_3Si_6O_{12}N_2$, $(Ba,Ho)_3Si_6O_9N_4$, $(Ba,Ho)_3Si_6O_3N_8$, $(Ba,Ho)_3Si_7O_{12}N_{8/3}$, $(Ba,Ho)_3Si_8O_{12}N_{14/3}$, $(Ba,Ho)_3Si_8O_{12}N_6$, $(Ba,Ho)_3Si_{28/3}O_{12}N_{22/3}$, $(Ba,Ho)_3Si_{29/3}O_{12}N_{26/3}$, $(Ba,Ho)_3Si_{6.5}O_{13}N_2$, $(Ba,Ho)_3Si_7O_{14}N_2$, $(Ba,Ho)_3Si_8O_{16}N_2$, $(Ba,Ho)_3Si_9O_{18}N_2$, $(Ba,Ho)_3Si_{10}O2ON_2$, $(Ba,Ho)_3 Si_{11}O_{22}N_2$, $(Ba,Er)_3Si_6O_{12}N_2$, $(Ba,Er)_3Si_6O_9N_4$, $(Ba,Er)_3Si_6O_3N_8$, $(Ba,Er)_3Si_7O_{12}N_{8/3}$, $(Ba,Er)_3Si_8O_{12}N_{14/3}$, $(Ba,Er)_3Si_8O_{12}N_6$, $(Ba,Er)_3Si_{28/3}O_{12}N_{22/3}$, $(Ba,Er)_3Si_{29/3}O_{12}N_{26/3}$, $(Ba,Er)_3Si_{6.5}O_{13}N_2$, $(Ba,Er)_3Si_7O_{14}N_2$, $(Ba,Er)_3Si_8O_{16}N_2$, $(Ba,Er)_3Si_9O_{18}N_2$, $(Ba,Er)_3Si_{10}O_{20}N_2$, $(Ba,Er)_3Si_{11}O_{22}N_2$, $(Ba,Tm)_3Si_6O_{12}N_2$, $(Ba,Tm)_3Si_6O_9N_4$, $(Ba,Tm)_3 Si_6O_3N_8$, $(Ba,Tm)_3Si_7O_{12}N_{8/3}$, $(Ba,Tm)_3Si_8O_{12}N_{14/3}$, $(Ba,Tm)_3Si_8O_{12}N_6$, $(Ba,Tm)_3Si_{28/3}O_{12}N_{22/3}$, $(Ba,Tm)_3Si_{29/3} O_{12}N_{26/3}$, $(Ba,Tm)_3Si_{6.5}O_{13}N_2$, $(Ba,Tm)_3Si_7O_{14}N_2$, $(Ba,Tm)_3Si_8O_{16}N_2$, $(Ba,Tm)_3Si_9O_{18}N_2$, $(Ba,Tm)_3Si_{10}O_{20}N_2$, $(Ba,Tm)_3Si_{11}O_{22}N_2$, $(Ba,Yb)_3Si_6O_{12}N_2$, $(Ba,Yb)_3Si_6O_9N_4$, $(Ba,Yb)_3Si_6O_3N_8$, $(Ba,Yb)_3Si_7O_{12}N_{8/3}$, $(Ba,Yb)_3Si_8O_{12}N_{14/3}$, $(Ba,Yb)_3Si_8O_{12}N_6$, $(Ba,Yb)_3Si_{28/3}O_{12}N_{22/3}$, $(Ba,Yb)_3Si_{29/3}O_{12}N_{26/3}$, $(Ba,Yb)_3Si_{6.5}O_{13}N_2$, $(Ba,Yb)_3Si_7O_{14}N_2$, $(Ba,Yb)_3Si_8O_{16}N_2$, $(Ba,Yb)_3Si_9O_{18}N_2$, $(Ba,Yb)_3Si_{10}O_{20}N_2$ and $(Ba,Yb)_3Si_{11}O_{22}N_2$. Still more preferable examples include $Ba_3Si_6O_{12}N_2$, $Ba_3Si_6O_9N_4$, $Ba_3Si_6O_3N_8$, $Ba_3Si_7O_{12}N_{8/3}$, $Ba_3Si_8O_{12}N_{14/3}$, $Ba_3Si_8O_{12}N_6$, $Ba_3Si_{28/3}O_{12}N_{22/3}$, $Ba_3Si_{29/3}O_{12}N_{26/3}$, $Ba_3Si_{6.5}O_{13}N_2$, $Ba_3Si_7O_{14}N_2$, $Ba_3Si_8O_{16}N_2$, $Ba_3Si_9O_{18}N_2$, $Ba_3Si_{10}O_{20}N_2$ and $Ba_3Si_{11}O_{22}N_2$.

Furthermore, it is preferable that the multinary oxynitride of the present invention has the same characteristics with respect to its crystal structure as the phosphor of the present invention described in [1-1. Composition and crystal structure of multinary oxynitride phosphor].

The multinary oxynitride of the present invention can be produced by a method utilizing the same materials, manufacturing conditions and the like as those described in the aforementioned section of [1-3. Production method of multinary oxynitride phosphor]. Namely, it can be produced by the aforementioned production method, using the materials listed earlier in arbitral combination, in accordance with the above-mentioned composition.

Or otherwise, it can be produced by a known compression molding method of inorganic compounds such as molding a mixture, which is materials mixed in accordance with the intended composition, with a pressure onto the mixture.

There is no limitation on the use of the multinary oxynitride of the present invention. Examples of the use include raw materials for fluorescent pigments, paints and cosmetics, as well as general uses of ceramics such as abrasive grain, abradant, insulator, dielectric and heat-resistant material.

EXAMPLE

In the following, the present invention will be explained in more detail using Examples. It is to be understood that the present invention is by no means limited by the following examples insofar as they do not depart from the intent of the invention.

[1. Method for Measurement and Evaluation of Phosphor]

Various evaluations of phosphor particles were carried out by the following methods in each Example and Comparative Example to be described later.

[Method for Measuring Emission Spectrum]

The emission spectrum was measured by using a fluorescence measurement apparatus (manufactured by JASCO corporation) equipped with an excitation light source of 150-W xenon lamp and a spectrum measurement apparatus of multichannel CCD detector, C7041 (manufactured by Hamamatsu Photonics K.K.). The light from an excitation light source was passed through a grating monochromator with focal length of 10 cm to separate a light having wavelength of 340 nm, 400 nm or 455 nm, and the separated light was radiated onto the phosphors via an optical fiber. The light emitted from the phosphors by the irradiation of the excitation light was separated by a grating monochromator with focal length of 25 cm, and the emission intensity of each wavelength was measured in the wavelength range of from 300 nm to 800 nm using the spectrum measurement apparatus. Through signal processing such as sensitivity correction with a personal computer, the emission spectrum was obtained. The slit width of the receiving spectroscope was specified at 1 nm at the time of measurement.

The emission peak wavelength and full width at half maximum were read out from the obtained emission spectrum. The emission peak intensity was indicated relatively to the reference value 100, the peak intensity of a phosphor, LP-B4, manufactured by Kasei Optonix, Ltd., at the time of 365-nm wavelength excitation. The higher the relative emission-peak intensity is, the more preferable.

[Method for Measuring Chromaticity Coordinate]

The chromaticity coordinates CIEx and CIEy, in XYZ color system defined in JIS Z8701, were calculated from the emission spectrum data in the wavelength region of 380 nm to 800 nm (a case of 340-nm excitation wavelength), 430 nm to 800 nm (a case of 400-nm excitation wavelength) or 480 nm to 800 nm (a case of 455-nm excitation wavelength), in accordance with the method of JIS Z8724.

[Method for Measuring Excitation Spectrum]

The excitation spectrum was determined in the wavelength range of 250 nm to 500 nm using a fluorescence spectrophotometer, F-4500, manufactured by Hitachi, Ltd., by means of monitoring the green emission peak of 525-nm wavelength.

[Temperature Characteristics]

The temperature characteristics were measured using an emission spectrum measurement device of multi-channel spectrum analyzer, MCPD7000, manufactured by Otsuka Electronics Co., Ltd., a stage equipped with a cooling mechanism using a peltiert device and a heating mechanism using a heater, and an apparatus equipped with a 150-W xenon lamp as light source.

A cell holding the phosphor sample was put on the stage, and the temperature was changed within the range of from 20° C. to 175° C. Namely, after verifying the surface temperature of the phosphor was held constant at 20° C., 25° C., 50° C., 75° C., 100° C., 125° C., 150° C. and 175° C., the emission spectrum of the phosphor was measured when it is excited with a light from the light source having wavelength of 455 nm, which was separated using a diffraction grating. Then, the emission peak intensity at each temperature was calculated, from each measured emission spectrum, and indicated by its ratio to the peak intensity at 20° C. as a percentage.

At this point, as the measurement value of the surface temperature of the phosphor, a value corrected by temperature values measured with a radiation thermometer and a thermocouple was used.

[Brightness Retention Rate]

The brightness retention rate was measured using the above-mentioned device added with a luminance calorimeter, BM5A, as brightness measurement apparatus. Concretely, each ratio of the brightness value, measured with the brightness measurement device, to the brightness value at 20° C. was adopted as brightness retention rate.

[Internal Quantum Efficiency, External Quantum Efficiency and Absorption Efficiency]

The absorption efficiency $\alpha q$, internal quantum efficiency $\eta i$ and external quantum efficiency $\eta o$ of the phosphor were determined by the following procedure.

First, the phosphor sample to be measured is stuffed up in a cell with its surface smoothed sufficiently to keep high measurement accuracy, and then it was set on an integrating sphere.

The integrating sphere was irradiated with light, from a light emission source (150-W Xe lamp) for exciting the phosphor, using an optical fiber. The emission peak wavelength of the light from the aforementioned light emission source was adjusted to be 455 nm, of a monochromatic light, using a monochromator (grating monochromator) or the like. Then the spectra of emitted light (fluorescence) and reflected light of the phosphor sample are measured, using a spectrometer (MCPD7000 manufactured by Otsuka Electronics Co., Ltd.) by irradiating the phosphor sample to be measured with the monochromatic light (excitation light). The light within the integrating sphere was guided with an optical fiber to the spectrometer.

Absorption efficiency $\alpha q$ takes the value of $N_{abs}/N$, wherein $N_{abs}$ is the number of photons of the excitation light that is absorbed in the phosphor sample and N is the number of all the photons in the excitation light.

First, the latter one, the total number N of all the photons in the excitation light is proportional to the value obtained by the (formula 4) below. Therefore, the reflection spectrum $I_{ref}(\lambda)$ was measured using the spectrometer with respect to a measurement object, a reflection plate "Spectralon", manufactured by Labsphere (with 98% of reflectance to an excitation light of 450 nm wavelength) and having reflectance R of approx. 100% to the excitation light, which was attached to the above integrating sphere in the same disposition as the phosphor sample, by radiating the excitation light. Then the value of (formula 4) was decided from the reflection spectrum $I_{ref}(\lambda)$.

[Mathematical Formula 4]

$$\frac{1}{R}\int \lambda \cdot I_{ref}(\lambda)d\lambda \qquad \text{(Formula 4)}$$

The integration was performed at integration interval of 410 nm to 480 nm.

The number $N_{abs}$ of the photons in the excitation light, which is absorbed in the phosphor sample is proportional to the amount calculated in the following (formula 5).

[Mathematical Formula 5]

$$\frac{1}{R}\int \lambda \cdot I_{ref}(\lambda)d\lambda - \int \lambda \cdot I(\lambda)d\lambda \qquad \text{(Formula 5)}$$

Therefore, the reflection spectrum $I(\lambda)$ was determined. The reflection spectrum $I(\lambda)$ is a spectrum when the target phosphor sample, of which absorption efficiency $\alpha q$ is intended to be determined, was attached. The integration interval in (formula 5) was set to be the same as in (formula 4). Because the actual measurement value of the spectrum is generally obtained as digital data which are divided by a certain finite band width which is related to $\lambda$, the integrations of (formula 4) and (formula 5) were calculated as finite sum, based on the band width.

Consequently, $\alpha q = N_{abs}/N = $ (formula 5)/(formula 4) was calculated.

Next, the internal quantum efficiency $\eta i$ was determined as follows. The internal quantum efficiency $\eta i$ takes the value of $N_{PL}/N_{abs}$, wherein $N_{PL}$ is the number of photons originating from the fluorescence phenomenon and $N_{abs}$ is the number of photons absorbed in the phosphor sample.

Here, $N_{PL}$ is proportional to the amount calculated by the following (formula 6). Therefore, the amount calculated by the following (formula 6) was determined.

[Mathematical Formula 6]

$$\int \lambda \cdot I(\lambda)d\lambda \qquad \text{(Formula 6)}$$

The integration was performed at integration interval of 481 nm to 800 nm.

Consequently, the internal quantum efficiency $\eta i$ was obtained by the calculation of $\eta i = $ (formula 6)/(formula 5).

Incidentally, the integration from spectra expressed by digital data was performed in the same way as when absorption efficiency αq was calculated.

The external quantum efficiency ηo was decided as a product of the absorption efficiency αq and internal quantum efficiency ηi, which were obtained as above.

[Weight Median Diameter]

The weight median diameter was measured using a laser diffraction/scattering particle size distribution analyzer, LA-300, manufactured by HORIBA, Ltd., and a dispersion medium of water.

[Powder X Ray Diffractometry for Structural Analysis]

Precise measurement of powder X-ray diffractometry was made using a powder X-ray diffractometry apparatus, X'Pert, manufactured by PANalytical. The measurement conditions were as follows.

Use of a CuKα Tube
X-ray output=40 KV, 30 mA
Divergence slit=auto variable (irradiation width of X-ray on the sample was fixed at 10 mm)
Detector=use of a semiconductor array detector, X'Celerator, and Ni filter
Scan range 2θ=5 to 155 degree
Reading width=0.015 degree
Counting time=99.7 sec The measurement data were converted from a variable divergence slit to a fixed divergence slit.

[Powder X Ray Diffractometry for General Identification]

Precise measurement of powder X-ray diffractometry was made using a powder X-ray diffractometry apparatus, X'Pert, manufactured by PANalytical. The measurement conditions were as follows.

Use of a CuKα Tube
X-ray output=45 KV, 40 mA
Divergence slit=¼ degree, X-ray mirror
Detector=use of a semiconductor array detector, X'Celerator, and Ni filter
Scan range 2θ=10 to 65 degree
Reading width=0.05 degree
Counting time=33 sec

[2. Production of Phosphor]

$BaCO_3$ (manufacture by Hakushin Chemical Laboratory Co, Ltd.), $SiO_2$ (manufacture by Tatsumori, Ltd.), $Si_3N_4$ (manufacture by Ube Industries, Ltd.) and $Eu_2O_3$ (manufacture by Shin-Etsu Chemical Co., Ltd.) were weighed out using an electronic balance so as to give a predetermined composition ratio. After weighing, these material powders were all transferred to an agate automatic mortar and ethanol was added. The mixture was mixed well until it became homogeneous by means of a wet-type mixing method. The pasty mixture thus obtained was dried, filled into a boron nitride crucible in its powder state, and compression-molded by applying a slight weight. This boron nitride crucible was placed in a resistance-heating vacuum pressurized-atmosphere heat-treating furnace (manufactured by Fujidenpa Kogyo Co., Ltd.), and vacuum heated from room temperature to 800° C. at a rate of 20° C./min under a reduced pressure of $<5\times10^{-3}$ Pa (namely, less than $5\times10^{-3}$ Pa). When the temperature reached 800° C., nitrogen gas of high purity (99.9995%) was introduced during 30 min until the pressure reached 0.92 MPa, while maintaining the temperature. After nitrogen gas introduction, the pressure of 0.92 MPa was maintained and the temperature was raised further to 1200° C. at a rate of 20° C./min. After that temperature was maintained for 5 min, the thermometer was changed from a thermocouple to a radiation thermometer, and the temperature was raised again to 1600° C. at a rate of 20° C./min, which was maintained for further 2 hr. The temperature was further raised to 1800° C. at a rate of 20° C./min, which temperature was maintained for 2 hr. After firing, the temperature was lowered to 1200° C. at a rate of 20° C./min, and the product was then allowed to cool spontaneously. This firing program was used for the below Production Examples 1 to 12.

Concrete Production Examples and Examples are shown below.

Production Examples 1 to 12

Each of $BaCO_3$, $SiO_2$, $Si_3N_4$ and $Eu_2O_3$ was used in the amount shown in Table 1, in order to realize a nominal chemical composition ratio shown in Table 2, and mixing and firing were performed.

TABLE 1

| | Amounts of materials used | | | |
|---|---|---|---|---|
| Production Example | $BaCO_3$ | $SiO_2$ | $Si_3N_4$ | $Eu_2O_3$ |
| 1 | 3.08 g | 1.89 g | 0.00 g | 0.03 g |
| 2 | 2.83 g | 1.74 g | 0.41 g | 0.03 g |
| 3 | 2.62 g | 1.61 g | 0.75 g | 0.02 g |
| 4 | 2.52 g | 1.55 g | 0.91 g | 0.02 g |
| 5 | 2.43 g | 1.49 g | 1.05 g | 0.02 g |
| 6 | 2.27 g | 1.40 g | 1.31 g | 0.02 g |
| 7 | 2.14 g | 1.31 g | 1.53 g | 0.02 g |
| 8 | 2.01 g | 1.24 g | 1.73 g | 0.02 g |
| 9 | 1.90 g | 1.17 g | 1.91 g | 0.02 g |
| 10 | 1.80 g | 1.11 g | 2.07 | 0.02 g |
| 11 | 1.71 g | 1.05 g | 2.22 g | 0.02 g |
| 12 | 1.63 g | 1.01 g | 2.25 g | 0.02 g |

TABLE 2

| | Nominal chemical composition ratio | |
|---|---|---|
| | Nominal chemical composition | Firing condition |
| Production Example 1 | $B_{0.99}Eu_{0.01}Si_2O_5$ | 1600° C. 2 hr + 1800° C. 2 hr |
| Production Example 2 | $B_{0.99}Eu_{0.01}Si_{2.6}N_{0.4}O_5$ | 1600° C. 2 hr + 1800° C. 2 hr |
| Production Example 3 | $B_{0.99}Eu_{0.01}Si_{3.2}N_{1.6}O_5$ | 1600° C. 2 hr + 1800° C. 2 hr |
| Production Example 4 | $B_{0.99}Eu_{0.01}Si_{3.5}N_2O_5$ | 1600° C. 2 hr + 1800° C. 2 hr |
| Production Example 5 | $B_{0.99}Eu_{0.01}Si_{3.8}N_{2.4}O_5$ | 1600° C. 2 hr + 1800° C. 2 hr |
| Production Example 6 | $B_{0.99}Eu_{0.01}Si_{4.4}N_{3.2}O_5$ | 1600° C. 2 hr + 1800° C. 2 hr |
| Production Example 7 | $B_{0.99}Eu_{0.01}Si_5N_4O_5$ | 1600° C. 2 hr + 1800° C. 2 hr |
| Production Example 8 | $B_{0.99}Eu_{0.01}Si_{5.6}N_{4.8}O_5$ | 1600° C. 2 hr + 1800° C. 2 hr |
| Production Example 9 | $B_{0.99}Eu_{0.01}Si_{6.2}N_{5.6}O_5$ | 1600° C. 2 hr + 1800° C. 2 hr |
| Production Example 10 | $B_{0.99}Eu_{0.01}Si_{6.8}N_{6.4}O_5$ | 1600° C. 2 hr + 1800° C. 2 hr |

TABLE 2-continued

| | Nominal chemical composition ratio | |
|---|---|---|
| | Nominal chemical composition | Firing condition |
| Production Example 11 | $B_{0.99}Eu_{0.01}Si_{7.4}N_{7.2}O_5$ | 1600° C. 2 hr + 1800° C. 2 hr |
| Production Example 12 | $B_{0.99}Eu_{0.01}Si_8N_8O_5$ | 1600° C. 2 hr + 1800° C. 2 hr |

Figure 6:
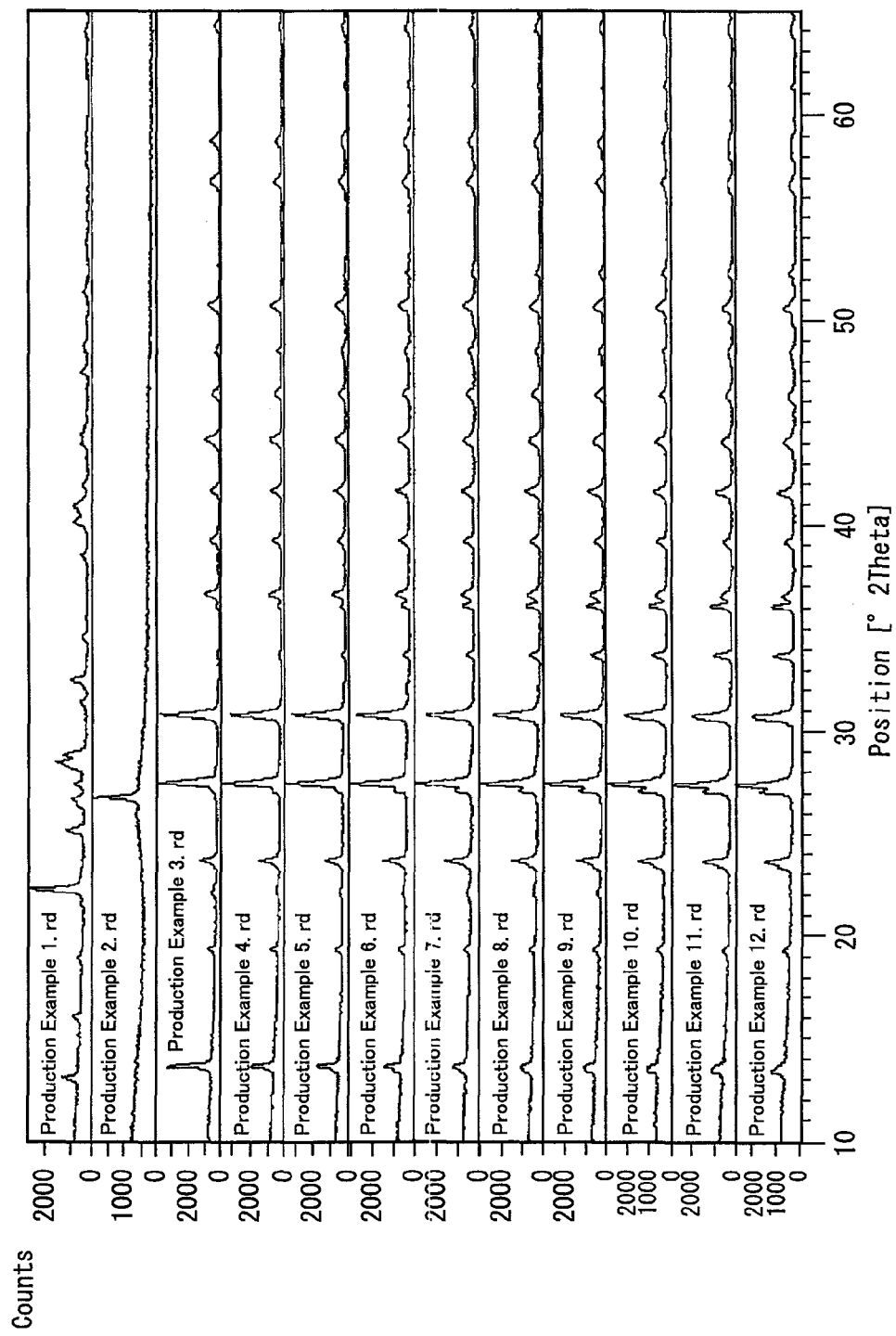
FIG. 6 is a graph illustrating the X ray diffraction patterns of the phosphors obtained in Production Examples 1 to 12.

X-ray diffraction patterns of the fired products obtained are shown in FIG. 6. In the fired products of Production Examples 3 to 12, BSON crystal phases were detected. Of these, Production Example 4 showed most preferable state.

In Examples 1 to 40 described below, the content ratio of M—Si—N—O was set on the basis of the nominal chemical composition of Production Example 4.

Examples 1 to 13, 18 and Examples 35 to 38

Each of $BaCO_3$, $SrCO_3$ (manufactured by Hakushin Chemical Laboratory Co, Ltd.), $CaCO_3$ (manufactured by Hakushin Chemical Laboratory Co, Ltd.), $SiO_2$, $Si_3N_4$ and $Eu_2O_3$ was weighed out so as to give a nominal chemical composition ratio shown in Table 3, and mixing/firing was performed in the same manner as described for Production Examples 1 to 12. Namely, in Example 1, 2.52 g of $BaCO_3$, 1.55 g of $SiO_2$, 0.91 g of $Si_3N_4$ and 0.02 g of $Eu_2O_3$ were used. In Example 2, 2.29 g of $BaCO_3$, 0.10 g of $SrCO_3$, 1.57 g of $SiO_2$, 0.91 g of $Si_3N_4$ and 0.14 g of $Eu_2O_3$ were used. In each of other Examples, according to each composition ratio, the proportion was varied based on the above-mentioned charge amount.

Figure 7:
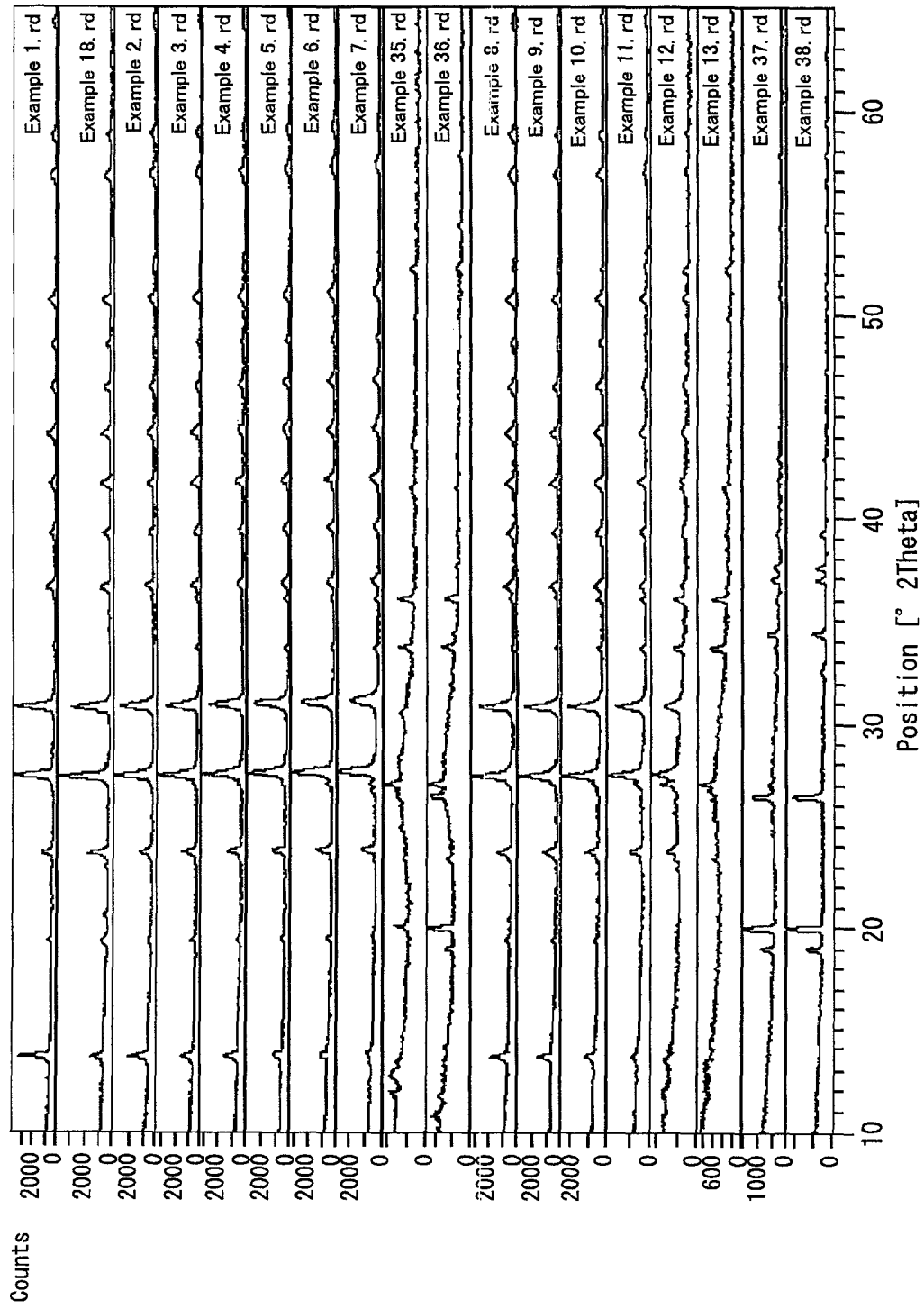
FIG. 7 is a graph illustrating the X ray diffraction patterns of the phosphors obtained in Examples 1 to 13, 18 and 35 to 38.
Figure 8:
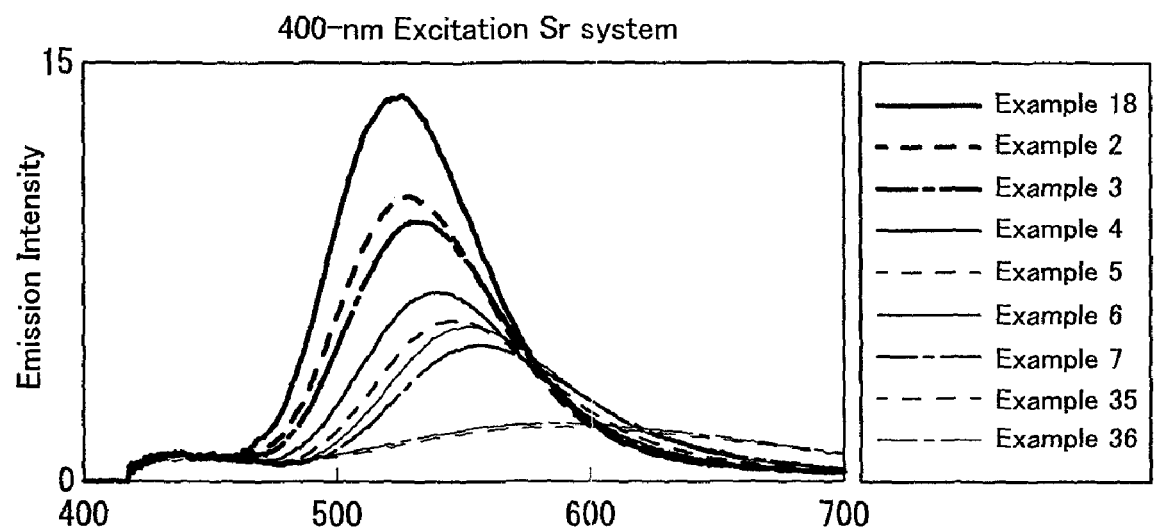
FIG. 8 is a graph illustrating the emission spectra of 400 nm-wavelength excitation, measured in Examples 2 to 7, 18, 35 and 36.
Figure 9:
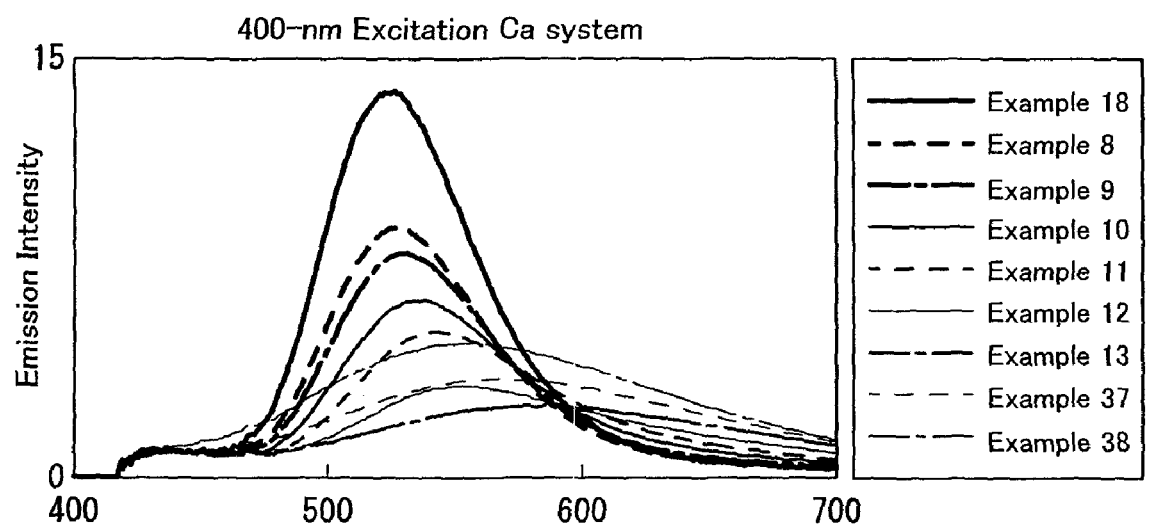
FIG. 9 is a graph illustrating the emission spectra of 400 nm-wavelength excitation, measured in Examples 8 to 13, 18, 37 and 38.
Figure 10:
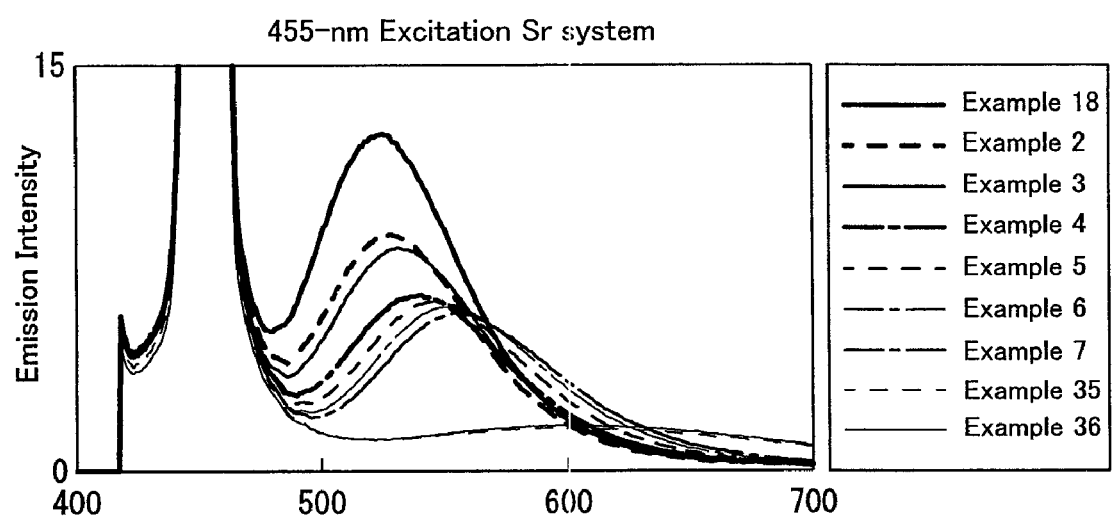
FIG. 10 is a graph illustrating the emission spectra of 455 nm-wavelength excitation, measured in Examples 2 to 7, 18, 35 and 36.
Figure 11:
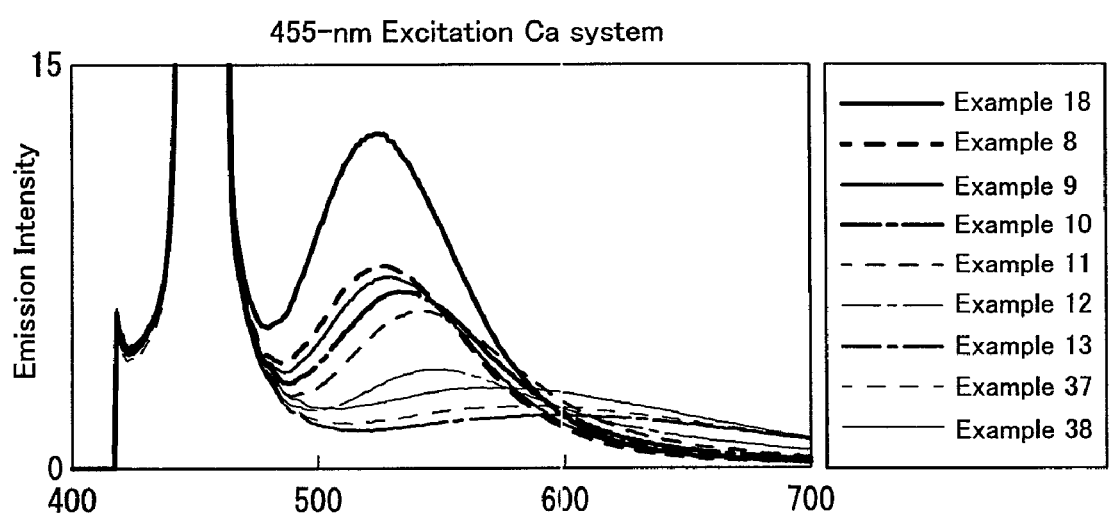
FIG. 11 is a graph illustrating the emission spectra of 455 nm-wavelength excitation, measured in Examples 8 to 13, 18, 37 and 38.

X-ray diffraction patterns of the fired products obtained are shown in FIG. 7. In each of Examples 1 to 7, 8 to 12 and 18, BSON crystal phase was detected as the main phase. It is evident that, when 40 atom % or more of Ba is replaced with Ca, BSON-phase crystal structure can not be maintained. Also it is evident that, when 50 atom % or more is replaced with Sr, BSON-phase crystal structure can not be maintained.

Fluorescence characteristics of these fired products were evaluated and the results are presented in Table 3. Emission spectrums at the excitation wavelengths of 400 nm and 455 nm are shown in FIGS. 8 to 11. The data show that, when the charge composition of Eu is increased from 0.01 to 0.12, the peak intensity of the emission spectrum becomes high. On the other hand, it is evident that, when Ca exceeds 40 atom %, or Sr exceeds 50 atom %, the peak intensity of the emission spectrum becomes low.

TABLE 3

[Results of Examples 1 to 13, 18 and 35 to 38]

| | | | | 400-nm excitation | | | | 455-nm excitation | | | |
|---|---|---|---|---|---|---|---|---|---|---|---|
| Example | Substitution for Ba with Sr or Ca | Firing condition | Nominal chemical composition | Peak wavelength (nm) | Peak intensity | CIEx | CIEy | Peak wavelength (nm) | Peak intensity | CIEx | CIEy |
| 1 | Sr and Ca 0% | 1600° C. 2 hr + 1800° C. 2 hr | $Ba_{0.99}Eu_{0.01}Si_{3.5}N_2O_6$ | 520 | 6.5 | 0.250 | 0.524 | 520 | 3.9 | 0.256 | 0.594 |
| 18 | Sr and Ca 0% | 1400° C. 2 hr + 1600° C. 2 hr | $Ba_{1.88}Eu_{0.12}Si_7O_{10}N_4$ | 526 | 13.9 | 0.272 | 0.612 | 525 | 12.4 | 0.273 | 0.626 |
| 2 | Sr 5% | 1600° C. 2 hr + 1800° C. 2 hr | $Ba_{1.78}Sr_{0.1}Eu_{0.12}Si_7O_{10}N_4$ | 529 | 10.2 | 0.286 | 0.567 | 526 | 8.8 | 0.292 | 0.616 |
| 3 | Sr 10% | 1600° C. 2 hr + 1800° C. 2 hr | $Ba_{1.68}Sr_{0.2}Eu_{0.12}Si_7O_{10}N_4$ | 530 | 9.3 | 0.303 | 0.563 | 531 | 8.3 | 0.309 | 0.610 |
| 4 | Sr 20% | 1600° C. 2 hr + 1800° C. 2 hr | $Ba_{1.48}Sr_{0.4}Eu_{0.12}Si_7O_{10}N_4$ | 540 | 6.8 | 0.333 | 0.537 | 540 | 6.6 | 0.339 | 0.591 |
| 5 | Sr 30% | 1600° C. 2 hr + 1800° C. 2 hr | $Ba_{1.28}Sr_{0.6}Eu_{0.12}Si_7O_{10}N_4$ | 546 | 5.8 | 0.357 | 0.516 | 546 | 6.3 | 0.365 | 0.575 |
| 6 | Sr 40% | 1600° C. 2 hr + 1800° C. 2 hr | $Ba_{1.08}Sr_{0.8}Eu_{0.12}Si_7O_{10}N_4$ | 552 | 5.6 | 0.378 | 0.505 | 554 | 6.1 | 0.387 | 0.561 |
| 7 | Sr 50% | 1600° C. 2 hr + 1800° C. 2 hr | $Ba_{0.88}Sr_{1.0}Eu_{0.12}Si_7O_{10}N_4$ | 557 | 4.9 | 0.390 | 0.490 | 554 | 5.9 | 0.402 | 0.549 |
| 35 | Sr 75% | 1600° C. 2 hr + 1800° C. 2 hr | $Ba_{0.38}Sr_{1.5}Eu_{0.12}Si_7O_{10}N_4$ | 590 | 2.0 | 0.405 | 0.404 | 592 | 1.6 | 0.432 | 0.477 |
| 36 | Sr 100% | 1600° C. 2 hr + 1800° C. 2 hr | $Sr_{1.88}Eu_{0.12}Si_7O_{10}N_4$ | 591 | 2.1 | 0.410 | 0.413 | 598 | 1.7 | 0.439 | 0.476 |
| 8 | Ca 5% | 1600° C. 2 hr + 1800° C. 2 hr | $Ba_{1.78}Ca_{0.1}Eu_{0.12}Si_7O_{10}N_4$ | 528 | 9.0 | 0.284 | 0.557 | 528 | 7.5 | 0.289 | 0.612 |
| 9 | Ca 10% | 1600° C. 2 hr + 1800° C. 2 hr | $Ba_{1.58}Ca_{0.2}Eu_{0.12}Si_7O_{10}N_4$ | 531 | 8.1 | 0.300 | 0.549 | 530 | 7.1 | 0.303 | 0.606 |
| 10 | Ca 20% | 1600° C. 2 hr + 1800° C. 2 hr | $Ba_{1.48}Ca_{0.4}Eu_{0.12}Si_7O_{10}N_4$ | 538 | 6.4 | 0.329 | 0.525 | 533 | 6.5 | 0.330 | 0.592 |
| 11 | Ca 30% | 1600° C. 2 hr + 1800° C. 2 hr | $Ba_{1.28}Ca_{0.6}Eu_{0.12}Si_7O_{10}N_4$ | 544 | 5.3 | 0.359 | 0.504 | 543 | 5.8 | 0.360 | 0.573 |
| 12 | Ca 40% | 1600° C. 2 hr + 1800° C. 2 hr | $Ba_{1.08}Ca_{0.8}Eu_{0.12}Si_7O_{10}N_4$ | 554 | 3.3 | 0.384 | 0.453 | 552 | 3.7 | 0.389 | 0.540 |
| 13 | Ca 50% | 1600° C. 2 hr + 1800° C. 2 hr | $Ba_{0.88}Ca_{1.0}Eu_{0.12}Si_7O_{10}N_4$ | 579 | 2.6 | 0.407 | 0.420 | 598 | 2.0 | 0.437 | 0.481 |

TABLE 3-continued

[Results of Examples 1 to 13, 18 and 35 to 38]

| | | | | 400-nm excitation | | | | 455-nm excitation | | | |
|---|---|---|---|---|---|---|---|---|---|---|---|
| Example | Substitution for Ba with Sr or Ca | Firing condition | Nominal chemical composition | Peak wavelength (nm) | Peak intensity | CIEx | CIEy | Peak wavelength (nm) | Peak intensity | CIEx | CIEy |
| 37 | Ca 75% | 1600° C. 2 hr + 1800° C. 2 hr | $Ba_{0.38}Ca_{1.5}Eu_{0.12}Si_7O_{10}N_4$ | 580 | 3.5 | 0.399 | 0.443 | 585 | 2.3 | 0.435 | 0.490 |
| 38 | Ca 100% | 1600° C. 2 hr + 1800° C. 2 hr | $Ca_{1.88}Eu_{0.12}Si_7O_{10}N_4$ | 554 | 4.9 | 0.382 | 0.454 | 567 | 3.0 | 0.428 | 0.501 |

Examples 41 to 51

Each of $BaCO_3$, ZnO, $SiO_2$, $Si_3N_4$ and $Eu_2O_3$ was weighed out so as to give a nominal chemical composition ratio shown in Table 4. Namely, in Example 41, 2.75 g of $BaCO_3$, 1.74 g of $SiO_2$, 1.02 g of $Si_3N_4$ and 0.15 g of $Eu_2O_3$ were used. In Example 42, 2.52 g of $BaCO_3$, 0.11 g of ZnO (manufactured by MITSUI MINING & SMELTING CO., LTD.), 1.78 g of $SiO_2$, 1.04 g of $Si_3N_4$ and 0.16 g of $Eu_2O_3$ were used. In each of other Examples, according to each composition ratio, the proportion was varied based on the above-mentioned charge amount.

These material powders were all transferred to an agate automatic mortar, ethanol was added, and the mixture was mixed well until it became homogeneous by means of a wet-type mixing method. The pasty mixture thus obtained was dried, filled into an alumina crucible and compression-molded by applying a slight weight. This was placed in a resistance-heating tubular electric furnace fitted with a temperature regulator and, in a nitrogen current of 0.5 l/min under atmospheric pressure, heated to 1200° C. at a rate of 4.8° C./min. That temperature was maintained for 4 hr and then the mixture was allowed to cool to room temperature. The sample obtained was pulverized in an aluminum mortar and the pulverized sample was again filled into an alumina crucible and compression-molded by applying a slight weight. This alumina crucible was placed in a resistance-heating tubular electric furnace fitted with a temperature regulator and, in a nitrogen current of 0.5 l/min under atmospheric pressure, heated to 1300° C. at a rate of 4.8° C./min. That temperature was maintained for 4 hr and then the product was allowed to cool to room temperature.

Figure 12:
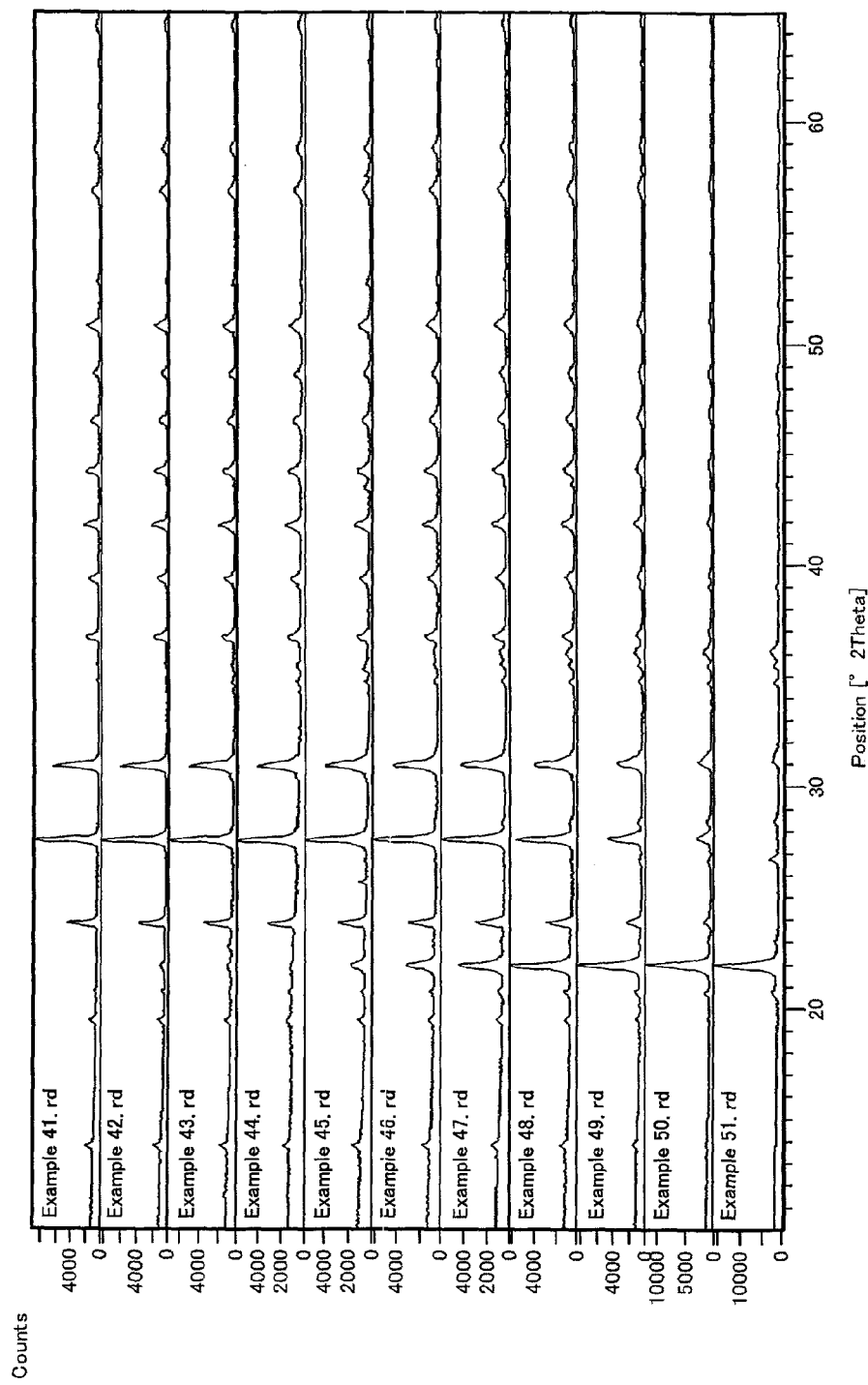
FIG. 12 is a graph illustrating the X ray diffraction patterns of the phosphors obtained in Examples 41 to 51.
Figure 13:
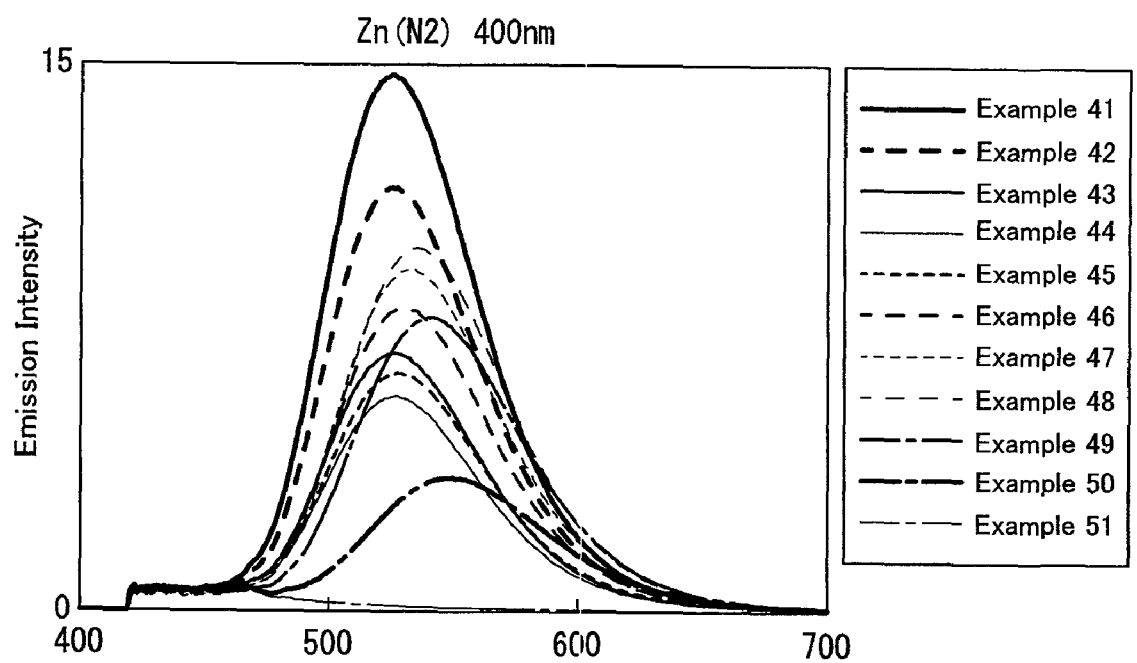
FIG. 13 is a graph illustrating the emission spectra of 400 nm-wavelength excitation, measured in Examples 41 to 51.
Figure 14:
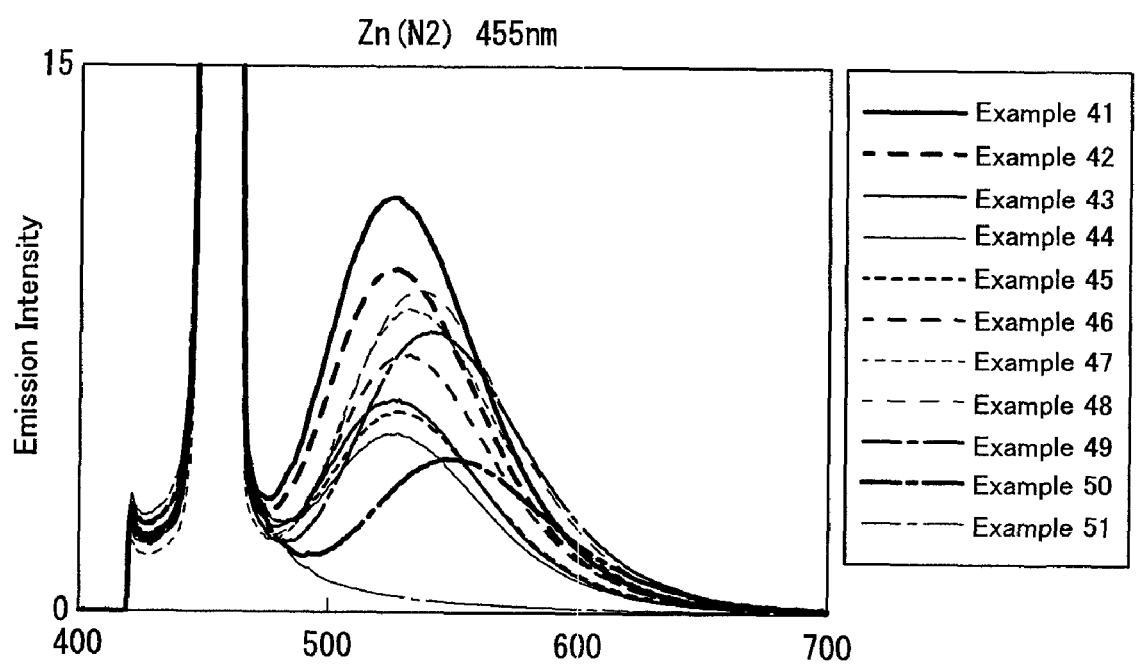
FIG. 14 is a graph illustrating the emission spectra of 455 nm-wavelength excitation, measured in Examples 41 to 51.

X-ray diffraction patterns of the fired products obtained are shown in FIG. 12. When Zn is substituted in 10 to 50 weight % in a state of solid solution, higher emission intensity could be obtained than the BSON crystal phase of Ba only. However, since a peak shift accompanying the substitution of Zn in a state of solid solution was not observed markedly in the XRD pattern, ZnO may have contributed to the crystallinity enhancement of the BSON crystal phase just as flux agent. In addition, deposition of $SiO_2$ as impurity phase, associated with increasing amount of Zn added, was observed. At that time, no compound containing Zn could be confirmed in the XRD pattern. Accordingly, it is considered that Zn was flown away by the nitrogen stream in a certain form under this synthesis condition. Fluorescence characteristics of these fired products were evaluated and the results are presented in Table 4. Emission spectra at the excitation wavelengths of 400 nm and 455 nm are shown in FIGS. 13 and 14.

In Examples 41 to 49, BSON crystal phases were detected. When Ba was replaced by Zn to the extent of 90% or more, it is evident that the aforementioned crystal structure can not be maintained. The result shows that, when Zn exceeds 90 atom %, the peak intensity of the emission spectrum of the phosphor becomes low.

TABLE 4

[Results of Examples 41 to 51]

| | | | | 400-nm excitation | | | | 455-nm excitation | | | |
|---|---|---|---|---|---|---|---|---|---|---|---|
| Example | Substitution amount | Firing condition | Charge composition | Peak wavelength (nm) | Peak intensity | CIEx | CIEy | Peak wavelength (nm) | Peak intensity | CIEx | CIEy |
| 41 | Zn 0% | 1200° C. 4 hr + 1300° C. 4 hr | $Ba_{1.88}Eu_{0.12}Si_7O_{10}N_4$ | 525 | 39.2 | 0.274 | 0.640 | 525 | 30.5 | 0.276 | 0.633 |
| 42 | Zn 10% | | $Ba_{1.692}Zn_{0.188}Eu_{0.12}Si_7O_{10}N_4$ | 525 | 30.9 | 0.278 | 0.638 | 527 | 25.3 | 0.280 | 0.630 |
| 43 | Zn 20% | | $Ba_{1.504}Zn_{0.376}Eu_{0.12}Si_7O_{10}N_4$ | 525 | 18.8 | 0.282 | 0.635 | 528 | 15.7 | 0.281 | 0.625 |
| 44 | Zn 30% | | $Ba_{1.316}Zn_{0.564}Eu_{0.12}Si_7O_{10}N_4$ | 527 | 15.7 | 0.286 | 0.632 | 527 | 13.1 | 0.281 | 0.619 |
| 45 | Zn 40% | | $Ba_{1.128}Zn_{0.752}Eu_{0.12}Si_7O_{10}N_4$ | 527 | 17.4 | 0.292 | 0.630 | 528 | 14.7 | 0.289 | 0.618 |
| 46 | Zn 50% | | $Ba_{0.94}Zn_{0.94}Eu_{0.12}Si_7O_{10}N_4$ | 528 | 22.2 | 0.300 | 0.630 | 532 | 19.0 | 0.299 | 0.622 |
| 47 | Zn 60% | | $Ba_{0.752}Zn_{1.128}Eu_{0.12}Si_7O_{10}N_4$ | 534 | 25.0 | 0.311 | 0.627 | 532 | 22.3 | 0.311 | 0.621 |
| 48 | Zn 70% | | $Ba_{0.564}Zn_{1.316}Eu_{0.12}Si_7O_{10}N_4$ | 535 | 26.6 | 0.325 | 0.621 | 534 | 23.7 | 0.325 | 0.614 |
| 49 | Zn 80% | | $Ba_{0.376}Zn_{1.504}Eu_{0.12}Si_7O_{10}N_4$ | 541 | 21.5 | 0.347 | 0.608 | 540 | 20.7 | 0.346 | 0.601 |
| 50 | Zn 90% | | $Ba_{0.188}Zn_{1.692}Eu_{0.12}Si_7O_{10}N_4$ | 549 | 9.8 | 0.382 | 0.582 | 546 | 11.3 | 0.373 | 0.573 |
| 51 | Zn 100% | | $Zn_{1.88}Eu_{0.12}Si_7O_{10}N_4$ | 437 | 1.8 | 0.265 | 0.526 | 627 | 0.2 | 0.221 | 0.502 |

Examples 52 to 62

Each of $BaCO_3$, ZnO, $SiO_2$, $Si_3N_4$ and $Eu_2O_3$ was weighed out so as to give a charge composition ratio shown in Table 5. Namely, in Example 52, 2.75 g of $BaCO_3$, 1.74 g of $SiO_2$, 1.02 g of $Si_3N_4$ and 0.15 g of $Eu_2O_3$ were used. In Example 53, 2.52 g of $BaCO_3$, 0.11 g of ZnO, 1.78 g of $SiO_2$, 1.04 g of $Si_3N_4$ and 0.16 g of $Eu_2O_3$ were used. In each of other Examples, according to each composition ratio, the proportion was varied based on the above charge amount.

Mixing/firing was performed in the same manner as described for the above Examples 41 to 51, except that nitrogen gas was replaced with a mixed gas of 96 volume % of nitrogen and 4 volume % of hydrogen.

Figure 15:
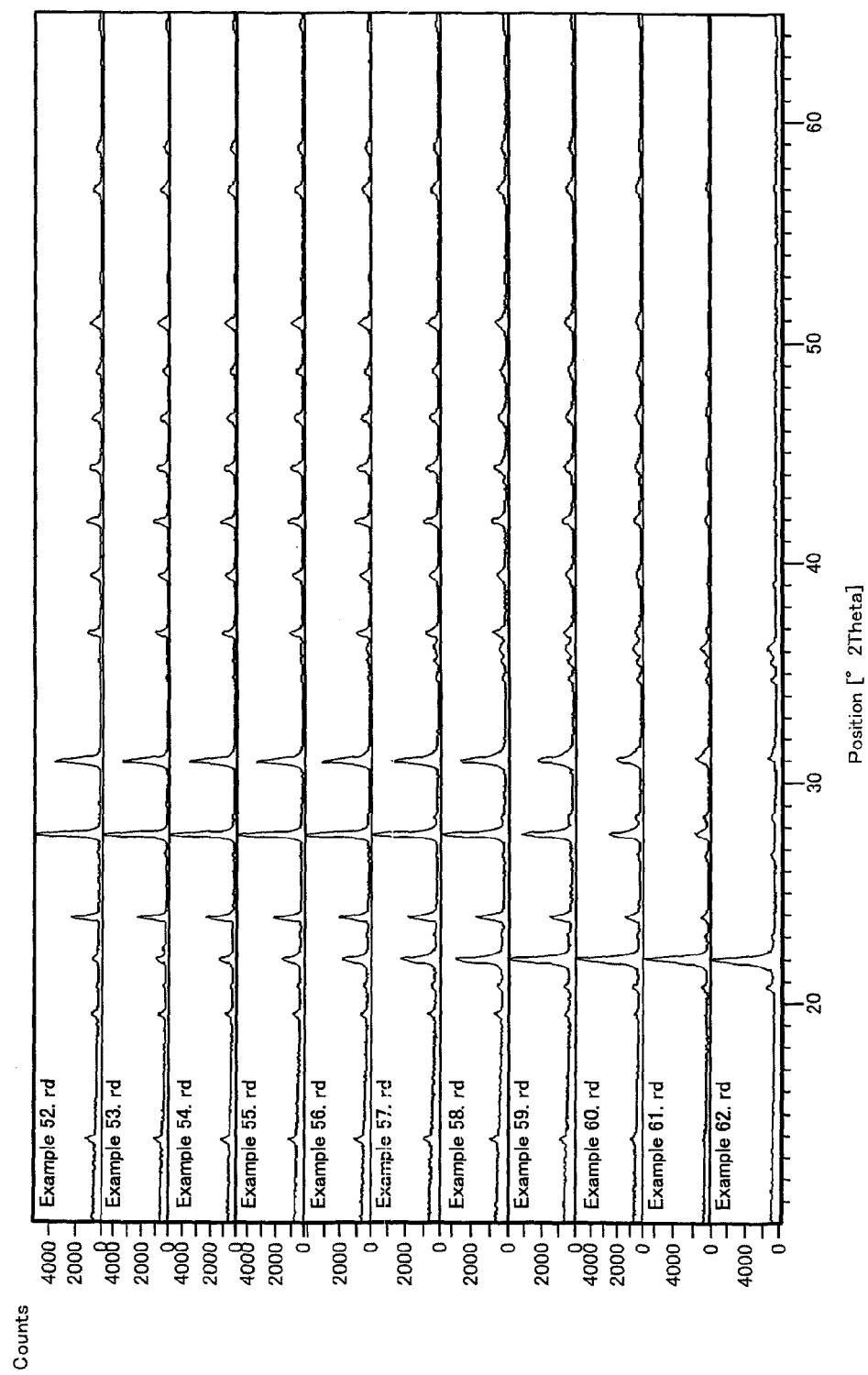
FIG. 15 is a graph illustrating the X ray diffraction patterns of the phosphors obtained in Examples 52 to 62.
Figure 16:
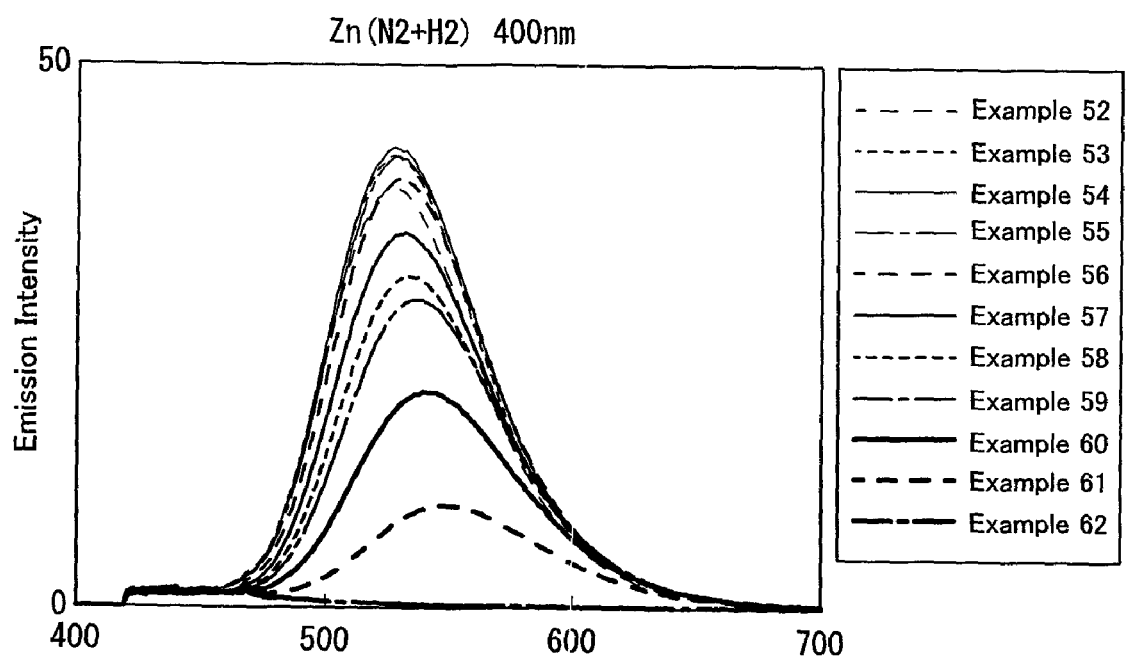
FIG. 16 is a graph illustrating the emission spectra of 400 nm-wavelength excitation, measured in Examples 52 to 62.
Figure 17:
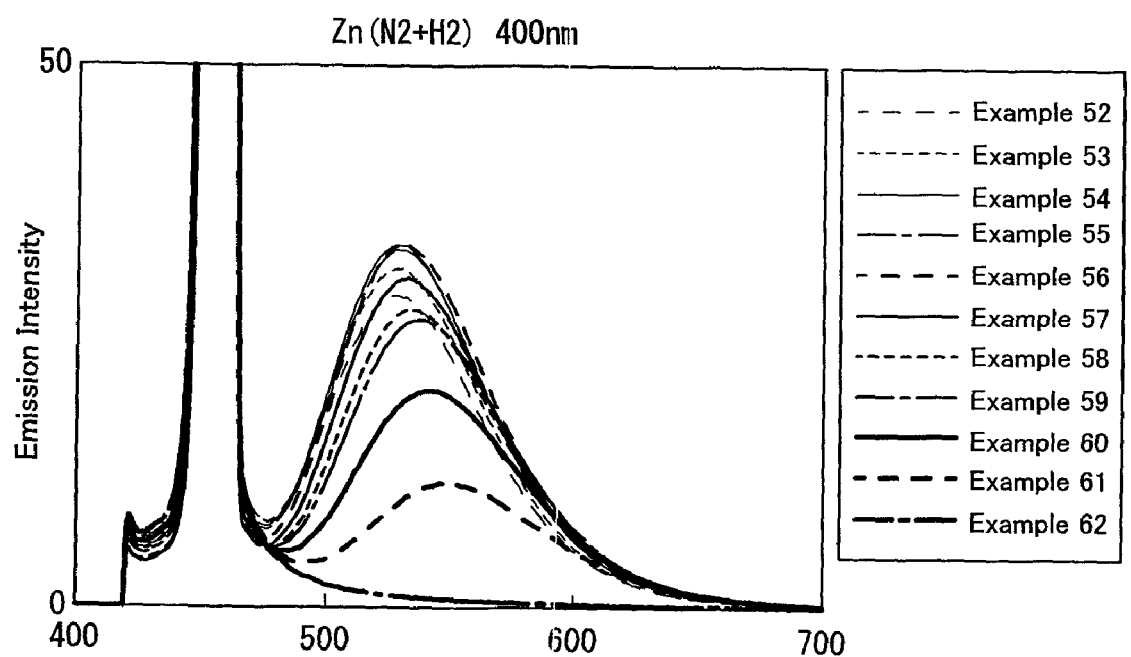
FIG. 17 is a graph illustrating the emission spectra of 455 [sic] nm-wavelength excitation, measured in Examples 52 to 62.

X-ray diffraction patterns of the fired products obtained are shown in FIG. 15. Fluorescence characteristics of these fired products were evaluated and the results are presented in Table 5. Emission spectra at the excitation wavelengths of 400 nm and 455 nm are shown in FIGS. 16 and 17.

BSON crystal phases were detected in Examples 52 to 60. When Ba was replaced by Zn to the extent of 90% or more, it is evident that the aforementioned crystal structure can not be maintained. It is also evident that, when firing atmosphere was changed from N2 atmosphere to reducing atmosphere of (N2+H2), the peak intensity of the emission spectrum of the phosphor becomes low until Zn exceeds 90 atom %.

Examples 63 to 66

Each of $BaCO_3$, $SiO_2$, $GeO_2$, $Si_3N_4$ and $Eu_2O_3$ was weighed out so as to give a nominal chemical composition ratio shown in Table 6. Namely, in Example 63, 3.85 g of $BaCO_3$, 2.44 g of $SiO_2$, 1.43 g of $Si_3N_4$ and 0.21 g of $Eu_2O_3$ were used. In Example 64, 3.80 g of $BaCO_3$, 2.29 g of $SiO_2$, 0.21 g of $GeO_2$ (manufactured by Furuuchi Chemical Corporation), 1.41 g of $Si_3N_4$ and 0.21 g of $Eu_2O_3$ were used. In each of other Examples, according to each composition ratio, the proportion was varied based on the above charge amount. Mixing/firing was performed in the same manner as described for the above Examples 41 to 51.

Figure 18:
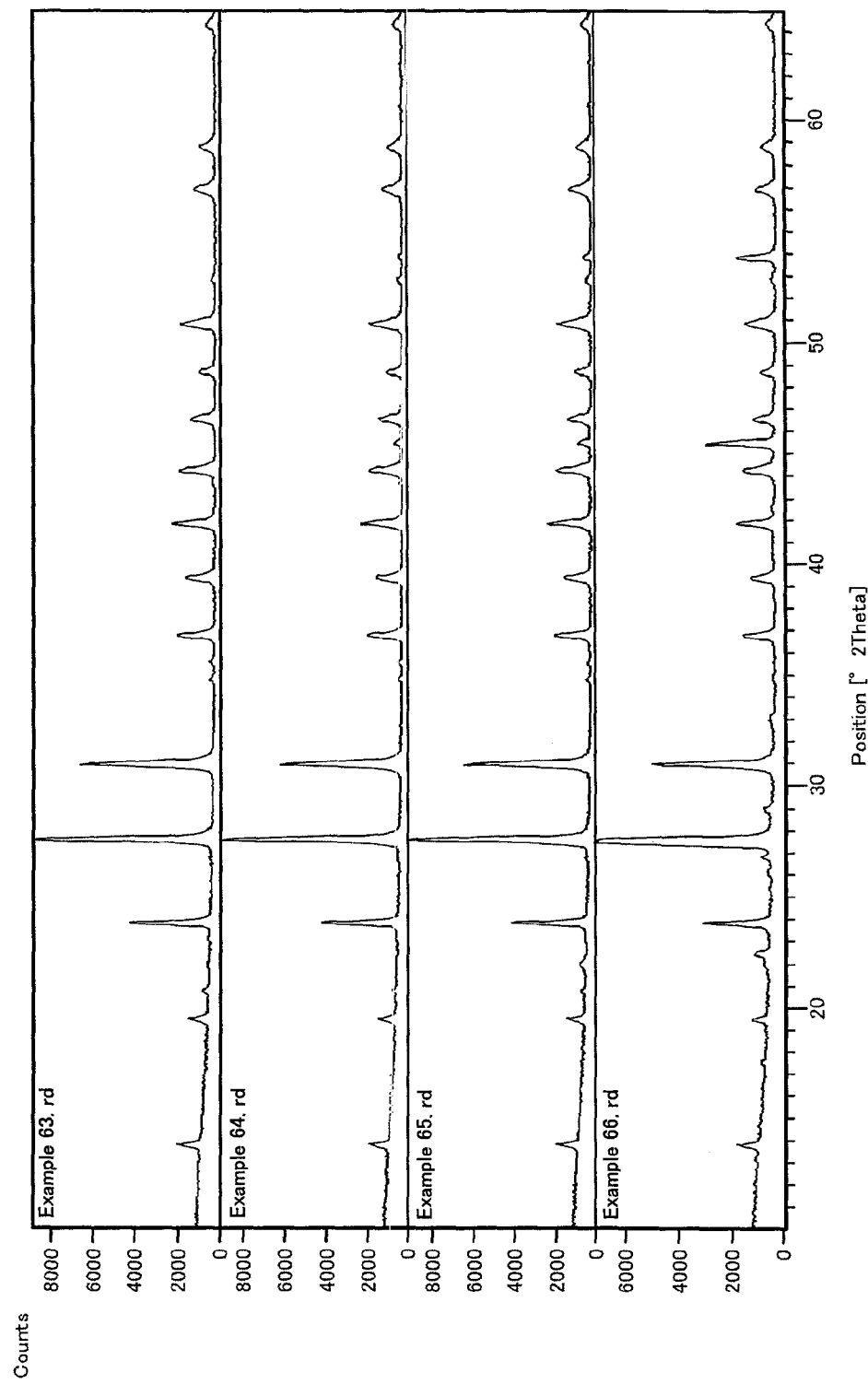
FIG. 18 is a graph illustrating the X ray diffraction patterns of the phosphors obtained in Examples 63 to 66.
Figure 19:
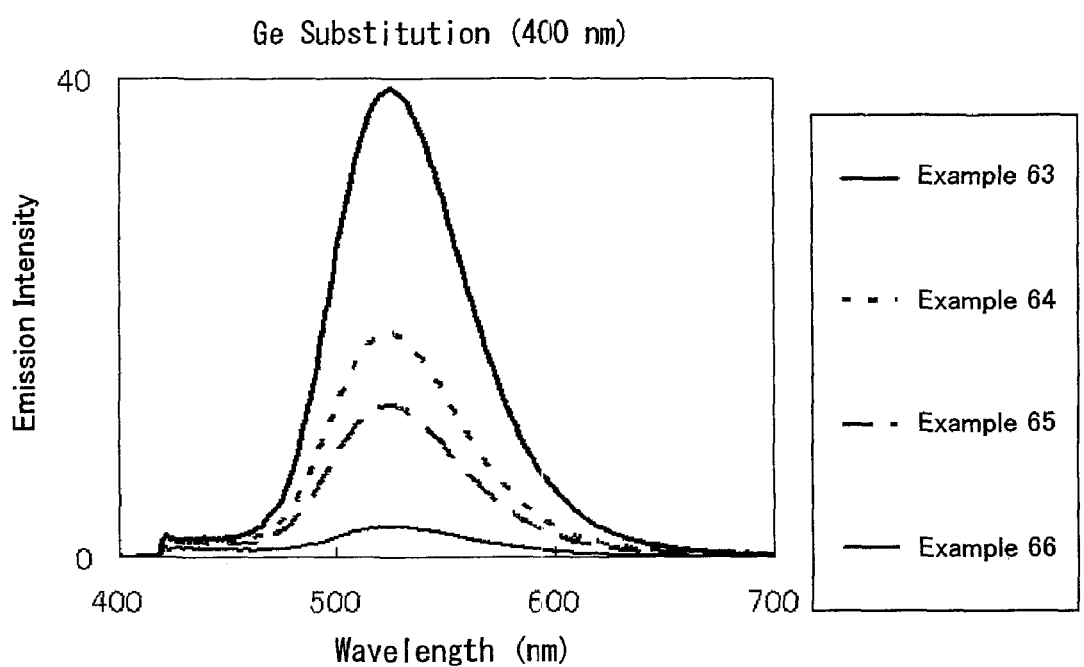
FIG. 19 is a graph illustrating the emission spectra of 400 nm-wavelength excitation, measured in Examples 63 to 66.
Figure 20:
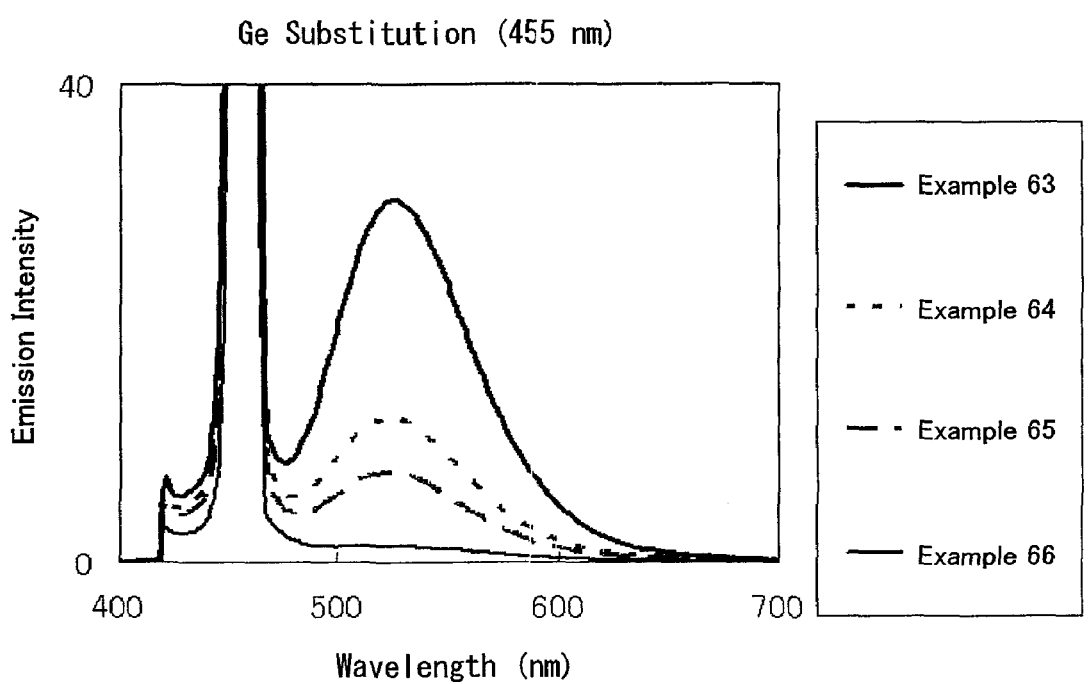
FIG. 20 is a graph illustrating the emission spectra of 455 nm-wavelength excitation, measured in Examples 63 to 66.

X-ray diffraction patterns of the fired products obtained are shown in FIG. 18. Fluorescence characteristics of these fired products were evaluated and the results are presented in Table 6. Emission spectra at the excitation wavelengths of 400 nm and 455 nm are shown in FIGS. 19 and 20.

Judging from a small change of the peak shape of XRD, Ge is considered to have been replaced slightly in BSON crystal phase due to solid solution. However, when the replacement by Ge amounted to 3 atom % or more, the emission intensity decreased markedly. This is considered to be attributable to blackening of $GeO_2$ during firing in the nitrogen stream.

TABLE 5

[Resutls of Examples 52 to 62]

| | | | | 400-nm excitation | | | | 455-nm excitation | | | |
|---|---|---|---|---|---|---|---|---|---|---|---|
| Example | Substitution amount | Firing condition | Nominal chemical composition | Peak wavelength (nm) | Peak intensity | CIEx | CIEy | Peak wavelength (nm) | Peak intensity | CIEx | CIEy |
| 52 | Zn 0% | 1200° C. | $Ba_{1.88}Eu_{0.12}Si_7O_{10}N_4$ | 528 | 38.7 | 0.287 | 0.636 | 528 | 28.9 | 0.291 | 0.628 |
| 53 | Zn 10% | 4 hr + | $Ba_{1.692}Zn_{0.188}Eu_{0.12}Si_7O_{10}N_4$ | 527 | 41.6 | 0.288 | 0.636 | 528 | 31.3 | 0.291 | 0.629 |
| 54 | Zn 20% | 1300° C. | $Ba_{1.504}Zn_{0.376}Eu_{0.12}Si_7O_{10}N_4$ | 528 | 42.3 | 0.291 | 0.635 | 528 | 33.6 | 0.294 | 0.629 |
| 55 | Zn 30% | 4 hr | $Ba_{1.316}Zn_{0.564}Eu_{0.12}Si_7O_{10}N_4$ | 529 | 41.5 | 0.295 | 0.634 | 528 | 33.1 | 0.298 | 0.628 |
| 56 | Zn 40% | | $Ba_{1.128}Zn_{0.752}Eu_{0.12}Si_7O_{10}N_4$ | 529 | 39.5 | 0.302 | 0.631 | 532 | 33.6 | 0.304 | 0.626 |
| 57 | Zn 50% | | $Ba_{0.94}Zn_{0.94}Eu_{0.12}Si_7O_{10}N_4$ | 532 | 34.6 | 0.309 | 0.628 | 533 | 30.5 | 0.311 | 0.623 |
| 58 | Zn 60% | | $Ba_{0.752}Zn_{1.128}Eu_{0.12}Si_7O_{10}N_4$ | 533 | 30.6 | 0.319 | 0.624 | 533 | 27.5 | 0.320 | 0.619 |
| 59 | Zn 70% | | $Ba_{0.564}Zn_{1.316}Eu_{0.12}Si_7O_{10}N_4$ | 538 | 28.4 | 0.332 | 0.617 | 537 | 26.6 | 0.333 | 0.611 |
| 60 | Zn 80% | | $Ba_{0.376}Zn_{1.504}Eu_{0.12}Si_7O_{10}N_4$ | 540 | 20.0 | 0.353 | 0.604 | 543 | 20.0 | 0.351 | 0.597 |
| 61 | Zn 90% | | $Ba_{0.188}Zn_{1.692}Eu_{0.12}Si_7O_{10}N_4$ | 548 | 9.5 | 0.384 | 0.580 | 546 | 11.4 | 0.376 | 0.571 |
| 62 | Zn 100% | | $Zn_{1.88}Eu_{0.12}Si_7O_{10}N_4$ | 434 | 1.6 | 0.266 | 0.533 | 622 | 0.2 | 0.222 | 0.506 |

TABLE 6

[Results of Examples 63 to 66]

|  |  |  |  | 400-nm excitation | | | | 455-nm excitation | | | |
|---|---|---|---|---|---|---|---|---|---|---|---|
| Example | Substitution amount | Firing condition | Nominal chemical composition | Peak wavelength (nm) | Peak intensity | CIEx | CIEy | Peak wavelength (nm) | Peak intensity | CIEx | CIEy |
| 63 | Ge 0% | 1200° C. 4 hr + 1300° C. 4 hr | $Ba_{1.88}Eu_{0.12}Si_7O_{10}N_4$ | 525 | 39.2 | 0.274 | 0.640 | 525 | 30.5 | 0.276 | 0.633 |
| 64 | Ge 3% | | $Ba_{1.88}Eu_{0.12}Si_{6.8}Ge_{0.2}O_{10}N_4$ | 525 | 18.7 | 0.269 | 0.639 | 525 | 12.1 | 0.267 | 0.627 |
| 65 | Ge 6% | | $Ba_{1.88}Eu_{0.12}Si_{6.6}Ge_{0.4}O_{10}N_4$ | 524 | 12.7 | 0.271 | 0.638 | 525 | 7.5 | 0.266 | 0.622 |
| 66 | Ge 29% | | $Ba_{1.88}Eu_{0.12}Si_5Ge_2O_{10}N_4$ | 528 | 2.5 | 0.283 | 0.628 | 521 | 1.4 | 0.267 | 0.585 |

Examples 14 to 25, 39 and 40

Each of $BaCO_3$, $SiO_2$, $Si_3N_4$ and $Eu_2O_3$ was weighed out so as to give a nominal chemical composition ratio shown in Table 7. Namely, in Example 14, 2.53 g of $BaCO_3$, 1.55 g of $SiO_2$, 0.91 g of $Si_3N_4$ and 0.01 g of $Eu_2O_3$ were used. In Example 15, 2.52 g of $BaCO_3$, 1.55 g of $SiO_2$, 0.91 g of $Si_3N_4$ and 0.02 g of $Eu_2O_3$ were used. In each of other Examples, according to each composition ratio, the proportion was varied based on the above charge amount.

These material powders were all transferred to an agate automatic mortar, ethanol was added, and the mixture was mixed well until it became homogeneous by means of a wet-type mixing method. The pasty mixture thus obtained was dried, filled into a boron nitride crucible in its powder state, and compression-molded by applying a slight weight. This boron nitride crucible was placed in a resistance-heating vacuum pressurized-atmosphere heat-treating furnace (manufactured by Fujidenpa Kogyo Co., Ltd.), and vacuum heated from room temperature to 800° C. at a rate of 20° C./min under a reduced pressure of $<5 \times 10^{-3}$ Pa. When the temperature reached 800° C., nitrogen gas of high purity (99.9995%) was introduced during 30 min until the pressure reached 0.92 MPa, while maintaining the temperature. After nitrogen gas introduction, the pressure of 0.92 MPa was maintained and the temperature was raised further to 1200° C. at a rate of 20° C./min. After that temperature was maintained for 5 min, the thermometer was changed from a thermocouple to a radiation thermometer, and the temperature was raised again to 1400° C. at a rate of 20° C./min, which was maintained for further 2 hr. The temperature was further raised to 1600° C. at a rate of 20° C./min, which temperature was maintained for 2 hr. After firing, the temperature was lowered to 1200° C. at a rate of 20° C./min, and the product was then allowed to cool spontaneously.

Figure 21:
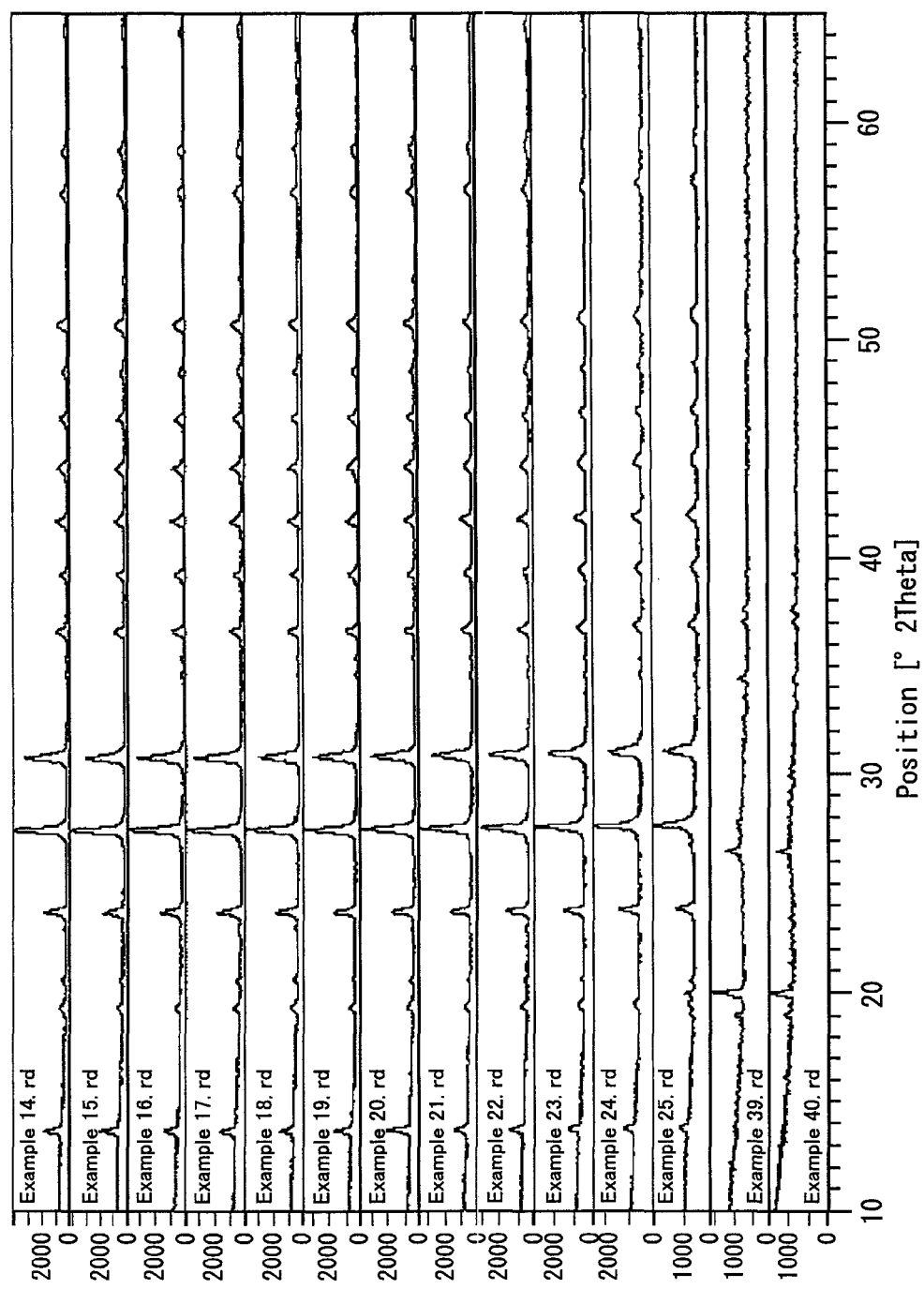
FIG. 21 is a graph illustrating the X ray diffraction patterns of the phosphors obtained in Examples 14 to 25, 39 and 40.
Figure 22:
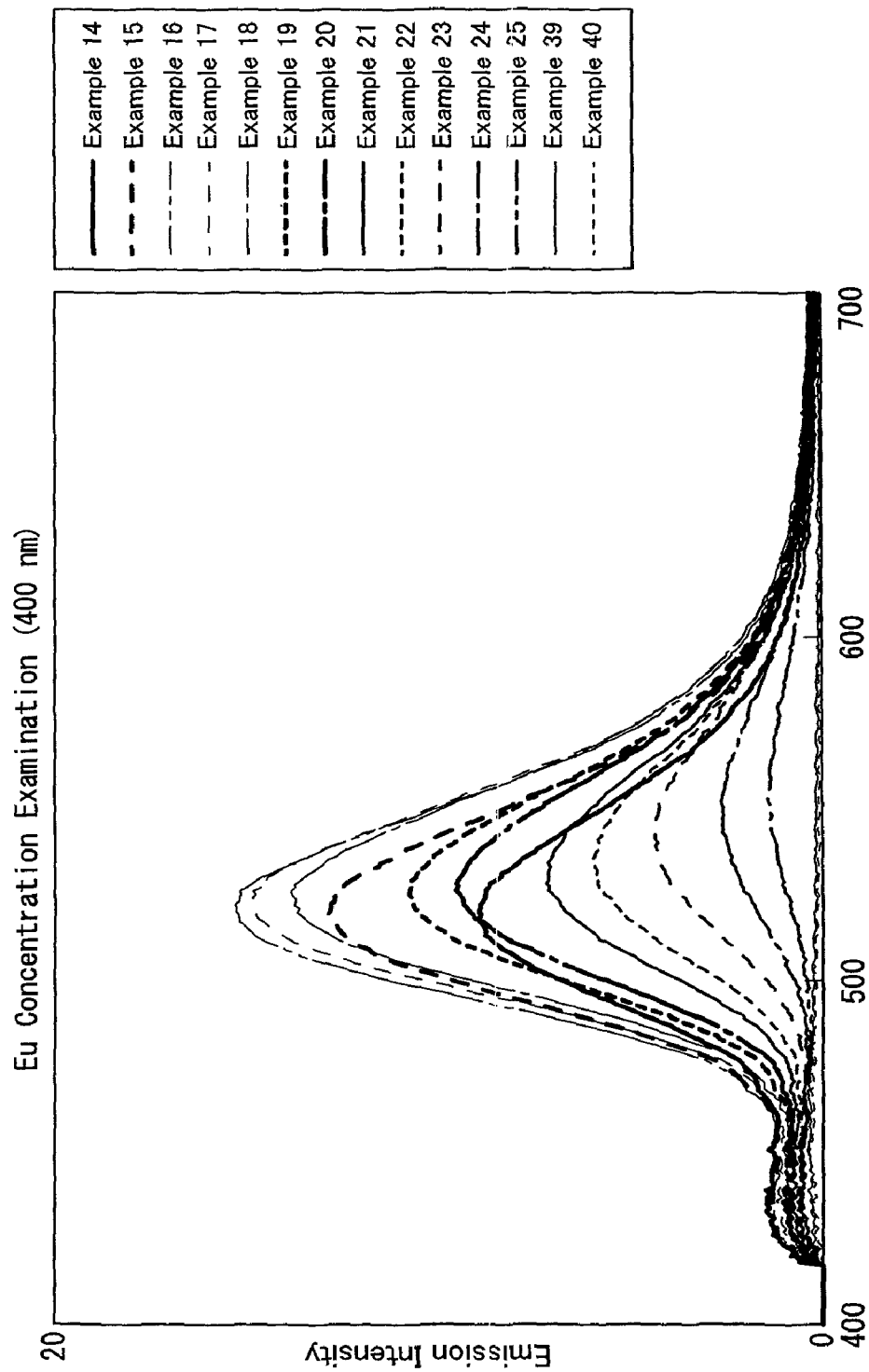
FIG. 22 is a graph illustrating the emission spectra of 400 nm-wavelength excitation, measured in Examples 14 to 25, 39 and 40.
Figure 23:
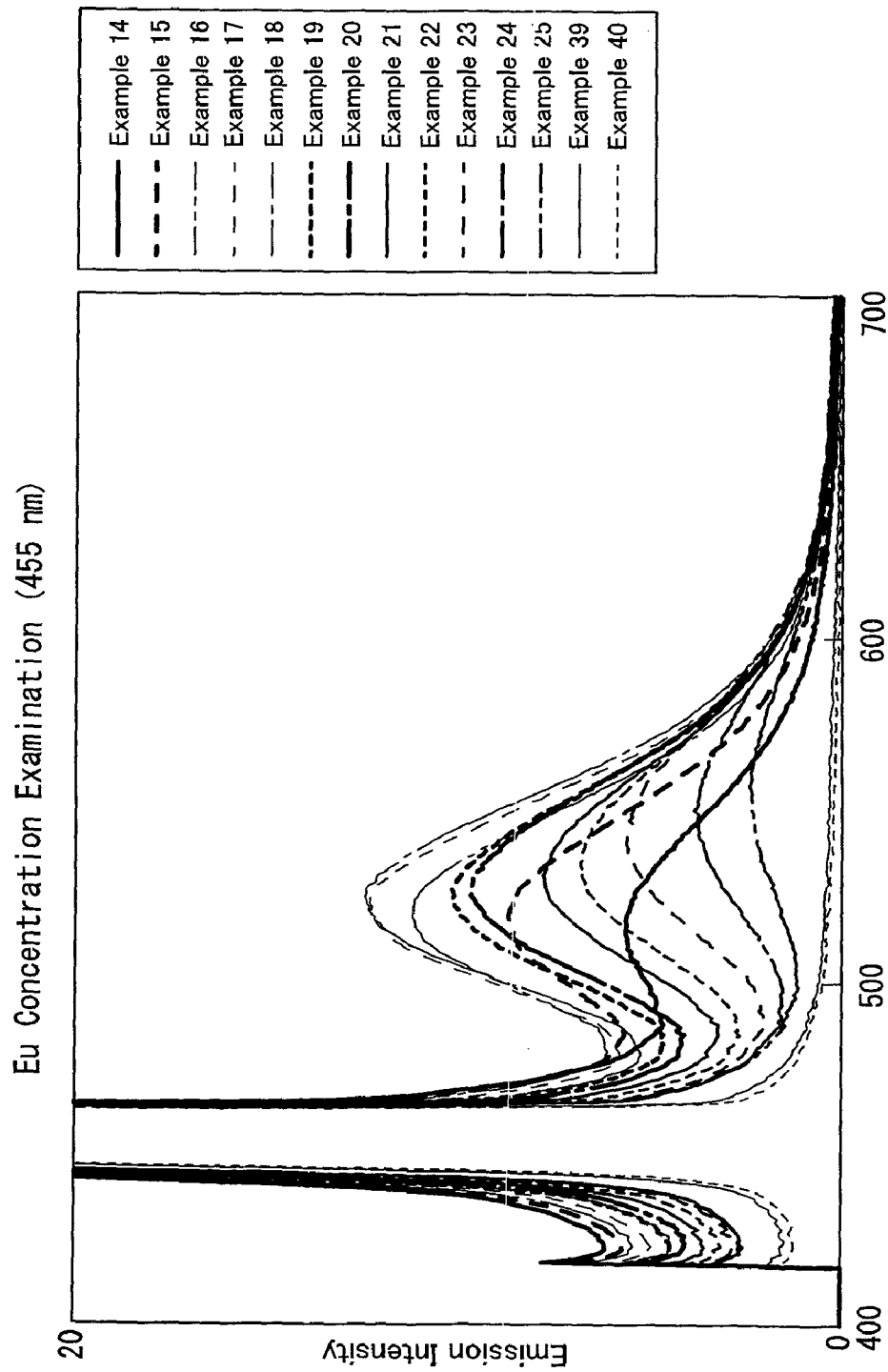
FIG. 23 is a graph illustrating the emission spectra of 455 nm-wavelength excitation, measured in Examples 14 to 25, 39 and 40.

X-ray diffraction patterns of fired products obtained are shown in FIG. 21. BSON phases were detected as the main phases in Examples 14 to 25. Fluorescence characteristics of these fired products were evaluated and the results are presented in Table 7. Emission spectr under the excitation wavelengths of 400 nm and 455 nm are shown in FIGS. 22 and 23.

At each excitation wavelength, light emitting was observed in the Eu concentration range of 0.5 atom % to 50 atom %. Light emitting was intense in the Eu concentration range of 0.5 atom % to 20 atom % and most intense in the Eu concentration range of 1 atom % to 10 atom %.

The relationship between the amount of Eu added and the emission peak wavelength is as follows. Namely, at an excitation wavelength of 400 nm and Eu concentration of 0.5 atom %, the emission peak wavelength was 520 nm. The luminous wavelength tended to be shifted to longer wavelength region as the Eu concentration was increased. At Eu concentrations of 10, 30 and 50 atom %, the peak wavelength was 526 nm, 544 nm and 553 nm, respectively.

TABLE 7

[Results of Examples 14 to 25, 39 and 40]

|  |  |  |  | 400-nm excitation | | | | 455-nm excitation | | | |
|---|---|---|---|---|---|---|---|---|---|---|---|
| Example | Substitution for Ba with Eu | Firing condition | Nominal chemical composition | Peak wavelength (nm) | Peak intensity | CIEx | CIEy | Peak wavelength (nm) | Peak intensity | CIEx | CIEy |
| 14 | Eu 0.5% | 1400° C. 2 hr + 1600° C. 2 hr | $Ba_{1.99}Eu_{0.01}Si_7O_{10}N_4$ | 520 | 9.0 | 0.249 | 0.594 | 515 | 5.6 | 0.250 | 0.600 |
| 15 | Eu 1% | 1400° C. 2 hr + 1600° C. 2 hr | $Ba_{1.98}Eu_{0.02}Si_7O_{10}N_4$ | 519 | 12.9 | 0.251 | 0.603 | 519 | 8.7 | 0.253 | 0.616 |
| 16 | Eu 2% | 1400° C. 2 hr + 1600° C. 2 hr | $Ba_{1.96}Eu_{0.04}Si_7O_{10}N_4$ | 522 | 15.3 | 0.255 | 0.607 | 519 | 11.2 | 0.257 | 0.622 |
| 17 | Eu 4% | 1400° C. 2 hr + 1600° C. 2 hr | $Ba_{1.92}Eu_{0.08}Si_7O_{10}N_4$ | 524 | 14.9 | 0.264 | 0.610 | 523 | 12.3 | 0.265 | 0.625 |
| 18 | Eu 6% | 1400° C. 2 hr + 1600° C. 2 hr | $Ba_{1.88}Eu_{0.12}Si_7O_{10}N_4$ | 526 | 13.9 | 0.272 | 0.612 | 525 | 12.4 | 0.273 | 0.626 |
| 19 | Eu 8% | 1400° C. 2 hr + 1600° C. 2 hr | $Ba_{1.84}Eu_{0.16}Si_7O_{10}N_4$ | 528 | 10.8 | 0.280 | 0.608 | 527 | 10.2 | 0.280 | 0.621 |
| 20 | Eu 10% | 1400° C. 2 hr + 1600° C. 2 hr | $Ba_{1.8}Eu_{0.2}Si_7O_{10}N_4$ | 526 | 9.5 | 0.288 | 0.608 | 526 | 9.7 | 0.287 | 0.620 |
| 21 | Eu 15% | 1400° C. 2 hr + 1600° C. 2 hr | $Ba_{1.7}Eu_{0.3}Si_7O_{10}N_4$ | 528 | 7.2 | 0.304 | 0.604 | 531 | 7.8 | 0.304 | 0.614 |

TABLE 7-continued

[Results of Examples 14 to 25, 39 and 40]

| | | | | 400-nm excitation | | | | 455-nm excitation | | | |
|---|---|---|---|---|---|---|---|---|---|---|---|
| Example | Substitution for Ba with Eu | Firing condition | Nominal chemical composition | Peak wavelength (nm) | Peak intensity | CIEx | CIEy | Peak wavelength (nm) | Peak intensity | CIEx | CIEy |
| 22 | Eu 20% | 1400° C. 2 hr + 1600° C. 2 hr | $Ba_{1.6}Eu_{0.4}Si_7O_{10}N_4$ | 535 | 6.0 | 0.321 | 0.599 | 534 | 6.8 | 0.319 | 0.608 |
| 23 | Eu 30% | 1400° C. 2 hr + 1600° C. 2 hr | $Ba_{1.4}Eu_{0.6}Si_7O_{10}N_4$ | 544 | 4.4 | 0.352 | 0.582 | 540 | 5.6 | 0.349 | 0.590 |
| 24 | Eu 40% | 1400° C. 2 hr + 1600° C. 2 hr | $Ba_{1.2}Eu_{0.8}Si_7O_{10}N_4$ | 551 | 2.6 | 0.375 | 0.556 | 550 | 3.9 | 0.372 | 0.568 |
| 25 | Eu 50% | 1400° C. 2 hr + 1600° C. 2 hr | $Ba_1Eu_1Si_7O_{10}N_4$ | 553 | 1.4 | 0.386 | 0.523 | 557 | 2.4 | 0.384 | 0.546 |
| 39 | Eu 70% | 1400° C. 2 hr + 1600° C. 2 hr | $Ba_{0.6}Eu_{1.4}Si_7O_{10}N_4$ | 468 | 0.4 | 0.289 | 0.404 | 523 | 0.5 | 0.309 | 0.512 |
| 40 | Eu 100% | 1400° C. 2 hr + 1600° C. 2 hr | $Eu_2Si_7O_{10}N_4$ | 450 | 0.4 | 0.256 | 0.382 | 547 | 0.2 | 0.261 | 0.514 |

Examples 67 to 69

Each of $BaCO_3$, $SiO_2$, $Si_3N_4$, $Eu_2O_3$, $CeO_2$ and $MnO_2$ was weighed out so as to give a nominal chemical composition ratio shown in Table 8. Namely, in Example 67, 5.80 g of $BaCO_3$, 3.50 g of $SiO_2$, 2.04 g of $Si_3N_4$ and 0.05 g of $CeO_2$ (manufactured by Shin-Etsu Chemical Co., Ltd.) were used. In Example 68, 5.80 g of $BaCO_3$, 3.50 g of $SiO_2$, 2.04 g of $Si_3N_4$ and 0.05 g of $Eu_2O_3$ were used. In Example 69, 5.45 g of $BaCO_3$, 3.50 g of $SiO_2$, 2.04 g of $Si_3N_4$, 0.31 g of $Eu_2O_3$ and 0.03 g of $MnO_2$ (manufactured by Junsei Chemical Co., Ltd.) were used.

These material powders were all transferred to an agate automatic mortar, ethanol was added, and the mixture was mixed well until it became homogeneous by means of a wet-type mixing method. The pasty mixture thus obtained was dried, filled into an alumina crucible and compression-molded by applying a slight weight. This was placed in a resistance-heating tubular electric furnace fitted with a temperature regulator and heated to 1200° C. at a rate of 4.8° C./min, in a mixed current of 0.5 l/min of 96 volume % of nitrogen and 4 volume % of hydrogen under atmospheric pressure. That temperature was maintained for 4 hr and then the mixture was allowed to cool to room temperature. The sample obtained was pulverized in an aluminum mortar and the pulverized sample was again filled into an alumina crucible and compression-molded by applying a slight weight. This alumina crucible was placed in a resistance-heating tubular electric furnace fitted with a temperature regulator and heated to 1300° C. at a rate of 4.8° C./min, in a mixed current of 0.5 l/min of 96 volume % of nitrogen and 4 volume % of hydrogen under atmospheric pressure. That temperature was maintained for 4 hr and then the product was allowed to cool to room temperature.

Figure 24:
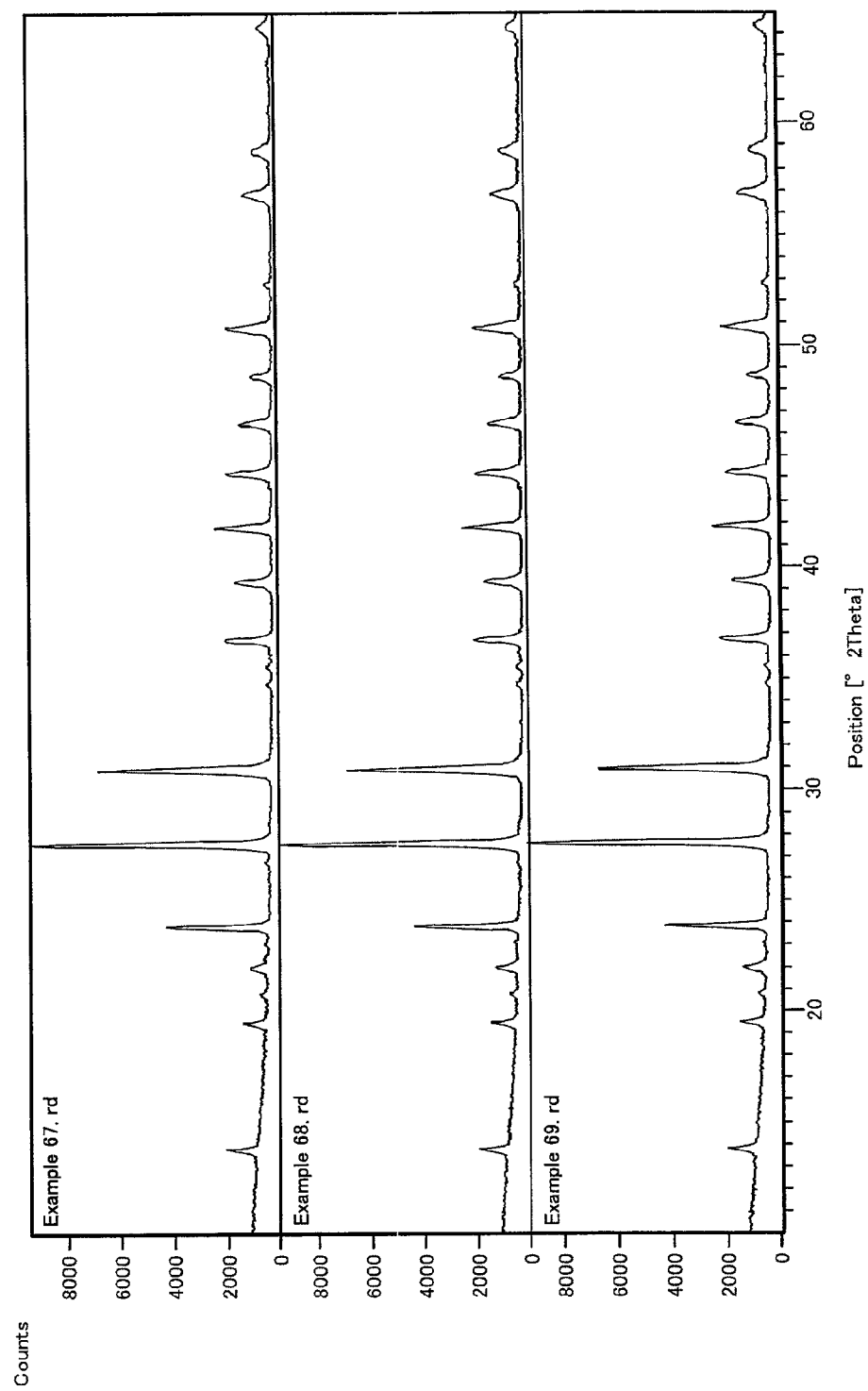
FIG. 24 is a graph illustrating the X ray diffraction patterns of the phosphors obtained in Examples 67 to 69.
Figure 25:
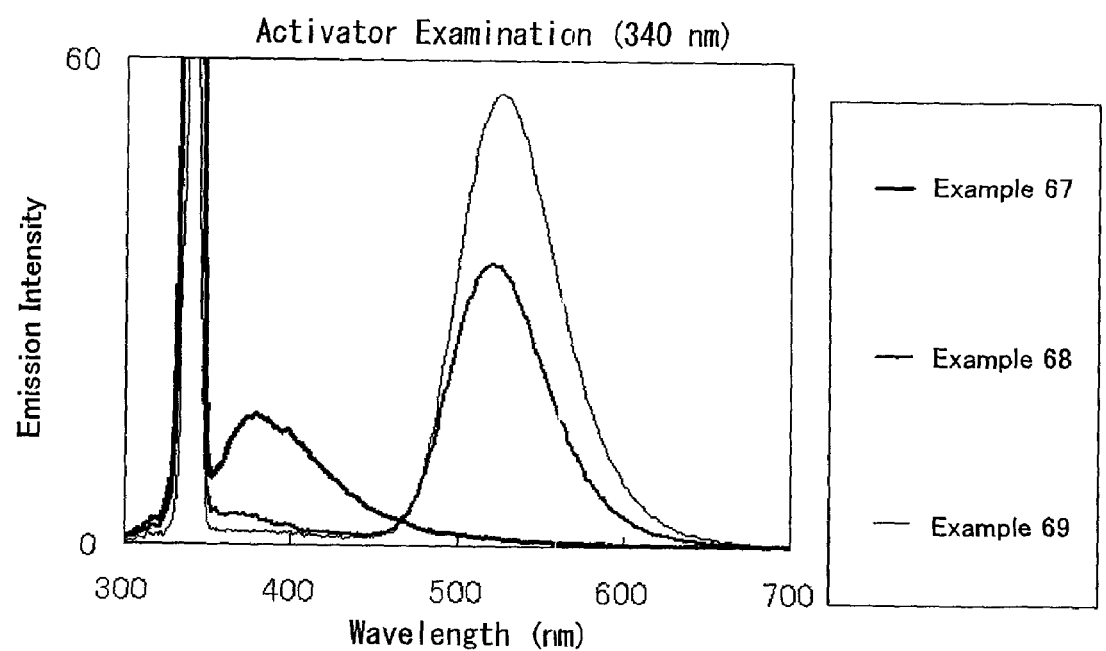
FIG. 25 is a graph illustrating the emission spectra of 340 nm-wavelength excitation, measured in Examples 67 to 69.
Figure 26:
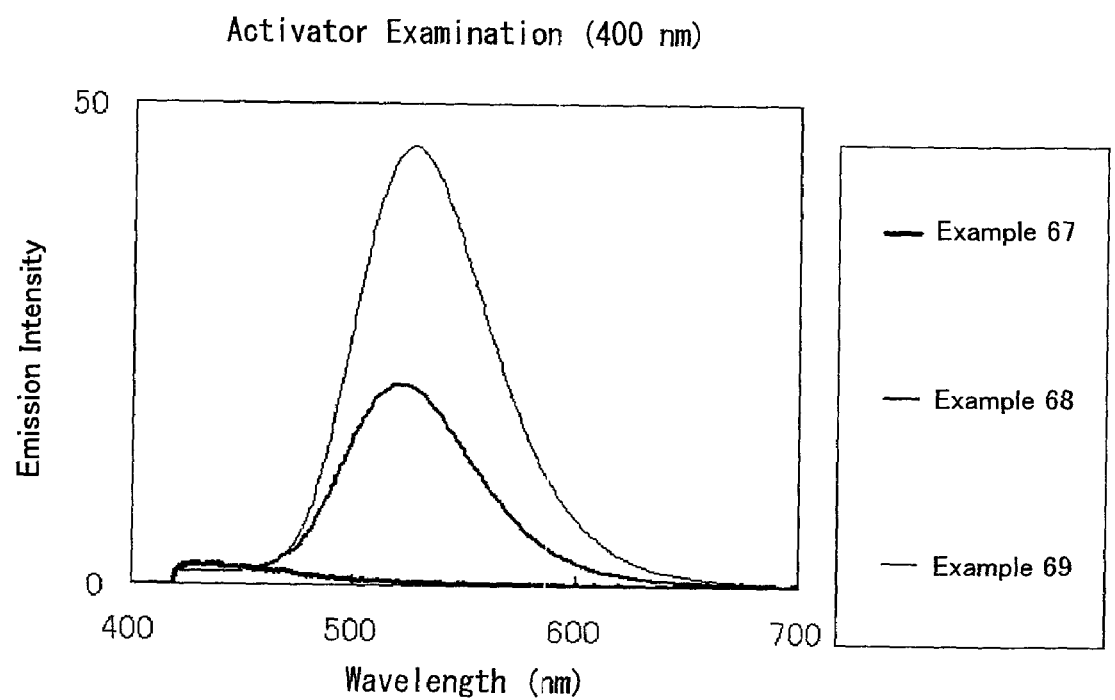
FIG. 26 is a graph illustrating the emission spectra of 400 nm-wavelength excitation, measured in Examples 67 to 69.
Figure 27:
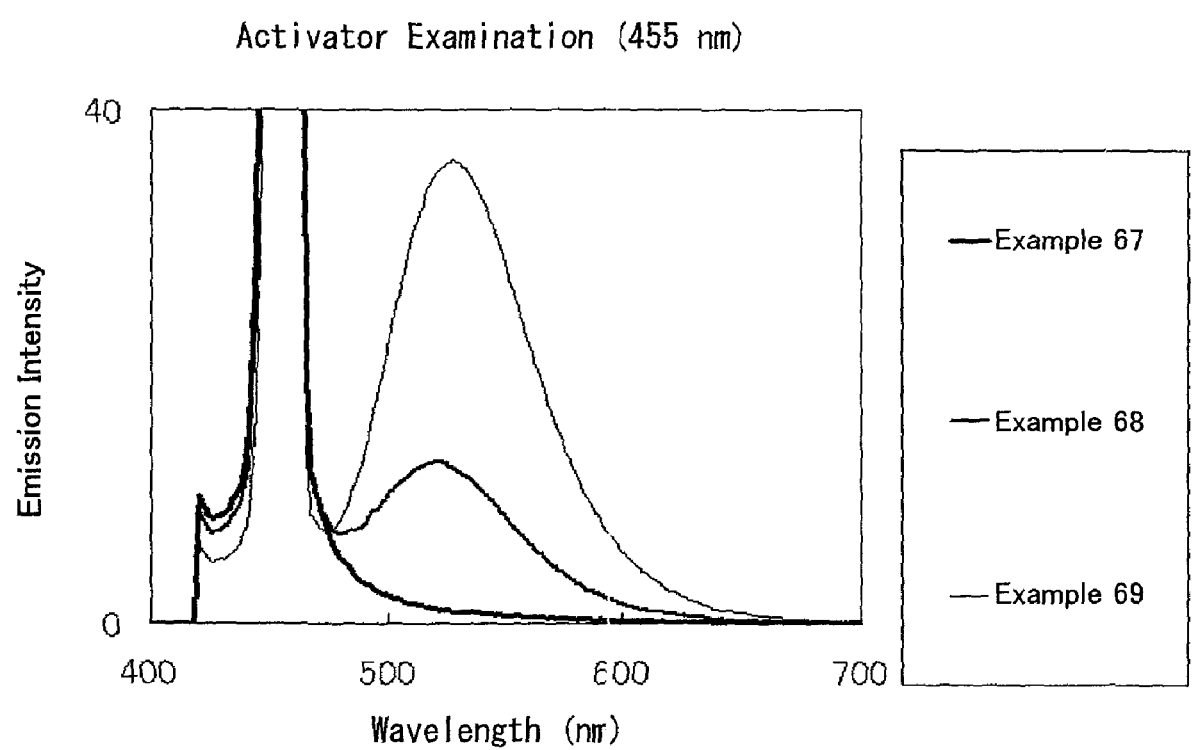
FIG. 27 is a graph illustrating the emission spectra of 455 nm-wavelength excitation, measured in Examples 67 to 69.

X-ray diffraction patterns of the fired products obtained are shown in FIG. 24. The results show that BSON phases were detected as the main phases. Fluorescence characteristics of these fired products were evaluated and the results are presented in Table 8. Emission spectra at the excitation with wavelength of 340 nm, 400 nm and 455 nm are shown in FIGS. 25 to 27.

At the excitation wavelength of 340 nm, light emitting, although slightly, was confirmed only in the BSON crystal phase with Ce and Eu as the luminescent centers. Further, in the Eu—Mn coactivation, red light emitting originating from Mn was not confirmed but green light emitting originating from Eu could be confirmed.

TABLE 8

[Results of Examples 67 to 69]

| | | | | 340-nm excitation | | | |
|---|---|---|---|---|---|---|---|
| Example | Substitution amount | Firing condition | Nominal chemical composition | Peak wavelength (nm) | Peak intensity | CIEx | CIEy |
| 67 | Ce 1% | 1200° C. 4 hr + 1300° C. 4 hr | $Ba_{1.98}Ce_{0.02}Si_7O_{10}N_4$ | 380 | 16.3 | 0.173 | 0.094 |
| 68 | Eu 1% | | $Ba_{1.98}Eu_{0.02}Si_7O_{10}N_4$ | 520 | 34.8 | 0.240 | 0.596 |
| 69 | Eu 6% Mn 1% | | $Ba_{1.86}Eu_{0.12}Mn_{0.02}Si_7O_{10}N_4$ | 526 | 56.0 | 0.270 | 0.617 |

TABLE 8-continued

[Results of Examples 67 to 69]

|  | 400-nm excitation | | | | 455-nm excitation | | | |
| --- | --- | --- | --- | --- | --- | --- | --- | --- |
| Example | Peak wavelength (nm) | Peak intensity | CIEx | CIEy | Peak wavelength (nm) | Peak intensity | CIEx | CIEy |
| 67 | 437 | 2.1 | 0.222 | 0.531 | 617 | 0.2 | 0.209 | 0.498 |
| 68 | 520 | 21.0 | 0.251 | 0.643 | 518 | 12.6 | 0.249 | 0.625 |
| 69 | 527 | 45.7 | 0.279 | 0.641 | 527 | 36.2 | 0.281 | 0.636 |

Examples 26 to 34

In order to give a charge composition ratio shown in Table 9, 2.40 g of $BaCO_3$, 1.56 g of $SiO_2$, 0.91 g of $Si_3N_4$ and 0.14 g of $Eu_2O_3$ were used.

In Example 26, these material powders were all transferred to an agate automatic mortar, ethanol was added, and the mixture was mixed well until it became homogeneous by means of a wet-type mixing method. The pasty mixture thus obtained was dried, filled into a boron nitride crucible in its powder state, and compression-molded by applying a slight weight. This boron nitride crucible was placed in a resistance-heating vacuum pressurized-atmosphere heat-treating furnace (manufactured by Fujidenpa Kogyo Co., Ltd.), and vacuum heated from room temperature to 800° C. at a rate of 20° C./min under a reduced pressure of $<5\times10^{-3}$ Pa. When the temperature reached 800° C., nitrogen gas of high purity (99.9995%) was introduced during 30 min until the pressure reached 0.92 MPa, while maintaining the temperature. After nitrogen gas introduction, the pressure of 0.92 MPa was maintained and the temperature was raised further to 1200° C. at a rate of 20° C./min. After that temperature was maintained for 5 min, the thermometer was changed from a thermocouple to a radiation thermometer, and the temperature was raised again to 1600° C. at a rate of 20° C./min, which was maintained for further 2 hr. The temperature was further raised to 1800° C. at a rate of 20° C./min, which temperature was maintained for 2 hr. After firing, the temperature was lowered to 1200° C. at a rate of 20° C./min, and the product was then allowed to cool spontaneously.

For Examples 27 to 29, mixing/firing was performed in the same manner as described above for Example 26, except that the firing temperatures of 1600° C. and 1800° C. in Example 26 was changed to the temperatures described in Table 9.

In Example 30, the process after the change from a thermocouple to a radiation thermometer, of the mixing/firing method described in Example 26 above, was modified as follows. Namely, the temperature was raised to 1300° C. at a rate of 20° C./min, which temperature was maintained for 2 hr, and then lowered to 1200° C. at a rate of 20° C./min, followed by spontaneous cooling.

In Example 31, mixing/firing was performed in the same manner as described for Example 30, except that maintenance time at 1300° C. was 4 hr.

In Example 32, refiring was performed in the same manner as described for example 31, after the fired product obtained by the method of Example 30 was pulverized and mixed in an alumina mortar.

In Example 33, when the mixture was filled in a boron nitride crucible and fired, it was placed in a resistance-heating electric furnace first and heated in the air from room temperature to 1100° C. at a rate of 5° C./min and that temperature was maintained for 3 hr. The mixture was then cooled to room temperature. The calcined product obtained was pulverized and mixed in an alumina mortar and then refired in the same manner as described for Example 30.

In Example 34, further refiring was performed in the same manner as described for example 31, after the fired product obtained in Example 33 was pulverized and mixed in an alumina mortar.

Figure 28:
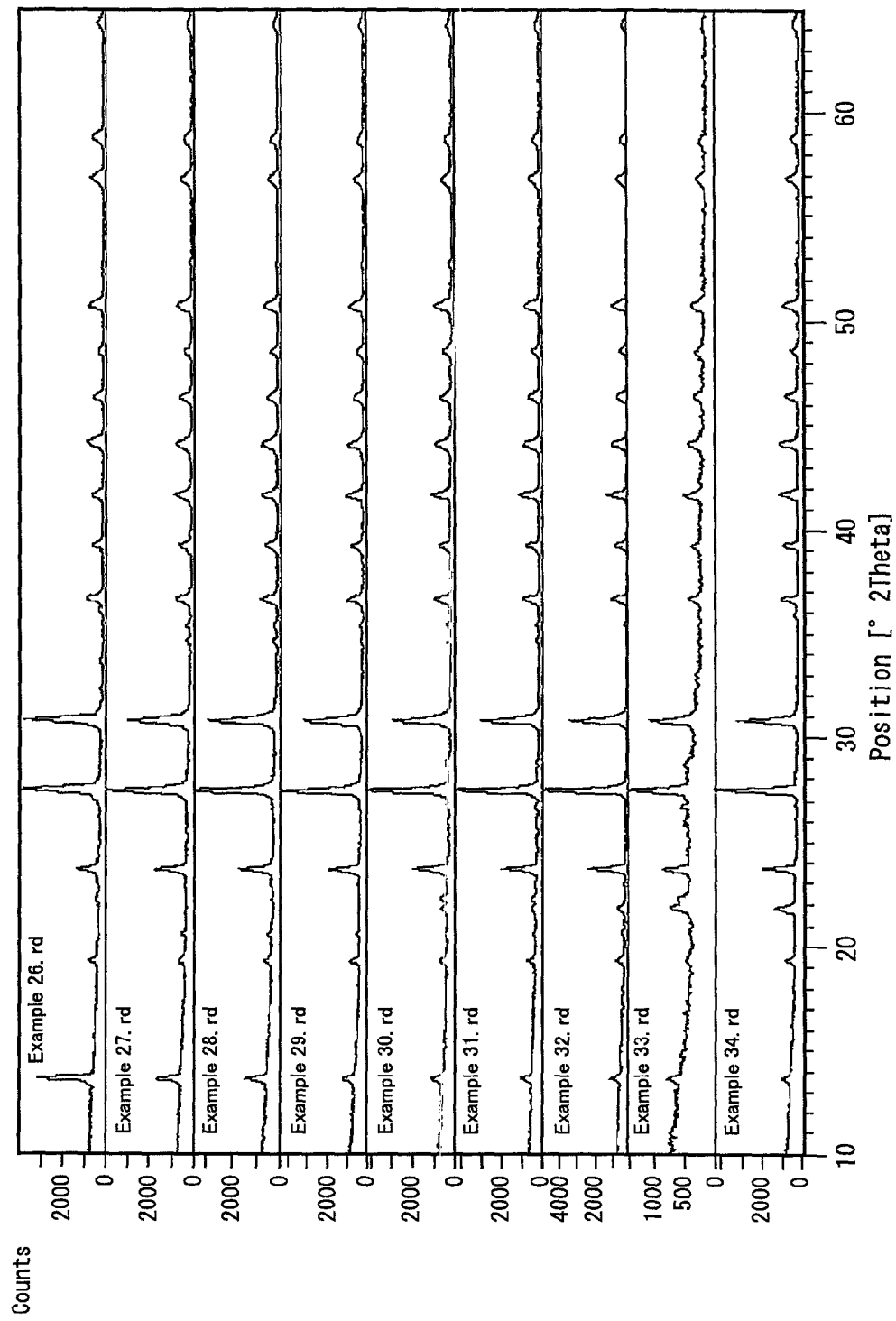
FIG. 28 is a graph illustrating the X ray diffraction patterns of the phosphors obtained in Examples 26 to 34.

X-ray diffraction patterns of the fired products obtained are shown in FIG. 28. Particularly for Example 34, the enlarged view thereof is presented as FIG. 29. BSON phases were detected in all the Examples of 26 to 34.

With the firing temperature of 1400° C. or higher, the intensity of green light emitted decreased markedly. There was no change observed in the emission peak wavelength, though.

Figure 30:
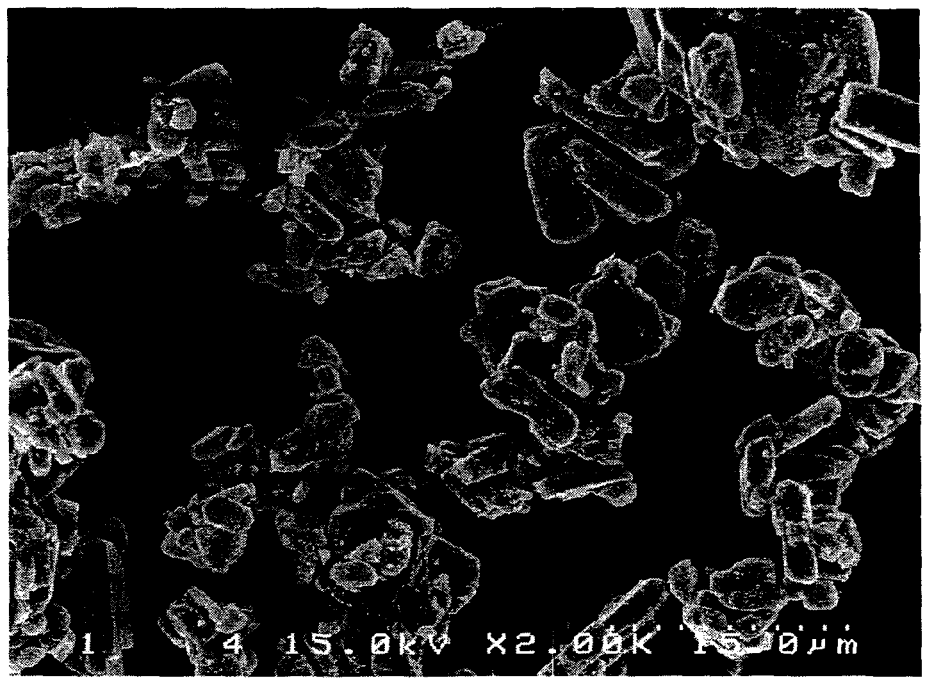
FIG. 30 is a photo, which substitutes for a drawing, of the phosphor obtained in Example 30, taken with an SEM.

Example 30, in which firing was done at 1300° C., gave a BSON crystal phase with high crystallinity. FIG. 30 is a photo, which substitutes for a drawing, of the sample powder at that time, taken with a transmission [sic] electron microscope (SEM). There were secondary particles observed, which were formed of primary particles with particle diameters of around 6 μm.

In also Example 32, powder of high crystallinity was obtained, of which emission intensity was also high.

Particularly, powder obtained in Example 34 was high in crystallinity and the highest in emission intensity.

Figure 31:
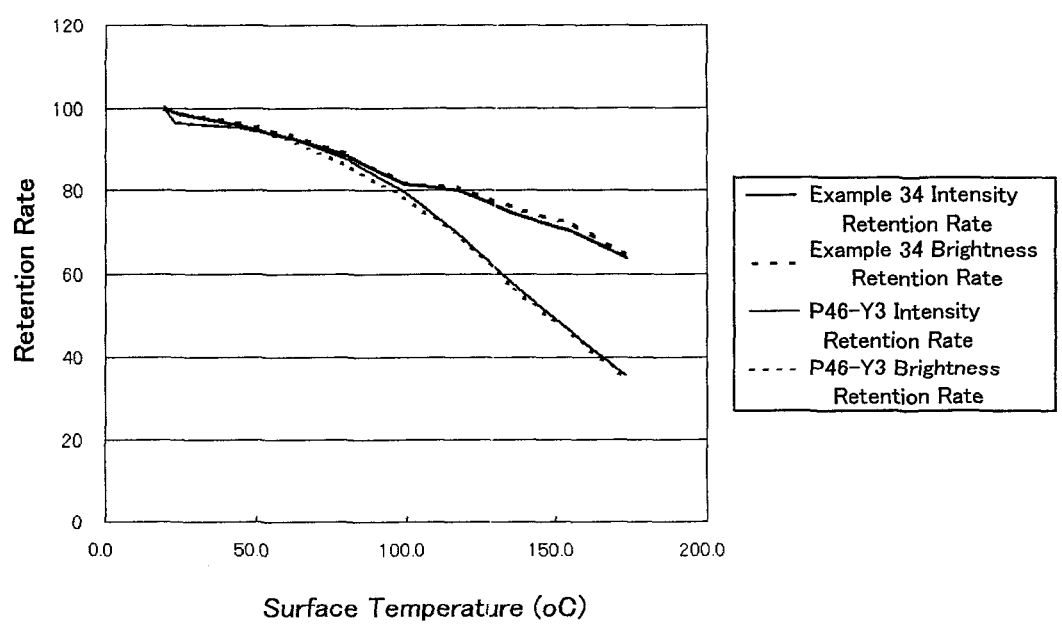
FIG. 31 is a graph comparing the temperature characteristics of the phosphor obtained in Example 34 with that of P46-Y3 (YAG:Ce).

Temperature characteristics of the phosphor obtained in Example 34 and a YAG:Ce phosphor (yttrium aluminium garnet phosphor "P46-Y3", manufactured by Kasei Optonics, Ltd.) were measured. The result is shown in FIG. 31. The phosphor of Example 34 decreases less in emission intensity or emission brightness when the temperature rose than the YAG:Ce phosphor. Therefore, the phosphor of the present invention can be preferably used for an illumination lamp that is used at high temperature range of luminous chip for high power output.

In Example 33, a glass phase was observed. Phase identification of the glass phase was impossible. The light emission was minute.

TABLE 9

[Resuts of Examples 26 to 34]

| | | | 400-nm excitation | | | | 455-nm excitation | | | |
|---|---|---|---|---|---|---|---|---|---|---|
| Example | Firing condition | Nominal chemical composition | Peak wavelength (nm) | Peak intensity | CIEx | CIEy | Peak wavelength (nm) | Peak intensity | CIEx | CIEy |
| 26 | 1600° C. 2 hr + 1800° C. 2 hr | $Ba_{1.88}Eu_{0.12}Si_2O_{10}N_4$ | 524 | 12.6 | 0.267 | 0.575 | 527 | 10.4 | 0.276 | 0.623 |
| 27 | 1400° C. 2 hr + 1600° C. 2 hr | $Ba_{1.88}Eu_{0.12}Si_2O_{10}N_4$ | 524 | 12.6 | 0.265 | 0.575 | 523 | 12.0 | 0.274 | 0.625 |
| 28 | 1400° C. 2 hr + 1500° C. 2 hr | $Ba_{1.88}Eu_{0.12}Si_2O_{10}N_4$ | 525 | 10.3 | 0.259 | 0.569 | 521 | 9.7 | 0.269 | 0.623 |
| 29 | 1200° C. 2 hr + 1400° C. 2 hr | $Ba_{1.88}Eu_{0.12}Si_2O_{10}N_4$ | 520 | 12.2 | 0.255 | 0.576 | 523 | 10.2 | 0.265 | 0.625 |
| 30 | 1300° C. 2 hr | $Ba_{1.88}Eu_{0.12}Si_2O_{10}N_4$ | 527 | 21.9 | 0.265 | 0.598 | 525 | 17.3 | 0.275 | 0.632 |
| 31 | 1300° C. 4 hr | $Ba_{1.88}Eu_{0.12}Si_2O_{10}N_4$ | 524 | 29.5 | 0.266 | 0.610 | 525 | 23.6 | 0.275 | 0.636 |
| 32 | 1300° C. 2 hr + 1300° C. 4 hr | $Ba_{1.88}Eu_{0.12}Si_2O_{10}N_4$ | 524 | 38.5 | 0.270 | 0.616 | 526 | 31.2 | 0.278 | 0.637 |
| 33 | calcination 1100° C. 3 hr + 1300° C. 2 hr | $Ba_{1.88}Eu_{0.12}Si_2O_{10}N_4$ | 527 | 5.0 | 0.302 | 0.519 | 529 | 5.8 | 0.304 | 0.597 |
| 34 | calcination 1100° C. 3 hr + 1300° C. 2 hr + 1300° C. 4 hr | $Ba_{1.88}Eu_{0.12}Si_2O_{10}N_4$ | 528 | 50.3 | 0.276 | 0.625 | 528 | 49.4 | 0.282 | 0.642 |

Further, Eu-L3 absorption edges of phosphors obtained in Example 32 and 34 were measured by means of X-ray absorption near-edge fine structure (XANES) spectrum measurement. The XANES measurement was carried out using an Si(111) two-crystal spectroscope in XAFS measurement apparatus placed in Beamline 12C, of Inter-university research institute, High Energy Accelerator Research Organization, Institute of Materials Structure Science, Photon Factory. Energy calibration of the X-ray was made with the angle of the spectroscope, in a preedge peak that can be seen at 8980.3 eV in the copper-foil XANES spectrum of Cu—K absorption edge, set at 12.7185 degree. Additionally, minute deviation of the spectroscope over time was corrected by performing XANES measurement of Eu-L3 absorption edge of europium oxide before and after the sample measurement. At that time, the peak of $Eu^{3+}$, in europium oxide, was located at 6979.6 eV.

The XANES spectrum measurement was carried out by means of transmission method in the vicinity of Eu-L3 absorption edge (around 6970 eV) at intervals of 0.25 eV with 1 or 2 sec of accumulation time at each measurement point. Namely, ion chambers filled with nitrogen gas having electrode lengths of 17 cm and 31 cm were used for detectors of X-rays incident and X-rays after being passed through the sample, respectively, and X-ray absorption coefficient was defined as $\mu t=\ln(I0/I)$ (here, I0 and I indicate intensities of X-rays incident and X-rays after being passed through the sample, respectively) in accordance with Lambert-Beer law.

Sample used for measurement was a phosphor powder tablet of 10 mm in diameter, which was formed by firing, sieved, and mixed well with boron nitride of about 70 mg in an agate mortar to be homogenous and then pressurized at 150 kg-wt/cm².

The first order differentiation of the XANES spectra, obtained as above, of the Eu-L3 absorption edges was performed for removing influences of background, resulting in appearances of spectral patterns originating from $Eu^{2+}$ and $Eu^{3+}$, around 6965 eV to 6976 eV and 6976 eV to 6990 eV, respectively. Each difference between the maximum value and the minimum value of the derivative spectrum in the respective energy range was calculated. Then, for normalization, each of them Was divided by the difference between the maximum value and the minimum value of each Eu-L3 XANES derivative spectrum of standard sample $Eu^{2+}$ or $Eu^{3+}$, and the divided values were defined as peak intensities p and q of $Eu^{2+}$ and $Eu^{3+}$, respectively. When the ratio of $Eu^{2+}$ in the entire Eu, defined as $r=p/(p+q)$, was investigated, it was more than 95% in both Examples.

Figure 32:
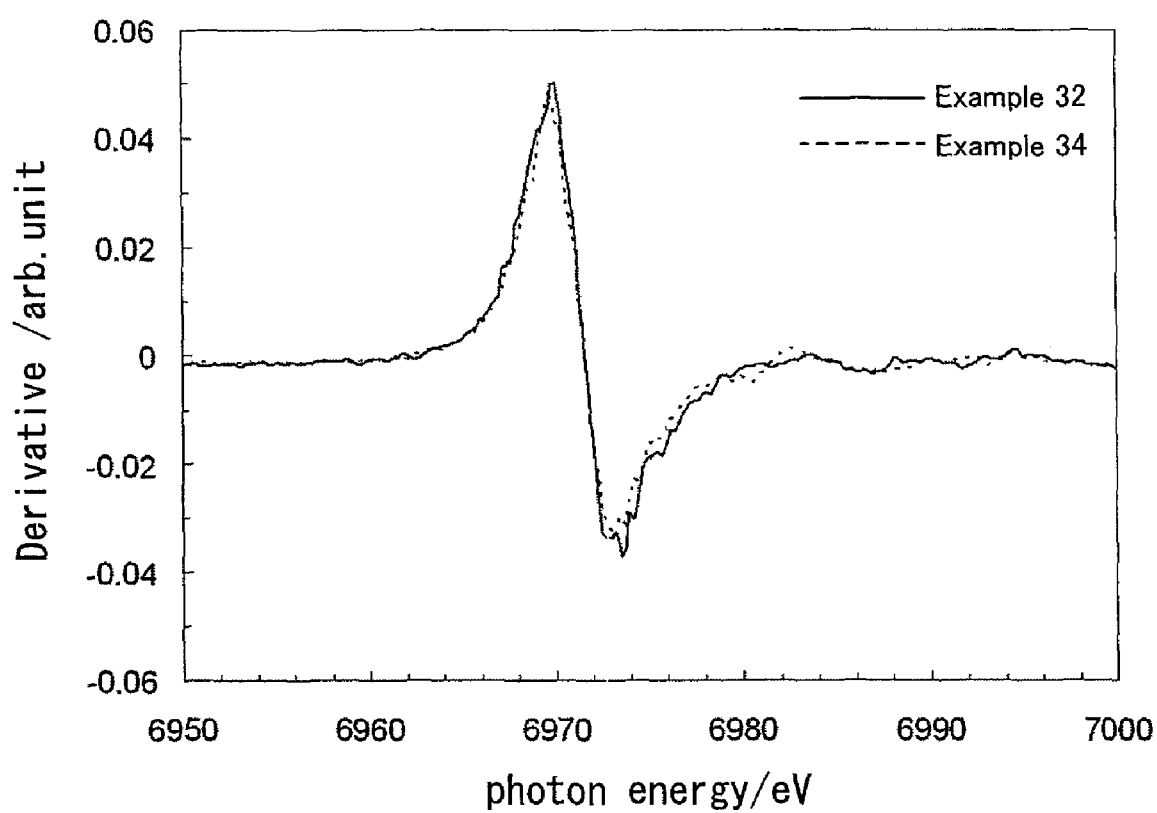
FIG. 32 is a graph of the first order differential curves of the XANES spectra measured for the phosphors of Examples 32 and 34.

The first order differential curves of the above-mentioned XANES spectra are shown in FIG. 32.

Figure 33:
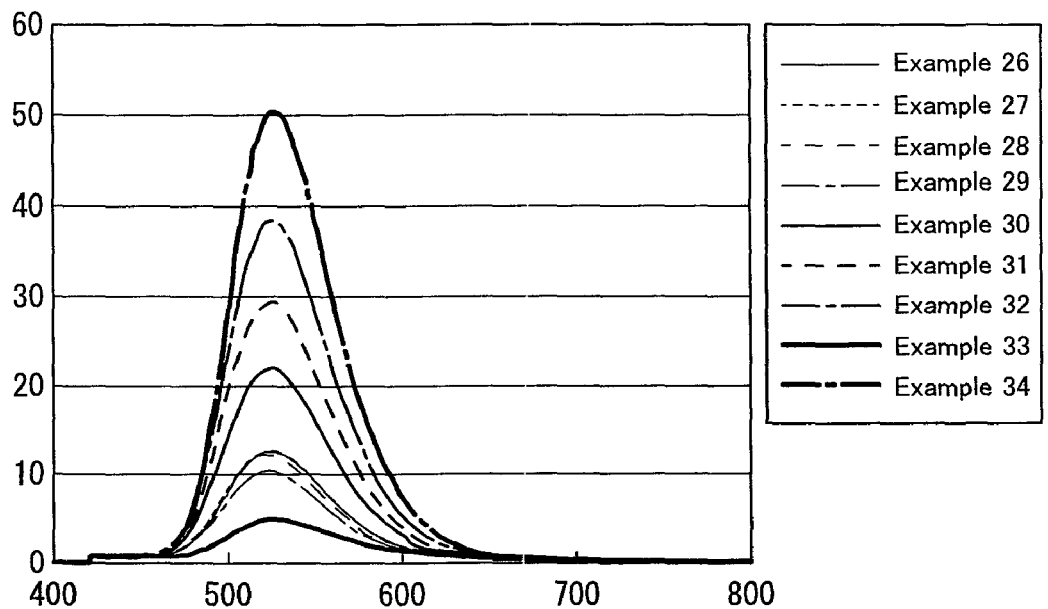
FIG. 33 is a graph illustrating the emission spectra of 400 nm-wavelength excitation, measured in Examples 26 to 34.
Figure 34:
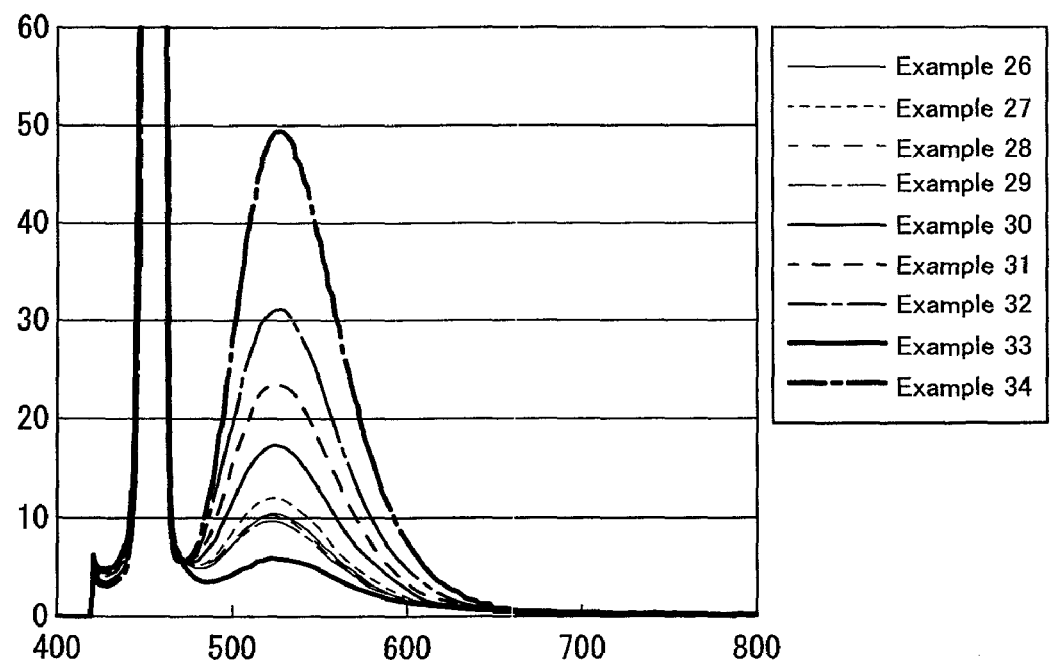
FIG. 34 is a graph illustrating the emission spectra of 455 nm-wavelength excitation, measured in Examples 26 to 34.

Emission spectrum of the phosphors of Examples 26 to 34, at the excitation wavelengths of 400 nm and 455 nm, are shown in FIGS. 33 and 34, respectively.

Figure 29:
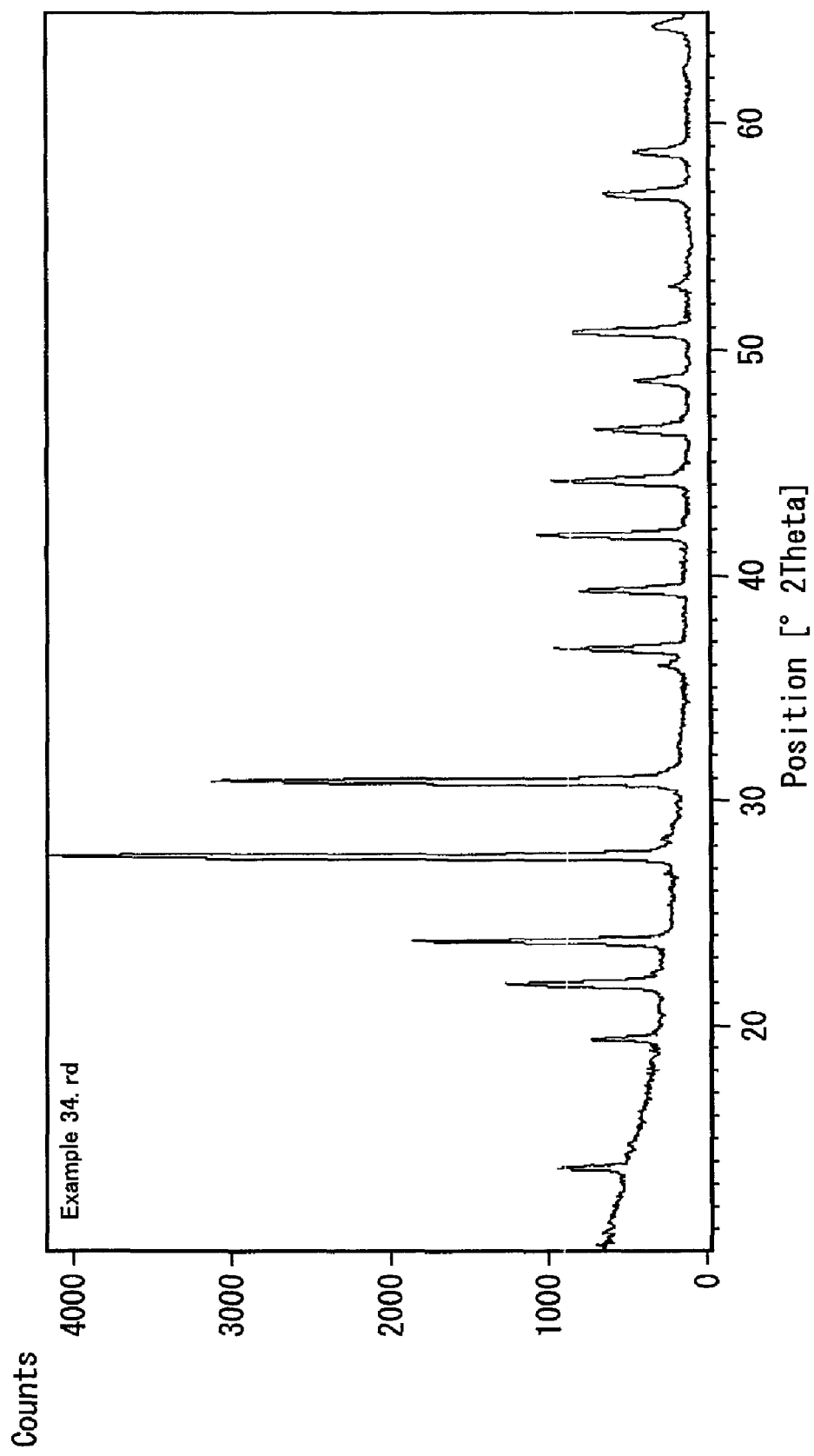
FIG. 29 is an enlarged graph illustrating the X ray diffraction pattern of the phosphor obtained in Example 34.

Peaks of $2\theta=21.88°$, 28.40° and 35.94° (refer to Table 10) shown in FIG. 29 were identified as peaks of impurities which can be attributed to $SiO_2$ having cristobalite structures (PDF card of (39-1425)). As the other unknown peaks, several candidates such as monoclinic crystal, trigonal crystal and orthorhombic crystal could be confirmed. The Table 10 showed the peaks observed and their Miller indices of monoclinic crystal $P2_1/c$ (a=7.486 Å, b=6.469 Å, c=7.471 Å, β=119.97 Å), trigonal P3 ($a_h$=7.483 Å, c=6.474 Å) and orthorhombic crystal Ama2 (a=6.47 Å, b=12.943 Å, c=7.484 Å). It was evident from the comparison of the above lattice constants that all the other peaks are attributable to the same crystal. For example, the differences between the Miller indices of monoclinic crystals and trigonal crystals were due to the difference between the two β, 119.97° and 120°. Further, the lattice constant b of orthorhombic system corresponds to the following formula, represented using the value of $a_h$ of the aforementioned trigonal system P3.

$$a_h \times 2 \times \sqrt{3}/2 = 12.96 \qquad \text{[Mathematical Formula 7]}$$

In other words, trigonal system and orthorhombic system are different just in how to take the lattice as.

Accordingly, indices of all the peaks, other than those of $SiO_2$ impurities, could be determined, and they were attributed to a single phase. Furthermore, it was not identified by PDF database, which indicates that the crystal is a new substance.

Therefore, Table 10 shows X-ray diffraction peaks (using $Cu\kappa\alpha=1.5406$ Å as radiation source) which will be observed possibly for the multinary oxynitride phosphor represented by the general formula (I) in the range of $2\theta_{obs}=10°$ to 60°, with their relative peak intensities $I_{obs}$ ($=I/I_{27.5°}\times 100$) and determined indices based on the three crystal systems in the range of $2\theta_{obs}=10°$ to 60°.

TABLE 10

[Measurement results concerning X-ray diffraction peak]

| Peak number | $2\theta_{obs}$ | $I_{obs}$ (%) | $P2_1/c$ | P3 | Ama2 |
|---|---|---|---|---|---|
| 1 | 11.7–14.7 | 18 | 100 | 100 | 011 |
| 2 | 17.4–20.4 | 13 | 110 | 011 | 111 |
| 3 | 20.9–22.9 | 27 | — | — | — |
| 4 | 21.8–24.8 | 47 | 102 | 110 | 002 |
| 5 | 25.5–28.5 | 100 | 200 | 200 | 022 |
| 6 | 27.4–29.4 | 4 | | | |
| 7 | 28.9–31.9 | 69 | 210 | 021 | 122 |
| 8 | 34.9–36.9 | 4 | — | — | — |
| 9 | 34.7–37.7 | 20 | 302 | 120 | 013 |
| 10 | 37.3–40.3 | 15 | 311 | 121 | 113 |
| 11 | 39.8–42.8 | 22 | 300 | 300 | 033 |
| 12 | 41.8–43.8 | 2 | — | — | — |
| 13 | 42.2–45.2 | 18 | 310 | 031 | 133 |
| 14 | 44.5–47.5 | 13 | −321 | 212 | 213 |
| 15 | 46.6–49.6 | 9 | −402 | 220 | 004 |
| 16 | 48.8–51.8 | 16 | −412 | 130 | 024 |
| 17 | 50.8–53.8 | 1 | −411 | 311 | 124 |
| 18 | 54.8–57.8 | 12 | 400 | 400 | 044 |
| 19 | 56.9–59.9 | 7 | 410 | 041 | 144 |

Peak Numbers 3, 6, 8, and 12 were identified as $SiO_2$ haivng Cristobalite type structure by PDF card (39-1425).

Figure 35:
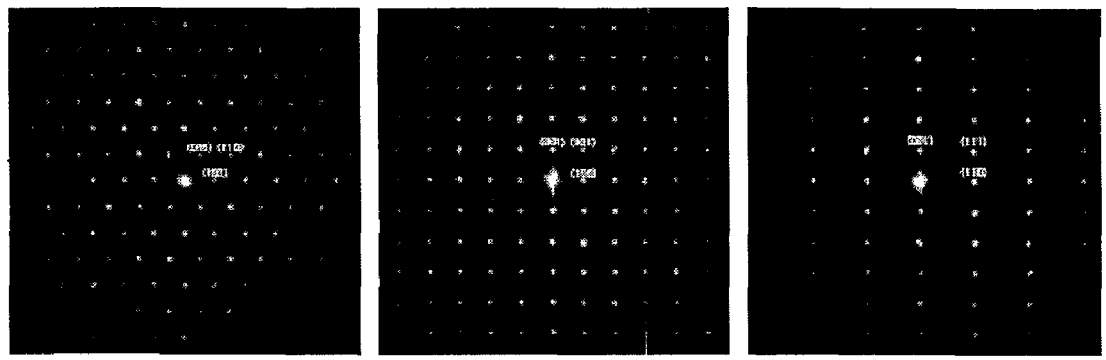
FIG. 35 is photos, which substitute for drawings, illustrating the selected-area electron diffraction images of the powder sample used in Example 29.

In order to determine the crystal system, from the three, selected-area electron diffraction image measurement was performed for the powder sample used in Example 34 using TECNAIG2F20 manufactured by FEI Company. The acceleration voltage of the electron beam and the camera length were set at 200 kV and 970 mm, respectively. The result is shown in FIG. 35. Each electron diffraction image could be obtained by radiating an electron beam from the direction independent of each other to the crystal piece (c-axis direction in the right image, a or b-axis direction in the center, direction along ab-plane in the left). From the left image, in which axes appeared three-fold axis in the c-axis direction, it is evident that the present crystal is a trigonal crystal. In all those images, in which indices were determined, extinction rule was not observed. Therefore, the space group was determined to be P3.

After the space group was determined to be P3, the lattice constants were refined to give such lattice constants as shown in the below Table 11.

TABLE 11

Lattice constant

| a/Å | c/Å |
|---|---|
| 7.506 | 6.487 |

From the refined lattice constants, integrated intensity of the XRD patterns were extracted. From these values, approximate fraction coordinates of this unknown target substance in its unit cell were determined using a direct-method program. For refining the solution of the fraction coordinates, determined by the above program, first principle method was used for calculation. Then further refinement of the fraction coordinates as shown in the below Table 12 obtained was performed based on the data of BSON X-ray diffraction patterns and neutron diffraction patterns following Rietveld method.

TABLE 12

Fraction coordinate

| | x | y | z |
|---|---|---|---|
| Ba1 | 1/3 | 2/3 | 0.2245 |
| Ba2 | 2/3 | 1/3 | 0.3252 |
| Ba3 | 0 | 0 | 0.1240 |
| Si1 | 0.5693 | 0.4951 | 0.8343 |
| Si2 | 0.7408 | 0.9026 | 0.6148 |
| O1 | 0.6943 | 0.9631 | 0.3965 |
| O2 | 0.3187 | 0.3481 | 0.8130 |
| O3 | 0.3978 | 0.0276 | 0.0527 |
| O4 | 0.6374 | 0.6520 | 0.6361 |
| N1 | 2/3 | 1/3 | 0.7877 |
| N2 | 0 | 0 | 0.6615 |

Because it was possible that the space group was P(3−), not P3, the Rietveld refinement was again performed using the neutron diffraction patterns by converting the fraction coordinate that was obtained for P3 to P(3−). The results are shown in Tables 13 and 14. In Rietveld method, when fraction coordinates are refined, lattice constants are also refined.

TABLE 13

Lattice constant

| a/Å | c/Å |
|---|---|
| 7.504 | 6.470 |

TABLE 14

Fraction coordinate

| | x | y | z |
|---|---|---|---|
| Ba1 | 0 | 0 | 0 |
| Ba2 | 1/3 | 2/3 | 0.1046 |
| Si1 | 0.2351 | 0.8269 | 0.6203 |
| O1 | 0.3578 | 0.2936 | 0.1839 |
| O2 | 0.0039 | 0.6901 | 0.5868 |
| N1 | 1/3 | 2/3 | 0.5629 |

Though the fraction coordinate was determined from different space groups of P3 and P(3−), the spatial positions of the atoms in the crystal structure of the targeted unknown substance were almost the same in both cases.

By confirming the number of atoms in the unit cell, determined as above, the composition of the present crystal could be decided as $Ba_3Si_6O_{12}N_2$:Eu.

Examples 70 to 74

In order to give a charge composition ratio shown in Table 15, 5.78 g of $BaCO_3$, 3.34 g of $SiO_2$, 1.95 g of $Si_3N_4$ and 0.32 g of $Eu_2O_3$ were used.

In Examples 70 and 71, these material powders were all transferred to an agate automatic mortar, ethanol was added, and the mixture was mixed well until it became homogeneous by means of a wet-type mixing method. The pasty mixture thus obtained was dried, filled into an alumina crucible and compression-molded by applying a slight weight. This was placed in a resistance-heating tubular electric furnace fitted with a temperature regulator and heated to 1200° C. at a rate of 4.8° C./min, in a mixed current of 0.5 l/min of 96 volume % of nitrogen and 4 volume % of hydrogen under atmospheric pressure. That temperature was maintained for 4 hr and then the mixture was allowed to cool to room temperature. The sample obtained was pulverized in an aluminum mortar and the pulverized sample was again filled into an alumina crucible and compression-molded by applying a slight weight. This alumina crucible was placed in a resistance-heating tubular electric furnace fitted with a temperature regulator and heated to 1300° C. at a rate of 4.8° C./min, in a mixed current of 0.5 l/min of 96 volume % of nitrogen and 4 volume % of hydrogen under atmospheric pressure. That temperature was maintained for 4 hr and then the product was allowed to cool to room temperature.

In Example 72, the process of the above-mentioned Examples 70 and 71 was followed, except that the firing temperature was 1400° C. instead of 1300° C.

In Example 73, these material powders were all transferred to an agate automatic mortar, ethanol was added, and the mixture was mixed well until it became homogeneous by means of a wet-type mixing method. The pasty mixture thus obtained was dried, filled into a boron nitride crucible in its powder state, and compression-molded by applying a slight weight. The boron nitride crucible was first placed in a resistance-heating electric furnace first and heated in the air from room temperature to 1100° C. at a rate of 5° C./min and that temperature was maintained for 3 hr. The mixture was then cooled to room temperature. The calcined product obtained was pulverized and mixed in an alumina mortar, filled into a boron nitride crucible in its powder state, and compression-molded by applying a slight weight. This boron nitride crucible was placed in a resistance-heating vacuum pressurized-atmosphere heat-treating furnace (manufactured by Fujidenpa Kogyo Co., Ltd.), and vacuum heated from room temperature to 800° C. at a rate of 20° C./min under a reduced pressure of $<5\times10^{-3}$ Pa. When the temperature reached 800° C., nitrogen gas of high purity (99.9995%) was introduced during 30 min until the pressure reached 0.92 MPa, while maintaining the temperature.

After nitrogen gas introduction, the pressure of 0.92 MPa was maintained and the temperature was raised further to 1200° C. at a rate of 20° C./min. After that temperature was maintained for 5 min, the thermometer was changed from a thermocouple to a radiation thermometer, and the temperature was raised again to 1300° C. at a rate of 20° C./min, which was maintained for further 2 hr. After that, the temperature was lowered to 1200° C. at a rate of 20° C./min, and the product was then allowed to cool spontaneously. The sample obtained was further pulverized in an aluminum mortar and the pulverized sample was again filled into an alumina crucible and compression-molded by applying a slight weight. This alumina crucible was placed in a resistance-heating tubular electric furnace (manufactured by Siliconit Co., Ltd.) fitted with a temperature regulator and, in a nitrogen current of 0.5 l/min under atmospheric pressure, heated to 1300° C. at a rate of 4.8° C./min. That temperature was maintained for 48 hr and then the product was allowed to cool to room temperature.

The product obtained was screened through a nylon sieve N-NO355T (opening: 37 μm).

In Example 74, the residue which remained on the above sieve of Example 73 was used as the sample.

Here, in Examples 72 and 73, β-Si$_3$N$_4$ obtained through the following treatments was used as the material of Si$_3$N$_4$.

292 g of α-Si$_3$N$_4$ (manufactured by Ube Industries, Ltd.) was filled into a boron nitride crucible in its powder state and compression-molded by applying a slight weight. This boron nitride crucible was placed in a resistance-heating vacuum pressurized-atmosphere heat-treating furnace (manufactured by Fujidenpa Kogyo Co., Ltd.), and vacuum heated from room temperature to 800° C. at a rate of 20° C./min under a reduced pressure of $<5\times10^{-3}$ Pa. When the temperature reached 800° C., nitrogen gas of high purity (99.9995%) was introduced during 30 min until the pressure reached 0.92 MPa, while maintaining the temperature. After nitrogen gas introduction, the pressure of 0.92 MPa was maintained and the temperature was raised further to 1200° C. at a rate of 20° C./min. After than temperature was maintained for 5 min, the thermometer was changed from a thermocouple to a radiation thermometer, and the temperature was raised again to 2000° C. at a rate of 20° C./min, which was maintained for further 2 hr. The temperature was further raised to 1800° C. at a rate of 20° C./min, which temperature was maintained for 3 hr. After firing, the temperature was lowered to 1200° C. at a rate of 20° C./min, and the product was then allowed to cool spontaneously.

X-ray diffraction measurement and reflection spectrum measurement were performed for the Si$_3$N$_4$ before and after the above-mentioned treatments. By comparing their X-ray diffraction patterns with peaks of α-Si$_3$N$_4$ and β-Si$_3$N$_4$, registered in PDF (Powder Diffraction File) of 76-1407 and 75-0950, it was confirmed that the phase of α-Si$_3$N$_4$ was completely transformed to β-Si$_3$N$_4$ through the above-mentioned treatments.

Figure 36:
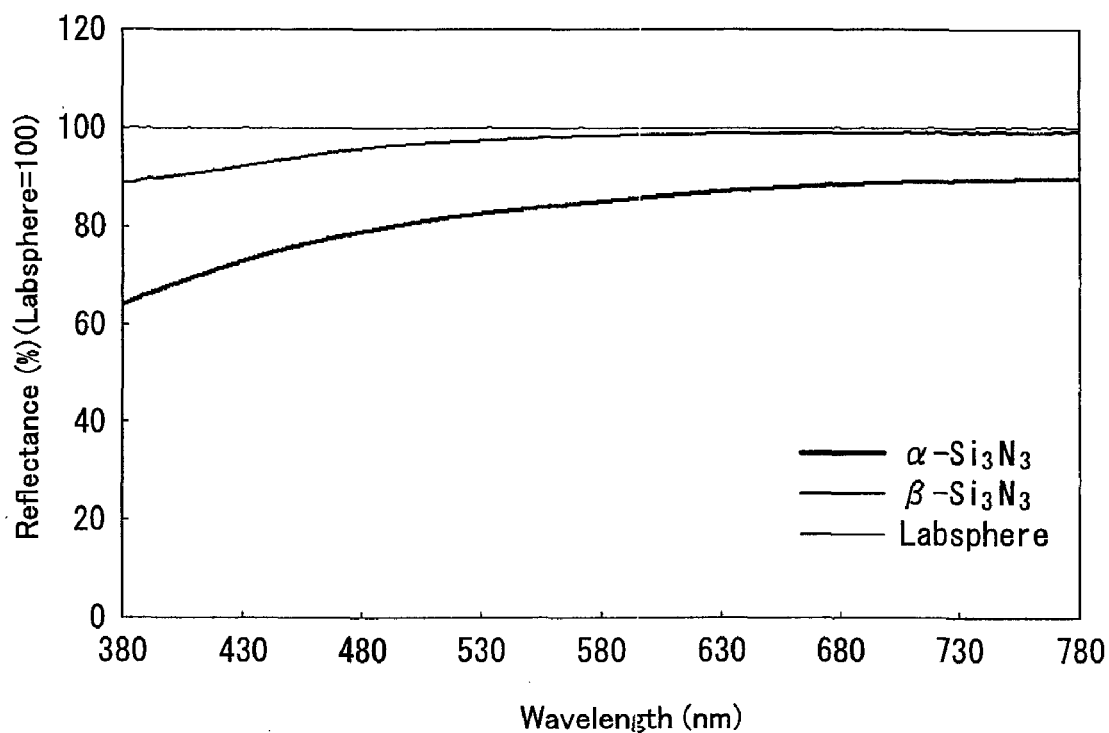
FIG. 36 is a graph illustrating the reflection spectra, measured for $\alpha$-$Si_3N_4$ and $\beta$-$Si_3N_4$ respectively.

Further, reflection spectra of the above-mentioned α-Si$_3$N$_4$ and β-Si$_3$N$_4$ are presented in FIG. 36. It is evident from this figure that β-Si$_3$N$_4$, obtained by the above-mentioned treatments, had higher reflectance than α-Si$_3$N$_4$.

The residual carbon amounts were measured for these α-Si$_3$N$_4$ and β-Si$_3$N$_4$ by means of high-frequency furnace heat combustion extract-nondispersive infrared analyzer (EMIA520F, manufactured by HORIBA, Ltd.) The result showed that β-Si$_3$N$_4$ contained less carbon residue of 0.02 weight %, than α-Si$_3$N$_4$, having 0.1 weight % thereof. The SEM observation results showed that the mean particle diameters of α$_3$N$_4$ and β-Si$_3$N$_4$ were 0.2 to 0.5 μm and 1 to 2 μm, respectively.

Figure 37:
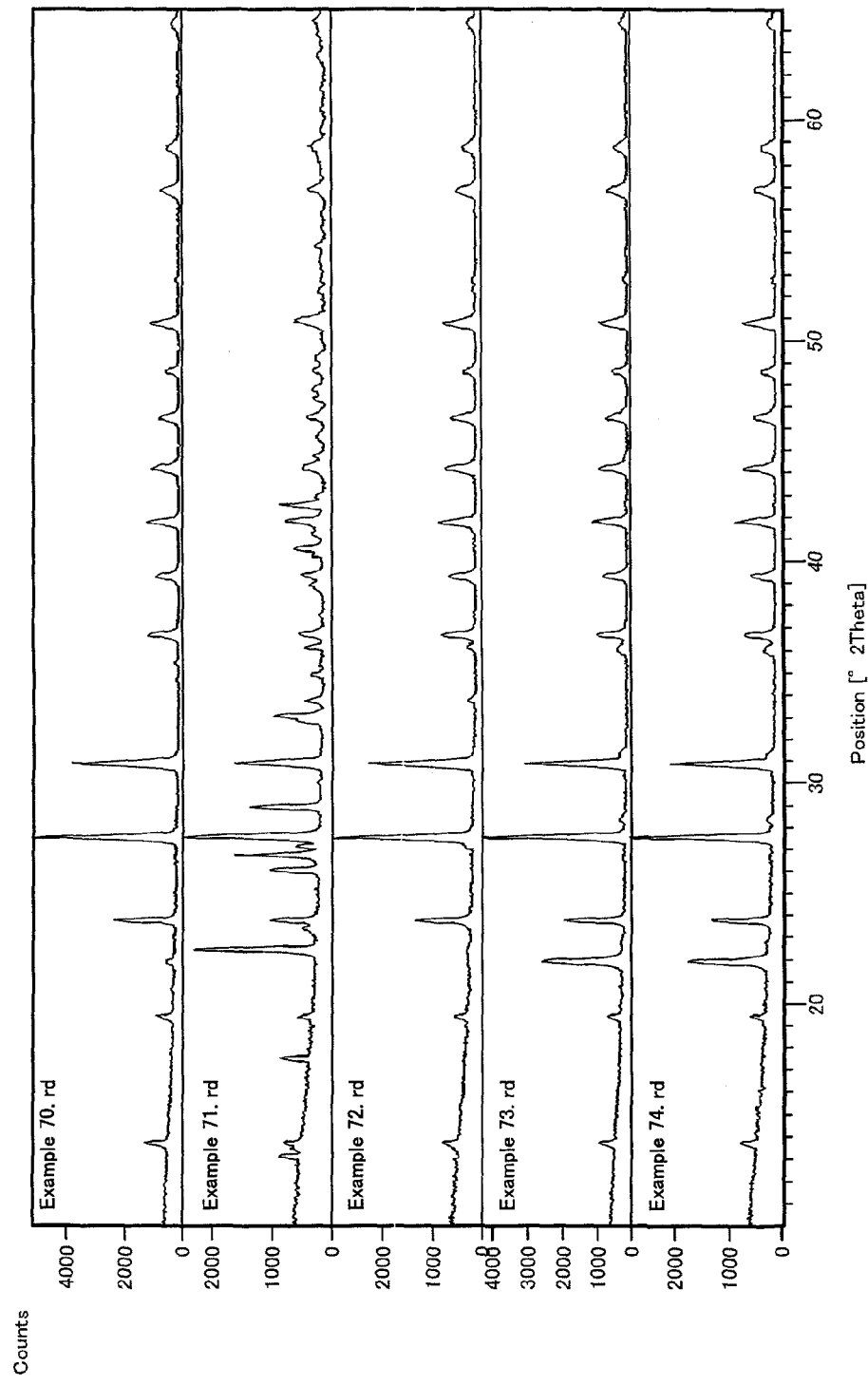
FIG. 37 is a graph illustrating the X ray diffraction patterns of the phosphors obtained in Examples 70 to 74.
Figure 38:
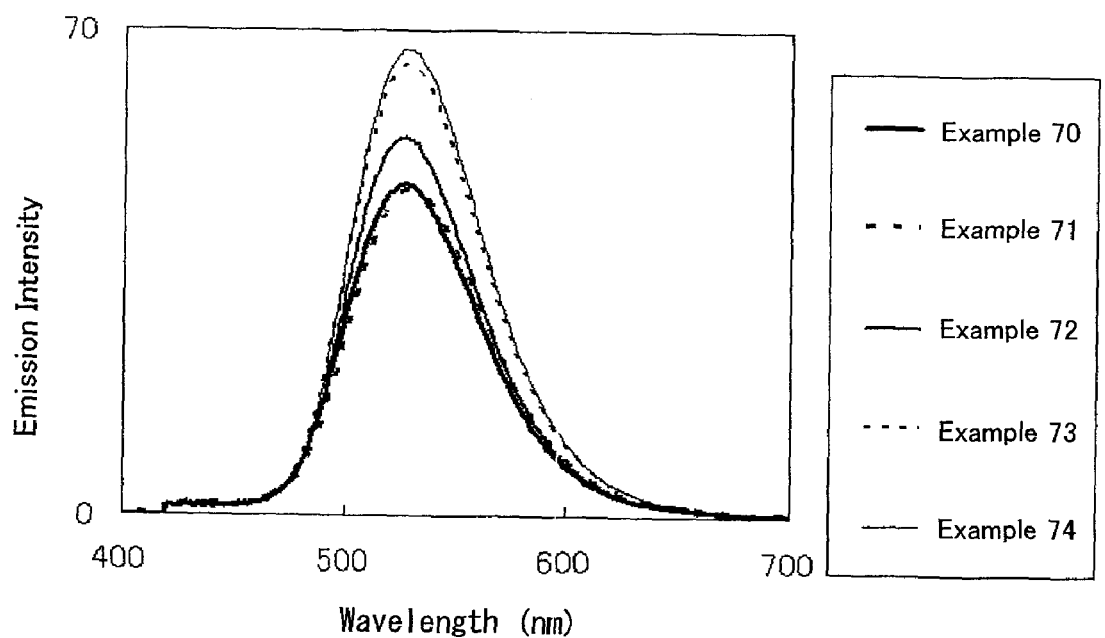
FIG. 38 is a graph illustrating the emission spectra of 400 nm-wavelength excitation, measured in Examples 70 to 74.
Figure 39:
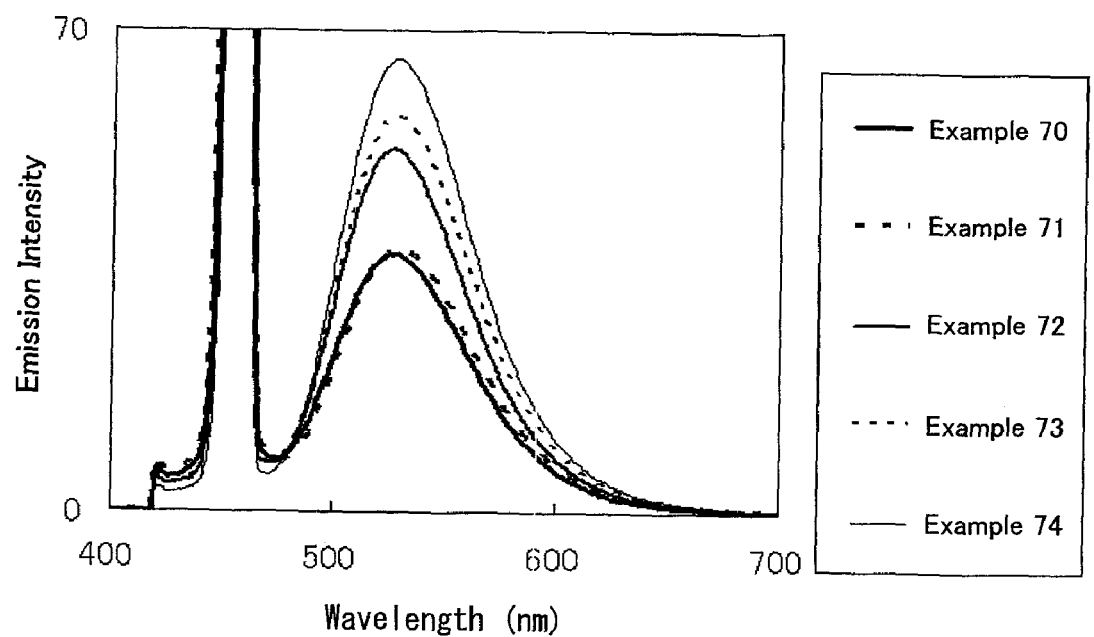
FIG. 39 is a graph illustrating the emission spectra of 455 nm-wavelength excitation, measured in Examples 70 to 74.

The X-ray diffraction patterns of the fired products obtained in the above-mentioned Examples 70 to 74 are shown in FIG. 37. The results showed that BSON crystal phases were detected as the main phases. Fluorescence characteristics of these fired products were evaluated and the results are presented in Table 15. Emission spectrum at the excitation wavelengths of 400 nm and 455 nm are shown in FIGS. 38 and 39, respectively. Moreover, changes in the synthesis conditions (refiring of the glass phase, for example), including firing time, could improve the luminescent characteristics.

TABLE 15

[Resuls of Examples 70 to 74]

| | | | 400-nm excitation | | | | 455-nm excitation | | | |
|---|---|---|---|---|---|---|---|---|---|---|
| Example | Firing condition | Nominal chemical composition | Peak wavelength (nm) | Peak intensity | CIEx | CIEy | Peak wavelength (nm) | Peak intensity | CIEx | CIEy |
| 70 | 1200° C. 4 hr + 1300° C. 4 hr | $Ba_{2.07}Eu_{0.13}Si_7O_{10.2}N_4$ | 527 | 47.9 | 0.274 | 0.613 | 527 | 37.6 | 0.282 | 0.635 |
| 71 | 1200° C. 4 hr + 1300° C. 4 hr | $Ba_{2.07}Eu_{0.13}Si_7O_{10.2}N_4$ | 528 | 47.1 | 0.287 | 0.608 | 529 | 38.4 | 0.295 | 0.633 |
| 72 | 1200° C. 4 hr + 1300° C. 4 hr | $Ba_{2.07}Eu_{0.13}Si_7O_{10.2}N_4$ | 526 | 54.7 | 0.273 | 0.622 | 525 | 53.0 | 0.280 | 0.642 |
| 73 | 1100° C. 3 hr + 1300° C. 2 hr + 1300° C. 48 hr | $Ba_{2.07}Eu_{0.13}Si_7O_{10.2}N_4$ | 529 | 65.3 | 0.282 | 0.621 | 529 | 57.7 | 0.288 | 0.638 |
| 74 | 1100° C. 3 hr + 1300° C. 2 hr + 1300° C. 48 hr | $Ba_{2.07}Eu_{0.13}Si_7O_{10.2}N_4$ | 528 | 67.5 | 0.284 | 0.625 | 527 | 66.0 | 0.290 | 0.640 |

Further, the emission efficiency, absorption efficiency and internal quantum efficiency of these fired products were determined. The results are shown in Table 16.

TABLE 16

Emission efficiency or the like of Examples 70-74

| | Emissiion efficiency | Absorption efficiency | Internal quantum efficiency |
|---|---|---|---|
| Example 70 | 24.2 | 51.6 | 46.8 |
| Example 71 | 27.0 | 46.1 | 58.6 |
| Example 72 | 33.6 | 61.9 | 54.2 |
| Example 73 | 37.9 | 60.5 | 62.7 |
| Example 74 | 41.2 | 71.3 | 57.8 |

Every emission efficiency was 20% or higher, and when $Si_3N_4$ of β body (Example 72) was used, instead of α body (Example 71), as the starting material, it was increased to 30% or higher. Moreover, changes in the synthesis conditions (refiring of the glass phase, for example) including firing time could improve it up to as high as 40% or higher.

On the other hand, every absorption efficiency was 40% or higher, and by similar changes in the synthesis conditions, including firing time, it could be enhanced as high as up to 60% or higher. Furthermore, the sample of Example 74, which was the residue on the filter at the time of filtration using nylon N-NO355T (opening: 37 μm), could gave a value of 70% or higher.

Internal quantum efficiency can be obtained by dividing emission efficiency by absorption efficiency.

Examples 75 and 76

In order to give a charge composition ratio shown in Table 17, 6.02 g of $BaCO_3$, 2.87 g of $SiO_2$, 2.23 g of $Si_3N_4$ and 0.34 g of $Eu_2O_3$ were used.

These material powders were all transferred to an agate automatic mortar, ethanol was added, and the mixture was mixed well until it became homogeneous by means of a wet-type mixing method. The pasty mixture thus obtained was dried, filled into an alumina crucible and compression-molded by applying a slight weight. This was placed in a resistance-heating tubular electric furnace fitted with a temperature regulator and heated to 1200° C. at a rate of 4.8° C./min, in a mixed current of 0.5 l/min of 96 volume % of nitrogen and 4 volume % of hydrogen under atmospheric pressure. That temperature was maintained for 4 hr and then the mixture was allowed to cool to room temperature. The sample obtained was pulverized in an aluminum mortar and the pulverized sample was again filled into an alumina crucible and compression-molded by applying a slight weight. This alumina crucible was placed in a resistance-heating tubular electric furnace fitted with a temperature regulator and heated to 1350° C. at a rate of 4.8° C./min, in a mixed current of 0.5 l/min of 96 volume % of nitrogen and 4 volume % of hydrogen under atmospheric pressure. That temperature was maintained for 72 hr and then the product was allowed to cool to room temperature.

In the above-mentioned Example 76, β-$Si_3N_4$ treated as above was used as $Si_3N_4$.

Figure 40:
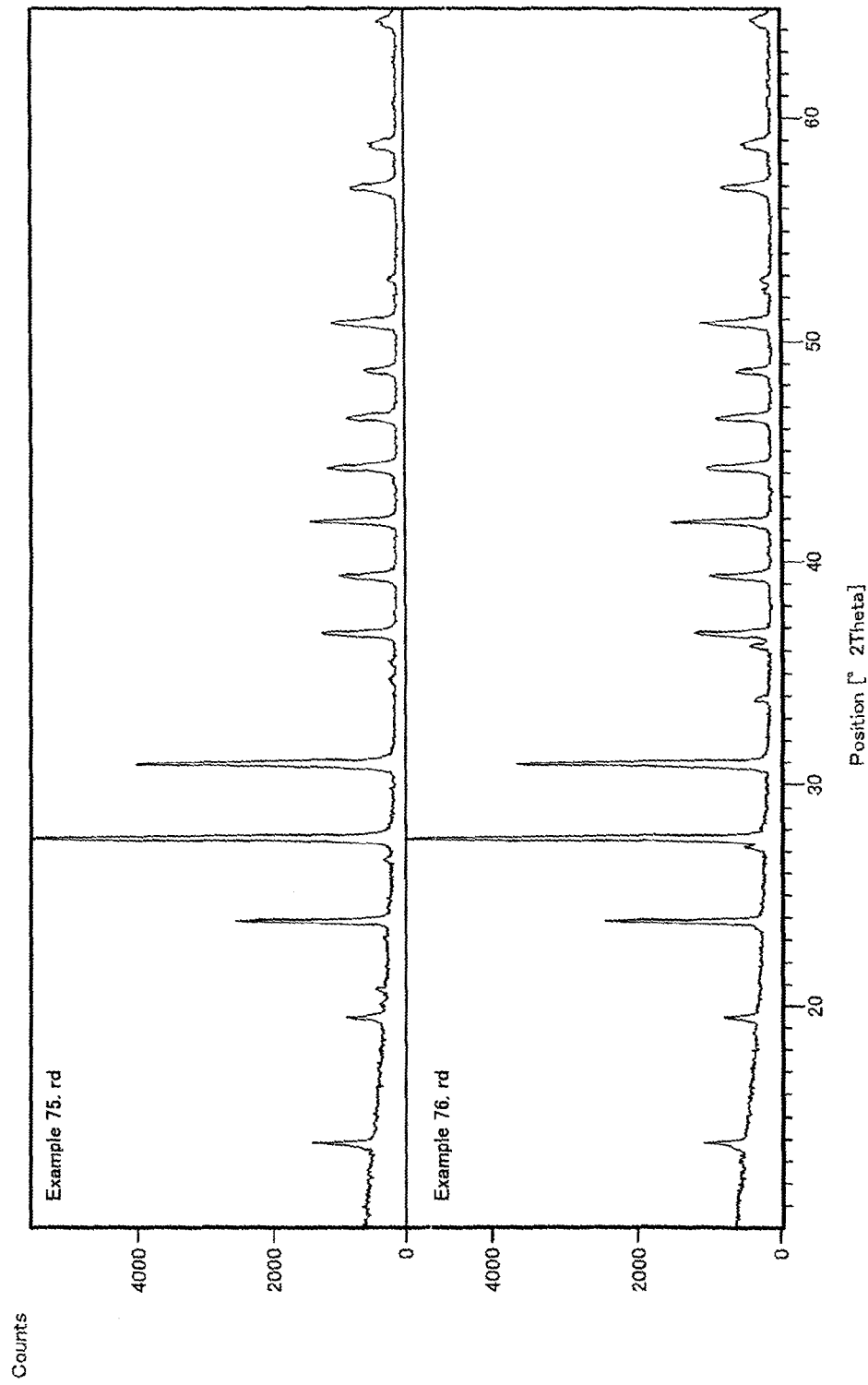
FIG. 40 is a graph illustrating the X ray diffraction patterns of the phosphors obtained in Examples 75 and 76.
Figure 41:
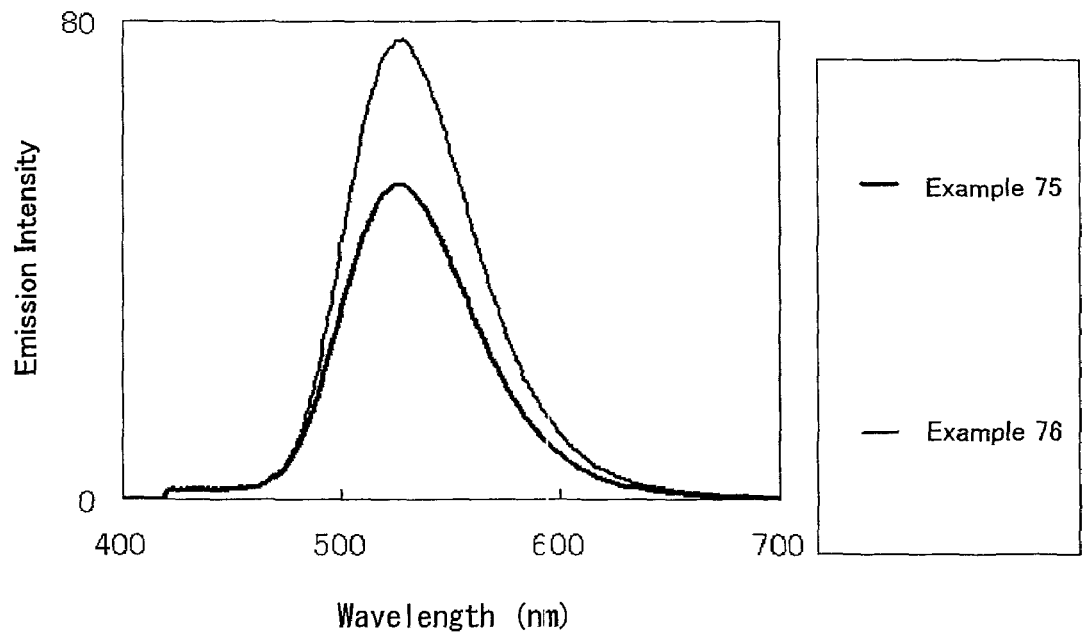
FIG. 41 is a graph illustrating the emission spectra of 400 nm-wavelength excitation, measured in Examples 75 and 76.
Figure 42:
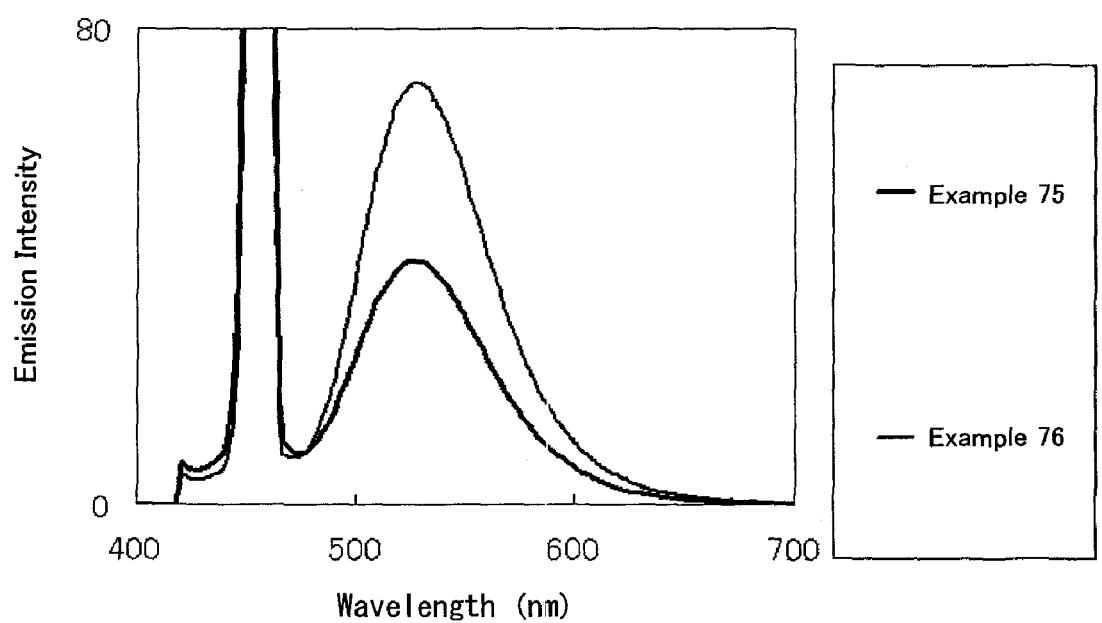
FIG. 42 is a graph illustrating the emission spectra of 455 nm-wavelength excitation, measured in Examples 75 and 76.

Concerning fired products obtained in the above-mentioned Examples 75 and 76, the powder obtained in Example 76 had brighter green coloration than the powder synthesized in Example 75. The X-ray diffraction patterns are shown in FIG. 40. The result showed that BSON crystal phases were detected as the main phases in both Examples. Fluorescence characteristics of these fired products were evaluated and the results are presented in Table 17. Emission spectra at the excitation wavelengths of 400 nm and 455 nm are shown in FIGS. 41 and 42, respectively.

The positions of the emission peaks obtained were almost the same, but the emission peak of the Example 76 was higher.

Figure 43:
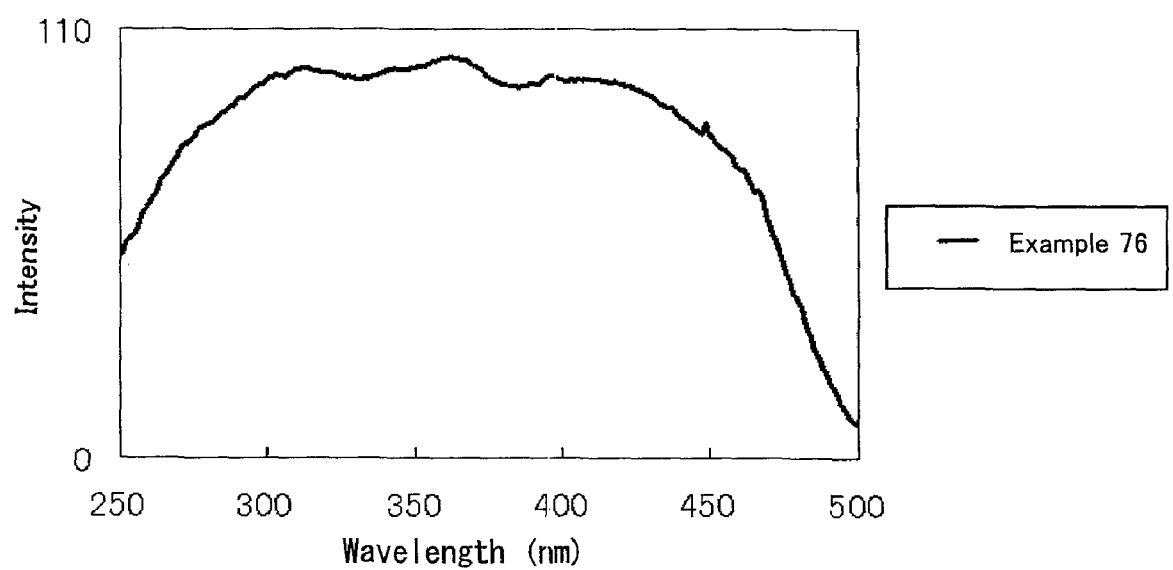
FIG. 43 is a graph illustrating the excitation spectrum of the fired substance obtained in Example 76.

In addition, the excitation spectrum of the fired product obtained in Example 76 is shown in FIG. 43.

TABLE 17

[Resuls of Examples 75 and 76]

| | | | | 400-nm excitation | | | | 455-nm excitation | | | |
|---|---|---|---|---|---|---|---|---|---|---|---|
| Example | SiN$_3$ | Firing condition | Nominal chemical composition | Peak wavelength (nm) | Peak intensity | CIEx | CIEy | Peak wavelength (nm) | Peak intensity | CIEx | CIEy |
| 75 | α- | 1200° C. 4 hr + 1350° C. 72 hr | Ba$_{1.88}$Eu$_{0.12}$Si$_6$O$_8$N$_4$ | 525 | 52.7 | 0.277 | 0.642 | 527 | 41.2 | 0.278 | 0.637 |
| 76 | β- | | | 527 | 76.9 | 0.281 | 0.645 | 526 | 70.9 | 0.282 | 0.643 |

Example 77

In order to give a charge composition ratio of Ba$_3$Si$_6$O$_{12}$N$_2$, 15.1 g of BaCO$_3$, 6.76 g of SiO$_2$ and 1.75 g of Si$_3$N$_4$ were used.

These material powders were all transferred to an agate automatic mortar, ethanol was added, and the mixture was mixed well until it became homogeneous by means of a wet-type mixing method. The pasty mixture thus obtained was dried, filled into an alumina crucible and compression-molded by applying a slight weight. This was placed in a resistance-heating tubular electric furnace fitted with a temperature regulator and heated to 1200° C. at a rate of 4.8° C./min, in a mixed current of 0.5 l/min of 96 volume % of nitrogen and 4 volume % of hydrogen under atmospheric pressure. That temperature was maintained for 4 hr and then the mixture was allowed to cool to room temperature. The sample obtained was pulverized in an aluminum mortar and the pulverized sample was again filled into an alumina crucible and compression-molded by applying a slight weight. This alumina crucible was placed in a resistance-heating tubular electric furnace fitted with a temperature regulator and, in a nitrogen current of 0.5 l/min under atmospheric pressure, heated to 1350° C. at a rate of 4.8° C./min. That temperature was maintained for 10 hr and then the product was allowed to cool to room temperature. The sample obtained was further pulverized in an aluminum mortar and the pulverized sample was again filled into an alumina crucible and compression-molded by applying a slight weight. This alumina crucible was placed in a resistance-heating tubular electric furnace fitted with a temperature regulator and heated to 1400° C. at a rate of 4.8° C./min, in a mixed current of 0.5 l/min of 96 volume % of nitrogen and 4 volume % of hydrogen under atmospheric pressure. That temperature was maintained for 4 hr and then the product was allowed to cool to room temperature.

Figure 44:
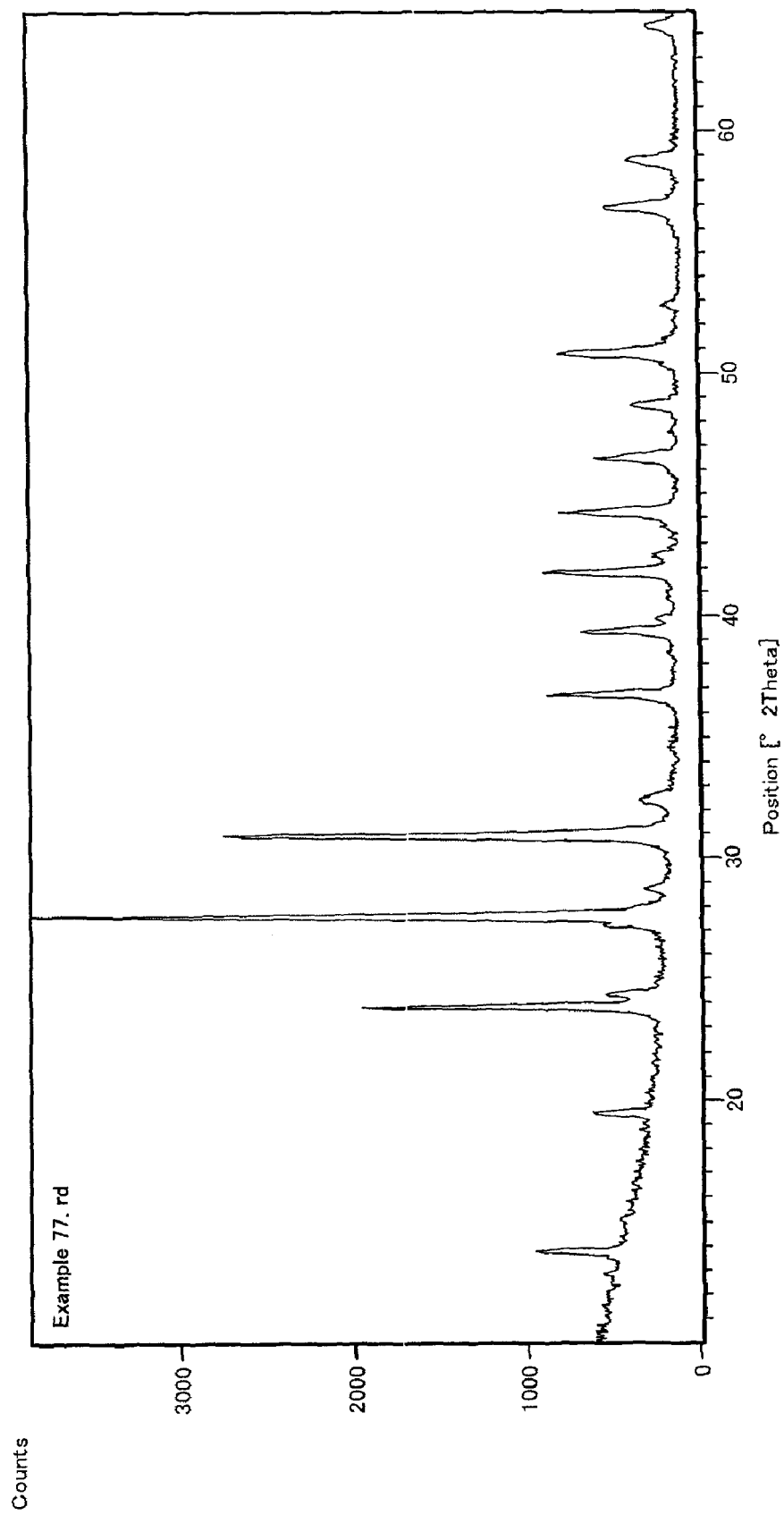
FIG. 44 is a graph illustrating the X ray diffraction pattern of the phosphor obtained in Example 77.

An X-ray diffraction pattern of the fired product obtained is shown in FIG. 44. The result showed that a BSON crystal phase was detected as the main phase.

Examples 78 to 87

In order to give a charge composition ratio shown in Table 18, BaCO$_3$, SiO$_2$, Si$_3$N$_4$, MnO$_2$ (manufactured by Junsei Chemical Co., Ltd.), Pr$_6$O$_{11}$ (manufactured by Furuuchi Chemical Corporation), Nd$_2$O$_3$ (manufactured by Nissan Kigenso Kagaku Kogyo Co., Ltd.), Sm$_2$O$_3$ (manufactured by Mitsuwa Chemicals Co., Ltd.), Tb$_4$O$_7$ (manufactured by Shin-Etsu Chemical Co., Ltd.), Dy$_2$O$_3$ (manufactured by Nikki Co., Ltd.), Ho$_2$O$_3$ (manufactured by Furuuchi Chemical Corporation), Er$_2$O$_3$ (manufactured by Nissan Kigenso Kagaku Kogyo Co., Ltd.), Tm$_2$O$_3$ (manufactured by Shin-Etsu Chemical Co., Ltd.) and Yb$_2$O$_3$ (manufactured by Furuuchi Chemical Corporation) were weighed out. Namely, in Example 78, 5.82 g of BaCO$_3$, 3.50 g of SiO$_2$, 2.05 g of Si$_3$N$_4$ and 0.03 g of MnO$_2$ were used. In Example 79, 5.80 g of BaCO$_3$, 3.50 g of SiO$_2$, 2.04 g of Si$_3$N$_4$ and 0.05 g of Pr$_6$O$_{11}$ were used. In each of other Examples, according to each composition ratio, the proportion was decided based on the above charge amount.

These material powders were all transferred to an agate automatic mortar, ethanol was added, and the mixture was mixed well until it became homogeneous by means of a wet-type mixing method. The pasty mixture thus obtained was dried, filled into an alumina crucible and compression-molded by applying a slight weight. This was placed in a resistance-heating tubular electric furnace fitted with a temperature regulator and heated to 1200° C. at a rate of 4.8° C./min, in a mixed current of 0.5 l/min of 96 volume % of nitrogen and 4 volume % of hydrogen under atmospheric pressure. That temperature was maintained for 4 hr and then the mixture was allowed to cool to room temperature. The sample obtained was pulverized in an aluminum mortar and the pulverized sample was again filled into an alumina crucible and compression-molded by applying a slight weight. This alumina crucible was placed in a resistance-heating tubular electric furnace fitted with a temperature regulator and, in a nitrogen current of 0.5 l/min under atmospheric pressure, heated to 1300° C. at a rate of 4.8° C./min. That temperature was maintained for 10 hr and then the product was allowed to cool to room temperature.

Figure 45:
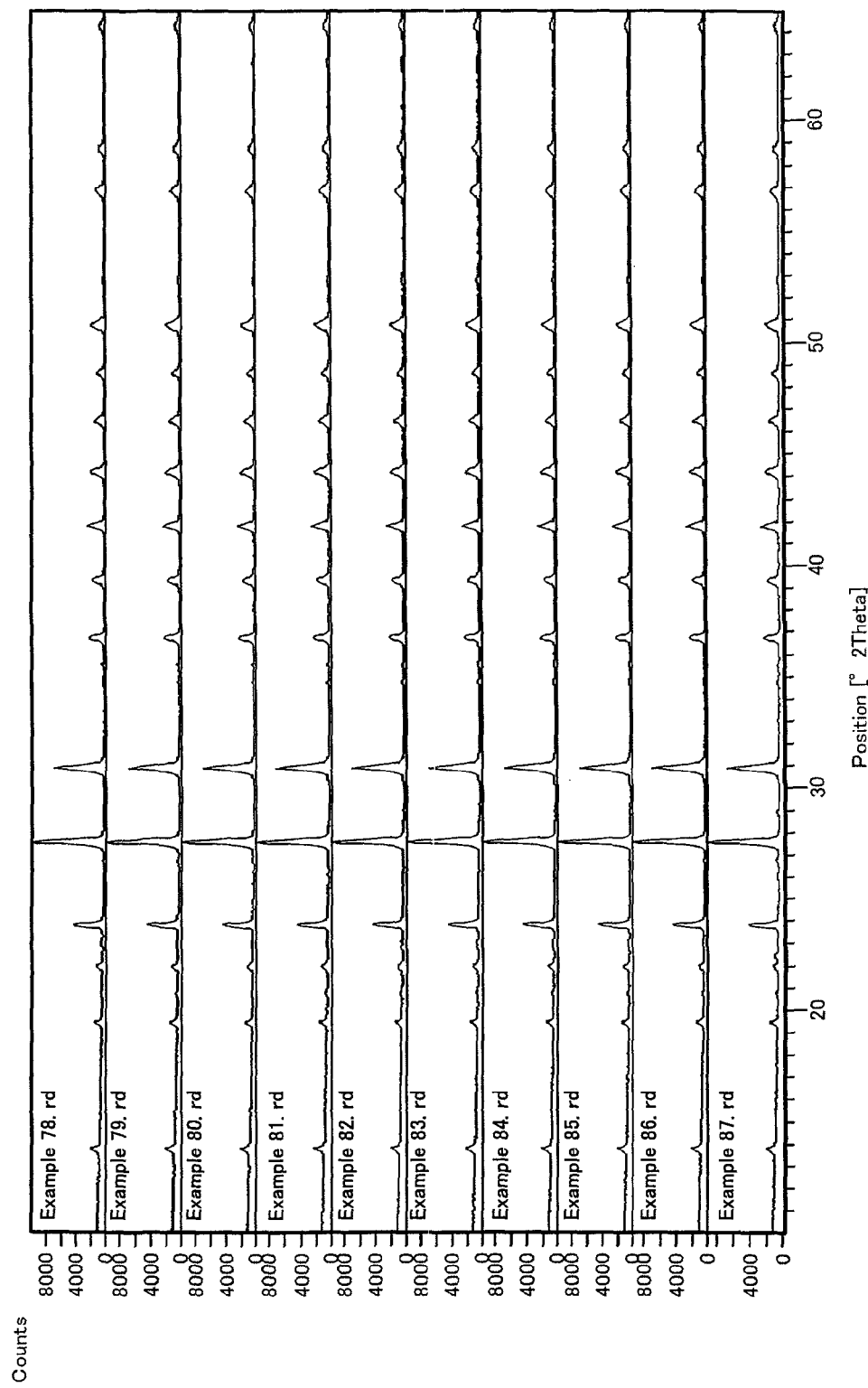
FIG. 45 is a graph illustrating the X ray diffraction patterns of the phosphors obtained in Examples 78 to 87.

X-ray diffraction patterns of the fired products obtained are shown in FIG. 45. From the result obtained, in all these Examples, BSON crystal phases were detected as the main phases.

TABLE 18

Material compositions of Examples 78 to 87

| Example | Nominal chemical composition |
|---|---|
| 78 | Ba$_{1.98}$Mn$_{0.02}$Si$_7$O$_{10}$N$_4$ |
| 79 | Ba$_{1.98}$Pr$_{0.02}$Si$_7$O$_{10}$N$_4$ |
| 80 | Ba$_{1.98}$Nd$_{0.02}$Si$_7$O$_{10}$N$_4$ |
| 81 | Ba$_{1.98}$Sm$_{0.02}$Si$_7$O$_{10}$N$_4$ |
| 82 | Ba$_{1.98}$Tb$_{0.02}$Si$_7$O$_{10}$N$_4$ |
| 83 | Ba$_{1.98}$Dy$_{0.02}$Si$_7$O$_{10}$N$_4$ |
| 84 | Ba$_{1.98}$Ho$_{0.02}$Si$_7$O$_{10}$N$_4$ |
| 85 | Ba$_{1.98}$Er$_{0.02}$Si$_7$O$_{10}$N$_4$ |
| 86 | Ba$_{1.98}$Tm$_{0.02}$Si$_7$O$_{10}$N$_4$ |
| 87 | Ba$_{1.98}$Yb$_{0.02}$Si$_7$O$_{10}$N$_4$ |

[3. Light Emitting Device]

[3-1. Preparation and Evaluation of Light Emitting Device Using a Blue-Light Emitting Diode]

The method of production of each phosphor used to make light emitting devices shown below will be described as Reference Examples.

Reference Example 1

Production of CaAlSiN$_3$:Eu

Each material powder was weighed out to give molar ratios of 0.331 mole of Ca$_3$N$_2$, 1 mole of AlN, 0.363 mole of Si$_3$N$_4$ and 0.004 mole of Eu$_2$O$_3$, per 1 mole of the phosphor, so that the chemical composition ratio of the phosphor produced was Ca$_{0.992}$AlEu$_{0.008}$SiN$_3$. These were mixed using a desktop mixer and fired in a boron nitride crucible at a maximum temperature of 1800° C. for 2 hr in a nitrogen atmosphere of 0.5 MPa. The fired powder obtained was pulverized in an alumina mortar and sieved through a nylon mesh of 450 μm and 224 μm. The powder was then stirred in purified water for 1 hr and pulverized with a ball mill. Subsequently, by classification treatment to adjust particle size and drying, Ca$_{0.992}$AlEu$_{0.008}$SiN$_3$ was produced.

Reference Example 2

Production of Sr$_2$Si$_5$N$_8$:Eu

Each material powder was weighed out to give molar ratios of 1.96 mole of SrCO$_3$, 1.666 mole of Si$_3$N$_4$ and 0.02 mole of Eu$_2$O$_3$, per 1 mole of the phosphor, so that the chemical composition ratio of the phosphor produced was Sr$_{1.95}$Eu$_{0.04}$Si$_5$N$_8$. These were wet-mixed using an agate mortar and fired in a carbon crucible at a maximum temperature of 1800° C. for 2 hr in a nitrogen atmosphere of 0.92 MPa. The fired powder obtained was pulverized in an agate mortar and again fired in a boron nitride crucible at a maximum temperature of 1800° C. for 2 hr in a nitrogen atmosphere of 0.92 MPa. The fired powder was pulverized and sieved through a nylon mesh of 37 μm.

Reference Example 3

Production of Sr$_{0.8}$Ca$_{0.2}$AlSiN$_3$:Eu

<Production of Mother Alloy>

Each metal was weighed out so as to give a metal element composition ratio of Al:Si=1:1 (molar ratio) and the material metal was fused in a graphite crucible using a high frequency induction fusion furnace in an atmosphere of argon. The fused metal was then poured into a mold from the crucible and allowed to solidify to obtain an alloy having a metal element composition of Al:Si=1:1.

<Production of Alloy to be Used as Material for Phosphor>

The mother alloy and other material metal were weighed out so as to give a metal element ratio of Eu:Sr:Ca:Al:Si=0.008:0.792:0.2:1:1 (molar ratio). Air was evacuated from the furnace until the pressure was 5×10$^{-2}$ Pa and then argon was introduced into the furnace to a predetermined level. In the furnace, the mother alloy, and then Sr, were fused in a calcia crucible and the fused metal was poured into a mold and allowed to solidify.

The alloy obtained was crushed to a coarse powder in an alumina mortar in a nitrogen atmosphere, and was further pulverized in a nitrogen atmosphere using a supersonic jet pulverizer under a pulverizing pressure of 0.15 MPa at a material-feeding speed of 0.8 kg/hr. The alloy powder obtained was washed with water, subjected to classification treatment and dried to give Sr$_{0.792}$Ca$_{0.200}$AlEu$_{0.008}$SiN$_3$.

Reference Example 4

Production of Sr$_2$BaSiO$_5$:Eu

Each material powder was weighed out to give molar ratios of 1 mole of BaCO$_3$, 1.98 mole of SrCO$_3$, 1 mole of SiO$_2$ and 0.02 mole of Eu$_2$O$_3$, per 1 mole of the phosphor, so that the composition formula of the phosphor produced was BaSr$_{1.98}$Eu$_{0.02}$SiO$_5$. These were wet-mixed using an agate mortar and fired in a molybdenum foil at a maximum temperature of 1550° C. for 2 hr in a nitrogen atmosphere. The fired powder obtained was pulverized in an alumina mortar and fired again in a platinum foil at a maximum temperature of 1550° C. for 2 hr in an atmosphere of nitrogen containing 4 volume % of hydrogen. The fired powder was pulverized and sieved through a nylon mesh of 37 μm.

Reference Example 5

Production of (Ca,Sr)S:Eu

Each material powder was weighed out to give molar ratios of 0.5976 mole of CaS, 0.3984 mole of SrS and 0.004 mole of EuF$_3$, per 1 mole of the phosphor, so that the chemical composition ratio of the phosphor produced was Ca$_{0.5976}$Eu$_{0.004}$Sr$_{0.3984}$. These were wet-mixed using an agate mortar and fired in an alumina crucible at a maximum temperature of 1000° C. for 2 hr in an atmosphere of nitrogen containing 4 volume % of hydrogen. The fired powder obtained was pulverized and sieved through a nylon mesh of 37 μm.

Reference Example 6

Production of Si$_5$Al(O,N)$_8$:Eu

Each material powder was weighed out to give molar ratios of 0.333 mole of AlN, 0.333 mole of Al$_2$O$_3$, 1.666 mole of Si$_3$N$_4$, 0.006 mole of Eu$_2$O$_3$ and 8.93×10$^{-4}$ mole of CaCO$_3$, per 1 mole of the phosphor, so that the chemical composition ratio of the phosphor produced was Si$_{5.0029}$Al$_{0.9970}$Eu$_{0.0120}$O$_{0.0184}$N$_{7.9816}$. These were pulverized and mixed in an agate mortar and the mixture obtained was fired in a boron nitride crucible at a maximum temperature of 1700° C. for 2 hr in a nitrogen atmosphere of 0.92 MPa. The fired powder obtained was pulverized in a mortar and again fired in a boron nitride crucible at a maximum temperature of 2000° C. for 2 hr in a nitrogen atmosphere of 0.92 MPa. After the firing, the powder was pulverized and sieved through a nylon mesh of 37 μm to give Si$_{5.0029}$Al$_{0.9970}$Eu$_{0.0120}$O$_{0.0184}$N$_{7.9816}$.

Reference Example 7

Production of (Ba,Sr)$_2$SiO$_4$:Eu

Each material powder was weighed out to give molar ratios of 1.39 mole of BaCO$_3$, 0.46 mole of SrCO$_3$, 0.15 mole of Eu$_2$O$_3$ and 1 mole of SiO$_2$, per 1 mole of the phosphor, so that the chemical composition ratio of the phosphor produced was Ba$_{1.39}$Sr$_{0.46}$Eu$_{0.15}$SiO$_4$. These were dry-type mixed in a plastic bag, passed through a nylon mesh of 100 μm and further dry-mixed in a plastic bag. The mixture was placed lightly in an alumina crucible and a hole was made with a pestle in the center. The lid of the alumina crucible was placed on the crucible with a gap secured between the two, and the powder in the crucible was fired at a maximum temperature of 1000° C. for 12 hr in a furnace of reducing atmosphere in a nitrogen atmosphere. The fired powder obtained was pulverized in an alumina mortar, passed through a nylon mesh of 100 μm, mixed with 12 weight % per the powder weight of $SrCl_2.2H_2O$ as a flux and passed through a nylon mesh of 65 μm. The mixture was filled lightly in an alumina crucible and fired again at a maximum temperature of 1190° C. for 5 hr in an atmosphere of nitrogen containing CO gas in the presence of solid carbon. The fired powder was pulverized with a stamp mill and passed through a nylon mesh of 37 μm. The powder was mixed with 5 times the volume of purified water and stirred. After condensed by decantation, the slurry was sieved in water through a nylon mesh of 37 μm without applying a force. The minus sieve was diluted with water and fine particles of the supernatant were removed. Then washing with water was repeated so that the electric conductivity of the solution was 2 mS/m or less. The powder was freed of water using a nutsche filter and dried at 150° C. for 10 hr in a dryer. Finally, the fired powder was passed through a nylon mesh of 37 μm to obtain $Ba_{1.39}Sr_{0.46}Eu_{0.15}SiO_4$.

Reference Example 8

Production of $SrGa_2S_4:Eu$

This phosphor was produced in the same manner as described in Example 1 of the Japanese Patent Laid-Open Publication (Kokai) No. 2003-291608, except that molar ratios were changed to 0.85 mole of SrS, 1 mole of $Ga_2S_3$ and 0.15 mole of $EuF_3$, per 1 mole of the phosphor, so that the chemical composition ratio of the phosphor produced was $Sr_{0.85}Ga_2Eu_{0.15}S_4$. Namely, each material powder was weighed out to give molar ratios of 0.85 mole of SrS, 1 mole of $Ga_2S_3$ and 0.15 mole of $EuF_3$, per 1 mole of the phosphor, so that the chemical composition ratio of the phosphor produced was $Sr_{0.85}Ga_2Eu_{0.15}S_4$. The mixture was pulverized and mixed in an agate mortar and fired in an alumina crucible at a maximum temperature of 1000° C. for 8 hr in a current of argon gas. The fired powder obtained was pulverized in an alumina mortar and its particle size was adjusted.

Reference Example 9

Production of $SrSi_2O_2N_2:Eu$

Each material powder was weighed out to give molar ratios of 1.92 mole of $SrCO_3$, 1 mole of $SiO_2$ and 0.04 mole of $Eu_2O_3$, per 2 moles of the phosphor, so that the chemical composition ratio of the product obtained by the primary firing was $Sr_{1.92}Eu_{0.08}Si_1O_4$. These were pulverized and mixed in an alumina mortar and the mixture obtained was fired in a boron nitride crucible at a maximum temperature of 1250° C. for 3 hr in an atmosphere of nitrogen containing 4 volume % of hydrogen. The fired product obtained was further pulverized in an alumina mortar and mixed with 1 mole of $Si_3N_4$ per 2 moles of the phosphor so that the chemical composition ratio of the phosphor produced was $Sr_{0.96}Eu_{0.04}Si_2O_2N_2$. The mixture was again fired at a maximum temperature of 1450° C. for 2 hr in a nitrogen atmosphere of 0.92 MPa. The fired powder was pulverized in an alumina mortar and passed through a nylon mesh of 37 μm to produce $Sr_{0.96}Eu_{0.04}Si_2O_2N_2$.

Reference Example 10

Production of $CaSc_2O_4:Ce$

Each material powder was weighed out to give molar ratios of 1.04 mole of $CaCO_3$ and 1 mole of $Sc_{1.9935}Ce_{0.0065}O_3$, coprecipitate of Sc—Ce, per 1 mole of the phosphor, so that the chemical composition ratio of the phosphor produced was $Ce_{0.0065}Ca_{0.9935}Sc_2O_4$. These were mixed in a bag and passed through a nylon mesh of 224 μm. The mixture obtained was fired in an alumina crucible at a maximum temperature of 1100 to 1150° C. for 4 hr in the air. The fired powder obtained was pulverized in a mortar, and $CaCl_2$, $Li_3PO_4$ and KCl were added as fluxes in the amount of 10 weight %, 5 weight % and 1.5 weight %, respectively, relative to the total weight of the powder. These were mixed in a bag and passed through a nylon mesh of 100 μm. These were fired in an alumina crucible at a maximum temperature of 1450° C. for 9 hr in an atmosphere of nitrogen containing 4 volume % of hydrogen. After cooling, the fired powder was pulverized in an alumina mortar. Further pulverization was performed using a ball mill in a 0.6-L vessel, with 600 g of 3-mm alumina balls and dilute hydrochloric acid, at 60 rpm of rotation speed for 4 hr. After ball mill pulverization, purified water was added to the dilute hydrochloric acid for thinning and the powder was passed through a nylon mesh of 65 μm in a wet process. The powder was washed with 1N-HCl and classified to remove particles of about 5 μm or smaller. Further, 100 g of the phosphor obtained was mixed well in a 500-ml solution until no lump remained, and 1.5 ml of $Na_3PO_4.12H_2O$ was added and stirred, followed by adding of 0.75 ml of $Ca(NO_3)_2.H_2O$ for coat treatment. Subsequently, the powder was then passed through nylon meshes of 40 μm and 25 μm to remove large particles. Then washing with water was repeated so that the electric conductivity of the solution was 2 mS/m or less. Water was removed using a nutsche filter and after drying at 150° C. for 10 hr in a dryer, $Ce_{0.0065}Ca_{0.9935}Sc_2O_4$ was obtained.

Reference Example 11

Production of $Ca_3(Sc,Mg)_2Si_3O_{12}:Ce$

Each material powder was weighed out to give molar ratios of 2.94 mole of $CaCO_3$, 0.06 mole of $CeO_2$, 0.97 mole of $Sc_2O_3$, 0.06 mole of $MgCO_3$ and 3 mole of $SiO_2$, per 1 mole of the phosphor, so that the chemical composition ratio of the phosphor produced was $Ca_{2.94}Ce_{0.06}Sc_{1.94}Mg_{0.06}Si_3O_{12}$. These were mixed well with a juicer mixer and passed through a nylon mesh of 224 μm. The mixture obtained was fired in an alumina crucible at a maximum temperature of 1380° C. for 6 hr in the air. The fired powder obtained was pulverized in an alumina mortar and passed through a nylon mesh of 100 μm. The powder was mixed with 4 times the weight of nylon iron balls and subjected to ball mill pulverization at 60 rpm of rotation speed for 2 hr in a vessel. Further, $CaCl_2.2H_2O$ was added as flux in the amount of 12 weight % per the total weight of the powder and these were passed through a nylon mesh of 65 μm. Then they were dried in a dryer at 200° C. for 8 hr. The dried powder was fired in an alumina crucible at a maximum temperature of 1450° C. for 6 hr in an atmosphere of nitrogen containing 4 volume % of hydrogen. The fired powder was moistened with water and separated into coarse particles in an alumina mortar, and passed through a sieve of 2 mm. Further pulverization was performed using a ball mill in a 0.6-L vessel, with 600 g of 3-mm alumina balls and dilute hydrochloric acid, at 60 rpm of rotation speed for 12 hr. After ball mill pulverization, purified water was added to the dilute hydrochloric acid for thinning and the powder was passed through a nylon mesh of 65 μm in a wet process. The powder was washed with 1N-HCl and classified to remove particles of about 5 μm or smaller. Further, 100 g of the phosphor obtained was mixed well in a 500-ml solution until no lump remained, and 1.5 ml of $Na_3PO_4 \cdot 12H_2O$ was added and stirred, followed by adding of 0.75 ml of $Ca(NO_3)_2 \cdot H_2O$ for coat treatment. Subsequently, the powder was then passed through nylon meshes of 40 μm and 25 μm to remove large particles. Then washing with water was repeated so that the electric conductivity of the solution was 2 mS/m or less. Water was removed using a nutsche filter and after drying at 150° C. for 10 hr in a dryer, $Ca_{2.94}Ce_{0.06}Sc_{1.94}Mg_{0.06}Si_3O_{12}$ was obtained.

Reference Example 12

Production of $BaMgAl_{10}O_{17}$:Eu

Each material powder was weighed out to give molar ratios of 0.7 mole of $BaCO_3$, 1 mole of $MgCO_3$, 0.15 mole of $Eu_2O_3$ and 5 mole of γ-$Al_2O_3$, per 1 mole of the phosphor, so that the chemical composition ratio of the phosphor produced was $Ba_{0.7}Eu_{0.3}MgAl_{10}O_{17}$. These were mixed in a bag and passed through a nylon mesh of 224 μm. The mixture obtained was fired in an alumina crucible at a maximum temperature of 1550° C. for 5 hr in an atmosphere of nitrogen containing CO gas in the presence of solid carbon. The fired powder was pulverized with a pestle in a mortar after cooling, washed with water, subjected to classification treatment and dried, thereby to produce $Ba_{0.7}Eu_{0.3}MgAl_{10}O_{17}$.

Reference Example 13

Production of $Ba_3MgSi_2O_8$:Eu

Each material powder was weighed out to give molar ratios of 2.98 mole of $BaCO_3$, 1 mole of $MgCO_3$, 2 mole of $SiO_2$, and 0.01 mole of $Eu_2O_3$, per 1 mole of the phosphor, so that the chemical composition ratio of the phosphor produced was $Ba_{2.98}Eu_{0.02}MgSi_2O_8$. These were pulverized and mixed in an alumina mortar and the mixture obtained was fired in an alumina crucible at a maximum temperature of 1200° C. for 2 hr in an atmosphere of nitrogen containing 4 volume % of hydrogen. The fired product obtained was pulverized and sieved through a nylon mesh of 37 μm to produce $Ba_{2.98}Eu_{0.02}MgSi_2O_8$.

Reference Example 14

Production of $Sr_5(PO_4)_3Cl$:Eu

Each material powder was weighed out to give molar ratios of 1 mole of $SrCO_3$, 3 mole of $SrHPO_4$, 0.5 mole of $SrCl_2$, and 0.25 mole of $Eu_2O_3$, per 1 mole of the phosphor, so that the chemical composition ratio of the phosphor produced was $Sr_{4.5}Eu_{0.5}(PO_4)_3Cl$. These were pulverized and mixed in an alumina mortar and the mixture obtained was fired in an alumina crucible at a maximum temperature of 1200° C. for 2 hr in an atmosphere of nitrogen containing 4 volume % of hydrogen. The fired product obtained was pulverized in an alumina mortar and sieved through a nylon mesh of 37 μm to produce $Sr_{4.5}Eu_{0.5}(PO_4)_3Cl$.

Reference Example 15

Production of $Eu(DBM)_3Phen$

Dibenzoylmethane (H-DBM) of 0.67 g (3 mmole), Phen monohydrate of 0.20 g (1.0 mmole) and 2,2-iminodiethanol of 0.32 g (3.0 mmole) were dissolved in 50 ml ethanol. To this solution was added dropwise 20-ml ethanol solution of 0.37 g (10 mmole) europium chloride (III) hexahydrate over a period of 2 hr at room temperature. After stirring was continued for 1 hr, precipitate formed was collected by suction, followed by washing with ethanol. The yellow powder obtained was dried in vacuo at 50° C. to produce the target product of $Eu(DBM)_3Phen$. The melting point of this complex was 171 to 174° C. This powder was pulverized with a jet mill.

Reference Example 16

Production of $La_2O_2S$:Eu

Each material powder was dry-type mixed to give molar ratios of 0.9 mole of $La_2O_3$, 0.05 mole of $Li_2CO_3$, 0.2 mole of $Na_2CO_3$, 0.75 mole of $K_2CO_3$, 0.1 mole of $KH_2PO_4$, 0.1 mole of $Eu_2O_3$ and 4.0 mole of sulfur powder which became S in the formula, per 1 mole of the phosphor, so that the chemical composition ratio of the phosphor produced was $La_{1.8}Eu_{0.2}O_2S$. The mixture was placed in a crucible made of high purity alumina, the crucible was covered with an airtight alumina lid and heated at 1250° C. for 2 hr in a nitrogen atmosphere. Lithium sulfide, sodium sulfide and potassium sulfide, formed during heating, functioned as alkali sulfide flux and reacted with lanthanum oxide and europium oxide to generate oxysulfides. The phosphor intended was obtained while the above fluxes continued to be in contact with them. Alkali sulfide flux, which remained attached on the surface, was removed by washing with water and after drying at 120° C., the phosphor $La_{1.8}Eu_{0.2}O_2S$ was obtained.

Example 88

A surface-mount type white light emitting device, of which constitution was the same as what is shown in FIG. 2(b), was prepared following the below procedure, and its chromaticity was evaluated by means of chromaticity coordinates (CIEx, CIEy). Among components of the light emitting device of Example 88, those having corresponding components in FIG. 2(b) will have their reference numerals in parentheses as appropriate.

As the first luminous body (22), a blue light-emitting diode (hereinafter abbreviated to as "blue LED" as appropriate) having emission wavelength of 450 nm to 470 nm, C460EZ290 (manufactured by Cree, Inc.), was used. The blue LED (22) was bonded by means of die bonding using silver paste as adhesive to the electrode (27) disposed at the bottom of the recess in frame (24). The adhesive of silver paste was applied thinly and uniformly, in consideration of efficient dissipation of heat generated at the blue LED (22). After curing the silver paste by heating at 150° C. for 2 hr, the blue LED (22) and the frame (24) were bonded through wire bonding. For wire (25), a gold wire with diameter of 25 μm was used.

For luminescent material of the phosphor-containing part (23), a green phosphor of the above-mentioned Example 76 (hereinafter referred to as "phosphor (A)" as appropriate) and a red phosphor of CaAlSiN$_3$:Eu (hereinafter referred to as "phosphor (B)" as appropriate) were used. A phosphor slurry (phosphor-containing composition) was prepared by mixing these two kinds of phosphors, epoxy resin (YL7301, manufactured by Japan Epoxy Resins Co., Ltd.), curing agent (YLH1230, manufactured by Japan Epoxy Resins Co., Ltd.) and aerosil (RY-200S, Nippon Aerojil). The aerosil was used for preventing sedimentation of the phosphor in the resin.

The obtained phosphor slurry was poured into the recess of the above-mentioned frame (24), and heated at 100° C. for 3 hr and then at 140° C. for another 3 hr, so as to be cured. The phosphor-containing part (23) was thus formed, resulting in preparing the surface-mount type white light emitting device.

The NTSC ratios of the present light emitting devices are shown in Table 19.

Figure 46:
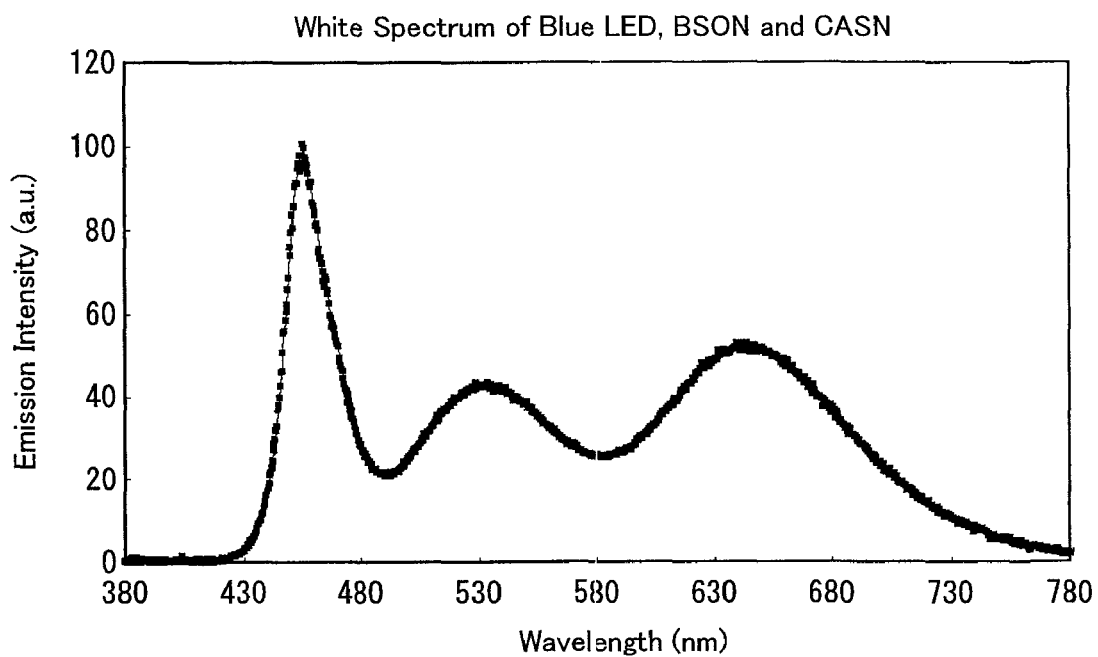
FIG. 46 is a graph illustrating the emission spectra of the light emitting device, measured in Example 88.

The obtained light emitting device was driven to emit light by energizing the blue LED (22) with a current of 20 mA at 25° C. All the emissions from the white light emitting device were received by an integrating sphere and then guided to a spectroscope through an optical fiber, and thus the emission spectrum and entire luminous flux were measured, as well as chromaticity coordinates of the white light. Concretely , they can be measured in a room of which temperature is kept at 25±1° C. using a software for measuring color and illumination intensity, manufactured by Ocean Optics, Inc., and a spectroscope of USB2000 series (integrating sphere version) with 20 mA energization. The emission spectrum measured is shown in FIG. 46. From this emission spectrum data, in the wavelength region of 380 nm to 780 nm, the chromaticity value (CIEx, CIEy) can be calculated as the chromaticity coordinate in XYZ color system, defined in JIS Z8701. In this case, the relational expression of Cx+Cy+Cz=1 holds.

Further, the emission efficiency (lm/W) was determined from the aforementioned entire luminous flux and the voltage between the LED terminals. The power consumption was obtained as the product of the current value and the voltage value, which was measured between the LED terminals using True RMS Multimeters Model 187 and 189 manufactured by Fluke Corporation with 20 mA energization. The results are shown in Table 19.

Examples 89 to 93, Comparative Examples 1 to 6

White light emitting devices were prepared in the same manner as Example 88, except that phosphors used were replaced with those described in Table 19 below.

(Evaluation of Luminescent Characteristics)
The results are shown in Table 19.

TABLE 19

[Results of Examples 88 to 92 and Comparative Examples 1 to 6]

| | Phosphor | | Mixed amount (weight %) | | NTSC ratio | CIEx | CIEy | Emission efficiency (lm/W) |
|---|---|---|---|---|---|---|---|---|
| | Green phosphor | Red phosphor | Green phosphor | Red phosphor | | | | |
| Example 88 | phosphor (A) | phosphor (B) | 11.1 | 2.0 | 75.9 | 0.328 | 0.316 | 39.1 |
| Example 89 | phosphor (A) | Sr$_2$Si$_5$N$_8$:Eu | 13.1 | 3.0 | 70.5 | 0.342 | 0.329 | 42.8 |
| Example 90 | phosphor (A) | Sr$_{0.8}$Ca$_{0.192}$AlSiN$_3$:Eu | 11.8 | 1.6 | 72.2 | 0.340 | 0.339 | 50.9 |
| Example 91 | phosphor (A) | Sr$_2$BaSiO$_5$:Eu | 11.0 | 4.7 | 55.4 | 0.325 | 0.323 | 57.4 |
| Example 92 | phosphor (A) | (Ca,Sr)S:Eu | 14.7 | 2.5 | 70.5 | 0.323 | 0.325 | 28.1 |
| Example 93 | phosphor (A) | | 28.8 | 0.0 | — | 0.235 | 0.416 | 63.9 |
| Comparative Examples 1 | Si$_5$Al(O,N)$_8$:Eu | phosphor (B) | 14.3 | 0.6 | 68 | 0.322 | 0.330 | 22.1 |
| Comparative Examples 2 | (Ba,Sr)$_2$SiO$_4$:Eu | phosphor (B) | 10.7 | 2.1 | 81.7 | 0.343 | 0.327 | not measured |
| Comparative Examples 3 | SrGa$_2$S$_4$:Eu | phosphor (B) | 4.1 | 2.7 | 81.6 | 0.318 | 0.327 | not measured |
| Comparative Examples 4 | SrSi$_2$O$_2$N$_2$:Eu | phosphor (B) | 7.8 | 1.6 | 67.6 | 0.336 | 0.342 | not measured |
| Comparative Examples 5 | CaSc$_2$O$_4$:Ce | phosphor (B) | 6.8 | 1.2 | 66 | 0.334 | 0.340 | not measured |
| Comparative Examples 6 | Ca$_3$(ScMg)$_2$Si$_3$O$_{12}$:Ce | phosphor (B) | 9.8 | 1.7 | 64.9 | 0.338 | 0.333 | not measured |

In the table, the mixed amount of phosphor is weight ratio of each phosphor relative to the total weight (100) of the epoxy resin, curing agent and aerosil.

From the above results, it is evident that the light emitting devices using the green phosphor of the present invention had high NTSC ratios. It is also evident that the emission efficiency was the lowest when $Si_5Al(O,N)_8$:Eu was used in place of the green phosphor of the present invention.

(Durability Test)

Durability tests were performed to the light emitting device of the above-mentioned Example 88, Comparative Examples 2 and 3, which showed high NTSC ratios. Concretely, they were driven to emit lights in a durability test apparatus under the condition of 85° C. of temperature and 85% of relative humidity by energizing their blue LEDs (21) with 20 mA currents. They were taken out of the durability test apparatus 200 hours later, and then the emission spectra and chromaticities thereof were measured after cooled to 25° C. Shifts of the chromaticity (CIEx, CIEy), with reference to the chromaticity (CIEx, CIEy) before the devices were placed in the durability test apparatus, are shown in Table 20.

TABLE 20

| | Results of durability test | | | |
|---|---|---|---|---|
| | Phosphor | | Chromaticity shift | |
| | Green phosphor | Red phosphor | CIEx | CIEy |
| Example 88 | phosphor (A) | phosphor (B) | −0.020 | −0.018 |
| Comparative Examples 2 | (Ba,Sr)$_2$SiO$_4$:Eu | | −0.043 | −0.044 |
| Comparative Examples 3 | SrGa$_2$S$_4$:Eu | | −0.040 | −0.071 |

In addition, retention rates of emission peak intensity at 150° C. with respect to 455-nm excitation wavelength (relative to the emission peak intensity at 20° C.), of each green phosphor used in the above-mentioned light emitting devices, are shown in the following Table 21.

TABLE 21

| | Measurement results of emission peak intensity retention rate | |
|---|---|---|
| | Green phosphor | Emission peak intensity retention rate |
| Example 88 | phosphor (A) | 76 |
| Comparative Examples 2 | (Ba,Sr)$_2$SiO$_4$:Eu | 30 |
| Comparative Examples 3 | SrGa$_2$S$_4$:Eu | 6 |

Examples 94 to 99

White light emitting devices were prepared in the same manner as Examples 88 to 93, except that the mixed amount of each phosphor was changed so that the white light emitting device emitted light having a color of a light bulb. The results are shown in Table 22.

TABLE 22

| | [Results of Examples 94 to 99] | | | | | | |
|---|---|---|---|---|---|---|---|
| | Phosphor | | Mixed amount (weight %) | | Emission characteristics | | |
| | Green phosphor | Red phosphor | Green phosphor | Red phosphor | CIEx | CIEy | Emission efficiency (lm/W) |
| Example 94 | phosphor (A) | CaAlSiN$_3$:Eu | 15.1 | 3.1 | 0.439 | 0.387 | 32.7 |
| Example 95 | phosphor (A) | Sr$_2$Si$_5$N$_8$:Eu | 43.9 | 10.4 | 0.488 | 0.423 | 23.9 |
| Example 96 | phosphor (A) | Sr$_{0.8}$Ca$_{0.192}$AlSiN$_3$:Eu | 20.5 | 3.7 | 0.479 | 0.408 | 31.0 |
| Example 97 | phosphor (A) | Sr$_2$BaSiO$_5$:Eu | 14.2 | 13.4 | 0.461 | 0.412 | 50.6 |
| Example 98 | phosphor (A) | (Ca,Sr)S:Eu | 26.7 | 4.2 | 0.456 | 0.385 | 12.2 |
| Example 99 | phosphor (A) | — | 41.3 | 0 | 0.267 | 0.521 | 52.6 |

In this context, the mixed amount of the phosphor is weight ratio of each phosphor relative to the total weight (100) of the epoxy resin, curing agent and aerosil.

Example 100

A white light emitting device was prepared in the same manner as Example 88, except that a Power Chip C460×B900 (manufactured by Cree, Inc.) was used in place of the C460EZ290 (manufactured by Cree, Inc.), and that mixed amounts of the phosphor A (green phosphor) and the $CaAlSiN_3$:Eu (red phosphor) were set at 16.1 weight % and 1.8 weight % respectively relative to the total weight (100) of epoxy resin, curing agent and aerosil. The chromaticity coordinate (CIEx, CIEy) thereof was (0.291, 0.289), and the emission efficiency was 3.7 lm/W.

[3-2. Preparation and Evaluation of Light Emitting Device Using a Near-Ultraviolet Emitting Diode]

Example 101

Figure 47:
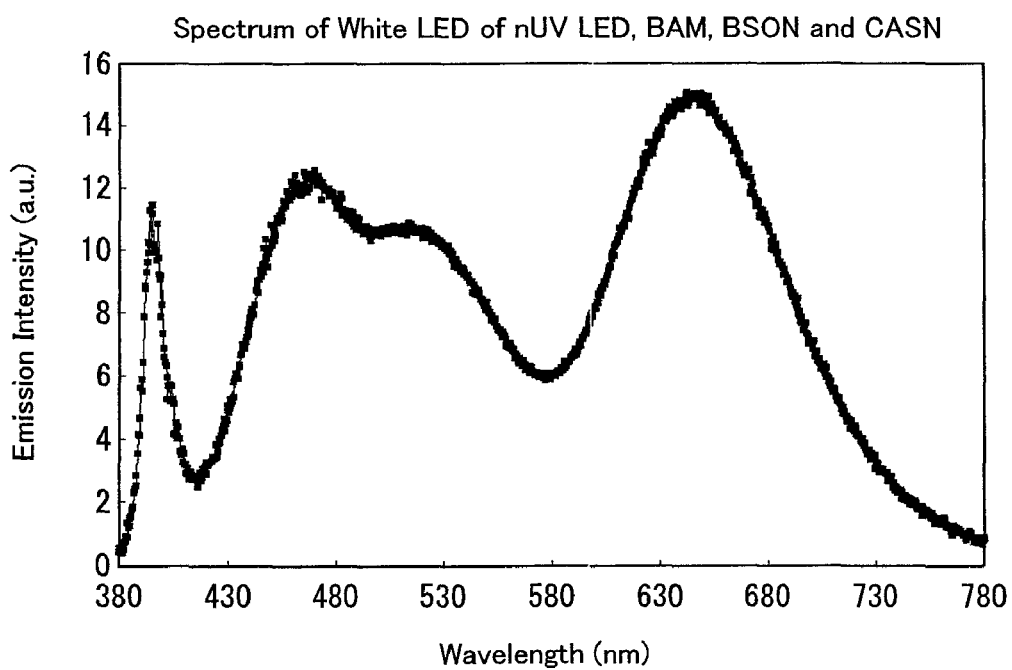
FIG. 47 is a graph illustrating the emission spectra of the light emitting device, measured in Example 101.

A light emitting device was prepared in the same manner as Example 88, except for the following points. As the first luminous body (22), a near-ultraviolet emitting diode (hereinafter abbreviated to as "near-ultraviolet LED" as appropriate) of C395MB290 (manufactured by Cree, Inc.) BR0428-03A was used. Further, a blue phosphor of $BaMgAl_{10}O_{17}$:Eu (hereinafter referred to as "phosphor (M)" as appropriate) was added as luminescent material used in the phosphor-containing resinous part (22) which was composed of three kinds of phosphors in total. A silicone resin (6101UP, manufactured by Shin-Etsu Chemical Co., Ltd.) was used in place of the epoxy resin. The curing condition was at 70° C. for 1 hr and then at 140° C. for 3 hr. The results are shown in Table 23. In addition, emission spectrum map measured on the evaluation is shown in FIG. 47.

Examples 102 to 110

White light emitting devices were prepared in the same manner as Example 101, except that phosphors used were replaced with those described in Table 23 below. The results are shown in Table 23.

TABLE 23

[Results of Examples 101 to 110]

| | Green | Red | Blue | Green | Red | Blue | CIEx | CIEy | Emission efficiency (lm/W) |
|---|---|---|---|---|---|---|---|---|---|
| Example 101 | phosphor (A) | $CaAlSiN_3$:Eu | phosphor (M) | 3.3 | 1.7 | 15.8 | 0.338 | 0.328 | 8.2 |
| Example 102 | phosphor (A) | $Sr_2Si_5N_8$:Eu | phosphor (M) | 1.6 | 2.1 | 3.7 | 0.311 | 0.389 | 10.0 |
| Example 103 | phosphor (A) | $Sr_{0.8}Ca_{0.192}AlSiN_3$:Eu | phosphor (M) | 3.6 | 1.6 | 13.7 | 0.348 | 0.311 | 7.7 |
| Example 104 | phosphor (A) | $Sr_2BaSiO_5$:Eu | phosphor (M) | 2.1 | 4.0 | 16.3 | 0.314 | 0.361 | 12.2 |
| Example 105 | phosphor (A) | (Ca,Sr)S:Eu | phosphor (M) | 4.0 | 2.4 | 13.2 | 0.318 | 0.357 | 6.0 |
| Example 106 | phosphor (A) | phosphor (N) | phosphor (M) | 2.6 | 1.1 | 10.2 | 0.281 | 0.425 | 3.9 |
| Example 107 | phosphor (A) | $La_2O_2S$:Eu | phosphor (M) | 4.6 | 61.5 | 20.8 | 0.313 | 0.344 | 4.1 |
| Example 108 | phosphor (A) | $CaAlSiN_3$:Eu | $Ba_3MgSi_2O_8$:Eu | 4.0 | 1.9 | 47.3 | 0.346 | 0.340 | 3.9 |
| Example 109 | phosphor (A) | $CaAlSiN_3$:Eu | $Sr_5(PO_4)_3Cl$:Eu | 6.3 | 1.9 | 12.2 | 0.338 | 0.336 | 5.7 |
| Example 110 | phosphor (A) | — | — | 3.0 | 0.0 | 0.0 | 0.253 | 0.329 | 13.7 |

In this context, the mixed amount of the phosphor is weight ratio of each phosphor relative to the total weight (100) of the silicone resin, curing agent and aerosil.

The structural formula of the red phosphor (N), Eu(DBM)$_3$Phen (in the formula, DBM represents dibenzoylmethane and Phen represents 1,10-phenanthroline), in the above Table 23 is as follows.

[Chemical Formula 1]

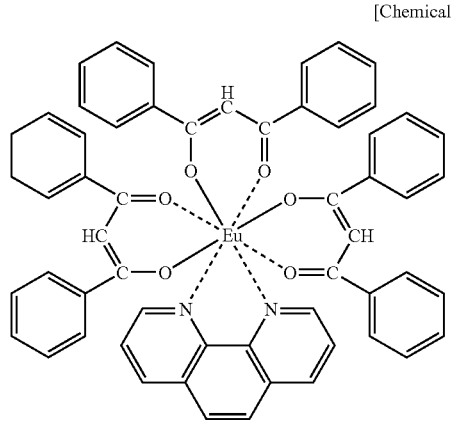

Examples 111 to 120

White light emitting devices were prepared in the same manner as Examples 101 to 110, except that the mixed amount of each phosphor was changed so that the white light emitting device emitted light having a color of a light bulb. The results are shown in Table 24.

In this context, the mixed amount of the phosphor is weight ratio of each phosphor relative to the total weight (100) of the silicone resin, curing agent and aerosil.

Example 121

A white light emitting device was prepared in the same manner as Example 101, except that a Power Chip C395XB900 (manufactured by Cree, Inc.) was used in place of the C395MB290 (manufactured by Cree, Inc.), and that mixed amounts of the phosphor A (green phosphor), the CaAlSiN$_3$:Eu (red phosphor) and BaMgAl$_5$O$_{17}$:Eu (blue phosphor) were set at 13.8 weight %, 3.7 weight % and 30.7 weight % respectively relative to the total weight (100) of silicone resin, curing agent and aerosil. The chromaticity coordinate (CIEx, CIEy) thereof was (0.401, 0.156), and the emission efficiency was 3.1 lm/W.

INDUSTRIAL APPLICABILITY

The present invention car be used in any fields of industry. Particularly, it can be used preferably for the purposes in which light is utilized, such as a illuminating device or image display.

The present invention has been explained in detail above with reference to specific embodiments. However, it is evident to those skilled in the art that various modifications can be added thereto without departing from the intention and the scope of the present invention.

The invention claimed is:

1. A multinary oxynitride phosphor comprising a crystal phase represented by general formula [I]:

$$M1_xBa_yM2_zL_uO_vN_w \qquad [I]$$

TABLE 24

[Results of Examples 111 to 120]

| | Phosphor | | | Mixed amount of phosphor (weight %) | | | Emission characteristics | | Emission efficiency |
|---|---|---|---|---|---|---|---|---|---|
| | Green | Red | Blue | Green | Red | Blue | CIEx | CIEy | (lm/W) |
| Example 111 | phosphor (A) | CaAlSiN$_3$:Eu | phosphor (M) | 7.2 | 3.7 | 11.0 | 0.459 | 0.134 | 4.7 |
| Example 112 | phosphor (A) | Sr$_2$Si$_5$N$_8$:Eu | phosphor (M) | 5.4 | 6.6 | 7.0 | 0.458 | 0.117 | 8.3 |
| Example 113 | phosphor (A) | Sr$_{0.8}$Ca$_{0.192}$AlSiN$_3$:Eu | phosphor (M) | 3.4 | 2.7 | 7.8 | 0.441 | 0.177 | 9.8 |
| Example 114 | phosphor (A) | Sr$_2$BaSiO$_5$:Eu | phosphor (M) | 3.7 | 8.1 | 23.6 | 0.448 | 0.130 | 10.1 |
| Example 115 | phosphor (A) | CaS:Eu | phosphor (M) | 7.7 | 4.8 | 5.7 | 0.423 | 0.170 | 5.1 |
| Example 116 | phosphor (A) | phosphor (N) | phosphor (M) | 4.8 | 2.7 | 5.8 | 0.460 | 0.137 | 4.6 |
| Example 117 | phosphor (A) | La$_2$O$_2$S:Eu | phosphor (M) | 4.6 | 76.5 | 4.7 | 0.450 | 0.150 | 6.8 |
| Example 118 | phosphor (A) | Sr$_{0.8}$Ca$_{0.192}$AlSiN$_3$:Eu | BaMgSi$_2$O$_8$:Eu | 4.8 | 3.4 | 18.2 | 0.482 | 0.110 | 6.3 |
| Example 119 | phosphor (A) | Sr$_2$BaSiO$_5$:Eu | Sr$_5$(PO$_4$)$_3$Cl:Eu | 8.8 | 4.5 | 9.6 | 0.481 | 0.116 | 6.9 |
| Example 120 | phosphor (A) | | | 9.0 | 0.0 | 0.0 | 0.273 | 0.193 | 13.7 | where:
M1 represents at least one activation element selected from the group consisting of Cr, Mn, Fe, Ce, Pr, Nd, Sm, Eu, Tb, Dy, Ho, Er, Tm and Yb, and includes at least Eu or Ce;
M2 represents at least one divalent metal element selected from the group consisting of Sr, Ca, Mg and Zn;
L represents a metal element, including Si, selected from metal elements belonging to the fourth group or the fourteenth group of the periodic table; and
x, y, z, u, v and w are numeric values in the following ranges:

$0.03 \leq x \leq 0.9$;

$0.9 \leq y \leq 2.95$;

$x+y+z=3$;

$u=6$;

$v=12$; and $w=2$.

2. The multinary oxynitride phosphor according to claim 1, wherein the crystalline structure of the multinary oxynitride phosphor comprises a trigonal unit cell.

3. The multinary oxynitride phosphor according to claim 1, wherein a peak wavelength $\lambda_p$ (nm) of an emission spectrum of the phosphor, when measured with excitation light of 400-nm wavelength, is in a range of from greater than 500 nm to 550 nm.

4. The multinary oxynitride phosphor according to claim 1, wherein the multinary oxynitride phosphor comprises a BSON crystal phase defined as follows:
a crystal phase of which diffraction peak is observed within the range (R0) of the diffraction angle (2θ) of from 26.9° to 28.2°, in X-ray diffraction measurement using a CuKα as an X-ray source, wherein:
when that a diffraction peak (P0) is taken as the reference diffraction peak, with 5 diffraction peaks, other than the diffraction peaks existing in the angle range of from 20.9° to 22.9°, derived from the Bragg angle (θ0) of P0 shown by P1, P2, P3, P4 and P5 respectively in increasing order of angle and with diffraction angle ranges of these diffraction peaks shown by R1, R2, R3, R4 and R5, R1, R2, R3, R4 and R5 indicate the following angle ranges respectively:

$R1=R1s\sim R1e$, $R2=R2s\sim R2e$, $R3=R3s\sim R3e$, $R4=R4s\sim R4e$, $R5=R5s\sim R5e$, at least one diffraction peak exists in all the ranges of R1, R2, R3, R4 and R5, and, to the highest diffraction peak height among those of P0, P1, P2, P3, P4 and P5, P0 has an intensity of 20% or stronger in diffraction peak height ratio and at least one of P1, P2, P3, P4 and P5 has a peak intensity of 5% or stronger in diffraction peak height ratio, when two or more diffraction peaks exist in each angle range of R0, R1, R2, R3, R4 or R5, the peak having the highest peak intensity of them is taken as P0, P1, P2, P3, P4 or P5, and R1s, R2s, R3s, R4s and R5s, indicating the starting angles of R1, R2, R3, R4 and R5 respectively and R1e, R2e, R3e, R4e and R5e, indicating the ending angles of R1, R2, R3, R4 and R5 respectively, are the following angles:

$R1s:2\times\arcsin\{\sin(\theta 0)/(1.994\times 1.015)\}$ $R1e:2\times\arcsin\{\sin(\theta 0)/(1.994\times 0.985)\}$ $R2s:2\times\arcsin\{\sin(\theta 0)/(1.412\times 1.015)\}$ $R2e:2\times\arcsin\{\sin(\theta 0)/(1.412\times 0.985)\}$ $R3s:2\times\arcsin\{\sin(\theta 0)/(1.155\times 1.015)\}$ $R3e:2\times\arcsin\{\sin(\theta 0)/(1.155\times 0.985)\}$ $R4s:2\times\arcsin\{\sin(\theta 0)/(0.894\times 1.015)\}$ $R4e:2\times\arcsin\{\sin(\theta 0)/(0.894\times 0.985)\}$ $R5s:2\times\arcsin\{\sin(\theta 0)/(0.756\times 1.015)\}$ $R5e:2\times\arcsin\{\sin(\theta 0)/(0.756\times 0.985)\}$.

5. The multinary oxynitride phosphor according to claim 4, wherein, in X-ray diffraction measurement using a CuKα as an X-ray source, the strongest peak intensity of the impurity phase, among the measurement results of the X-ray diffraction, is 40% or weaker to the strongest peak intensity of the P0, P1, P2, P3, P4 and P5.

6. A phosphor-containing composition comprising:
the multinary oxynitride phosphor according to claim 1; and
a liquid medium.

* * * * *